(12) United States Patent
Takizawa

(10) Patent No.: US 7,582,390 B2
(45) Date of Patent: *Sep. 1, 2009

(54) TWO-PHOTON ABSORBING POLYMERIZATION METHOD, TWO-PHOTON ABSORBING OPTICAL RECORDING MATERIAL AND TWO-PHOTON ABSORBING OPTICAL RECORDING METHOD

(75) Inventor: Hiroo Takizawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 503 days.

This patent is subject to a terminal disclaimer.

(21) Appl. No.: 10/849,519

(22) Filed: May 20, 2004

(65) Prior Publication Data

US 2004/0245432 A1    Dec. 9, 2004

(30) Foreign Application Priority Data

May 23, 2003  (JP)  ............ P. 2003-146527
Sep. 4, 2003  (JP)  ............ P. 2003-312744

(51) Int. Cl.
*G03H 1/04*   (2006.01)

(52) U.S. Cl. ................ 430/1; 430/2; 430/280.1; 430/945; 359/3

(58) Field of Classification Search ............ None
See application file for complete search history.

(56) References Cited

U.S. PATENT DOCUMENTS

| | | | | |
|---|---|---|---|---|
| 4,496,216 | A * | 1/1985 | Cowan | 359/566 |
| 4,917,977 | A * | 4/1990 | Smothers | 430/1 |
| 5,698,373 | A * | 12/1997 | Fujikawa et al. | 430/288.1 |
| 5,952,160 | A * | 9/1999 | Bakeman, Jr. et al. | |
| 6,512,606 | B1 * | 1/2003 | Lipson et al. | 359/3 |
| 7,112,616 | B2 * | 9/2006 | Takizawa et al. | 522/8 |
| 2002/0168494 | A1 * | 11/2002 | Nagata et al. | |
| 2002/0182530 | A1 * | 12/2002 | Takashima et al. | |
| 2003/0052311 | A1 | 3/2003 | Inagaki et al. | |
| 2003/0129501 | A1 * | 7/2003 | Megens et al. | 430/1 |
| 2004/0086803 | A1 * | 5/2004 | Takizawa et al. | 430/270.18 |
| 2004/0204513 | A1 * | 10/2004 | Takizawa et al. | 522/2 |
| 2004/0245432 | A1 * | 12/2004 | Takizawa | |
| 2005/0003133 | A1 * | 1/2005 | Akiba et al. | 428/64.2 |
| 2005/0019711 | A1 * | 1/2005 | Takizawa | 430/561 |
| 2005/0058910 | A1 * | 3/2005 | Takizawa et al. | 430/1 |
| 2005/0214650 | A1 * | 9/2005 | Takizawa et al. | |
| 2005/0221198 | A1 * | 10/2005 | Takizawa et al. | |
| 2005/0231776 | A1 * | 10/2005 | Akiba et al. | 359/27 |
| 2006/0078803 | A1 * | 4/2006 | Takizawa et al. | |
| 2006/0083890 | A1 * | 4/2006 | Takizawa | |
| 2006/0160025 | A1 * | 7/2006 | Lungu | |
| 2006/0188789 | A1 * | 8/2006 | Takizawa et al. | |
| 2006/0188790 | A1 * | 8/2006 | Takizawa | |
| 2006/0194122 | A1 * | 8/2006 | Takizawa | |
| 2007/0047038 | A1 * | 3/2007 | Takizawa | |
| 2007/0048666 | A1 * | 3/2007 | Takizawa | 430/281.1 |

FOREIGN PATENT DOCUMENTS

| | | | |
|---|---|---|---|
| JP | 74015490 | * | 4/1974 |
| JP | 59-178448 | * | 10/1984 |
| JP | 61-183644 | * | 8/1986 |
| JP | 1-205153 | A | 8/1989 |
| JP | 2-3081 | A | 1/1990 |
| JP | 3-89219 | A | 4/1991 |
| JP | WO 98/53448 | A1 | 11/1998 |
| JP | 2000-047046 | A | 2/2000 |
| JP | 2000-258917 | A | 9/2000 |
| JP | 2000-512061 | A | 9/2000 |
| JP | 2001-524245 | A | 11/2001 |
| JP | 2003-027040 | A | 1/2003 |
| JP | 2003-029404 | A | 1/2003 |
| JP | 2003/073410 | * | 3/2003 |
| WO | 80/01846 | * | 9/1980 |
| WO | WO 98/25268 | A1 | 6/1998 |
| WO | 01/96917 | * | 12/2001 |
| WO | 01/96961 | * | 12/2001 |

OTHER PUBLICATIONS

Diamond et al., "Two-photon holography in 3-D photopolymer host-guest matrix", Optics Express, vol. 6(3) pp. 64-68 (Jan. 2000).*
Belfield et al. "Near-IR two photon absorbing dyes and photoinitiated cationic polymerization.", Polymer Preprints, vol. 41(1) pp. 578-579 (Mar. 2000).*
Brian H. Cumpston et al., "Two-photon polymerization initiators for three-dimensional optical data storage and microfabrication", Nature (1999), vol. 398, pp. 51-54.
Mukesh P. Joshi et al., "Three-dimensional optical circuitry using two-photon-assisted polymerization" (1999) American Institute of Physics, vol. 74, pp. 1-3/E.
Product Information of SAN-EI TECH LTD., pp. 1-7/E.
Catalog of Epo-Tek Epoxies 301 and 301-2, pp. 1-5/E.
Japanese Office Action dated Nov. 12, 2008.

\* cited by examiner

*Primary Examiner*—Martin J Angebrannt
(74) *Attorney, Agent, or Firm*—Sughrue Mion, PLLC

(57) ABSTRACT

(1) A two-photon absorbing polymerization method comprising a first step of irradiating light absorbable by two-photon absorption to form a latent image and a second step of exciting the latent image to cause polymerization, and (2) A two-photon absorbing optical recording method comprising a first step of forming a latent image of a color-forming material by two-photon absorption, a second step of irradiating light on the latent image of a color-forming material to cause polymerization based on the linear absorption of the color-forming material, and thereby forming difference in the refractive index to perform a recording, are provided.

16 Claims, No Drawings

TWO-PHOTON ABSORBING POLYMERIZATION METHOD, TWO-PHOTON ABSORBING OPTICAL RECORDING MATERIAL AND TWO-PHOTON ABSORBING OPTICAL RECORDING METHOD

FIELD OF THE INVENTION

The present invention relates to a material of expressing a non-linear optical effect, more specifically, the present invention relates to a two-photon absorbing polymerization method of causing polymerization by utilizing non-resonant two-photon absorption, a two-photon absorbing polymeric material capable of undergoing such polymerization, a two-photon absorbing optical recording method, and a two-photon absorbing optical recording material capable of performing the two-photon absorbing optical recording.

BACKGROUND OF THE INVENTION

In general, the non-linear optical effect means a non-linear optical response proportional to the square, cube or higher power of photoelectric field applied. Known examples of the secondary non-linear optical effect proportional to the square of photoelectric field applied include second harmonic generation (SHG), optical rectification, photorefractive effect, Pockels effect, parametric amplification, parametric oscillation, light sum frequency mixing and light difference frequency mixing. Examples of the ternary non-linear optical effect proportional to the cube of photoelectric field applied include third harmonic generation (THG), optical Kerr effect, self-induced refractive index change and two-photon absorption.

As the non-linear optical material of exhibiting these non-linear optical effects, a large number of inorganic materials have been heretofore found. However, inorganic materials can be hardly used in practice because so-called molecular design so as to optimize desired non-linear optical characteristics or various properties necessary for the production of a device is difficult. On the other hand, organic compounds can realize not only optimization of desired non-linear optical characteristics by the molecular design but also control of other various properties and therefore, the probability of its practical use is high. Thus, organic compounds are attracting attention as a promising non-linear optical material.

In recent years, among non-linear optical characteristics of the organic compound, ternary non-linear optical effects, particularly, non-resonant two-photon absorption, are being taken notice of. The two-photon absorption is a phenomenon such that a compound is excited by simultaneously absorbing two photons. In the case where the two-photon absorption occurs in the energy region having no (linear) absorption band of the compound, this is called non-resonant two-photon absorption. In the following, even when not particularly specified, two-photon absorption indicates non-resonant two-photon absorption.

The non-resonant two-photon absorption efficiency is proportional to the square of photoelectric field applied (square-law characteristic of two-photon absorption). Therefore, when a laser is irradiated on a two-dimensional plane, two-photon absorption takes place only in the position having a high electric field strength at the center part of laser spot and utterly no two-photon absorption occurs in the portion having a weak electric field strength in the periphery. On the other hand, in a three-dimensional space, two-photon absorption occurs only in the region having a large electric field strength at the focus where the laser rays are converged through a lens, and two-photon absorption does not take place at all in the off-focus region because the electric field strength is weak. As compared with the linear absorption where excitation occurs in all positions proportionally to the strength of photoelectric field applied, in the non-resonant two-photon absorption, excitation occurs only at one point inside the space by virtue of the square-law characteristic and therefore, the space resolution is remarkably enhanced.

Usually, in the case of inducing non-resonant two-photon absorption, a short pulse laser in the near infrared region having a wavelength longer than the wavelength region where the (linear) absorption band of a compound is present, and not having the absorption of the compound is used in many cases. Since a near infrared ray in a so-called transparent region is used, the excitation light can reach the inside of a sample without being absorbed or scattered and one point inside the sample can be excited with very high space resolution due to the square-law characteristic of non-resonant two-photon absorption.

Therefore, if polymerization can be caused by using excitation energy obtained upon non-resonant two-photon absorption, polymerization can be brought about at an arbitrary position in a three-dimensional space and this enables application to a three-dimensional optical recording medium, a fine three-dimensional stereo-lithography material and the like, which are considered as an ultimate high-density recording medium.

Examples of the technique of performing two-photon photopolymerization with use of a non-resonant two-photon absorbing compound and applying it to stereolithography and the like are described in B. H. Cumpston et al., *Nature*, Vol. 398, page 51 (1999) [Non-Patent Document 1], K. D. Belfield et al., *J. Phys. Org. Chem.*, Vol. 13, page 837 (2000) [Non-Patent Document 2], C. Li et al., *Chem. Phys. Lett.*, Vol. 340, page 444 (2001) [Non-Patent Document 3], K. D. Belfield et al., *J. Am. Chem. Soc.*, Vol. 122, page 1217 (2000) [Non-Patent Document 4], S. Maruo et al., *Oppt. Lett.*, Vol. 22, page 132 (1997) [Non-Patent Document 5].

However, these techniques have the following problems:

1) the two-photon absorbing cross-sectional area of the two-photon absorbing compound is small, 2) two photons are absorbed directly into a polymerization initiator having a very low two-photon absorbing cross-sectional area, without using a two-photon absorbing compound, 3) a polymerization initiator is not used, 4) the polymerization initiator, if used, has bad matching with the two-photon absorbing compound, and the like. In this way, a high-efficiency two-photon absorbing compound and an appropriate polymerization initiator are not used and this gives rise to problems in practice, that is, the polymerization efficiency is bad and for performing stereolithography or the like by polymerization, a strong laser must be irradiated for a long period of time.

Also, in these publications, a design of causing the photopolymerization composition to undergo modulation of the refractive index between the polymerized area and the non-polymerized area as a result of photopolymerization is not made and not described at all.

On the other hand, an optical information recording medium (optical disc) capable of recording information only once by laser light has been conventionally known and recordable CD (so-called CD-R), recordable DVD (so-called DVD-R) and the like are put into practical use.

For example, in a representative structure of DVD-R, a recording layer comprising a dye is provided on a disc-like substrate where guide grooves (pre-grooves) for tracking the laser light irradiated are formed at a pitch as narrow as a half or less (0.74 to 0.8 μm) of that in CD-R. On the recording layer, a light reflection layer is usually provided and if desired, a protective layer is further provided.

In the recording of information on DVD-R, visible laser light (usually in the range from 630 to 680 nm) is irradiated and absorbed in the irradiated portion of the recording layer, as a result, the temperature is locally elevated to cause physical or chemical changes (for example, production of pits) and in turn, changes in the optical characteristics, whereby the recording of information is effected. In the reading (reproduction) of information, laser light having the same wavelength as the laser light for recording is also irradiated and by detecting the difference in reflectance between the portion of the recording layer where the optical characteristics are changed (recorded area) and the portion where the optical characteristics are not changed (unrecorded area), the information is reproduced. This difference in reflectance is based on so-called "modulation of refractive index" and as the difference in refractive index between the recorded area and the unrecorded area is larger, the ratio of light reflectance, namely, S/N ratio in reproduction is advantageously larger.

Recently, network (e.g., Internet) and high-vision television are rapidly becoming widespread. In addition, the start of HDVT (High Definition Television) broadcasting is near at hand. To cope with such a tendency, demands for a large-capacity recording medium capable of recording image information easily and inexpensively are increasing also in civilian uses.

Furthermore, in business uses such as use for backup of computer or broadcast, an optical recording medium capable of recording large-volume information of about 1 TB or more at high speed and low cost is being demanded.

However, in view of physical principle, conventional two-dimensional optical recording mediums such as DVD-R can have a capacity of about 25 GB at most even if the wavelength of light for recording/reproduction is shortened, and a recording capacity large enough to satisfy the requirement in future cannot be expected.

Under these circumstances, a three-dimensional optical recording medium is abruptly attracting an attention as an ultimate high-density, high-capacity recording medium. In the three-dimensional optical recording medium, recording is superposed in tens or hundreds of layers in the three-dimensional (thickness) direction to achieve super high-density and super high-capacity recording as large as tens or hundreds of times conventional two-dimensional recording mediums. In order to provide a three-dimensional optical recording medium, access and writing must be performed at an arbitrary position in the three-dimensional (thickness) direction and as a technique therefor, a method of using a two-photon absorbing material and a method of using holography (interference) are known.

In the three-dimensional optical recording medium using a two-photon absorbing material, based on the above-described physical principle, so-called bit recording can be performed over tens or hundreds of times and a higher density recording can be attained. Thus, this is very an ultimate high-density high-capacity optical recording medium.

As for the three-dimensional optical recording medium using a two-photon absorbing material, for example, a method of using a fluorescent material for recording and reproduction and reading the information by fluorescence (see, JP-T-2001-524245 (the term "JP-T" as used herein means a "published Japanese translation of a PCT patent application") by LEVICH, Eugene Boris et al. [Patent Document 1] and JP-T-2000-512061 by PAVEL, Eugen et al. [Patent Document 2]), and a method of using a photochromic compound and reading the information by absorption or fluorescence (JP-T-2001-522119 by KOROTEEV, Nicolai I. et al. [Patent Document 3] and JP-T-2001-508221 by ARSENOV, Vladimir et al. [Patent Document 4]) have been proposed. However, in either method, a specific two-photon absorbing material is not set forth and although examples of the two-photon absorbing compound are abstractly described, the two-photon absorbing compound used has a very small two-photon absorbing efficiency. In addition, these methods have a problem, for example, in the nondestructive reading, the long-term storability of record or the S/N ratio on reproduction and these systems are not practicable as an optical recording medium.

Particularly, in view of nondestructive reading, long-term record storage and the like, it is preferred to use an irreversible material and reproduce the information by detecting the change in reflectance (refractive index). However, a two-photon absorbing material having such a function is not specifically disclosed in any publication.

Also, JP-A-6-28672 by Satoshi Kawada and Yoshimasa Kawada and JP-A-6-1118306 by Satoshi Kawada, Yoshimasa Kawada et al. are disclosing, for example, an apparatus for three-dimensionally recording information by using the modulation of refractive index, and a reproducing apparatus and a reading method for the information, but є method using a two-photon absorbing polymerizable composition is not specifically described.

As described above, if polymerization can be caused by using the excitation energy obtained upon non-resonant two-photon absorption and as a result thereof, the refractive index can be modulated between the laser-focused area and the unfocused area, modulation of light reflectance due to modulation of refractive index can be brought about at an arbitrary position in a three-dimensional space with very high space resolution and this enables application to a three-dimensional optical recording medium which is considered as an ultimate high-density recording medium. Furthermore, nondestructive reading can be achieved and because of an irreversible material, good storability can be expected, therefore, the practicability is high.

However, since two-photon absorbing compounds usable at present are low in the two-photon absorbing ability, a very high-output laser is necessary as the light source and the recording takes a long time. In particular, for use in a three-dimensional optical recording medium, it is essential to establish a two-photon absorbing three-dimensional optical recording material capable of undergoing modulation of the refractive index by two-photon absorption with high sensitivity. For this purpose, a two-photon absorbing compound capable of absorbing two photons with high efficiency and producing an excited state, and a method of only forming a latent image in the recording by two-photon absorption and causing polymerization due to heat or linear light absorption by using the latent image, thereby effecting the recording, are useful. However, such a material has been heretofore not disclosed at all and establishment thereof is being demanded.

SUMMARY OF THE INVENTION

An object of the present invention is to provide a two-photon absorbing polymerization method of causing polymerization by irradiating light absorbable by two-photon absorption and a two-photon absorbing polymeric material capable of undergoing such polymerization. Particularly, an object of the present invention is to provide a two-photon absorbing optical recording method of forming difference in refractive index and thereby recording information, and a two-photon absorbing optical recording material capable of performing such recording. Another object, of the present invention is to provide a two-photon absorbing three-dimensional optical recording medium, an optical material, a three-dimensional stereo-lithography material and the like each using such a method or material.

Another object of the present invention is to provide a two-photon absorbing polymerizable composition capable of forming three-dimensional modulation of refractive index as a result of photopolymerization caused by non-resonant two-photon absorption. Another object of the present invention is to provide a three-dimensional optical recording medium using the two-photon absorbing polymerizable composition.

As a result of intensive investigations by the present inventors, the above-described objects of the present invention can be attained by the following methods and materials.

(1) A two-photon absorbing polymerization method comprising a first step of irradiating light capapable of a two-photon absorption to form a latent image and a second step of exciting the latent image to cause a polymerization.

(2) The two-photon absorbing polymerization method as described in (1), wherein the excitation in the second step is performed by at least one of irradiation of light and an application of heat.

(3) The two-photon absorbing polymerization method as described in (2), wherein the second step includes an irradiation of light.

(4) A two-photon absorbing optical recording method comprising a first step of producing a latent image of a color-forming material by two-photon absorption and a second step of irradiating light on the latent image of a color-forming material to cause polymerization based on the linear absorption of the color-forming material and thereby forming difference in the refractive index to perform a recording.

(5) The two-photon absorbing optical recording method as described in (4), wherein in the second step, light is irradiated on the latent image of a color-forming material to cause polymerization while self-sensitizing and self-amplifying based on the linear absorption of the color-forming material and thereby difference in the refractive index is formed to perform a recording.

(6) The two-photon absorbing optical recording method as described in (4) or (5), wherein the two-photon optical recording is performed by a dry process.

(7) The two-photon absorbing optical recording method as described in any one of (4) to (6), wherein the two-photon absorbing optical recording is a write-once system, that is, an unrewritable system (8) A two-photon absorbing optical recording material and a two-photon absorbing polymerizable material comprising:

1) a two-photon absorbing compound capable of undergoing a two-photon absorption to produce an excited state upon irradiation with light having a wavelength that is longer than the linear absorption band of the compound 1) itself and has a molar absorption coefficient of linear absorption of 10 or less;

2) a dye precursor having an absorption shifted to the longer wavelength side than in the original state by electron or energy transfer from said two-photon absorbing compound 1) in the excited state to become a color-forming material having an absorption in the wavelength region where the molar absorption coefficient of linear absorption in the two-photon absorbing compound 1) is 5,000 or less;

3) a polymerization initiator capable of initiating a polymerization of a polymerizable compound by electron or energy transfer from said two-photon absorbing compound 1) in the excited state;

4) a polymerizable compound; and 5) a binder.

(9) A two-photon absorbing optical recording method and a two-photon absorbing polymerization method each using the two-photon absorbing optical recording material or two-photon absorbing polymeric material described in (8).

(10) The two-photon absorbing optical recording method as described in any one of (4) to (7) and (9), wherein the light irradiated in the second step is light at a wavelength in the region where the molar absorption coefficient of linear absorption in the two-photon absorbing compound is 5,000 or less.

(11) The two-photon absorbing optical recording method as described in (10), wherein the light irradiated in the second step is light at a wavelength in the region where the molar absorption coefficient of linear absorption in the two-photon absorbing compound is 1,000 or less.

(12) The two-photon absorbing optical recording method as described in (10) or (11), wherein the light irradiated in the second step is light at a wavelength in the region where the molar absorption coefficient of linear absorption in the two-photon absorbing compound is 500 or less.

(13) The two-photon absorbing optical recording method as described in any one of (4) to (7) and (9) to (12), wherein the light irradiated in the second step is light at a wavelength in the region where the molar absorption coefficient of the color-forming material is 5,000 or more.

(14) The two-photon absorbing optical recording method as described in any one of (4) to (7) and (9) to (13), wherein the wavelength of light for performing the formation of a latent image by two-photon absorption in the first step and the wavelength of light for causing polymerization by the latent image in the second step are the same.

(15) The two-photon absorbing optical recording method as described in any one of (4) to (7), (9) and (10) to (14), wherein the wavelength of light for causing polymerization by a latent image in the second step is shorter than the wavelength of light for performing the formation of the latent image by two-photon absorption in the first step, and present in the wavelength region where the molar absorption coefficient of linear (one-photon) absorption by the two-photon absorbing compound is 5,000 or less.

(16) A photon absorbing optical recording and reproducing method comprising performing the recording through the first and second steps described in any one of (4) to (7) and (9) to (15) and then performing the reproduction by irradiating light on the recorded area and detecting the difference in reflectance attributable to the difference in refractive index.

(17) The two-photon absorbing optical recording and reproducing method as described in (16), wherein the wavelength of light irradiated at the time of performing two-photon absorption in the first step and the wavelength of light irradiated for detecting the difference in reflectance at the reproduction are the same.

(18) The two-photon absorbing optical recording method as described in any one of (4) to (7), (9) and (10) to (15), wherein the polymerizable compound and the binder are differing in the refractive index and the compositional ratio of the polymerizable compound and a polymerization reaction product thereof to the binder becomes non-uniform between the recorded area and the unrecorded area to enable the two-photon absorbing optical recording by utilizing the modulation of refractive index.

(19) The two-photon absorbing optical recording method as described in (18), wherein the amount of modulation formed of refractive index is 0.001 or more.

(20) The two-photon absorbing optical recording method as described in any one of (4) to (7), (9), (10) to (15), (18) and (19), wherein the two-photon absorbing compound is decomposed and fixed by any one of the first step, the second step and the subsequent fixing step of performing light irradiation, heat application or both thereof.

(21) The two-photon absorbing optical recording method as described in (20), wherein the two-photon absorbing compound is decomposed and fixed by any one of the first step, the second step and the subsequent fixing step of performing light irradiation, heat application or both thereof and the color-forming material is decomposed and fixed by either the second step or the subsequent fixing step of performing light irradiation, heat application or both thereof.

(22) The two-photon absorbing optical recording method as described in any one of (4) to (7), (9), (10) to (15) and (18) to (21) and the two-photon absorbing optical recording material as described in (8), wherein the binder has a refractive index lower than that of the polymerizable compound.

(23) The two-photon absorbing optical recording material as described in (8) or (22), wherein the polymerizable compound contains at least one aryl group, aromatic heterocyclic group, chlorine atom, bromine atom, iodine atom or sulfur atom and the binder has a refractive index lower than that of the polymerizable compound.

(24) The two-photon absorbing optical recording material as described in (8), (22) or (23), wherein at least one polymerizable compound is a liquid having a boiling point of 100° C. or more.

(25) The two-photon absorbing optical recording material as described in (8), (22), (23) or (24), wherein the polymerization initiator contains at least one radical generator and the polymerizable compound contains at least one radical polymerizable compound capable of undergoing polymerization under the action of a radical.

(26) The two-photon absorbing optical recording material as described in (25), wherein the at least one radical generator of generating a radical is any one of a ketone, an organic peroxide, a bisimidazole, a trihalomethyl-substituted triazine, a diazonium salt, a diaryliodonium salt, a sulfonium salt, a triphenyl-alkylborate, a diaryliodonium organic boron complex, a sulfonium organic boron complex, a cationic two-photon absorbing compound organic boron complex, an anionic dye onium salt complex and a metal arene complex.

(27) The two-photon absorbing optical recording material as described in (8), (22), (23) or (24), wherein the polymerization initiator contains at least one acid generator and the polymerizable compound contains at least one cationic polymerizable compound capable of undergoing polymerization under the action of an acid.

(28) The two-photon absorbing optical recording material as described in (27), wherein the at least one acid generator of generating an acid is any one of a trihalomethyl-substituted triazine, a diazonium salt, a diaryliodonium salt, a sulfonium salt, a metal arene complex and a sulfonic acid ester.

(29) The two-photon absorbing optical recording material as described in (8), (22), (23) or (24), wherein the polymerization initiator contains at least one base generator and the polymerizable compound contains at least one anionic polymerizable compound capable of undergoing polymerization under the action of a base.

(30) The two-photon absorbing optical recording material as described in (29), wherein the at least one base generator is represented by the following formula (31-1), (31-2), (31-3) or (31-4):

Formula (31-1):

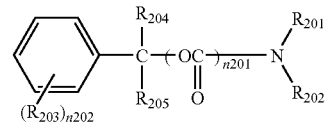

Formula (31-2):

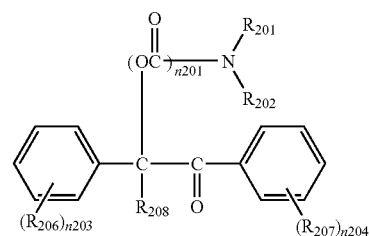

Formula (31-3):

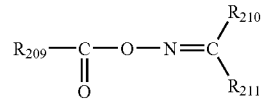

Formula (31-4):

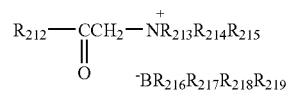

wherein $R_{201}$, $R_{202}$, $R_{213}$, $R_{214}$ and $R_{215}$ each independently represents a hydrogen atom, an alkyl group, an alkenyl group, a cycloalkyl group, an aryl group or a heterocyclic group, $R_{200}$ and $R_{202}$ may combine with each other to form a ring, $R_{213}$, $R_{214}$ and $R_{215}$ may combine with each other to form a ring, $R_{203}$, $R_{206}$, $R_{207}$ and $R_{209}$ each independently represents a substituent, $R_{204}$, $R_{205}$, $R_{208}$, $R_{210}$ and $R_{211}$ each independently represents a hydrogen atom or a substituent, $R_{210}$ and $R_{211}$ may combine with each other to form a ring, $R_{216}$, $R_{217}$, $R_{218}$ and $R_{219}$ each independently represents an alkyl group or an aryl group, $R_{212}$ represents an aryl group or a heterocyclic group, n201 represents an integer of 0 to 1, and n202 to n204 each independently represents an integer of 0 to 5.

(31) The two-photon absorbing optical recording material as described in (30), wherein in formulae (31-1) and (31-2), n201 is 1.

(32) The two-photon absorbing optical recording material as described in (30) or (31), wherein in formula (31-1), $R_{203}$ is a nitro group substituted to the 2-position or 2,6-position or an alkoxy group substituted to the 3,5-position.

(33) The two-photon absorbing optical recording material as described in (30) or (31), wherein in formula (31-2), $R_{206}$ is an alkoxy group substituted to the 3,5-position.

(34) The two-photon absorbing optical recording material as described in any one of (8) and (22) to (33), wherein the dye precursor is an acid-color forming dye precursor and preferably further contains an acid generator.

(35) The two-photon absorbing optical recording material as described in (34), wherein the acid generator is a diaryliodonium salt, a sulfonium salt, a diazonium salt, a metal arene complex, trihalomethyl-substituted triazine or a sulfonic acid ester.

(36) The two-photon absorbing optical recording material as described in (34) or (35), wherein the acid generator is a diaryliodonium salt, a sulfonium salt or a sulfonic acid ester.

(37) The two-photon absorbing optical recording material as described in any one (34) to (36), wherein the color-forming material produced from the acid-color forming dye precursor is a xanthene dye, a fluoran dye or a triphenylmethane dye.

(38) The two-photon absorbing optical recording material as described in any one (34) to (37), which further contains an acid-increasing agent.

(39) The two-photon absorbing optical recording material as described in (37), wherein the acid-increasing agent is a compound represented by the following formula (34-1), (34-2), (34-3), (34-4), (34-5) or (34-6):

Formula (34-1)

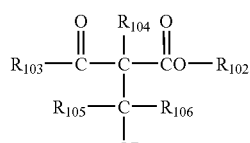

Formula (34-2)

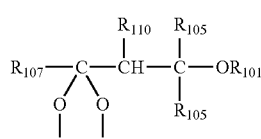

Formula 34-3)

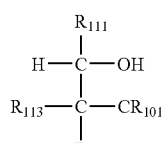

Formula (34-4)

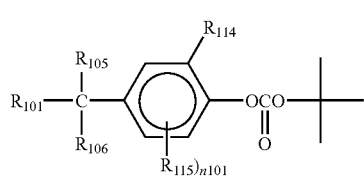

Formula (34-5)

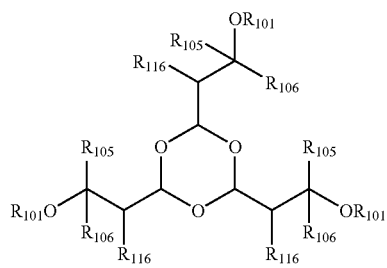

Formula (34-6)

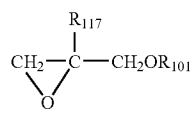

wherein $R_{101}$ represents a group of becoming an acid having a pKa of 5 or less in the form of $R_{101}OH$, $R_{102}$ represents a 2-alkyl-2-propyl group, a 2-aryl-2-propyl group, a cyclohexyl group, a tetrahydropyranyl group or a bis(p-alkoxyphenyl)-methyl group, $R_{103}$, $R_{104}$, $R_{115}$ and $R_{117}$ each independently represents a substituent, $R_{105}$, $R_{106}$, $R_{107}$, $R_{110}$, $R_{113}$ and $R_{116}$ each independently represents a hydrogen atom or a substituent, $R_{118}$ and $R_{119}$ each independently represents an alkyl group and may combine with each other to form a ring, $R_{111}$ and $R_{112}$ represent alkyl groups which combine with each other to form a ring, $R_{114}$ represents a hydrogen atom or a nitro group, and n101 represents an integer of 0 to 3.

(40) The two-photon absorbing optical recording material as described in (39), wherein in formulae (34-1) to (34-6), $R_{101}$ in the form of $R_{101}OH$ is a sulfonic acid or an electron-withdrawing group-substituted carboxylic acid.

(41) The two-photon absorbing optical recording material as described in any one of (8) and (22) to (33), wherein the dye precursor is a base-color forming dye precursor and preferably further contains a base generator.

(42) The two-photon absorbing optical recording material as described in (41), wherein the base generator is represented by formula (31-1), (31-2), (31-3) or (31-4).

(43) The two-photon absorbing optical recording material as described in (41) or (42), wherein the base-color forming dye precursor is a non-dissociated form of a dissociation-type azo dye, a dissociation-type azomethine dye, a dissociation-type oxonol dye, a dissociation-type xanthene dye, a dissociation-type fluoran dye or a dissociation-type triphenylmethane-base dye.

(44) The two-photon absorbing optical recording material as described in any one of (41) to (43), which further contains a base-increasing agent.

(45) The two-photon absorbing optical recording material as described in (44), wherein the base-increasing agent is represented by the following formula (35):

Formula (35):

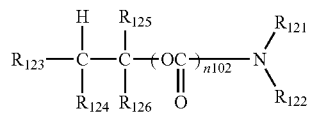

wherein $R_{121}$, and $R_{122}$ each independently represents a hydrogen atom, an alkyl group, an alkenyl group, a cycloalkyl group, an aryl group or a heterocyclic group, $R_{12}$, and $R_{122}$ may combine with each other to form a ring, $R_{123}$ and $R_{124}$ each independently represents a substituent, $R_{123}$ and $R_{124}$ may combine with each other to form a ring, $R_{125}$ and $R_{126}$ each independently represents a hydrogen atom or a substituent, and n102 represents an integer of 0 or 1.

(46) The two-photon absorbing optical recording material as described in (45), wherein in formula (35), n102 is 1.

(47) The two-photon absorbing optical recording material as described in (45) or (46), wherein the base-increasing agent of formula (35) is represented by the following formula (36-1) or (36-2):

Formula (36-1):

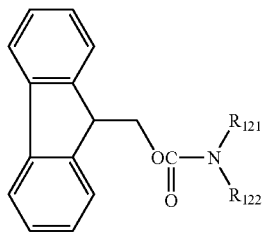

Formula (36-2):

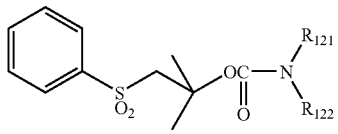

wherein $R_{121}$ and $R_{122}$ have the same meanings as in formula (35).

(48) The two-photon absorbing optical recording material as described in any one of (8) and (22) to (33), wherein the dye precursor is a dye precursor represented by the following formula (32):

A1-PD        Formula (32)

wherein A1 and PD are covalently bonded, A1 represents an organic compound moiety having a function of cutting the covalent bond with PD due to electron or energy transfer with the excited state of two-photon absorbing compound or color-forming material, and PD represents an organic compound moiety of becoming a color-forming material when covalently bonded with A1 and when released as a result of cutting of the covalent bond with A1.

(49) The two-photon absorbing optical recording material as described in (48), wherein the dye precursor of formula (32) is a compound represented by any one of the following formulae (33-1) to (33-6):

Formula (33-1):

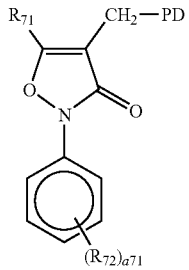

Formula (33-2):

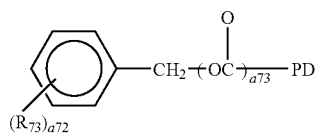

Formula (33-3):

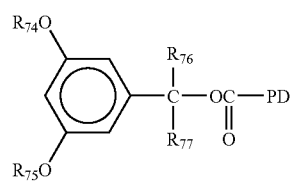

Formula (33-4):

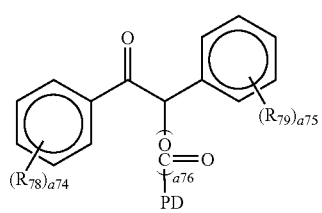

Formula (33-5):

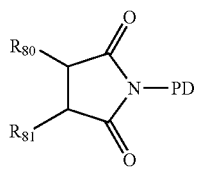

Formula (33-6)

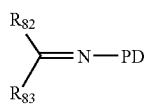

wherein PD has the same meaning as in formula (2), $R_{71}$, $R_{80}$, $R_{81}$ each independently represents a hydrogen atom or a substituent, $R_{72}$, $R_{73}$, $R_{78}$, $R_{79}$, $R_{82}$ and $R_{83}$ each represents a substituent, a71, a72, a74 and a75 each independently represents an integer of 0 to 5, a73 and a76 each independently represents 0 or 1, provided that when a71, a72, a74 and a75 each is 2 or more, the plurality of $R_{72}$s, $R_{73}$s, $R_{78}$s or $R_{79}$s may be the same or different and may combine with each other to form a ring, and each of the pairs $R_{80}$ and $R_{81}$, and $R_{82}$ and $R_{83}$ may combine with each other to form a ring.

(50) The two-photon absorbing optical recording material as described in (48) or (49), wherein in formulae (32) and (33-1) to (33-6), PD is a group comprising any one of a dissociation-type azo dye, a dissociation-type azomethine dye, a dissociation-type oxonol dye, a triphenylmethane dye and a xanthene dye, and being connected to A1 through a covalent bond on the chromophore.

(51) The two-photon absorbing optical recording material as described in any one of (8) and (22) to (33), wherein the dye precursor is a dye precursor represented by the following formula (37):

Formula (37):

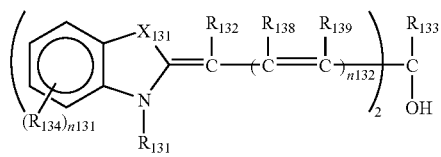

wherein $R_{131}$, represents a hydrogen atom, an alkyl group, an alkenyl group, a cycloalkyl group, an aryl group or a heterocyclic group, $X_{131}$ represents —O—, —S—, —$NR_{135}$— or —$CR_{136}R_{137}$—, $R_{135}$ represents a hydrogen atom, an alkyl group, an alkenyl group, a cycloalkyl group, an aryl group or a heterocyclic group, $R_{136}$ and $R_{137}$ each independently represents an alkyl group, an alkenyl group or an aryl group, $R_{132}$, $R_{133}$, $R_{138}$ and $R_{139}$ each independently represents a hydrogen atom or a substituent, $R_{134}$ represents a substituent, n131 represents an integer of 0 to 4, and n132 represents an integer of 0 to 3.

(52) The two-photon absorbing optical recording material as described in (51), wherein in formula (37), $X_{131}$ is —$CR_{136}R_{137}$—.

(53) The two-photon absorbing optical recording material as described in any one of (8) and (22) to (52), wherein the dye precursor is a dye precursor capable of undergoing a reaction due to at least electron transfer with the excited state of two-photon absorbing compound and becoming a color-forming material changed in the absorption form to the long wavelength.

(54) The two-photon absorbing optical recording material as described in any one of (8) and (22) to (53), wherein the two-photon absorbing compound is an organic dye.

(55) The two-photon absorbing optical recording material as described in any one of (8) and (22) to (54), wherein the two-photon absorbing compound is a methine dye or a phthalocyanine dye.

(56) The two-photon absorbing optical recording material as described in (55), wherein the two-photon absorbing compound is a cyanine dye, a merocyanine dye, an oxonol dye, a phthalocyanine dye or a compound represented by the following formula (1):

Formula (1)

$$X^2 + (CR^4 = CR^3)_m - \underset{O}{\overset{\|}{C}} - (CR^1 = CR^2)_n X^1$$

wherein $R^1$, $R^2$, $R^3$ and $R^4$ each independently represents a hydrogen atom or a substituent and some of $R^1$, $R^2$, $R^3$ and $R^4$ may combine with each other to form a ring; n and m each independently represents an integer of 0 to 4 and when n and m each is 2 or more, the plurality of $R^1$s, $R^2$s, $R^3$s or $R^4$s may be the same or different, provided that n and m are not 0 at the same time; and $X^1$ and $X^2$ each independently represents an aryl group, a heterocyclic group or a group represented by formula (2):

$$—CR^5 = \overset{\overset{}{\underset{R^6}{N}}}{\underset{}{}} Z^1$$

wherein $R^5$ represents a hydrogen atom or a substituent, $R^6$ represents a hydrogen atom, an alkyl group, an alkenyl group, an aryl group or a heterocyclic group, and $Z^1$ represents an atomic group for forming a 5- or 6-membered ring.

(57) The two-photon absorbing optical recording material as described in (56), wherein in the compound represented by formula (1), $R^1$ and $R^3$ are combined to form a ring.

(58) The two-photon absorbing optical recording material as described in (57), wherein in the compound represented by formula (1), $R^1$ and $R^3$ are combined to form a cyclopentanone ring together with the carbonyl group.

(59) The two-photon absorbing optical recording material as described in any one of (56) to (58), wherein in the compound represented by formula (1), $X^1$ and $X^2$ each is a group represented by formula (2).

(60) The two-photon absorbing optical recording material as described in (59), wherein in the compound represented by formula (1), $X^1$ and $X^2$ each is a group represented by formula (2), $R^6$ is an alkyl group, the ring formed by $Z^1$ is an indolenine ring, an azaindolenine ring, a pyrazoline ring, a benzothiazole ring, a thiazole ring, a thiazoline ring, a benzoxazole ring, an oxazole ring, an oxazoline ring, a benzimidazole ring, a thiadiazole ring or a quinoline ring.

(61) The two-photon absorbing optical recording material as described in (59) or (60), wherein in the compound represented by formula (1), $X^1$ and $X^2$ each is a group represented by formula (2), $R^6$ is an alkyl group, and the ring formed by $Z^1$ is an indolenine ring, an azaindolenine ring, a benzothiazole ring, a benzoxazole ring or a benzimidazole ring.

(62) The two-photon absorbing optical recording material as described in (56), wherein the cyanine dye is represented by the following formula (3), the merocyanine dye is represented by formula (4) and the oxonol dye is represented by formula (5):

Formula (3):

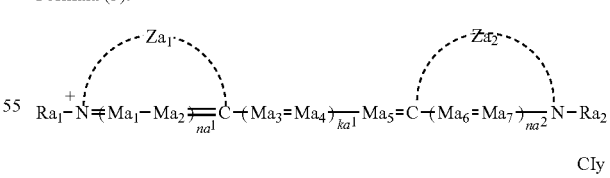

CIy

Formula (4):

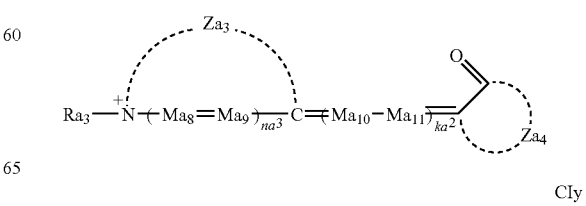

CIy

-continued

Formula (5):

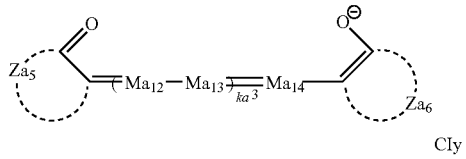

Cly wherein $Za_1$, $Za_2$ and $Za_3$ each represents an atomic group for forming a 5- or 6-membered nitrogen-containing heterocyclic ring, $Za_4$, $Za_5$ and $Za_6$ each represents an atomic group for forming a 5- or 6-membered ring, $Ra_1$, $Ra_2$ and $Ra_3$ each independently represents a hydrogen atom, an alkyl group, an alkenyl group, an aryl group or a heterocyclic group, $Ma_1$ to $Ma_{14}$ each independently represents a methine group, which may have a substituent or may form a ring together with another methine group, $na^1$, $na^2$ and $na^3$ each represents 0 or 1, $ka^1$ and $ka^3$ each represents an integer of 0 to 3, provided that when $ka^1$ is 2 or more, multiple $Ma_3$s or $Ma_4$s may be the same or different and when $ka^3$ is 2 or more, multiple $Ma_{12}$s or $Ma_{13}$s may be the same or different, $ka^2$ represents an integer of 0 to 8, provided that when $ka^2$ is 2 or more, multiple $Ma_{10}$s or $Ma_{11}$s may be the same or different, CI represents an ion for neutralizing the electric charge, and y represents a number necessary for the neutralization of electric charge.

(63) The two-photon absorbing optical recording material as described in any one of (8) and (22) to (62), wherein the two-photon absorbing compound contains at least one hydrogen bonding group.

(64) The two-photon absorbing optical recording material as described in (63), wherein the hydrogen bonding group is —COOH group or —CONH$_2$ group.

(65) The two-photon absorbing optical recording material as described in any one of (8) and (22) to (62), wherein the two-photon absorbing optical recording material contains an electron-donating compound having an ability of reducing the radical cation of the two-photon absorbing compound or a color-forming material produced from the dye precursor, or an electron-accepting compound having an ability of oxidizing the radical anion of the two-photon absorbing compound or a color-forming material produced from the dye precursor.

(66) The two-photon absorbing optical recording material as described in (65), wherein the two-photon absorbing optical recording material contains an electron-donating compound and the electron-donating compound is any one of alkylamines, anilines, phenylenediamines, triphenylamines, carbazoles, phenothiazines, phenoxazines, phenazines, hydroquinones, catechols, alkoxybenzenes, aminophenols, imidazoles, pyridines, metallocenes, metal complexes and fine particulate semiconductors.

(67) The two-photon absorbing optical recording material as described in (65) or (66), wherein the two-photon absorbing optical recording material contains an electron-accepting compound and the electron-accepting compound is any one of aromatic compounds having introduced thereinto an electron-withdrawing group, such as dinitrobenzene and dicyanobenzene, heterocyclic compounds, heterocyclic compounds having introduced thereinto an electron-withdrawing group, N-alkylpyridinium salts, benzoquinones, imides, metal complexes and fine particulate semiconductors.

(68) The two-photon absorbing optical recording material as described in (8), (27) or (28), wherein the polymerization initiator is an acid generator, the polymerizable compound is a cationic polymerizable compound and the dye precursor comprises an acid-color forming dye precursor and an acid generator serving also as the polymerization initiator.

(69) The two-photon absorbing optical recording material as described in (8), (25) or (27), wherein the polymerization initiator is a generator of generating an acid and a radical, the polymerizable compound is a radical polymerizable compound and the dye precursor group contains an acid-color forming dye precursor and an acid generator serving also as the polymerization initiator.

(70) The two-photon absorbing optical recording material as described in (8), (29) or (41), wherein the polymerization initiator is a base generator, the polymerizable compound is an anionic polymerizable compound and the dye precursor contains a base-color forming dye precursor and a base generator serving also as the polymerization initiator.

(71) The two-photon absorbing optical recording material as described in (8), (25) or (51), wherein the polymerization initiator is a radical or cation generator, the polymerizable compound is a radical or cationic polymerizable compound and the dye precursor group contains a compound represented by formula (37).

(72) The two-photon absorbing optical recording material as described in (8), (25) or (48), wherein the polymerization initiator is a radical or anion generator, the polymerizable compound is a radical or anionic polymerizable compound and the dye precursor group contains a compound represented by formula (32).

(73) An optical recording medium using the two-photon absorbing optical recording material described in any one of (8) and (22) to (72).

(74) A two-photon absorbing three-dimensional optical recording medium comprising the two-photon absorbing optical recording material described in any one of (8) and (22) to (72).

(75) A near-field optical recording medium using the two-photon absorbing optical recording material described in any one of (8) and (22) to (72).

(76) An optical recording medium using the two-photon absorbing optical recording material described in any one of (8) and (22) to (75), wherein the two-photon absorbing recording material is stored in a light-shielding cartridge at the storage.

(77) An optical material comprising the two-photon absorbing optical recording material described in any one of (8) and (22) to (72).

The other embodiment of the present invention is set forth below.

(1) A two-photon absorbing polymerizable composition comprising at least a two-photon absorbing compound, a polymerization initiator, a polymerizable compound and a binder, which can form three-dimensional modulation of refractive index as a result of photo-polymerization caused by non-resonant two-photon absorption.

(2) The two-photon absorbing polymerizable composition as described in (1), wherein the polymerizable compound and the binder are differing in the refractive index and as a result of photopolymerization caused by non-resonant two-photon absorption, the compositional ratio of the polymerizable compound and a polymerization reaction product thereof to the binder becomes non-uniform between the laser-focused area and the unfocused area to enable the three-dimensional modulation of refractive index.

(3) The two-photon absorbing polymerizable composition as described in (1) or (2), wherein either one of the polymerizable compound and the binder contains at least one aryl group, aromatic heterocyclic group, chlorine atom, bromine atom, iodine atom or sulfur atom and the remaining does not contain such a group or atom.

(4) The two-photon absorbing polymerizable composition as described in (3), wherein the polymerizable compound contains at least one aryl group, aromatic heterocyclic group, chlorine atom, bromine atom, iodine atom or sulfur atom and the binder does not contain such a group or atom.

(5) The two-photon absorbing polymerizable composition as described in any one of (1) to (4), wherein at least one polymerizable compound is a liquid having a boiling point of 100° C. or more.

(6) The two-photon absorbing polymerizable composition as described in any one of (1) to (5), wherein the binder has a refractive index lower than that of the polymerizable compound and the binder contains a cellulose ester, a polyvinyl alcohol, a polyvinyl acetal, a polyvinyl butyral, a polyvinyl formal or a fluorine-containing polymer.

(7) The two-photon absorbing polymerizable composition as described in (6), which can form three-dimensional modulation of refractive index as a result of photopolymerization caused by non-resonant two-photon absorption, wherein the polymerizable compound contains at least one aryl group, aromatic heterocyclic group, chlorine atom, bromine atom, iodine atom or sulfur atom, the binder has a refractive index lower than that of the polymerizable compound, and the binder contains a cellulose ester, a polyvinyl alcohol, a polyvinyl acetal, a polyvinyl butyral, a polyvinyl formal or a fluorine-containing polymer.

(8) The two-photon absorbing polymerizable composition as described in any one of (1) to (7), wherein the two-photon absorbing compound is an organic dye.

(9) The two-photon absorbing polymerizable composition as described in (8), wherein the two-photon absorbing compound is a methine dye or a phthalocyanine dye.

(10) The two-photon absorbing polymerizable composition as described in (9), wherein the two-photon absorbing compound is a cyanine dye, a merocyanine dye, an oxonol dye, a phthalocyanine dye or a compound represented by the following formula (1):

$$X^2+(CR^4=CR^3)_m-\underset{\underset{O}{\|}}{C}-(CR^1=CR^2)_n-X^1$$

wherein $R^1$, $R^2$, $R^3$ and $R^4$ each independently represents a hydrogen atom or a substituent and some of $R^1$, $R^2$, $R^3$ and $R^4$ may combine with each other to form a ring; n and m each independently represents an integer of 0 to 4 and when n and m each is 2 or more, multiple $R^1$s, $R^2$s, $R^3$s or $R^4$s may be the same or different, provided that n and m are not 0 at the same time; and $X^1$ and $X^2$ each independently represents an aryl group, a heterocyclic group or a group represented by formula (2):

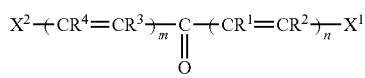

wherein $R^5$ represents a hydrogen atom or a substituent, $R^6$ represents a hydrogen atom, an alkyl group, an alkenyl group, an aryl group or a heterocyclic group, and $Z^1$ represents an atomic group for forming a 5- or 6-membered ring.

(11) The two-photon absorbing polymerizable composition as described in (10), wherein in the compound represented by formula (1), $R^1$ and $R^3$ combine to form a ring.

(12) The two-photon absorbing polymerizable composition as described in (11), wherein in the compound represented by formula (1), $R^1$ and $R^3$ combine to form a cyclopentanone ring together with the carbonyl group.

(13) The two-photon absorbing polymerizable composition as described in any one of (10) to (12), which can form three-dimensional modulation of refractive index as a result of photopolymerization caused by non-resonant two-photon absorption, wherein in the compound represented by formula (1), $X^1$ and $X^2$ each is represented by formula (2).

(14) The two-photon absorbing polymerizable composition as described in (13), wherein in the compound represented by formula (1), $X^1$ and $X^2$ each is represented by formula (2), $R^6$ is an alkyl group, and the ring formed by $Z^1$ is an indolenine group, an azaindolenine ring, a pyrazoline ring, a benzothiazole ring, a thiazole ring, a thiazoline ring, a benzoxazole ring, an oxazole ring, an oxazoline ring, a benzimidazole ring, a thiadiazole ring or a quinoline ring.

(15) The two-photon absorbing polymerizable composition as described in (14), wherein in the compound represented by formula (1), $X^1$ and $X^2$ each is represented by formula (2), $R^6$ is an alkyl group, and the ring formed by $Z^1$ is an indolenine group, an azaindolenine ring, a benzothiazole ring, a benzoxazole ring or a benzimidazole ring.

(16) The two-photon absorbing polymerizable composition as described in (110), wherein the cyanine dye is represented by the following formula (3), the merocyanine dye is represented by formula (4) and the oxonol dye is represented by formula (5):

Formula (3):

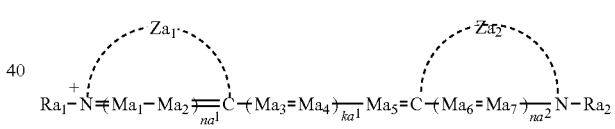

Formula (4):

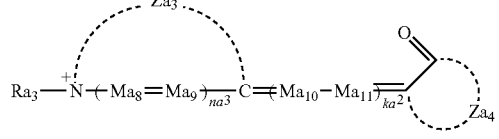

Formula (5):

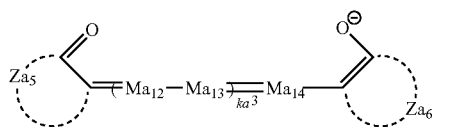

wherein $Za_1$, $Za_2$ and $Za_3$ each represents an atomic group for forming a 5- or 6-membered nitrogen-containing heterocyclic ring, $Za_4$, $Za_5$ and $Za_6$ each represents an atomic group for forming a 5- or 6-membered ring, $Ra_1$, $Ra_2$ and $Ra_3$ each independently represents a hydrogen atom, an alkyl group, an alkenyl group, an aryl group or a heterocyclic group, $Ma_1$ to Ma₁₄ each independently represents a methine group which may have a substituent or may form a ring together with another methine group, $na^1$, $na^2$ and $na^3$ each represents 0 or 1, $ka^1$ and $ka^3$ each represents an integer of 0 to 3, provided that when $ka^1$ is 2 or more, multiple $Ma_3$s or $Ma_4$s may be the same or different and when $ka^3$ is 2 or more, multiple $Ma_{12}$s or $Ma_{13}$s may be the same or different, $ka^2$ represents an integer of 0 to 8, provided that when $ka^2$ is 2 or more, multiple $Ma_{10}$s or $Ma_{11}$s may be the same or different, CI represents an ion for neutralizing the electric charge, and y represents a number necessary for the neutralization of electric charge.

(17) The two-photon absorbing polymerizable composition as described in any one of (1) to (16), wherein the two-photon absorbing compound contains at least one hydrogen bonding group.

(18) The two-photon absorbing polymerizable composition as described in (17), which can form three-dimensional modulation of refractive index as a result of photopolymerization caused by non-resonant two-photon absorption, wherein the hydrogen bonding group is —COOH group or —CONH₂ group.

(19) The two-photon absorbing polymerizable composition as described in any one of (1) to (18), wherein the polymerization initiator is 1) a ketone-base polymerization initiator, 2) an organic peroxide-base polymerization initiator, 3) a bisimidazole-base polymerization initiator, 4) a trihalomethyl-substituted triazine-base polymerization initiator, 5) a diazonium salt-base polymerization initiator, 6) a diaryliodonium salt-base polymerization initiator, 7) a sulfonium salt-base polymerization initiator, 8) a triphenylalkylborate-base polymerization initiator, 9) a diaryliodonium organic boron complex-base polymerization initiator, 10) a sulfonium organic boron complex-base polymerization initiator, 11) a cationic two-photon absorbing compound organic boron complex-base polymerization initiator, 12) an anionic two-photon absorbing compound onium salt complex-base polymerization initiator, 13) a metal arene complex-base polymerization initiator or 14) a sulfonic acid ester-base polymerization initiator.

(20) The two-photon absorbing polymerizable composition as described in (19), which can form three-dimensional modulation of refractive index as a result of photopolymerization caused by non-resonant two-photon absorption, wherein the polymerization initiator is 1) a ketone-base polymerization initiator, 3) a bisimidazole-base polymerization initiator, 4) a trihalomethyl-substituted triazine-base polymerization initiator, 6) a diaryliodonium salt-base polymerization initiator, 7) a sulfonium salt-base polymerization initiator, 11) a cationic two-photon absorbing compound organic boron complex-base polymerization initiator or 12) an anionic two-photon absorbing compound onium salt complex-base polymerization initiator.

(21) The two-photon absorbing polymerizable composition as described in any one of (1) to (20), wherein the polymerization initiator contains at least one polymerization initiator of generating a radical and the polymerizable compound contains at least one radical polymerizable compound of undergoing polymerization under the action of a radical.

(22) The two-photon absorbing polymerizable composition as described in (21), wherein at least one radical polymerization initiator of generating a radical is 1) a ketone-base polymerization initiator, 2) an organic peroxide-base polymerization initiator, 3) a bisimidazole-base polymerization initiator, 4) a trihalomethyl-substituted triazine-base polymerization initiator, 5) a diazonium salt-base polymerization initiator, 6) a diaryliodonium salt-base polymerization initiator, 7) a sulfonium salt-base polymerization initiator, 8) a triphenylalkylborate-base polymerization initiator, 9) a diaryliodonium organic boron complex-base polymerization initiator, 10) a sulfonium organic boron complex-base polymerization initiator, 11) a cationic two-photon absorbing compound organic boron complex-base polymerization initiator, 12) an anionic two-photon absorbing compound onium salt complex-base polymerization initiator or 13) a metal arene complex-base polymerization initiator.

(23) The two-photon absorbing polymerizable composition as described in (22), which can form three-dimensional modulation of refractive index as a result of photopolymerization caused by non-resonant two-photon absorption, wherein at least one radical polymerization initiator of generating a radical is 1) a ketone-base polymerization initiator, 3) a bisimidazole-base polymerization initiator, 4) a trihalomethyl-substituted triazine-base polymerization initiator, 6) a diaryliodonium salt-base polymerization initiator, 7) a sulfonium salt-base polymerization initiator, 11) a cationic two-photon absorbing compound organic boron complex-base polymerization initiator or 12) an anionic two-photon absorbing compound onium salt complex-base polymerization initiator.

(24) The two-photon absorbing polymerizable composition as described in (22), which can form three-dimensional modulation of refractive index as a result of photopolymerization caused by non-resonant two-photon absorption, wherein at least one radical polymerization initiator of generating a radical is 3) a bisimidazole-base polymerization initiator, 6) a diaryliodonium salt-base polymerization initiator, 7) a sulfonium salt-base polymerization initiator, 11) a cationic two-photon absorbing compound organic boron complex-base polymerization initiator or 12) an anionic two-photon absorbing compound onium salt complex-base polymerization initiator.

(25) The two-photon absorbing polymerizable composition as described in any one of (1) to (20), wherein the polymerization initiator contains at least one polymerization initiator of generating an acid and the polymerizable compound contains at least one cationic polymerizable compound of undergoing polymerization under the action of an acid.

(26) The two-photon absorbing polymerizable composition as described in (25), which can form three-dimensional modulation of refractive index as a result of photopolymerization caused by non-resonant two-photon absorption, wherein at least one radical polymerization initiator of generating an acid is 4) a trihalomethyl-substituted triazine-base polymerization initiator, 5) a diazonium salt-base polymerization initiator, 6) a diaryliodonium salt-base polymerization initiator, 7) a sulfonium salt-base polymerization initiator, 13) a metal arene complex-base polymerization initiator or 14) a sulfonic acid ester-base polymerization initiator.

(27) The two-photon absorbing polymerizable composition as described in (25), which can form three-dimensional modulation of refractive index as a result of photopolymerization caused by non-resonant two-photon absorption, wherein at least one radical polymerization initiator of generating both a radical and an acid is 6) a diaryliodonium salt-base polymerization initiator or 7) a sulfonium salt-base polymerization initiator.

(28) A two-photon absorbing polymerizable composition comprising at least a two-photon absorbing compound, a polymerizable compound and a binder, which can form three-dimensional modulation of refractive index as a result of photopolymerization caused by non-resonant two-photon absorption.

(29) The two-photon absorbing polymerizable composition as described in (28), wherein the two-photon absorbing compound is a cyanine dye represented by formula (3), a merocyanine dye represented by formula (4), an oxonol dye represented by formula (5) or a compound represented by formula (1).

(30) The two-photon absorbing polymerizable composition as described in any one of (1) to (29), wherein the amount of the formed modulation of refractive index is 0.005 or more.

(31) A method for three-dimensionally modulating a refractive index, comprising irradiating the two-photon absorbing polymerizable composition described in any one of (1) to (30) with laser light at a wavelength being longer than the linear absorption band of the two-photon absorbing compound and having no linear absorption, and causing photopolymerization by utilizing the two-photon absorption induced.

(32) A three-dimensional optical recording medium comprising the two-photon absorbing polymerizable composition described in any one of (1) to (30).

(33) A three-dimensional optical recording medium, comprising irradiating the two-photon absorbing polymerizable composition described in any one of (1) to (30) with laser light at a wavelength being longer than the linear absorption band of the two-photon absorbing compound and having no linear absorption, causing photopolymerization by utilizing the two-photon absorption induced, and effecting the recording by using the three-dimensional modulation of refractive index generated as a result of the compositional ratio of the polymerizable compound and a polymerization reaction product thereof to the binder becoming non-uniform between the laser-focused area and unfocused area.

When the two-photon absorbing polymerization method or two-photon absorbing optical recording method of the present invention is used, a color-forming latent image is formed by two-photon absorption in the laser-focused (recorded) area (first step) and light in a wavelength region having no linear absorption of a two-photon absorbing compound and having linear absorption of a color-forming material is irradiated on the color-forming latent image to cause linear absorption of only the color-forming material and thereby bring about polymerization (second step), so that very efficient polymerization can be brought about only in the laser-focused area having the latent image (in general, the efficiency of linear absorption is by far higher than that of two-photon absorption) and therefore, polymerization can be brought about with very high efficiency as compared with conventional cases of bringing about polymerization by using only two-photon absorption. Moreover, modulation of the refractive index can be brought about by using the polymerization and therefore, recording by polymerization and modulation of refractive index can be achieved with very high sensitivity as compared with known systems. Furthermore, two-photon absorption is used for the recording and therefore, the refractive index can be three-dimensionally modulated by polymerization between the laser-focused (recorded) area and the unfocused (unrecorded) area, as a result, the reflectance of light can be changed and this enables application to a three-dimensional optical recording medium and a recording/reproducing method therefor.

DETAILED DESCRIPTION OF THE INVENTION

The two-photon absorbing polymerizable composition of the present invention comprises a two-photon absorbing compound, a radical or cationic polymerization initiator of generating a radical or an acid by using the excitation energy of the two-photon absorbing compound, a polymerizable compound of undergoing polymerization under the action of a radical or a cation, and a binder comprising a polymer compound, and if desired, uses additives such as chain transfer agent, heat stabilizer, plasticizer and solvent.

In the two-photon absorbing polymerizable composition of the present invention, the polymerizable compound and the binder are preferably differing in the refractive index. By virtue of this difference, the compositional ratio of the polymerizable compound and a polymerization reaction product thereof to the binder becomes non-uniform between the laser-focused area and the unfocused area as a result of photopolymerization caused by non-resonant two-photon absorption and this enables three-dimensional modulation of the refractive index.

The formed modulation of refractive index is preferably larger than 0.005, more preferably larger than 0.01, still more preferably larger than 0.05.

As for the difference in refractive index between the polymerizable compound and the binder, the refractive index of the polymerizable compound may be larger or the refractive index of the binder may be larger, but the refractive index of the polymerizable compound is preferably larger than that of the binder.

The two-photon absorbing polymerization method and two-photon absorbing polymeric material capable of undergoing such two-photon absorbing polymerization of the present invention preferably comprise a first step of irradiating light absorbable by two-photon absorption to form a latent image and a second step of causing polymerization by the latent image.

The second step is preferably performed by irradiating light or applying heat, most preferably by irradiating light.

In the case of performing the second step by irradiating light, the light is preferably irradiated to effect entire surface exposure (so-called solid exposure, blanket exposure or non-imagewise exposure). As for the light source used, preferred examples thereof include visible light laser, ultraviolet light laser, infrared light laser, carbon arc, high-pressure mercury lamp, xenon lamp, metal halide lamp, fluorescent lamp, tungsten lamp, LED and organic LED. In order to irradiate light in a specific wavelength region, a sharp-cut filter, band-pass filter, diffraction grating or the like is preferably used, if desired.

The two-photon absorbing optical recording method of the present invention is preferably a two-photon absorbing optical recording method comprising a first step of producing a color-forming material as a latent image by two-photon absorption and a second step of irradiating light on the latent image of a color-forming material to cause polymerization based on the linear absorption of the color-forming material and thereby forming difference in the refractive index to effect the recording, or a two-photon absorbing optical recording method comprising at least a first step of producing a latent image of a color-forming material by two-photon absorption and a second step of irradiating light on the latent image of a color-forming material to cause polymerization while self-sensitizing, amplifying and producing a color-forming material based on the linear absorption of the color-forming material, and thereby forming difference in the refractive index to effect the recording.

In the first step of the two-photon absorbing polymeric material and two-photon absorbing optical recording material of the present invention, a laser is preferably used for the recording by two-photon absorption. The light for use in the present invention is preferably ultraviolet light, visible light or infrared light at a wavelength of 200 to 2,000 nm, more preferably ultraviolet light, visible light or infrared light at a wavelength of 300 to 1,000 nm, still more preferably visible light or infrared light at 400 to 800 nm.

The laser which can be used is not particularly limited, but specific examples of the laser which can be preferably used include a solid or fiber laser having an oscillation wavelength in the vicinity of center wavelength of 1,000 nm, such as Ti-sapphire, a semiconductor, solid or fiber laser having an oscillation wavelength in the vicinity of 780 nm, which is also used in CD-R and the like, a semiconductor or solid laser having an oscillation wavelength in the range from 620 to 680 nm, which is also used in DVD-R and the like, and a GaN laser having an oscillation wavelength in the vicinity of 400 to 415 nm.

In addition, a solid or semiconductor SGH laser having an oscillation wavelength in the visible light region, such as YAG•SHG laser, may also be preferably used.

The laser for use in the present invention may be either a pulse oscillation laser or a CW laser.

The light used at the time of reproducing the information is also preferably laser light and although the power or pulse shape may be the same or different, the reproduction is preferably performed by using the same laser as used for the recording.

The term "latent image" in the first step of the present invention indicates an "image by the difference in refractive index of preferably ½ or less, more preferably ⅕ or less, of the difference in refractive index formed after the second step" (that is, the amplification in the second step is preferably 5 times or more), more preferably an image by the difference in refractive index or absorptivity of 1/10 or less, still more preferably 1/30 or less (that is, the amplification in the second step is more preferably 10 times or more, still more preferably 30 times or more).

The two-photon absorbing polymeric material and two-photon absorbing optical recording material used in the two-photon absorbing polymerization method and two-photon absorbing optical recording method of the present invention each preferably comprises at least 1) a two-photon absorbing compound of, in the first step, undergoing two-photon absorption to produce an excited state upon irradiation with light at a wavelength which is longer than the linear (one-photon) absorption band of the compound itself and in which the molar absorption coefficient of linear absorption is 10 or less, 2) a dye precursor capable of becoming a color-forming material as a result of electron or energy transfer from the excited state of the two-photon absorbing compound in the first step or from the excited state of the color-forming material in the second step, the color-forming material having absorption shifted to the longer wavelength side than in the original state and having absorption in the wavelength region where the molar absorption coefficient of linear absorption by the two-photon compound is 5,000 or less, 3) a polymerization initiator capable of, in the first step, initiating polymerization of a polymerizable compound as a result of electron or energy transfer from the excited state of the two-photon absorbing compound, 4) a polymerizable compound, and 5) a binder.

At this time, the light irradiated in the first step is preferably light at a wavelength where the molar absorption coefficient of linear (one-photon) absorption by the two-photon absorbing compound is 10 or less, more preferably 1 or less, still more preferably 0.1 or less, and most preferably, no linear absorption is present.

The light irradiated in the second step is preferably light at a wavelength in the region where the molar absorption coefficient of linear absorption by the two-photon absorbing compound is 5,000 or less, more preferably 1,000 or less, still more preferably 500 or less.

In the wavelength region of light irradiated in the second step, the molar absorption coefficient of the color-forming material is preferably 5,000 or more, more preferably 10,000 or more.

The linear absorption of the color-forming material preferably appears in the longer wavelength side than the linear absorption of the two-photon absorbing compound.

In the two-photon absorbing photopolymerization method and two-photon absorbing optical recording method of the present invention, it is preferred that the wavelength of light for performing the formation of a latent image by two-photon absorption in the first step and the wavelength of light for causing polymerization by the latent image in the second step are the same or that the wavelength of light for causing polymerization by a latent image in the second step is shorter than the wavelength of light for performing the formation of the latent image by two-photon absorption in the first step and at the same time, is present in the wavelength region where the molar absorption coefficient of linear (one-photon) absorption by the two-photon absorbing compound is 5,000 or less.

In the first step, polymerization sometimes slightly occurs, but this can be neglected in the present invention.

The two-photon absorbing optical recording of the present invention is preferably in a write-once system, that is, unrewritable system.

The two-photon absorbing optical recording material of the present invention is preferably not subjected to a wet processing, that is, the steps are preferably performed in a dry system.

A two-photon absorbing optical recording and reproducing method comprising performing the recording and amplification as described above in the first and second steps by using the two-photon absorbing optical recording material of the present invention to record the difference in refractive index and then performing the reproduction by irradiating light on the recording material and detecting the difference in reflectance based on the difference in refractive index between the recorded area and the unrecorded area, is preferred.

According to this method, in the optical recording medium using the photon absorbing optical recording medium, digital signals can be recorded and reproduced by irradiating light on the material modulated in the refractive index.

In this two-photon absorbing optical recording and reproducing method, the wavelength of light for performing the recording by two-photon absorption in the first step and the wavelength of light irradiated for detecting the difference in reflectance at the reproduction are preferably the same.

In the two-photon absorbing optical recording material of the present invention, it is preferred that the polymerizable compound and the binder are differing in the refractive index and the compositional ratio of the polymerizable compound and a polymerization reaction product thereof to the binder becomes non-uniform between the laser-focused (recorded) area and the laser-unfocused (unrecorded) area to enable the optical recording by utilizing the modulation of refractive index. At this time, the binder preferably has a refractive index lower than that of the polymerizable compound. The refractive index of the bulk is preferably lower by 0.05 or more, more preferably 0.1 or more.

For this purpose, the polymerizable compound preferably contains at least one aryl group, aromatic heterocyclic group, chlorine atom, bromine atom, iodine atom or sulfur atom and it is more preferred that the binder does not contain such a group or atom.

The modulation of refractive index between the recorded area and the unrecorded area is preferably from 0.001 to 0.5, more preferably from 0.005 to 0.2.

In addition to these two-photon absorbing compound, dye precursor group, polymerization initiator, polymerizable compound and binder, the two-photon absorbing optical recording material of the present invention may contain, if desired, additives such as electron-donating compound, electron-accepting compound, crosslinking agent, heat stabilizer, plasticizer and solvent.

In the two-photon absorbing optical recording material of the present invention, the size of the recorded area (reacted part or color-formed part) produced by the recording is preferably in the range from 10 nm to 100 µm, more preferably from 50 nm to 5 µm, still more preferably from 50 nm to 2 µm.

After the recording, the two-photon absorbing optical recording material of the present invention may be subjected to a fixing step by using light (one photon), heat or both thereof.

Particularly, in the case of using an acid- or base-increasing agent in the two-photon absorbing optical recording material of the present invention, heating is preferably used for the fixing also from the standpoint of effectively bringing out the function of the acid- or base-increasing agent.

In the case of fixing by light, ultraviolet or visible light is entirely irradiated (incoherent exposure) throughout the two-photon absorbing optical recording material. As for the light source used, preferred examples thereof include visible light laser, ultraviolet light laser, carbon arc, high-pressure mercury lamp, xenon lamp, metal halide lamp, fluorescent lamp, tungsten lamp, LED and organic LED.

For the light source in the fixing by light, the laser used for the recording is also preferably used as it is or by changing the power, pulse, concentration, wavelength or the like.

In the case of fixing by heat, the fixing step is preferably performed at 40 to 160° C., more preferably from 60 to 130° C.

In the case of performing the fixing by using both light and heat, the light and the heat may be applied simultaneously or separately.

In the present invention, those first and second steps each may serve also as the fixing step, and the second step preferably serves also as the fixing step.

In the two-photon absorbing optical recording method and two-photon absorbing optical recording material capable of undergoing such two-photon absorbing optical recording, from the standpoint of storability and nondestructive reproduction, the two-photon absorbing compound is preferably decomposed and fixed in any one of the first step, the second step and the subsequent fixing step of performing light irradiation, heat application or both thereof. It is more preferred that the two-photon absorbing compound is decomposed and fixed in any one of the first step, the second step and the subsequent fixing step of performing light irradiation, heat application or both thereof and the color-forming material is decomposed and fixed in either the second step or the subsequent fixing step of performing light irradiation, heat application or both thereof.

The two-photon absorbing compound and two-photon absorbing optical recording material of the present invention may undergo multi-photon absorption of absorbing three or more photons.

The two-photon absorbing polymeric material, two-photon absorbing polymerization method, two-photon absorbing optical recording material and two-photon absorbing optical recording (and reproducing) method of the present invention are preferably used for an optical recording medium such as DVD-R and DVD-BL(BR), a near-field optical recording medium, a three-dimensional optical recording medium, an optical material such as antireflection film, light take-out efficiency enhancing film, reflectance enhancing film and polarizing film, a three-dimensional stereolithography material and the like.

The two-photon absorbing polymeric material, two-photon absorbing polymerization method, two-photon absorbing optical recording material and two-photon absorbing optical recording (and reproducing) method of the present invention are more preferably a two-photon absorbing three-dimensional optical recording method and a two-photon absorbing three-dimensional optical recording material capable of undergoing such two-photon absorbing three-dimensional optical recording. In this case, these materials and methods are preferably used for a three-dimensional optical recording medium.

In using the two-photon absorbing optical recording material of the present invention for an optical recording medium, the two-photon absorbing optical recording material at the storage is preferably stored in a light-shielding cartridge.

The concept of the two-photon absorbing optical recording material of the present invention is described below, however, the present invention is of course not limited thereto. Also, values are set forth absolutely for the purpose of qualitative description and not always reflecting a quantitative value.

For example, a laser of 780 nm is irradiated on the two-photon absorbing optical recording material and absorbed in the two-photon absorbing compound to produce an excited state and from the excited state of the two-photon absorbing compound, an energy or electron is transferred to the dye precursor, whereby the dye precursor is changed into a color-forming material and a latent image is formed by the color formation (first step). Next, light in the wavelength region of 680 to 740 nm is irradiated to bring about linear absorption of the color-forming material and while amplifying and producing a color-forming material by the self-sensitization of the color-forming material, the polymerization initiator is activated by the electron or energy transfer, whereby polymerization is initiated. For example, when the refractive index of the polymerizable compound is larger than that of the binder, the polymerizable compound gathers to the portion where the polymerization takes place, as a result, the refractive index increases in that portion (second step). In the unrecorded area where the laser is not irradiated in the first step, a latent image is not produced and therefore, polymerization does not substantially occur in the second step to elevate the abundance ratio of the binder, as a result, modulation of refractive index between the recorded area and the unrecorded area can be formed. For example, when a laser of 780 nm is again used and irradiated on the two-photon absorbing optical recording material used for the recording, reproduction can be performed by using the difference in light reflectance based on the difference in refractive index between the recorded area and the unrecorded area. Therefore, a two-photon absorbing (three-dimensional) optical recording medium capable of recording and reproducing information by using light of 780 nm can be provided.

Also, for example, a laser of 780 nm is irradiated on the two-photon absorbing optical recording material and absorbed in the two-photon absorbing compound to produce an excited state and from the excited state of the two-photon absorbing compound, an energy or electron is transferred to the dye precursor group, whereby the dye precursor contained in the dye precursor group is changed into a color-forming material and a latent image is formed by the color formation (first step). Next, laser light of 780 nm is irradiated to bring about linear absorption of the color-forming material and the polymerization initiator is activated by transferring an electron or energy thereto, whereby polymerization is initiated. For example, when the refractive index of the polymerizable compound is larger than that of the binder, the polymerizable compound gathers to the portion where the polymerization takes place, as a result, the refractive index increases in that portion (second step). In the unrecorded area where the laser is not irradiated in the first step, a latent image is not produced and therefore, polymerization does not substantially occur in the second step to elevate the abundance ratio of the binder, as a result, modulation of refractive index between the recorded area and the unrecorded area can be formed. If decolorization can be achieved by decomposing the two-photon absorbing compound and color-forming material in the first or second step or further in the subsequent fixing step, a colorless transparent two-photon absorbing optical recording material excellent in nondestructive reproduction and storability can be provided.

For example, when a laser of 780 nm is again used and irradiated on the two-photon absorbing optical recording material used for the recording, reproduction can be performed by using the difference in light reflectance based on the difference in refractive index between the recorded area and the unrecorded area. Therefore, a two-photon absorbing (three-dimensional) optical recording medium can be provided.

In this case, a laser of 780 nm can be used in all of the recording in the first step, the photopolymerization amplification in the first step, and the reproduction.

Respective components of the two-photon absorbing polymeric material and two-photon absorbing optical recording material of the present invention are described in detail below.

The two-photon absorbing compound for use in the present invention is described below.

The two-photon absorbing compound for use in the present invention is a compound of undergoing non-resonant two-photon absorption (a phenomenon that two photons are simultaneously absorbed in the energy region having no (linear) absorption band of the compound to cause excitation).

At the application to the two-photon absorbing optical recording material, particularly, two-photon absorbing three-dimensional optical recording material, in order to achieve a high transfer (recording) rate, a two-photon absorbing compound capable of undergoing two-photon absorption with high sensitivity and efficiently producing an excited state is necessary.

The efficiency of two-photon absorption by the two-photon absorbing compound is expressed by a two-photon absorbing cross-sectional area $\delta$ and defined by 1 GM=$1\times10^{-50}$ cm$^4$s/photon. In the two-photon absorbing optical recording material of the present invention, the two-photon absorbing cross-sectional area $\delta$ of the two-photon absorbing compound is preferably 100 GM or more in view of, for example, increase in the writing speed or reduction in the size and cost of laser, more preferably 1,000 GM or more, still more preferably 5,000 GM or more, and most preferably 10,000 GM or more.

The two-photon absorbing compound in the two-photon absorbing optical recording material and the two-photon absorbing polymerizable composition (hereinafter, there is the case that said material and said composition are simply referred as "two-photon absorbing optical recording material") of the present invention is described below.

The two-photon absorbing compound for use in the present invention is a compound of undergoing non-resonant absorption (a phenomenon excited when two photons are simultaneously absorbed in the energy region having no (linear) absorption band of the compound).

Preferred examples of the two-photon absorbing compound for use in the present invention are described below.

The two-photon absorbing compound for use in the present invention is preferably an organic compound, more preferably an organic dye.

In the present invention, when a specific moiety is called "a group", unless otherwise indicated, this means that the group may or may not be substituted by one or more (up to the maximum possible number) substituent. For example, "an alkyl group" means a substituted or unsubstituted alkyl group. The substituent which can be used for the compound in the present invention may be any substituent.

Also, in the present invention, when a specific moiety is called "a ring" or when "a ring" is contained in "a group", unless otherwise indicated, the ring may be a monocyclic ring or a condensed ring or may or may not be substituted.

For example, "an aryl group" may be a phenyl group or a naphthyl group or may be a substituted phenyl group.

Incidentally, the dye as used herein is a generic term of compounds having a part of the absorption in the ultraviolet region (preferably from 200 to 400 nm), visible region (from 400 to 700 nm) or near infrared region (preferably from 700 to 2,000 nm), preferably a generic term of compounds having a part of the absorption in the visible region.

The two-photon absorbing compound for use in the present invention may be any compound, but examples thereof include cyanine dyes, hemicyanine dyes, streptocyanine dyes, styryl dyes, pyrilium dyes, merocyanine dyes, trinuclear merocyanine dyes, tetranuclear merocyanine dyes, rhodacyanine dyes, complex cyanine dyes, complex merocyanine dyes, allopolar dyes, arylidene dyes, oxonol dyes, hemioxonol dyes, squalium dyes, croconium dyes, azulenium dyes, coumarin dyes, ketocoumarin dyes, styrylcoumarin dyes, pyran dyes, anthraquinone dyes, quinone dyes, triphenylmethane dyes, diphenylmethane dyes, xanthene dyes, thioxanthene dyes, phenothiazine dyes, phenoxazine dyes, phenazine dyes, azo dyes, azomethine dyes, fluorenone dyes, diarylethene dyes, spiropyran dyes, flugido dyes, perylene dyes, phthaloperylene dyes, indigo dyes, polyene dyes, acridine dyes, acridinone dyes, diphenylamine dyes, quinacridone dyes, quinophthalone dyes, porphyrin dyes, azaporphyrin dyes, chlorophyll dyes, phthalocyanine dyes, condensed aromatic dyes, styrene-base dyes, metallocene dyes, metal complex dyes, phenylene vinylene dyes and stilbazolium dyes. Among these, preferred are cyanine dyes, hemicyanine dyes, streptocyanine dyes, styryl dyes, pyrilium dyes, merocyanine dyes, trinuclear merocyanine dyes, tetranuclear merocyanine dyes, rhodacyanine dyes, complex cyanine dyes, complex merocyanine dyes, allopolar dyes, arylidene dyes, oxonol dyes, hemioxonol dyes, squalium dyes, croconium dyes, azulenium dyes, coumarin dyes, ketocoumarin dyes, styrylcoumarin dyes, pyran dyes, anthraquinone dyes, quinone dyes, triphenylmethane dyes, diphenylmethane dyes, thioxanthene dyes, phenothiazine dyes, phenoxazine dyes, phenazine dyes, azo dyes, azomethine dyes, perylene dyes, phthaloperylene dyes, indigo dyes, polyene dyes, acridine dyes, acridinone dyes, diphenylamine dyes, quinacridone dyes, quinophthalone dyes, porphyrin dyes, azaporphyrin dyes, chlorophyll dyes, phthalocyanine dyes, condensed aromatic dyes, styrene-base dyes, metallocene dyes, metal complex dyes and stilbazolium dyes, more preferred are cyanine dyes, hemicyanine dyes, streptocyanine dyes, styryl dyes, pyrilium dyes, merocyanine dyes, trinuclear merocyanine dyes, tetranuclear merocyanine dyes, rhodacyanine dyes, complex cyanine dyes, complex merocyanine dyes, allopolar dyes, arylidene dyes, oxonol dyes, hemioxonol dyes, squalium dyes, croconium dyes, azulenium dyes, ketocoumarin dyes, styrylcoumarin dyes, pyran dyes, anthraquinone dyes, quinone dyes, triphenylmethane dyes, diphenylmethane dyes, thioxanthene dyes, phenothiazine dyes, phenoxazine dyes, phenazine dyes, azo dyes, azomethine dyes, indigo dyes, polyene dyes, acridine dyes, acridinone dyes, diphenylamine dyes, quinacridone dyes, quinophthalone dyes, azaporphyrin dyes, chlorophyll dyes, phthalocyanine dyes, condensed aromatic dyes, metallocene dyes and metal complex dyes, still more preferred are cyanine dyes, hemicyanine dyes, streptocyanine dyes, styryl dyes, pyrilium dyes, merocyanine dyes, arylidene dyes, oxonol dyes, squalium dyes, ketocoumarin dyes, styrylcoumarin dyes, pyran dyes, thioxanthene dyes, phenothiazine dyes, phenoxazine dyes, phenazine dyes, azo dyes, polyene dyes, azaporphyrin dyes, chlorophyll dyes, phthalocyanine dyes and metal complex dyes, yet still more preferred are cyanine dyes, merocyanine dyes, arylidene dyes, oxonol dyes, squalium dyes, azo dyes and phthalocyanine dyes, further more preferred are cyanine dyes, merocyanine dyes and oxonol dyes, and most preferred are cyanine dyes.

These dyes are described in detail, for example, in F. M. Harmer, *Heterocyclic Compounds-Cyanine Dyes and Related Compounds*, John Wiley & Sons, New York, London (1964), D. M. Sturmer, *Heterocyclic Compounds—Special topics in heterocyclic chemistry*, Chap. 18, Section 14, pp. 482-515, John Wiley & Sons, New York, London (1977), and *Rodd's Chemistry of Carbon Compounds*, 2nd ed., Vol. IV, Part B, Chap. 15, pp. 369-422, Elsevier Science Publishing Company Inc., New York (1977).

Specific examples of the cyanine, merocyanine and oxonol dyes include those described in F. M. Harmer, *Heterocyclic Compounds-Cyanine Dyes and Related Compounds*, John Wiley & Sons, New York, London (1964).

As for the formulae of the cyanine and merocyanine dyes, formulae (XI) and (XII) described at pages 21 and 22 of U.S. Pat. No. 5,340,694 are preferred (however, the numbers represented by n12 and n15 are not limited and each is an integer of 0 or more (preferably from 0 to 4)).

When the two-photon absorbing compound for use in the present invention is a cyanine dye, the cyanine dye is preferably represented by formula (3).

In formula (3), $Za_1$ and $Za_2$ each represents an atomic group for forming a 5- or 6-membered nitrogen-containing heterocyclic ring. Preferred examples of the 5- or 6-membered nitrogen-containing heterocyclic ring formed include oxazole nuclei having a carbon number (hereinafter referred to as "a C number") of 3 to 25 (e.g., 2-3-methyloxazolyl, 2-3-ethyloxazolyl, 2-3,4-diethyloxazolyl, 2-3-methylbenzoxazolyl, 2-3-ethylbenzoxazolyl, 2-3-sulfoethylbenzoxazolyl, 2-3-sulfopropylbenzoxazolyl, 2-3-methylthioethylbenzoxazolyl, 2-3-methoxyethylbenzoxazolyl, 2-3-sulfobutylbenzoxazolyl, 2-3-methyl-β-naphthoxazolyl, 2-3-methyl-α-naphthoxazolyl, 2-3-sulfopropyl-β-naphthoxazolyl, 2-3-sulfopropyl-β-naphthoxazolyl, 2-3-(3-naphthoxyethyl)-benzoxazolyl, 2-3,5-dimethylbenzoxazolyl, 2-6-chloro-3-methylbenzoxazolyl, 2-5-bromo-3-methylbenzoxazolyl, 2-3-ethyl-5-methoxybenzoxazolyl, 2-5-phenyl-3-sulfopropylbenzoxazolyl, 2-5-(4-bromophenyl)-3-sulfobutylbenzoxazolyl, 2-3-dimethyl-5,6-dimethylthiobenzoxazolyl), thiazole nuclei having a C number of 3 to 25 (e.g., 2-3-methylthiazolyl, 2-3-ethylthiazolyl, 2-3-sulfopropylthiazolyl, 2-3-sulfobutyl-thiazolyl, 2-3,4-dimethylthiazolyl, 2-3,4,4-trimethyl-thiazolyl, 2-3-carboxyethylthiazolyl, 2-3-methylbenzothiazolyl, 2-3-ethylbenzothiazolyl, 2-3-butylbenzothiazolyl, 2-3-sulfopropylbenzothiazolyl, 2-3-sulfobutylbenzothiazolyl, 2-3-methyl-β-naphthothiazolyl, 2-3-sulfopropyl-γ-naphthothiazolyl, 2-3-(1-naphthoxyethyl)benzothiazolyl, 2-3,5-dimethylbenzothiazolyl, 2-6-chloro-3-methylbenzothiazolyl, 2-6-iodo-3-ethylbenzothiazolyl, 2-5-bromo-3-methylbenzothiazolyl, 2-3-ethyl-5-methoxybenzothiazolyl, 2-5-phenyl-3-sulfopropylbenzothiazolyl, 2-5-(4-bromophenyl)-3-sulfobutylbenzothiazolyl, 2-3-dimethyl-5,6-dimethylthio-benzothiazolyl), imidazole nuclei having a C number of 3 to 25 (e.g., 2-1,3-diethylimidazolyl, 2-1,3-dimethylimidazolyl, 2-1-methylbenzimidazolyl, 2-1,3,4-triethylimidazolyl, 2-1,3-diethylbenzimidazolyl, 2-1,3,5-trimethylbenzimidazolyl, 2-6-chloro-1,3-dimethylbenzimidazolyl, 2-5,6-dichloro-1,3-diethylbenzimidazolyl, 2-1,3-disulfopropyl-5-cyano-6-chlorobenzimidazolyl), indolenine nuclei having a C number of 10 to 30 (e.g., 1,3,3-trimethylindolenine), quinoline nuclei having a C number of 9 to 25 (e.g., 2-1-methylquinolyl, 2-1-ethylquinolyl, 2-1-methyl-6-chloroquinolyl, 2-1,3-diethylquinolyl, 2-1-methyl-6-methylthioquinolyl, 2-1-sulfopropylquinolyl, 4-1-methylquinolyl, 4-1-sulfoethylquinolyl, 4-1-methyl-7-chloroquinolyl, 4-1,8-diethylquinolyl, 4-1-methyl-6-methylthioquinolyl, 4-1-sulfopropylquinolyl), selenazole nuclei having a C number of 3 to 25 (e.g., 2-3-methylbenzoselenazolyl), pyridine nuclei having a C number of 5 to 25 (e.g., 2-pyridyl), thiazoline nuclei, oxazoline nuclei, selenazoline nuclei, tetrazoline nuclei, tetrazole nuclei, benzotellurazole nuclei, imidazoline nuclei, imidazo[4,5-quinoxaline] nuclei, oxadiazole nuclei, thiadiazole nuclei, tetrazole nuclei and pyrimidine nuclei.

These heterocyclic rings each may be substituted and preferred examples of the substituent include an alkyl group (preferably having a C number of 1 to 20, e.g., methyl, ethyl, n-propyl, isopropyl, n-butyl, n-pentyl, benzyl, 3-sulfopropyl, 4-sulfobutyl, carboxymethyl, 5-carboxypentyl), an alkenyl group (preferably having a C number of 2 to 20, e.g., vinyl, allyl, 2-butenyl, 1,3-butadienyl), a cycloalkyl group (preferably having a C number of 3 to 20, e.g., cyclopentyl, cyclohexyl), an aryl group (preferably having a C number of 6 to 20, e.g., phenyl, 2-chlorophenyl, 4-methoxyphenyl, 3-methylphenyl, 1-naphthyl), a heterocyclic group (preferably having a C number of 1 to 20, e.g., pyridyl, thienyl, furyl, thiazolyl, imidazolyl, pyrazolyl, pyrrolidino, piperidino, morpholino), an alkynyl group (preferably having a C number of 2 to 20, e.g., ethynyl, 2-propynyl, 1,3-butadynyl, 2-phenylethynyl), a halogen atom (e.g., F, Cl, Br, I), an amino group (preferably having a C number of 0 to 20, e.g., amino, dimethylamino, diethylamino, dibutylamino, anilino), a cyano group, a nitro group, a hydroxyl group, a mercapto group, a carboxyl group, a sulfo group, a phosphonic acid group, an acyl group (preferably having a C number of 1 to 20, e.g., acetyl, benzoyl, salicyloyl, pivaloyl), an alkoxy group (preferably having a C number of 1 to 20, e.g., methoxy, butoxy, cyclohexyloxy), an aryloxy group (preferably having a C number of 6 to 26, e.g., phenoxy, 1-naphthoxy), an alkylthio group (preferably having a C number of 1 to 20, e.g., methylthio, ethylthio), an arylthio group (preferably having a C number of 6 to 20, e.g., phenylthio, 4-chlorophenylthio), an alkylsulfonyl group (preferably having a C number of 1 to 20, e.g., methanesulfonyl, butanesulfonyl), an arylsulfonyl group (preferably having a C number of 6 to 20, e.g., benzenesulfonyl, paratoluenesulfonyl), a sulfamoyl group (preferably having a C number of 0 to 20, e.g., sulfamoyl, N-methylsulfamoyl, N-phenylsulfamoyl), a carbamoyl group (preferably having a C number of 1 to 20, e.g., carbamoyl, N-methylcarbamoyl, N,N-dimethylcarbamoyl, N-phenylcarbamoyl), an acylamino group (preferably having a C number of 1 to 20, e.g., acetylamino, benzoylamino), an imino group (preferably having a C number of 2 to 20, e.g., phthalimino), an acyloxy group (preferably having a C number of 1 to 20, e.g., acetyloxy, benzoyloxy), an alkoxycarbonyl group (preferably having a C number of 2 to 20, e.g., methoxycarbonyl, phenoxycarbonyl) and a carbamoylamino group (preferably having a C number of 1 to 20, e.g., carbamoylamino, N-methylcarbamoylamino, N-phenyl-carbamoylamino). Among these, more preferred are an alkyl group, an aryl group, a heterocyclic group, a halogen atom, a cyano group, a carboxyl group, a sulfo group, an alkoxy group, a sulfamoyl group, a carbamoyl group and an alkoxycarbonyl group.

These heterocyclic rings each may be further condensed with another ring. Preferred examples of the ring with which the heterocyclic ring is condensed include a benzene ring, a benzofuran ring, a pyridine ring, a pyrrole ring, an indole ring and a thiophene ring.

The 5- or 6-membered nitrogen-containing heterocyclic ring formed by $Za_1$ and $Za_2$ is more preferably an oxazole nucleus, an imidazole nucleus, a thiazole nucleus or an indolenine ring, still more preferably an oxazole nucleus, an imidazole nucleus or an indolenine ring, and most preferably an oxazole nucleus.

$Ra_1$ and $Ra_2$ each independently represents a hydrogen atom, an alkyl group (preferably having a C number of 1 to 20, e.g., methyl, ethyl, n-propyl, isopropyl, n-butyl, n-pentyl, benzyl, 3-sulfopropyl, 4-sulfobutyl, 3-methyl-3-sulfopropyl, 2'-sulfobenzyl, carboxymethyl, 5-carboxy-pentyl), an alkenyl group (preferably having a C number of 2 to 20, e.g., vinyl, allyl), an aryl group (preferably having a C number of 6 to 20, e.g., phenyl, 2-chlorophenyl, 4-methoxyphenyl, 3-methylphenyl, 1-naphthyl) or a hetero-cyclic group (preferably having a C number of 1 to 20, e.g., pyridyl, thienyl, furyl, thiazolyl, imidazolyl, pyrazolyl, pyrrolidino, piperidino, morpholino), preferably an alkyl group (preferably an alkyl group having a C number of 1 to 6) or a sulfoalkyl group (preferably 3-sulfopropyl, 4-sulfobutyl, 3-methyl-3-sulfopropyl or 2'-sulfobenzyl).

$Ma_1$ to $Ma_7$ each independently represents a methine group and the methine group may have a substituent (preferred examples of the substituent are the same as examples of the substituent on $Za_1$ and $Za_2$). The substituent is preferably an alkyl group, a halogen atom, a nitro group, an alkoxy group, an aryl group, a nitro group, a heterocyclic group, an aryloxy group, an acylamino group, a carbamoyl group, a sulfo group, a hydroxy group, a carboxy group, an alkylthio group or a cyano group, more preferably an alkyl group.

$Ma_1$ to $Ma_7$ each is preferably an unsubstituted methine group or an alkyl group (preferably having a C number of 1 to 6)-substituted methine group, more preferably an unsubstituted methine group, an ethyl group-substituted methine group or a methyl group-substituted methine group.

$Ma_1$ to $Ma_7$ may combine with each other to form a ring and preferred examples of the ring formed include a cyclohexene ring, a cyclopentene ring, a benzene ring and a thiophene ring.

$na^1$ and $na^2$ each is 0 or 1, preferably both are 0.

$ka^1$ represents an integer of 0 to 3, preferably 0 to 2, more preferably 1 or 2.

When $ka^1$ is 2 or more, multiple $Ma_3$s or $Ma_4$s may be the same or different.

Cl represents an ion for neutralizing the electric charge and y represents a number necessary for the neutralization of electric charge.

When the two-photon absorbing compound for use in the present invention is a merocyanine dye, the merocyanine dye is preferably represented by formula (4).

In formula (4), $Za_3$ represents an atomic group for forming a 5- or 6-membered nitrogen-containing heterocyclic ring (preferred examples are the same as those for $Za_1$ and $Za_2$) and the heterocyclic group may be substituted (preferred examples of the substituent are the same as examples of the substituent on $Za_1$ and $Za_2$) or may be further condensed with another ring.

The 5- or 6-membered nitrogen-containing heterocyclic ring formed by $Za_3$ is more preferably an oxazole nucleus, an imidazole nucleus, a thiazole nucleus or an indolenine nucleus, still more preferably an oxazole nucleus, a thiazole nucleus or an indolenine nucleus.

$Za_4$ represents an atomic group for forming a 5- or 6-membered ring. The ring formed by $Za_4$ is a moiety generally called an acidic nucleus and this nucleus is defined in James (compiler), *The Theory of the Photographic Process*, 4th ed., page 198, Macmillan (1977). The ring formed by $Za_4$ is preferably a nucleus such as 2-pyrazolon-5-one, pyrazolidine-3,5-dione, imidazolin-5-one, hydantoin, 2- or 4-thiohydantoin, 2-iminooxazolidin-4-one, 2-oxazolin-5-one, 2-thiooxazoline-2,4-dione, isorhodanine, rhodanine, indane-1,3-dione, thiophen-3-one, thiophen-3-one-1,1-dioxide, indolin-2-one, indolin-3-one, 2-oxoindazolium, 5,7-dioxo-6,7-dihydrothiazolo[3,2-a]pyrimidine, 3,4-dihydroisoquinolin-4-one, 1,3-dioxane-4,6-dione, barbituric acid, 2-thiobarbituric acid, coumarin-2,4-dione, indazolin-2-one, pyrido[1,2-a]pyrimidine-1,3-dione, pyrazolo[1,5-b]quinazolone or pyrazolopyridone.

The ring formed by $Za_4$ is more preferably 2-pyrazolon-5-one, pyrazolidine-3,5-dione, rhodanine, indane-1,3-dione, thiophen-3-one, thiophen-3-one-1,1-dioxide, 1,3-dioxane-4,6-dione, barbituric acid, 2-thiobarbituric acid or coumarin-2,4-dione, still more preferably pyrazolidine-3,5-dione, indane-1,3-dione, 1,3-dioxane-4,6-dione, barbituric acid or 2-thiobarbituric acid, yet still more preferably pyrazolidine-3,5-dione, barbituric acid or 2-thiobarbituric acid, and most preferably 2-thiobarbituric acid.

The ring formed by $Za_4$ may be substituted (preferred examples of the substituent are the same as examples of the substituent on $Za_3$) and the substituent is more preferably an alkyl group, an aryl group, a heterocyclic group, a halogen atom, a cyano group, a carboxyl group, a sulfo group, an alkoxy group, a sulfamoyl group, a carbamoyl group or an alkoxycarbonyl group.

These heterocyclic rings each may be further condensed with another ring. Preferred examples of the ring with which the heterocyclic ring is condensed include a benzene ring, a benzofuran ring, a pyridine ring, a pyrrole ring, an indole ring and a thiophene ring.

$Ra_3$ is a hydrogen atom, an alkyl group, an alkenyl group, an aryl group or a heterocyclic group (preferred examples of these groups are the same as those for $Ra_1$ and $Ra_2$), preferably an alkyl group (preferably an alkyl group having a C number of 1 to 6) or a sulfoalkyl group (preferably 3-sulfopropyl, 4-sulfobutyl, 3-methyl-3-sulfopropyl or 2'-sulfobenzyl).

$Ma_8$ to $Ma_{11}$ each represents a methine group and the methine group may have a substituent (preferred examples of the substituent are the same as examples of the substituent on $Za_1$ and $Za_2$). The substituent is preferably an alkyl group, a halogen atom, a nitro group, an alkoxy group, an aryl group, a nitro group, a heterocyclic group, an aryloxy group, an acylamino group, a carbamoyl group, a sulfo group, a hydroxy group, a carboxy group, an alkylthio group or a cyano group, more preferably an alkyl group.

$Ma_8$ to $Ma_{11}$ each is preferably an unsubstituted methine group or an alkyl group (preferably having a C number of 1 to 6)-substituted methine group, more preferably an unsubstituted methine group, an ethyl group-substituted methine group or a methyl group-substituted methine group.

$Ma_8$ to $Ma_{11}$ may combine with each other to form a ring and preferred examples of the ring formed include a cyclohexene ring, a cyclopentene ring, a benzene ring and a thiophene ring.

$na^3$ is 0 or 1, preferably 0.

$ka^2$ represents an integer of 0 to 8, preferably 0 to 4, more preferably 2 to 4.

When $ka^2$ is 2 or more, multiple $Ma_{10}$s or $Ma_{11}$s may be the same or different.

CI represents an ion for neutralizing the electric charge and y represents a number necessary for the neutralization of electric charge.

When the two-photon absorbing compound for use in the present invention is an oxonol dye, the oxonol dye is preferably represented by formula (5).

In formula (5), $Za_5$ and $Za_6$ each represents an atomic group for forming a 5- or 6-membered ring (preferred examples are the same as those for $Za_4$) and the heterocyclic ring may be substituted (preferred examples of the substituent are the same as examples of the substituent on $Za_4$) or may be further condensed with another ring.

The ring formed by $Za_5$ and $Za_6$ is preferably 2-pyrazolon-5-one, pyrazolidine-3,5-dione, rhodanine, indane-1,3-dione, thiophen-3-one, thiophen-3-one-1,1-dioxide, 1,3-dioxane-4,6-dione, barbituric acid, 2-thiobarbituric acid or coumarin-2,4-dione, more preferably barbituric acid or 2-thiobarbituric acid, and most preferably barbituric acid.

$Ma_{12}$ to $Ma_{14}$ each represents a methine group and the methine group may have a substituent (preferred examples of the substituent are the same as examples of the substituent on $Za_5$ and $Za_6$). The substituent is preferably an alkyl group, a halogen atom, a nitro group, an alkoxy group, an aryl group, a nitro group, a heterocyclic group, an aryloxy group, an acylamino group, a carbamoyl group, a sulfo group, a hydroxy group, a carboxy group, an alkylthio group or a cyano group, more preferably an alkyl group, a halogen atom, an alkoxy group, an aryl group, a heterocyclic group, a carbamoyl group or a carboxy group, still more preferably an alkyl group, an aryl group or a heterocyclic group.

$Ma_{12}$ to $Ma_{14}$ each is preferably an unsubstituted methine group.

$Ma_{12}$ to $Ma_{14}$ may combine with each other to form a ring and preferred examples of the ring formed include a cyclohexene ring, a cyclopentene ring, a benzene ring and a thiophene ring.

$ka^3$ represents an integer of 0 to 3, preferably 0 to 2, more preferably 1 or 2.

When $ka^3$ is 2 or more, multiple $Ma_{12}$s or $Ma_{13}$s may be the same or different.

CI represents an ion for neutralizing the electric charge and y represents a number necessary for the neutralization of electric charge.

The compound for use in the present invention is also preferably represented by formula (1).

In formula (1), $R^1$, $R^2$, $R^3$ and $R^4$ each independently represents a hydrogen atom or a substituent and the substituent is preferably an alkyl group (preferably having a C number of 1 to 20, e.g., methyl, ethyl, n-propyl, isopropyl, n-butyl, n-pentyl, benzyl, 3-sulfopropyl, 4-sulfobutyl, 3-methyl-3-sulfopropyl, 2'-sulfobenzyl, carboxymethyl, 5-carboxypentyl), an alkenyl group (preferably having a C number of 2 to 20, e.g., vinyl, allyl), a cycloalkyl group (preferably having a C number of 3 to 20, e.g., cyclopentyl, cyclohexyl), an aryl group (preferably having a C number of 6 to 20, e.g., phenyl, 2-chlorophenyl, 4-methoxyphenyl, 3-methylphenyl, 1-naphthyl) or a heterocyclic group (preferably having a C number of 1 to 20, e.g., pyridyl, thienyl, furyl, thiazolyl, imidazolyl, pyrazolyl, pyrrolidino, piperidino, morpholino).

$R^1$, $R^2$, $R^3$ and $R^4$ each is preferably a hydrogen atom or an alkyl group. Some (preferably two) of $R^1$, $R^2$, $R^3$ and $R^4$ may combine with each other to form a ring. In particular, $R^1$ and $R^3$ preferably combine to form a ring and at this time, the ring formed together with the carbon atom of carbonyl is preferably a 6-, 5- or 4-membered ring, more preferably a 5- or 4-membered ring, and most preferably a 5-membered ring.

In formula (1), n and m each independently represents an integer of 0 to 4, preferably 1 to 4, but n and m are not 0 at the same time.

When n and m each is 2 or more, multiple $R^1$s, $R^2$s, $R^3$s or $R^4$s may be the same or different.

$X^1$ and $X^2$ each independently represents an aryl group [preferably having a C number of 6 to 20 and preferably a substituted aryl group (for example, a substituted phenyl group or a substituted naphthyl group and preferred examples of the substituent are the same as the substituents for $Ma_1$ to $Ma_7$), more preferably an aryl group substituted by an alkyl group, an aryl group, a heterocyclic group, a halogen atom, an amino group, a hydroxyl group, an alkoxy group, an aryloxy group or an acylamino group, still more preferably an aryl group substituted by an alkyl group, an amino group, a hydroxyl group, an alkoxy group or an acylamino group, and most preferably a phenyl group substituted by a dialkylamino group or a diarylamino group at the 4-position; at this time, a plurality of substituents may combine to form a ring and preferred examples of the ring formed include a julolidine ring), a heterocyclic group (preferably having a C number of 1 to 20 and preferably a 3-, 4-, 5-, 6-, 7- or 8-membered ring, more preferably a 5- or 6-membered ring, for example, pyridyl, thienyl, furyl, thiazolyl, imidazolyl, pyrazolyl, pyrrolyl, indolyl, carbazolyl, phenathiazino, pyrrolidino, piperidino or morpholino with indolyl, carbazolyl, pyrrolyl and phenathiazino being preferred; the heterocyclic ring may be substituted and preferred examples of the substituent are the same as those described above for the aryl group) or a group represented by formula (2).

In formula (2), $R^5$ represents a hydrogen atom or a substituent (preferred examples are the same as those for $R^1$ to $R^4$), preferably a hydrogen atom or an alkyl group, more preferably a hydrogen atom.

$R^6$ represents a hydrogen atom, an alkyl group, an alkenyl group, an aryl group or a heterocyclic group (preferred examples of the substituent for these groups are the same as those for $R^1$ to $R^4$) preferably an alkyl group (preferably an alkyl group having a C number of 1 to 6).

$Z^1$ represents an atomic group for forming a 5- or 6-membered ring.

The heterocyclic ring formed is preferably an indolenine ring, an azaindolenine ring, a pyrazoline ring, a benzothiazole ring, a thiazole ring, a thiazoline ring, a benzoxazole ring, an oxazole ring, an oxazoline ring, a benzimidazole ring, an imidazole ring, a thiadiazole ring, a quinoline ring or a pyridine ring, more preferably an indolenine ring, an azaindolenine ring, a pyrazoline ring, a benzothiazole ring, a thiazole ring, a thiazoline ring, a benzoxazole ring, an oxazole ring, an oxazoline ring, a benzimidazole ring, a thiadiazole ring or a quinoline ring, and most preferably an indolenine ring, an azaindolenine ring, a benzothiazole ring, a benzoxazole ring or a benzimidazole ring.

The heterocyclic ring formed by $Z^1$ may have a substituent (preferred examples of the substituent are the same as examples of the substituent on $Za_1$ and $Za_2$) and the substituent is more preferably an alkyl group, an aryl group, a heterocyclic group, a halogen atom, a carboxyl group, a sulfo group, an alkoxy group, a carbamoyl group or an alkoxycarbonyl group.

$X^1$ and $X^2$ each is preferably an aryl group or a group represented by formula (2), more preferably an aryl group substituted by a dialkylamino group or a diarylamino group at the 4-position, or a group represented by formula (2).

The two-photon absorbing compound for use in the present invention preferably contains a hydrogen bonding group within the molecule. The hydrogen bonding group as used herein means a group of donating or accepting hydrogen in the hydrogen bonding, and a group having both properties of donating and accepting hydrogen is preferred.

The compound having a hydrogen bonding group for use in the present invention preferably exhibits an aggregating interaction in the solution or solid state by causing interaction between hydrogen bonding groups with each other. The interaction may be intramolecular interaction or inter-molecular interaction but is preferably intermolecular interaction.

The hydrogen bonding group for use in the present invention is preferably —COOH, —CONHR$^{11}$, —SO$_3$H, —SO$_2$NHR$^{12}$, —P(O)(OH)OR$^{13}$, —OH, —SH, —NHR$^{14}$, —NHCOR$^{15}$ or —NR$^{16}$C(O)NHR$^{17}$, wherein R$^{11}$ and R$^{12}$ each independently represents a hydrogen atom, an alkyl group (preferably having a carbon number (hereinafter referred to as "a C number") of 1 to 20, e.g., methyl, ethyl, n-propyl, isopropyl, n-butyl, n-pentyl, benzyl, 3-sulfopropyl, 4-sulfobutyl, carboxymethyl, 5-carboxypentyl), an alkenyl group (preferably having a C number of 2 to 20, e.g., vinyl, allyl), an aryl group (preferably having a C number of 6 to 20, e.g., phenyl, 2-chlorophenyl, 4-methoxyphenyl, 3-methylphenyl, 1-naphthyl), a heterocyclic group (preferably having a C number of 1 to 20, e.g., pyridyl, thienyl, furyl, thiazolyl, imidazolyl, pyrazolyl, pyrrolidino, piperidino, morpholino), —COR$^{18}$ or —SO$_2$R$^{19}$, and R$^{13}$ to R$^{19}$ each independently represents a hydrogen atom, an alkyl group, an alkenyl group, an aryl group or a heterocyclic group (preferred examples of these groups are the same as those for R$^{11}$ and R$^{12}$).

R$^{11}$ is preferably a hydrogen atom, an alkyl group, an aryl group, —COR$^{18}$ group or —SO$_2$R$^{19}$ group and at this time, R$^{18}$ and R$^{19}$ each is preferably an alkyl group or an aryl group.

R$^{11}$ is more preferably a hydrogen atom, an alkyl group or —SO$_2$R$^{19}$ group, and most preferably a hydrogen atom.

R$^{12}$ is preferably a hydrogen atom, an alkyl group, an aryl group, —COR$^{18}$ group or —SO$_2$R$^{19}$ group and at this time, R$^{18}$ and R$^{19}$ each is preferably an alkyl group or an aryl group.

R$^{12}$ is more preferably a hydrogen atom, an alkyl group or —COR$^{18}$ group, and most preferably a hydrogen atom.

R$^{13}$ is preferably a hydrogen atom, an alkyl group or an aryl group, more preferably a hydrogen atom.

R$^{14}$ is preferably a hydrogen atom, an alkyl group or an aryl group.

R$^{15}$ is preferably an alkyl group or an aryl group.

R$^{16}$ is preferably a hydrogen atom, and R$^{17}$ is preferably a hydrogen atom, an alkyl group or an aryl group.

The hydrogen bonding group is more preferably —COOH, —CONHR$^{11}$, —SO$_2$NHR$^{12}$, —NHCOR$^{15}$ or —NR$^{16}$C(O)NHR$^{17}$, still more preferably —COOH, —CONHR$^{11}$ or —SO$_2$NHR$^{12}$, and most preferably —COOH or —CONH$_2$.

The two-photon absorbing compound for use in the present invention may be used in the monomer state or in the aggregated state.

Incidentally, the state where dye chromophores are fixed with each other to give a specific spatial disposition by a bonding force such as covalent bonding, coordinate bonding or various intermolecular forces (e.g., hydrogen bonding, van der Waals force, Coulomb force) is generally called an associated (or aggregated) state.

The two-photon absorbing compound for use in the present invention may be used in the intermolecular aggregated state or in a state where two or more chromophores of undergoing two-photon absorption are present within the molecule and these undergo two-photon absorption in the intramolecular aggregated state.

For reference, the aggregate is described below. The aggregate is described in detail, for example, in James (compiler), *The Theory of the Photographic Process,* 4th ed., Chap. 8, pp. 218-222, Macmillan (1977), and Takayoshi Kobayashi, *J-Aggregates,* World Scientific Publishing Co. Pte. Ltd. (1996).

The monomer means a one-molecule form. From the standpoint of absorption wavelength of the aggregate, an aggregate where the absorption shifts to the shorter wavelength side with respect to the monomer absorption is called an H-aggregate (a two-molecule form is specially called a dimer), and an aggregate where the absorption shifts to the longer wavelength side is called a J-aggregate.

From the standpoint of structure of the aggregate, in the case of a brickwork aggregate, an aggregate having a small shear angle is called a J-aggregate and an aggregate having a large shear angle is called an H-aggregate. The brickwork aggregate is described in detail in *Chemical Physics Letters,* Vol. 6, page 183 (1970). As an aggregate having a structure similar to the brickwork aggregate, an aggregate having a ladder or staircase structure is known. The aggregate having a ladder or staircase structure is described in detail in *Zeitschrift fur Physikalische Chemie,* Vol. 49, page 324 (1941).

Also, as an aggregate of forming a structure other than the brickwork structure, an aggregate taking a herringbone structure is known (this aggregate can be called a herringbone aggregate).

The herringbone aggregate is described in Charles Reich, *Photographic Science and Engineering,* Vol. 18, No. 3, page 335 (1974). The herringbone aggregate has two absorption maximums attributable to the aggregate.

As described above, whether the dye is taking an aggregated state can be confirmed by the change in the absorption (absorption $\lambda_{max}$, $\epsilon$, absorption form) from the monomer state.

The compound for use in the present invention may be shifted to shorter wavelength side (H-aggregate), longer wavelength side (J-aggregate) or both sides, but preferably forms a J-aggregate.

The intermolecular aggregated state of a compound can be formed by various methods.

For example, in the case of a solution system, a method of dissolving the compound in an aqueous solution having added thereto a matrix such as gelatin (for example, an aqueous 0.5 wt % gelatin.$10^{-4}$ M compound solution) or in an aqueous solution having added thereto a salt such as KCl (for example, an aqueous 5% KCl.$2\times10^{-3}$ M compound solution), or a method of dissolving the compound in a good solvent and then adding thereto a bad solvent (for example, DMF-water system or chloroform-toluene system) may be used.

In the case of a film system, methods such as polymer dispersion system, amorphous system, crystal system and LB film system may be used.

Furthermore, the intermolecular aggregated state may also be formed by the adsorption, chemical bonding or self-organization to a bulk or fine particulate (from μm to nm size) semiconductor (for example, silver halide or titanium oxide) or to a bulk or fine particulate metal (for example, gold, silver or platinum). The spectral sensitization by the J-aggregation adsorption of cyanine dye on a silver halide crystal, which is performed in the field of silver salt color photography, utilizes this technique.

As for the number of compounds participating in the intermolecular aggregation, two compounds may be used or a very large number of compounds may be used.

Specific preferred examples of the two-photon absorbing compound for use in the present invention are set forth below, however, the present invention is not limited thereto.

| | $R_{51}$ | Cl |
|---|---|---|
| D-1 | $-(CH_2)_3-SO_3^-$ | $Na^-$ |
| D-2 | $-C_2H_5$ | $I^-$ |
| D-3 | $-(CH_2)_3-\overset{+}{N}(CH_3)_3$ | $(Br^-)_3$ |

| | $R_{51}$ | $R_{52}$ | Cl |
|---|---|---|---|
| D-4 | $-(CH_2)_4-SO_3^-$ | $-H$ | |
| D-5 | $-C_2H_5$ | " | |
| D-6 | $-(CH_2)_3-SO_3^-$ | $-C_2H_5$ | $K^-$ |
| D-7 | $-(CH_2)_3-\overset{+}{N}(CH_3)_3$ | $-CH_3$ | $(Br^-)_3$ |

D-8

D-9

-continued
D-10 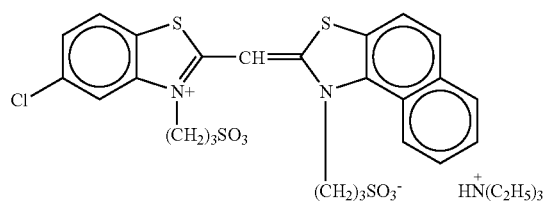
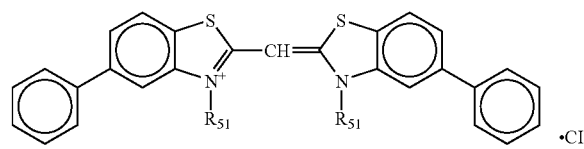
| | $R_{51}$ | Cl |
|---|---|---|
| D-11 | —(CH$_2$)$_3$—SO$_3^-$ | $H\overset{+}{N}(C_2H_5)_3$ |
| D-12 | —C$_2$H$_5$ | 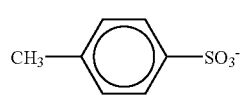 |
| D-13 | 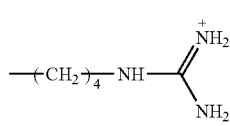 | (Br$^-$)$_3$ |
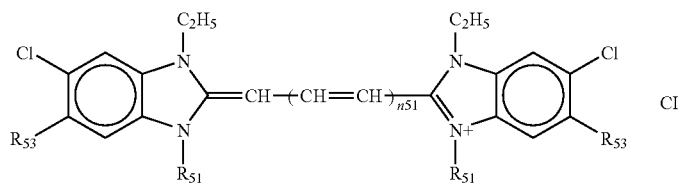
| | $R_{51}$ | $R_{53}$ | $n_{51}$ | Cl |
|---|---|---|---|---|
| D-14 | —(CH$_2$)$_3$—SO$_3^-$ | —Cl | 1 | Na$^+$ |
| D-15 | —C$_2$H$_5$ | " | 1 | I$^-$ |
| D-16 | —(CH$_2$)$_4$—SO$_3^-$ | —CF$_3$ | " | K$^+$ |
| D-17 | " | —CN | " | $H\overset{+}{N}(C_2H_5)_3$ |
| D-18 | " | —Cl | " | 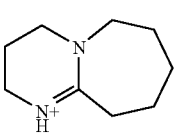 |
| D-19 | —(CH$_2$)$_3$—SO$_3^-$ | —CN | " | " |
| D-20 | —C$_2$H$_5$ | " | " |  |

-continued

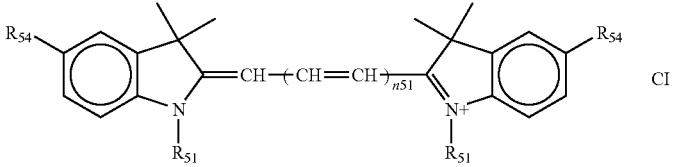

| | $R_{51}$ | $R_{54}$ | $n_{51}$ | Cl |
|---|---|---|---|---|
| D-21 | —(CH$_2$)$_3$—SO$_3^-$ | —H | 1 |  |
| D-22 | —C$_4$H$_9$ | —COOH | " |  |
| D-23 | —CH$_3$ | —H | 2 | I$^-$ |
| D-24 | —(CH$_2$)$_3$—SO$_3^-$ | —COOH | " | Na$^+$ |
| D-25 | —(CH$_2$)$_4$—SO$_3^-$ | —H | 3 | K$^+$ |
| D-26 | —(CH$_2$)$_3$—SO$_3^-$ | —COOH | " | " |
| D-27 | —CH$_3$ | —CONH$_2$ | " |  |

D-28

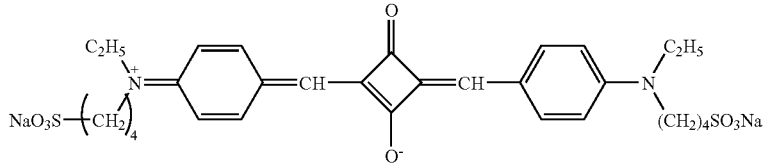

D-29

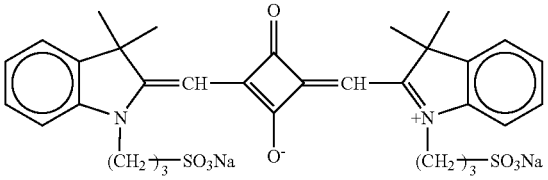

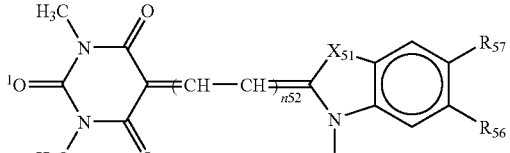

| | $R_{55}$ | $R_{56}$ | $R_{57}$ | $X_{51}$ | $n_{52}$ |
|---|---|---|---|---|---|
| D-30 | —(CH$_2$)$_3$—SO$_3^-$ $^+$HN(C$_2$H$_5$)$_3$ | —Cl | —H | —O— | 1 |
| D-31 | —C$_2$H$_5$ | —H | —COCH | " | 2 |
| D-32 | —(CH$_2$)$_3$—$^+$N(CH$_3$)$_3$ Br$^-$ | 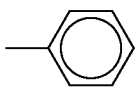 | —H | " | " |
| D-33 | —(CH$_2$)$_4$—SO$_3^-$ $^+$HN(C$_2$H$_5$)$_3$ | —CH$_3$ | —CH$_3$ | —S— | " |
| D-34 | —(CH$_2$)$_3$—SO$_3^-$ $^+$HN(C$_2$H$_5$)$_3$ | —H | —H | —C(CH$_3$)$_2$ | " |
| D-35 | —CH$_3$ | " | " | " | " |
| D-36 | —(CH$_2$)$_3$—SO$_3^-$ | " | —COOH | " | " |
| D-37 | —CH$_3$ | " | —CONH$_2$ | " | " |
| D-38 | —(CH$_2$)$_3$—SO$_3^-$ $^+$HN(C$_2$H$_5$)$_3$ | " | —H | " | 3 |

-continued
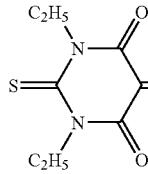
| | $R_{55}$ | $R_{56}$ | $R_{57}$ | $X_{51}$ | $n_{52}$ |
|---|---|---|---|---|---|
| D-39 | —(CH$_2$)$_3$—SO$_3^-$ $^+$HN(C$_2$H$_5$)$_3$ | —Cl | —H | —S— | 1 |
| D-40 | —C$_2$H$_5$ | —H | —CONH$_2$ | —O— | 2 |
| D-41 | —(CH$_2$)$_4$—SO$_3^-$ $^+$HN(C$_2$H$_5$)$_3$ | —CH$_3$ | —CH$_3$ | —S— | " |
| D-42 | —(CH$_2$)$_3$—SO$_3^-$ $^+$HN(C$_2$H$_5$)$_3$ | —H | —H | —C(CH$_3$)$_2$ | " |
| D-43 | —(CH$_2$)$_3$—SO$_3$Na | " | —COOH | " | " |
| D-44 | —CH$_3$ | " | —CONH$_2$ | " | " |
| D-45 | " | " | " | " | 3 |
$Q_{51}$=CH—(CH)$_{n51}$=$Q_{52}$
| | $Q_{51}$ | $Q_{52}$ | $n_{51}$ |
|---|---|---|---|
| D-46 | 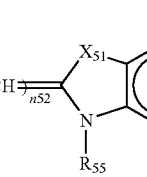 | 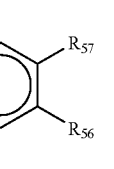 | 2 |
| D-47 |  |  | 1 |
| D-48 | 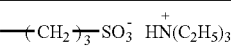 | 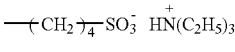 | 1 |
| D-49 | 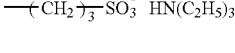 | 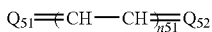 | 2 |
| D-50 | 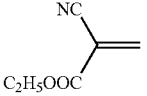 | 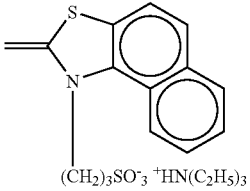 | 2 |

-continued
| | | | |
|---|---|---|---|
| D-51 | 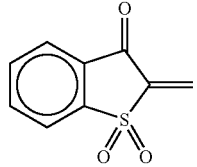 | " | 2 |
| D-52 | 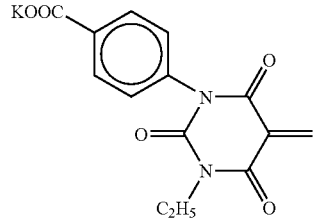 | 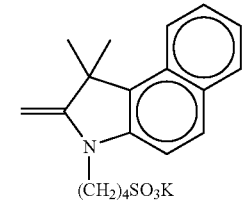 | 3 |
| D-53 | 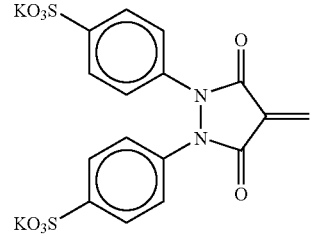 | 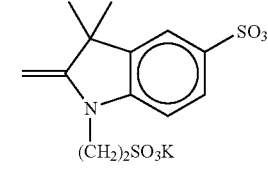 | 3 |
| D-54 | 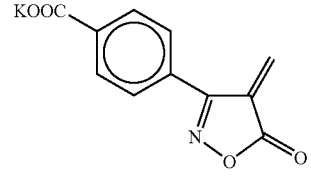 | 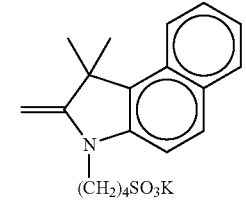 | 3 |
| D-55 | 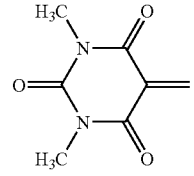 | 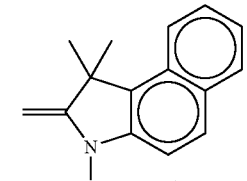 | 2 |
$$Q_{53}=CH-(CH=CH)_{\overline{n_{53}}}Q_{54} \quad Cl$$
| | $Q_{53}$ | $Q_{54}$ | $n_{53}$ | Cl |
|---|---|---|---|---|
| D-56 | 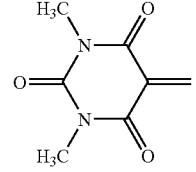 | 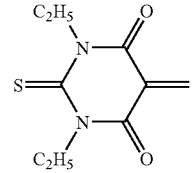 | 2 | H⁻ |
| D-57 | 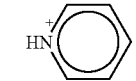 | 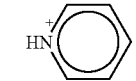 | 1 | 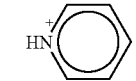 |
| D-58 | " | " | 2 | $HN(C_2H_5)_3^+$ |

-continued
| | | | |
|---|---|---|---|
| D-59 | 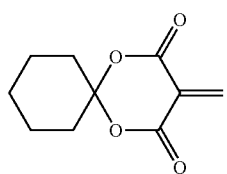 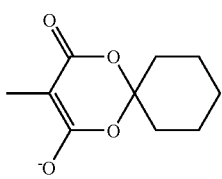 | 2 | H⁻ |
| D-60 | 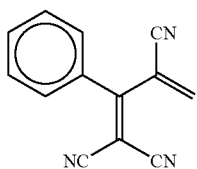 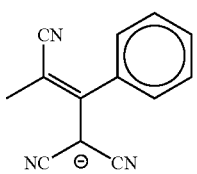 | 1 | $\overset{+}{H}N(C_2H_5)_3$ |
| D-61 | 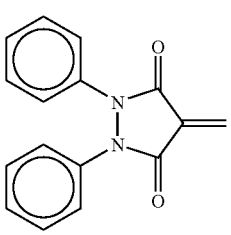 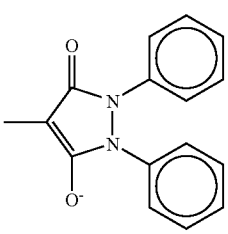 | 2 | H⁻ |
| D-62 | 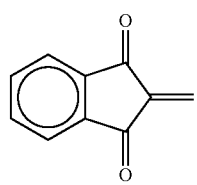 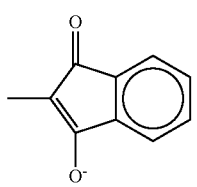 | 2 | $\overset{+}{H}N(C_2H_5)_3$ |
| D-63 | 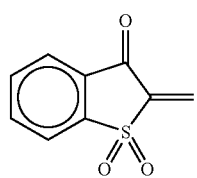 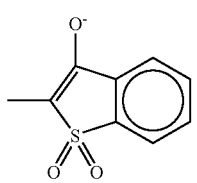 | 2 | " |
| D-64 | 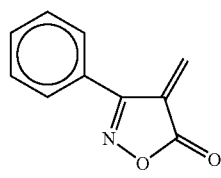 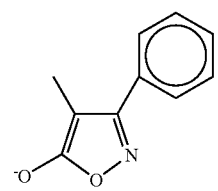 | 2 | H⁻ |
| D-65 | 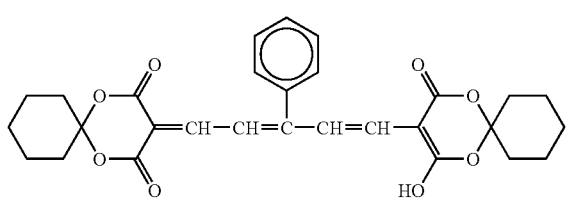 | | |
| D-66 | 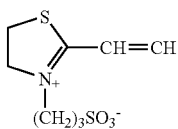—CH=CH—CH=CH—CH=CH—CH=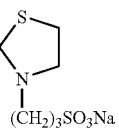 | | |

-continued
D-67 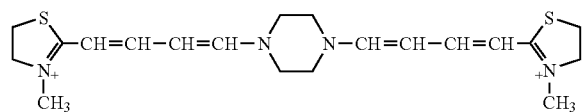
D-68 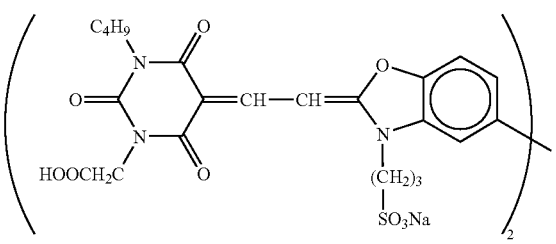
D-69 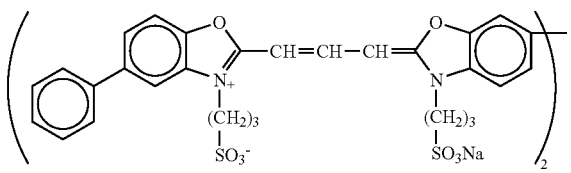
D-70 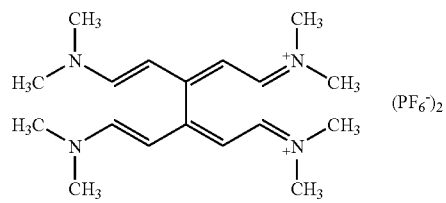
D-71 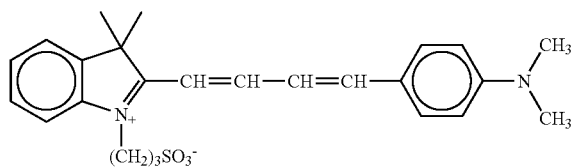
D-72 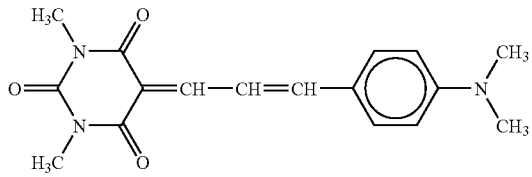
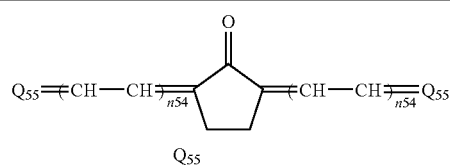
| | $Q_{55}$ | $n_{54}$ |
|---|---|---|
| D-73 | 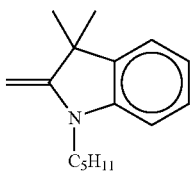 | 2 |

-continued
| | | |
|---|---|---|
| D-74 | 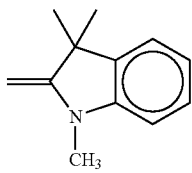 | 1 |
| D-75 | 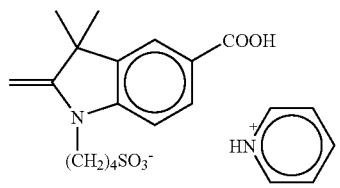 | 1 |
| D-76 | 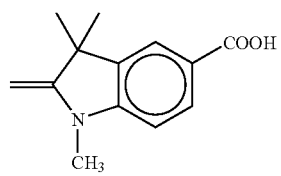 | 2 |
| D-77 | 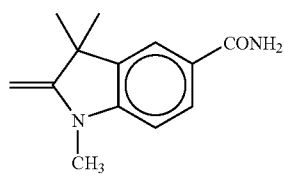 | 2 |
| D-78 | 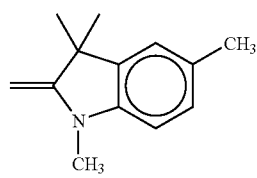 | 2 |
| D-79 | 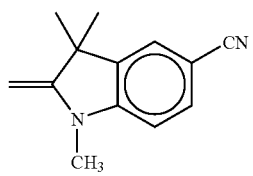 | 2 |
| D-80 | 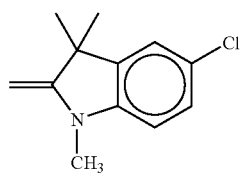 | 2 |
| D-81 | 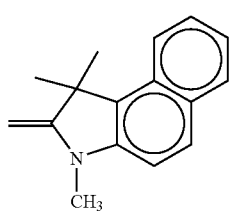 | 2 |

-continued
| | | |
|---|---|---|
| D-82 | 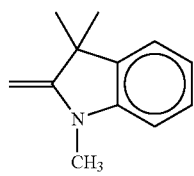 | 2 |
| D-83 | 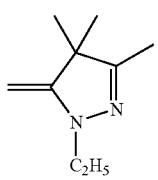 | 2 |
| D-84 | 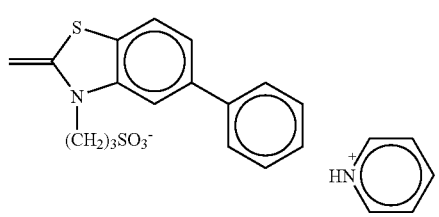 | 1 |
| D-85 | 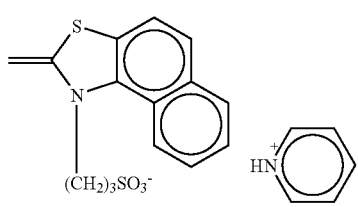 | 1 |
| D-86 | 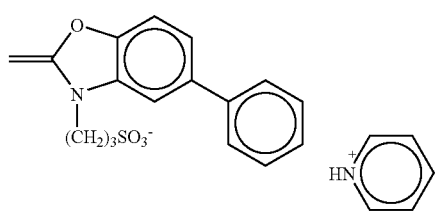 | 1 |
| D-87 | 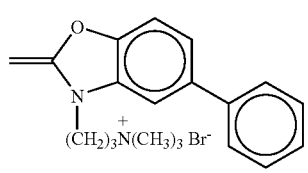 | 1 |
| D-88 | 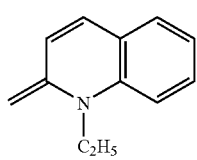 | 1 |
| D-89 | 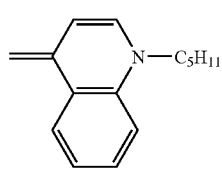 | 1 |

-continued
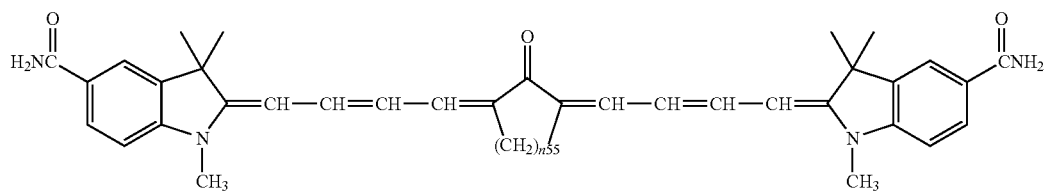
| | $n_{55}$ |
|---|---|
| D-90 | 0 |
| D-91 | 1 |
| D-92 | 3 |
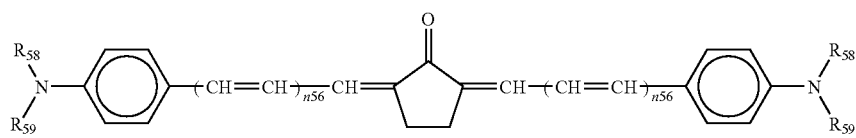
| | $R_{58}$ | $R_{59}$ | $n_{56}$ |
|---|---|---|---|
| D-93 | —C$_2$H$_5$ | —C$_5$H$_5$ | 0 |
| D-94 | —CH$_3$ | —CH$_3$ | 1 |
| D-95 | " | —(CH$_2$)$_3$—SO$_3$Na | 4 |
| D-96 | " | —CH$_3$ | 2 |
| D-97 | " | —COOH | " |
| D-98 | " | —CH$_3$ | 3 |
| D-93 |  | | 2 |
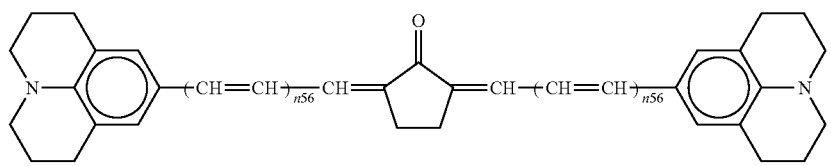
| | $n_{56}$ |
|---|---|
| D-100 | 1 |
| D-101 | 2 |
| D-102 | 3 |
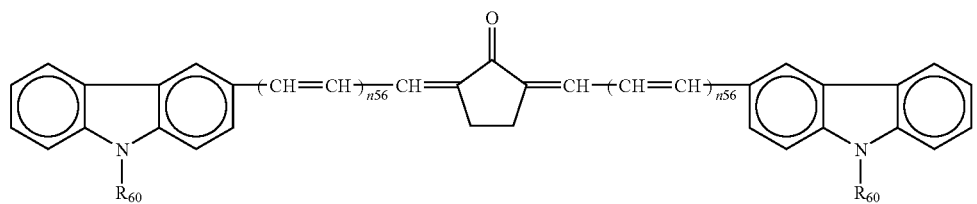
| | $R_{60}$ | $R_{56}$ |
|---|---|---|
| D-103 | —C$_2$H$_5$ | 0 |
| D-104 | " | 1 |
| D-105 | " | 2 |
| D-106 | —CH$_2$COOH | " |
| D-107 | —(CH$_2$)$_3$—SO$_3$Na | " |

-continued
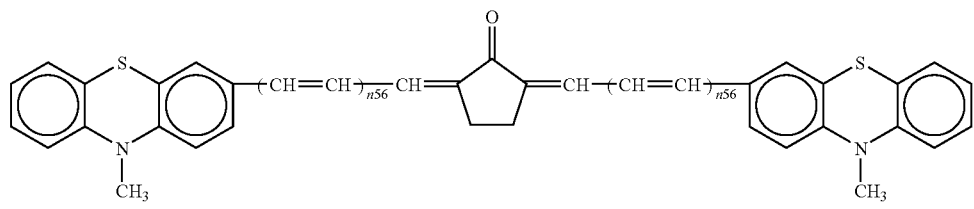
| | $n_{56}$ |
|---|---|
| D-108 | 1 |
| D-109 | 2 |
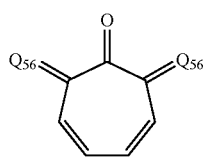
$Q_{56}$
| | $Q_{56}$ |
|---|---|
| D-110 | 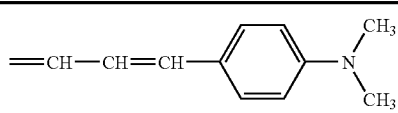 |
| D-111 | 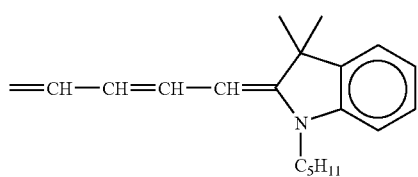 |
| D-112 | 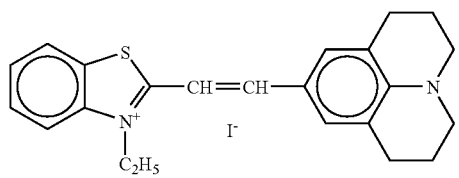 |
| D-113 | 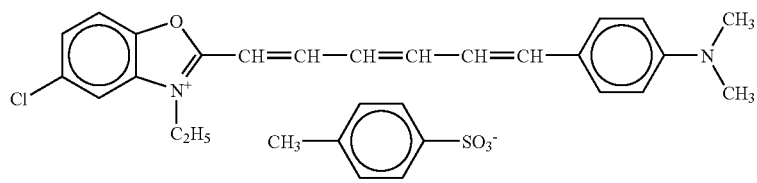 |
| D-114 | 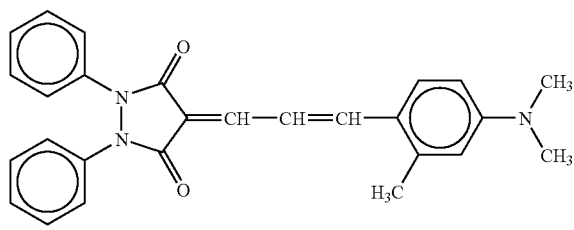 |
| D-115 | 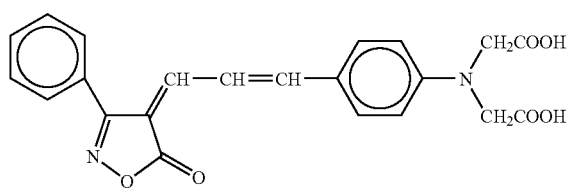 |

-continued
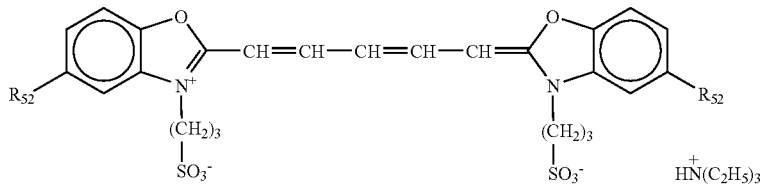
| | $R_{52}$ |
|---|---|
| D-116 | —F |
| D-117 | —Cl |
| D-118 | —Br |
| D-119 | —I |
| D-120 | H |
| D-121 | 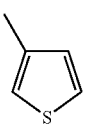 |
| D-122 | 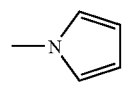 |
D-123 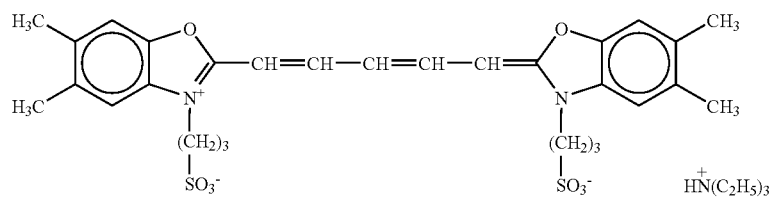
D-124 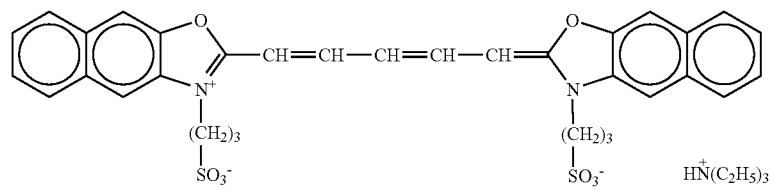
D-125 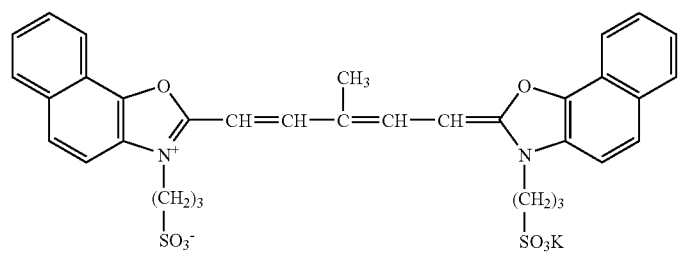
D-126 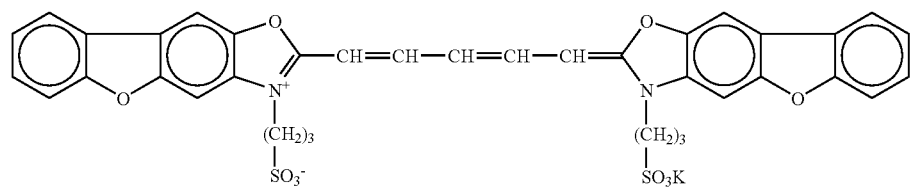
D-127 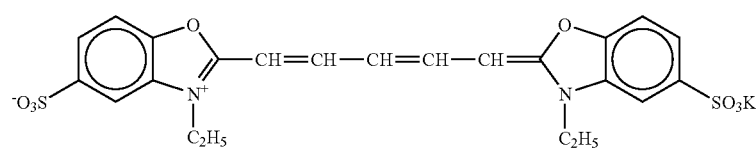

-continued
D-128 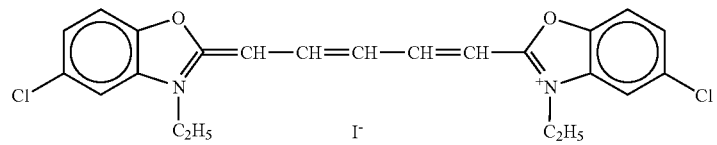
D-129 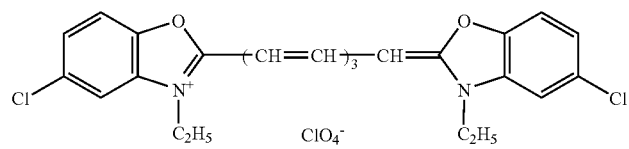
D-130 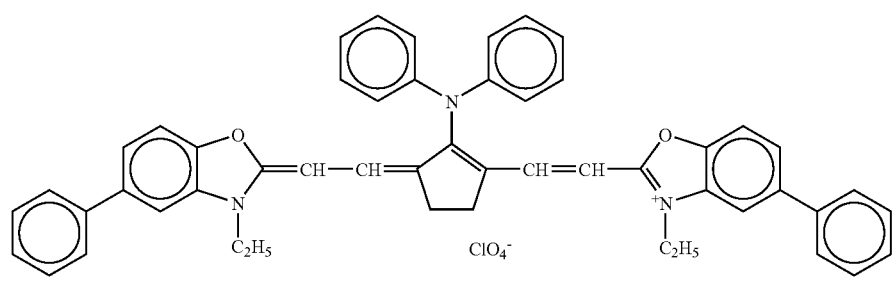
D-131 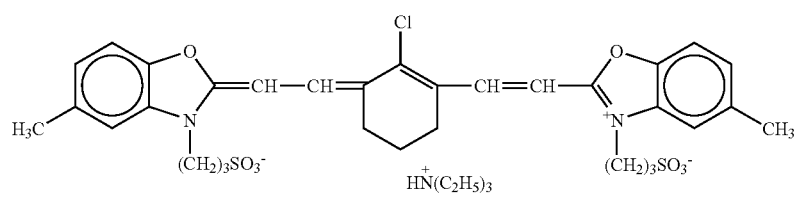
D-132 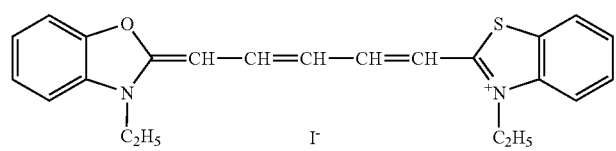
D-133 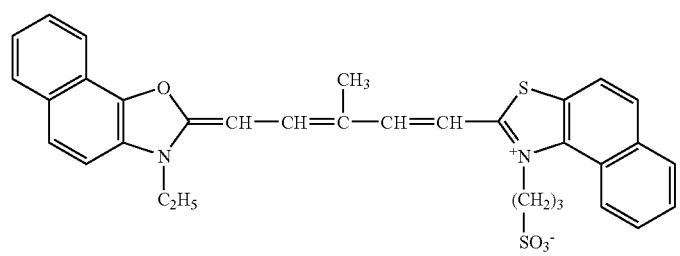
D-134 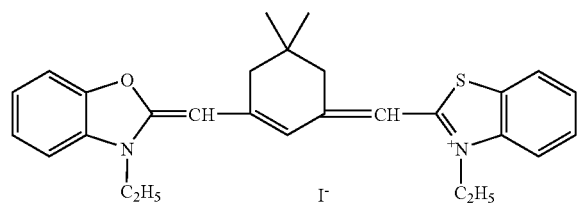

-continued
D-135 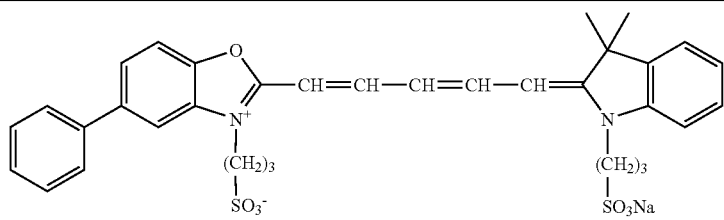
D-136 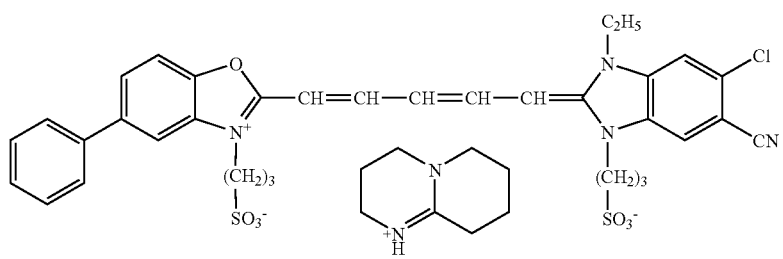
D-137 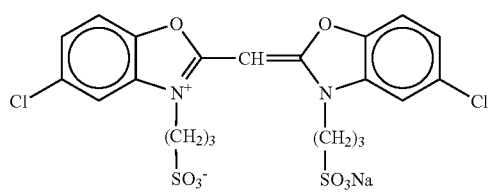
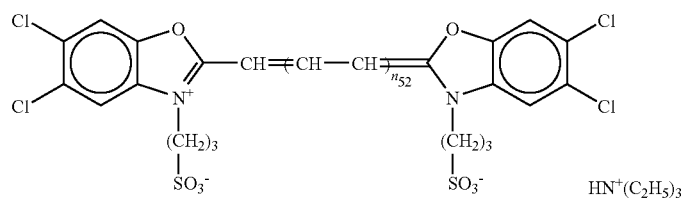
| | n52 |
|---|---|
| D-138 | 1 |
| D-139 | 2 |
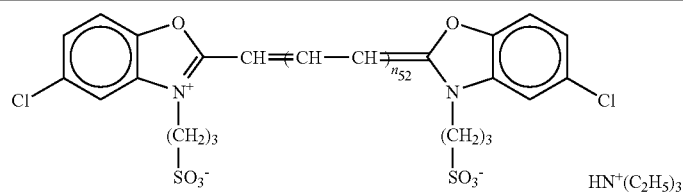
| | n52 |
|---|---|
| D-140 | 1 |
| D-141 | 2 |
| | n52 |
|---|---|
| D-142 | 1 |

-continued
| D-143 | 2 |
|---|---|
D-144
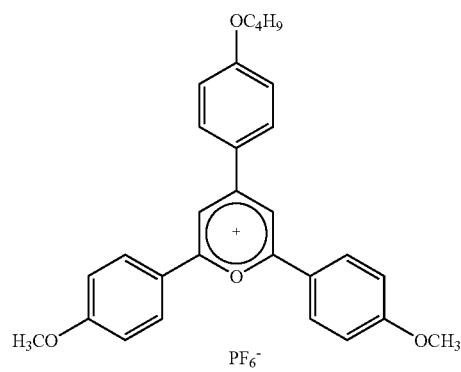
D-145
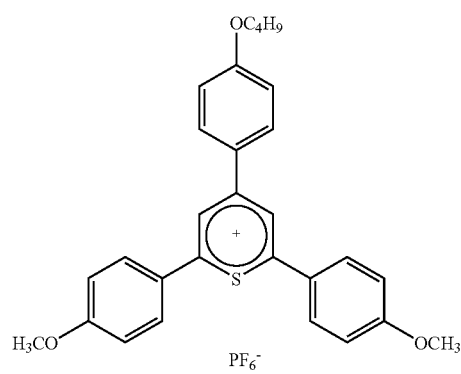
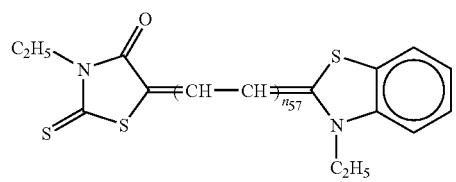
n57
| D-146 | 0 |
|---|---|
| D-147 | 1 |
| D-148 | 2 |
D-149
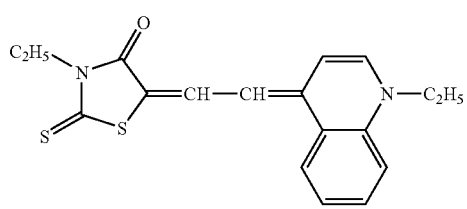
D-150
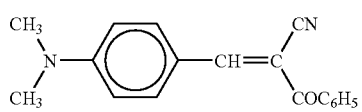
D-151
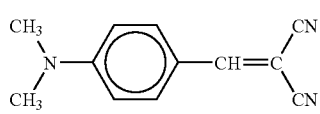

-continued
D-152 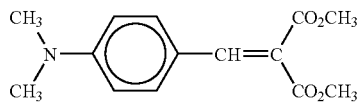
D-153 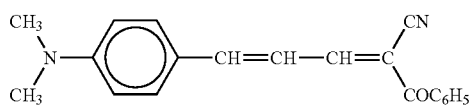
D-154 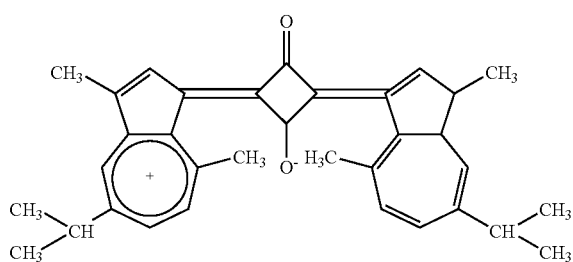
D-155 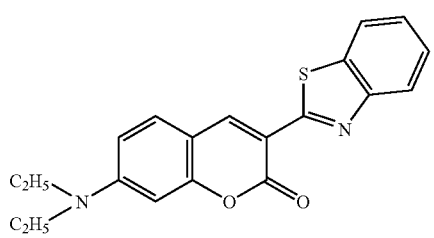
D-156 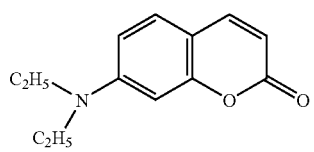
D-157 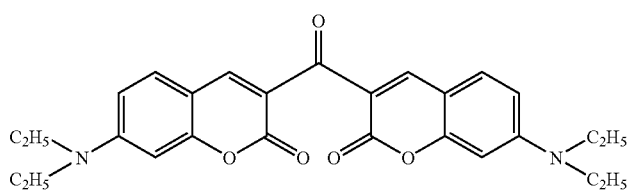
D-158 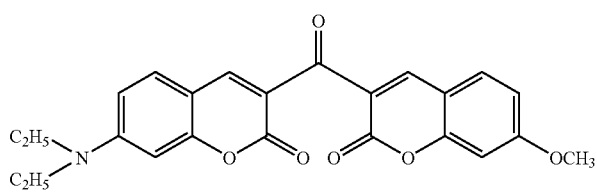
D-159 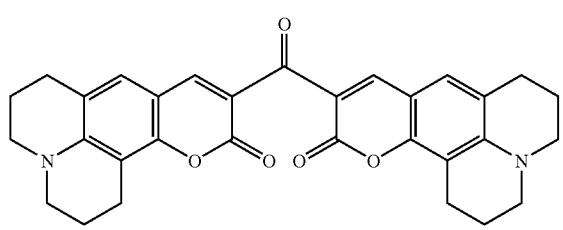

-continued
D-160
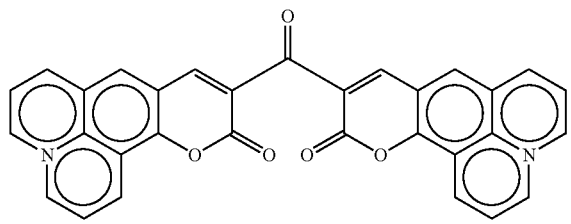
D-161
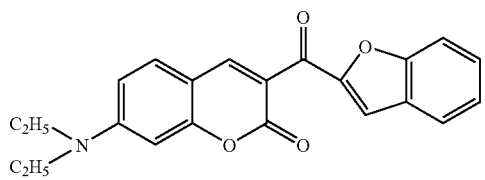
D-162
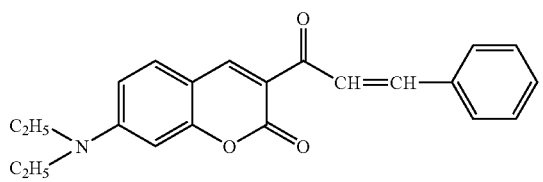
D-163
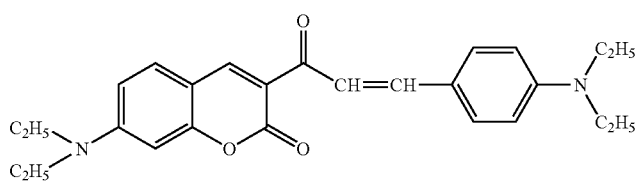
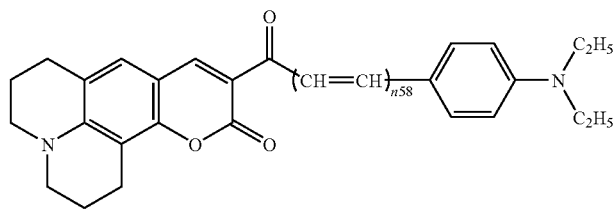
| | n58 |
|---|---|
| D-164 | 2 |
| D-165 | 3 |
| D-166 | 4 |
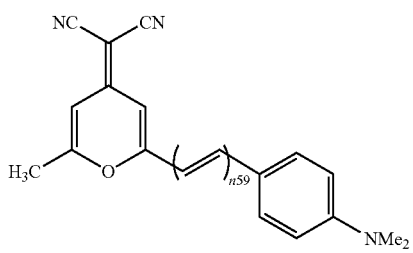
| | n59 |
|---|---|
| D-167 | 1 |
| D-168 | 2 |
| D-169 | 3 |
| D-170 | 4 |

-continued
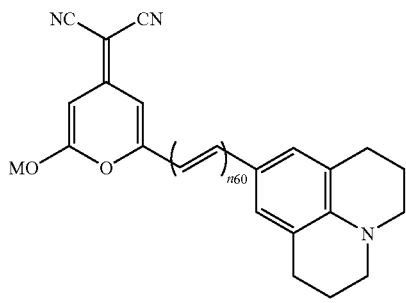
n60
| | n60 |
|---|---|
| D-171 | 1 |
| D-172 | 2 |
| D-173 | 3 |
D-174
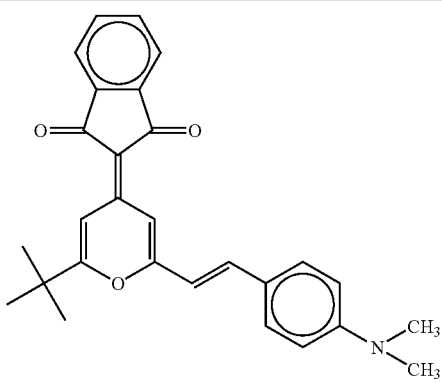
D-175
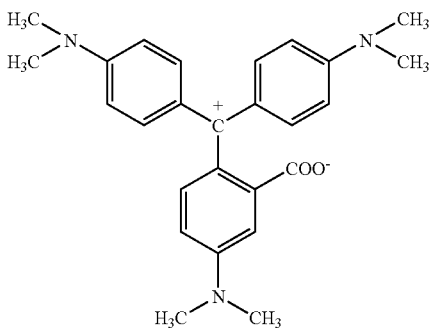
D-176
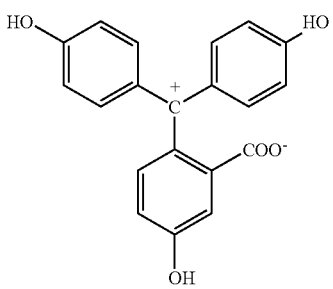
D-177
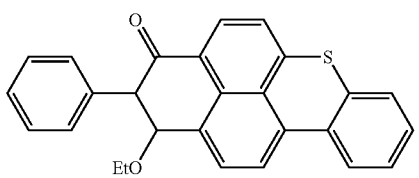

-continued
D-178
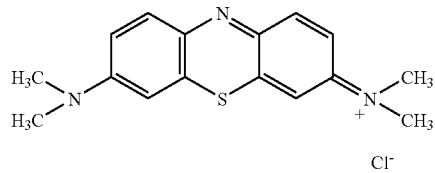
D-179
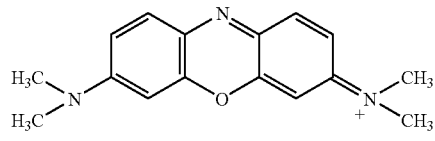
D-180
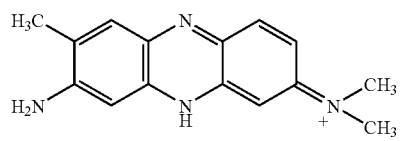
D-181
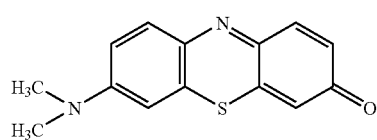
D-182
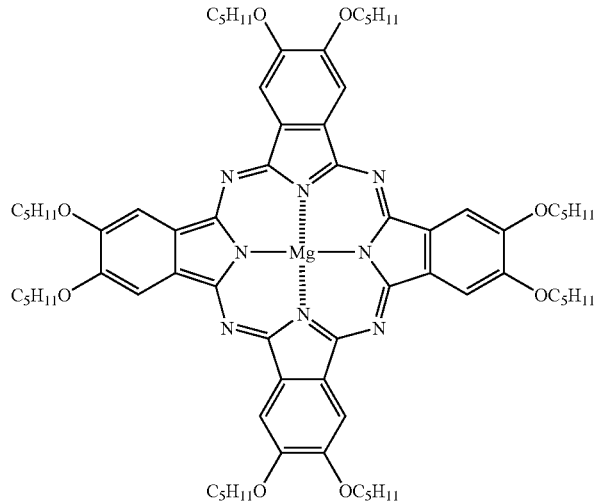

D-183
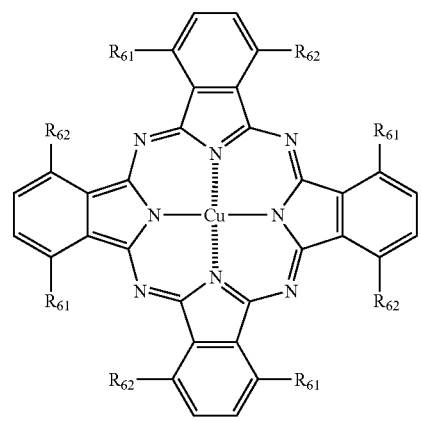
R61/R62　どちらかH
　　　　　どちらか —So2C4H8⁻(mixture)
D-184
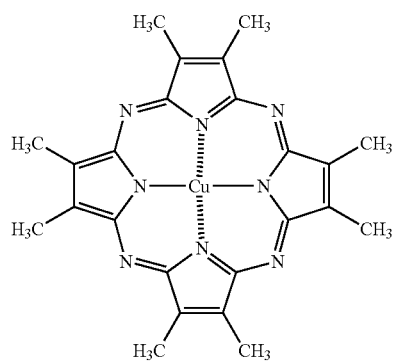
D-185
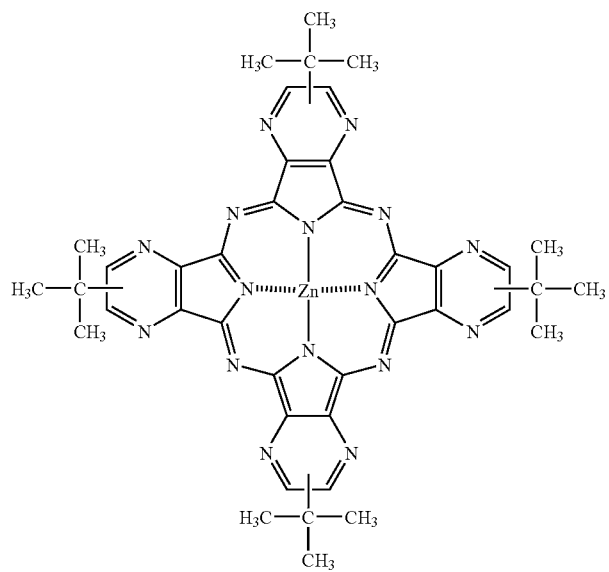

D-186
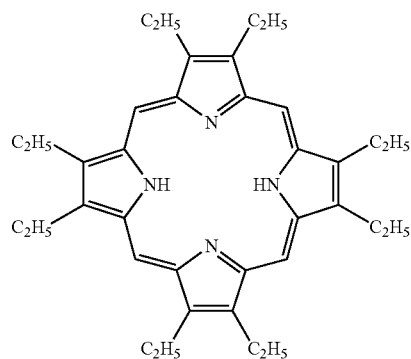
D-187
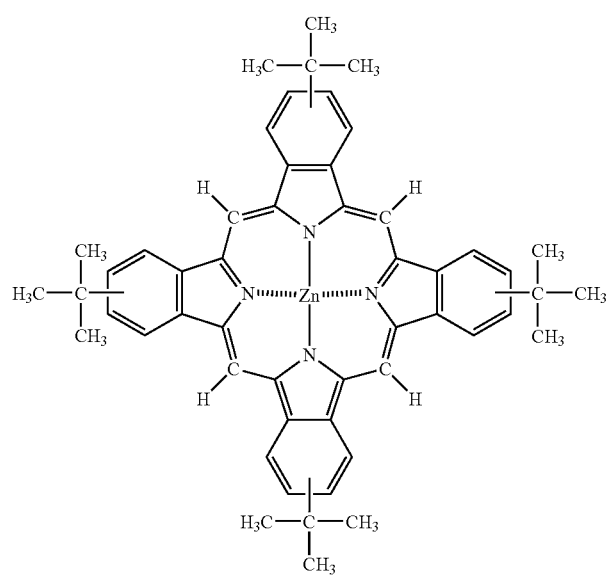
D-188
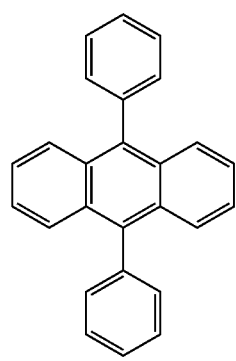

-continued
D-189
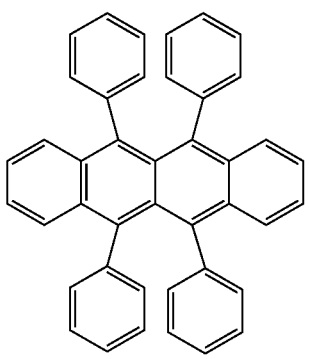
D-190
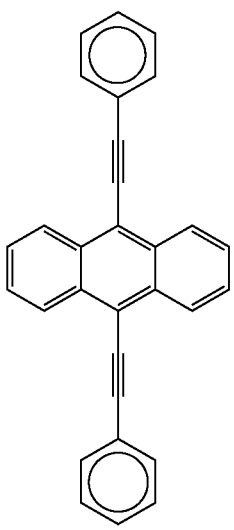
D-191
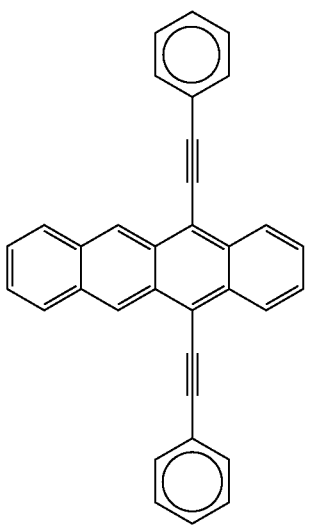
D-192
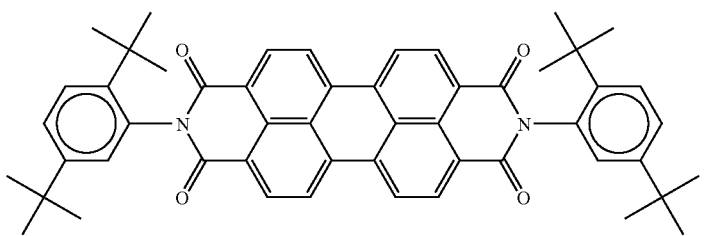

-continued
D-193
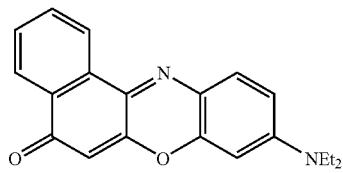
D-194
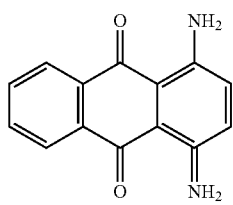
D-195
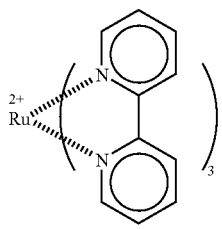
(Cl⁻)₂
D-196
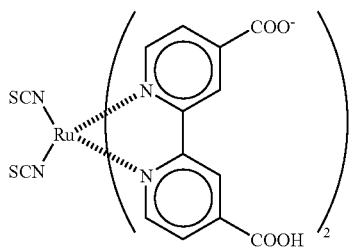
D-197
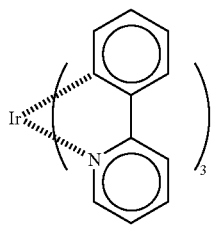
D-198
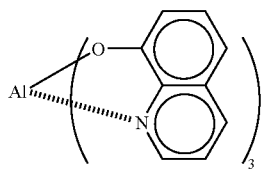

D-199 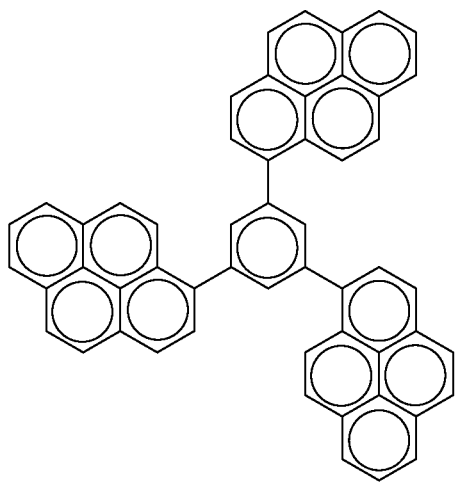
D-200 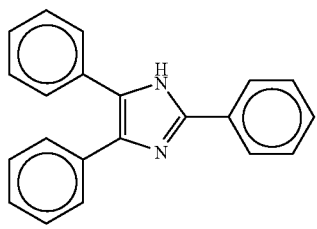
D-201 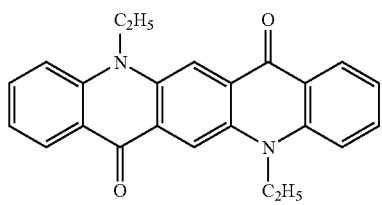
D-202 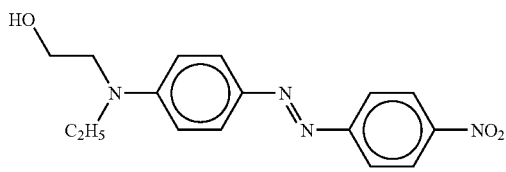
D-203 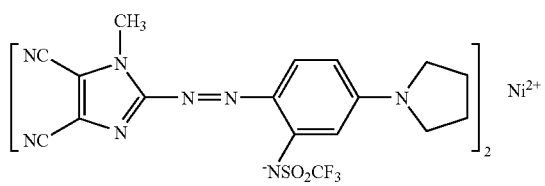
D-204 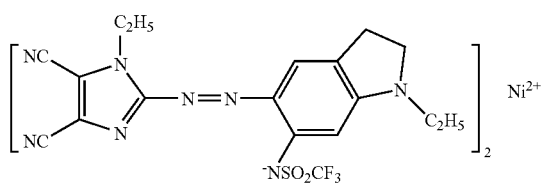

-continued
D-205 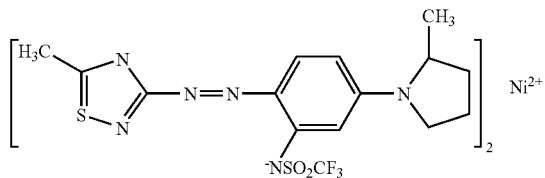
D-206 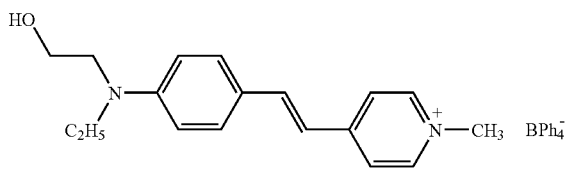
D-207 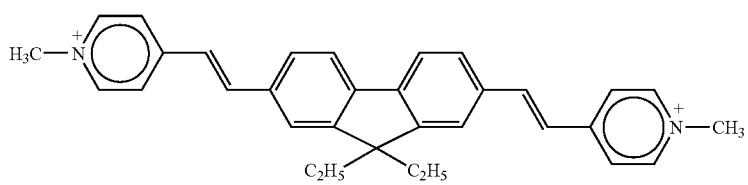
D-208 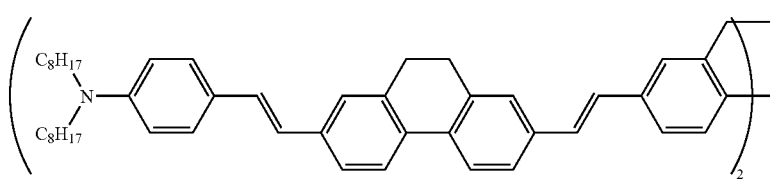
D-209 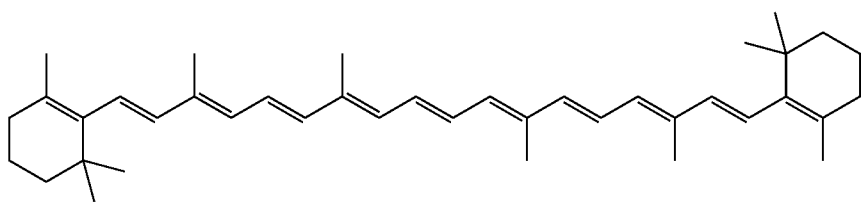
D-210 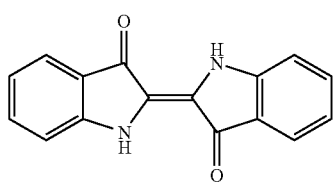
D-211 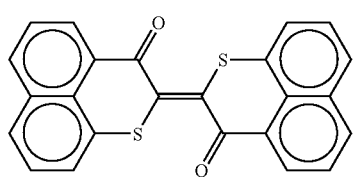
D-212 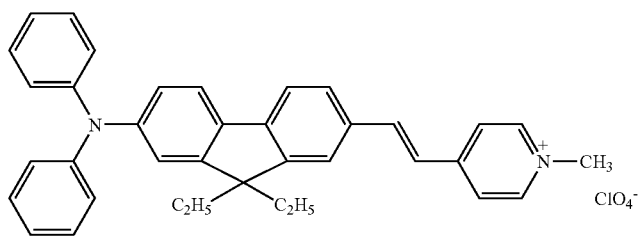

-continued
D-213
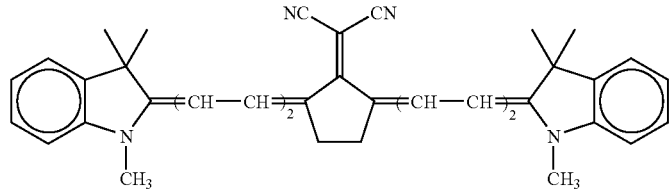
D-214
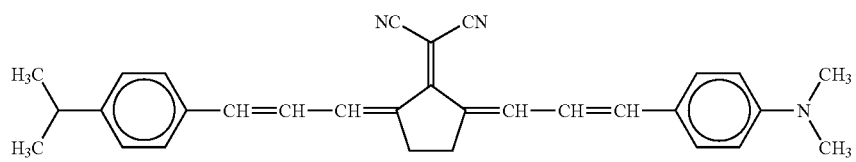
D-215
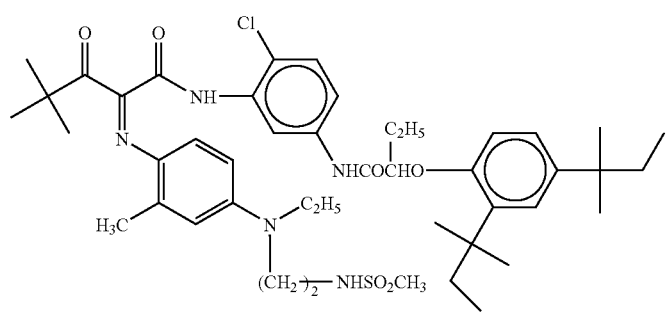
D-216
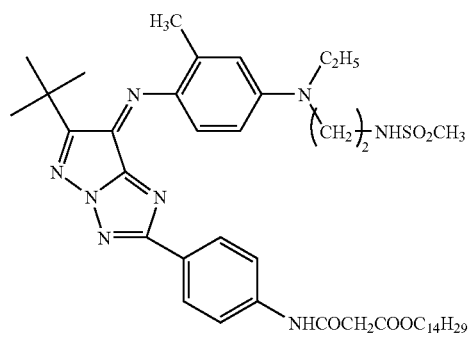
D-217
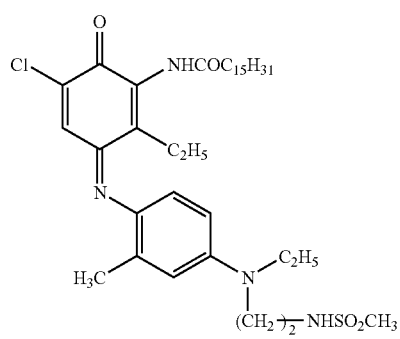

-continued

D-218
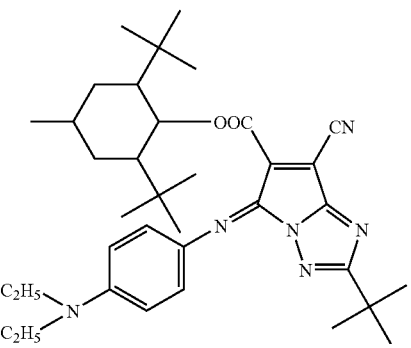

D-219
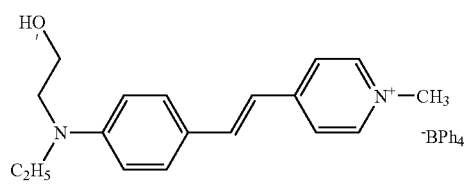

D-220
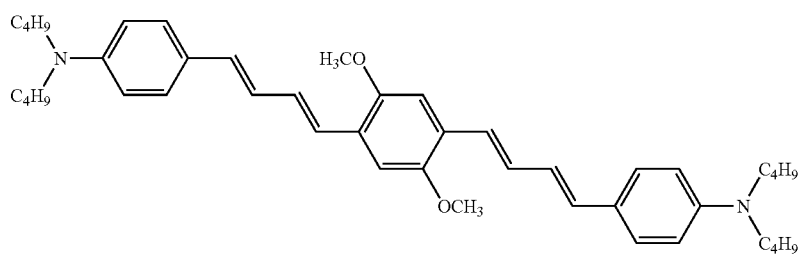

D-221
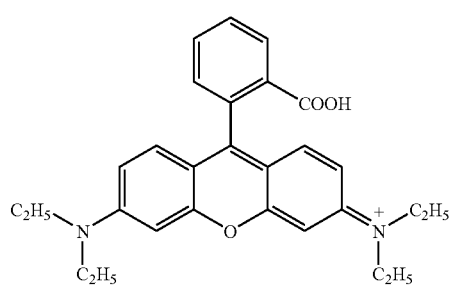

The polymerization initiator in the two-photon absorbing optical recording material of the present invention is described in detail below.

The polymerization initiator for use in the present invention is a compound capable of generating a radical, an acid (Broensted acid or Lewis acid) or a base (Broensted base or Lewis base) as a result of energy or electron transfer (giving or accepting an electron) from the excited state of the two-photon absorbing compound, which is produced upon two-photon absorption, and thereby initiating polymerization of the polymerizable compound.

The polymerization initiator for use in the present invention is preferably a radical polymerization initiator capable of generating a radical to initiate the radical polymerization of the polymerizable compound, a cationic polymerization initiator capable of generating only an acid without generating a radical to initiate only the cationic polymerization of the polymerizable compound, a polymerization initiator capable of generating both a radical and an acid to initiate both the radical polymerization and the cationic polymerization, or an anionic polymerization initiator capable of generating a base to initiate the anionic polymerization.

The radical polymerization initiator, the cationic polymerization initiator and the initiator capable of initiating both the radical polymerization and the cationic polymerization are described below.

As the polymerization initiator for use in the present invention, the following 14 systems are preferred. If desired, these polymerization initiators may be used as a mixture of two or more thereof at an arbitrary ratio.

1) Ketone-base polymerization initiator

2) Organic peroxide-base polymerization initiator

3) Bisimidazole-base polymerization initiator

4) Trihalomethyl-substituted triazine-base polymerization initiator

5) Diazonium salt-base polymerization initiator

6) Diaryliodonium salt-base polymerization initiator

7) Sulfonium salt-base polymerization initiator

8) Borate-base polymerization initiator

9) Diaryliodonium organic boron complex-base polymerization initiator

10) Sulfonium organic boron complex-base polymerization initiator

11) Cationic two-photon absorbing compound organic boron complex-base polymerization initiator 12) Anionic two-photon absorbing compound onium salt complex-base polymerization initiator 13) Metal arene complex-base polymerization initiator 14) Sulfonic acid ester-base polymerization initiator These preferred systems are specifically described below.

1) Ketone-Base Polymerization Initiator

The ketone-base polymerization initiator preferably includes an aromatic ketone, an aromatic diketone and the like.

Preferred examples thereof include benzophenone derivatives (e.g., benzophenone, Michler's ketone), benzoin derivatives (e.g., benzoin methyl ether, benzoin ethyl ether, α-methylbenzoin, α-allylbenzoin, α-phenylbenzoin), acetoin derivatives (e.g., acetoin, pivaloin, 2-hydroxy-2-methylpropiophenone, 1-hydroxycyclohexyl phenyl ketone), acyloin ether derivatives (e.g., diethoxyacetophenone), α-diketone derivatives (e.g., diacetyl, benzyl, 4,4'-dimethoxybenzyl, benzyldimethylketal, 2,3-bornanedione (camphor quinone), 2,2,5,5-tetramethyltetrahydro-3,4-furoic acid (imidazoletrione)), xanthone derivatives (e.g., xanthone), thioxanthone derivatives (e.g., thioxanthone, 2-chlorothioxanthone) and ketocoumarin derivatives.

Examples of the commercial product include Irgacure 184, 651 and 907 represented by the following formulae, which are commercially available from Ciba Geigy.

Irgacure 907:

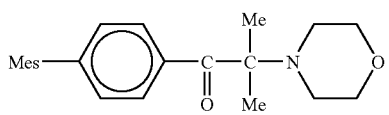

Irgacure 184:

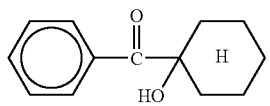

Irgacure 651:

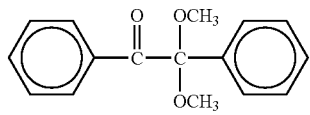

Other preferred examples include quinone-base polymerization initiators (e.g., 9,10-anthraquinone, 1-chloroanthraquinone, 2-chloroanthraquinone, 2-methyl-anthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-dimethylanthraquinone, sodium anthraquinone-α-sulfonate, 3-chloro-2-methylanthraquinone, retenequinone, 7,8,9,10-tetrahydronaphthacenequinone, 1,2,3,4-tetrahydrobenz(a)-anthracene-7,12-dione).

2) Organic Peroxide-Base Polymerization Initiator

Preferred examples of this system include benzoyl peroxide, di-tert-butyl peroxide, and 3,3',4,4'-tetra(tert-butylperoxycarbonyl)benzophenone described in JP-A-59-189340 and JP-A-60-76503.

3) Bisimidazole-Base Polymerization Initiator

The bisimidazole-base polymerization initiator is preferably a bis(2,4,5-triphenyl)imidazole derivative and examples thereof include bis(2,4,5-triphenyl)imidazole, 2-(o-chlorophenyl)-4,5-bis(m-methoxyphenyl)-imidazole dimer (CDM-HABI), 1,1'-biimidazole, 2,2'-bis(o-chlorophenyl)-4,4',5,5'-tetraphenyl (o-Cl-HABI), 1H-imidazole and 2,5-bis(o-chlorophenyl)-4-[3,4-dimethoxyphenyl]-dimer (TCTM-HABI).

The bisimidazole-base polymerization initiator is preferably used together with a hydrogen donor. Preferred examples of the hydrogen donor include 2-mercapto-benzoxazole, 2-mercaptobenzothiazole and 4-methyl-4H-1,2,4-triazole-3-thiol.

4) Trihalomethyl-Substituted Triazine-Base Acid Generator

The trihalomethyl-substituted triazine-base acid generator is preferably represented by the following formula (11):

Formula (11):

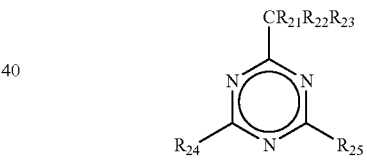

wherein $R_{21}$, $R_{22}$ and $R_{23}$ each independently represents a hydrogen atom, preferably a chlorine atom, $R_{24}$ and $R_{25}$ each independently represents a hydrogen atom, —$CR_{21}R_{22}R_{23}$ or other substituent.

Preferred examples of the substituent include an alkyl group (preferably having a C number of 1 to 20, e.g., methyl, ethyl, n-propyl, isopropyl, n-butyl, n-pentyl, benzyl, 3-sulfopropyl, 4-sulfobutyl, carboxymethyl, 5-carboxypentyl), an alkenyl group (preferably having a C number of 2 to 20, e.g., vinyl, allyl, 2-butenyl, 1,3-butadienyl), a cycloalkyl group (preferably having a C number of 3 to 20, e.g., cyclopentyl, cyclohexyl), an aryl group (preferably having a C number of 6 to 20, e.g., phenyl, 2-chlorophenyl, 4-methoxyphenyl, 3-methylphenyl, 1-naphthyl), a heterocyclic group (preferably having a C number of 1 to 20, e.g., pyridyl, thienyl, furyl, thiazolyl, imidazolyl, pyrazolyl, pyrrolidino, piperidino, morpholino), an alkynyl group (preferably having a C number of 2 to 20, e.g., ethynyl, 2-propynyl, 1,3-butadynyl, 2-phenylethynyl), a halogen atom (e.g., F, Cl, Br, I), an amino group (preferably having a C number of 0 to 20, e.g., amino, dimethylamino, diethylamino, dibutylamino, anilino), a cyano group, a nitro group, a hydroxyl group, a mercapto group, a carboxyl group, a sulfo group, a phosphonic acid group, an acyl group (preferably having a C number of 1 to 20, e.g., acetyl, benzoyl, salicyloyl, pivaloyl), an alkoxy group (preferably having a C number of 1 to 20, e.g., methoxy, butoxy, cyclohexyloxy), an aryloxy group (preferably having a C number of 6 to 26, e.g., phenoxy, 1-naphthoxy), an alkylthio group (preferably having a C number of 1 to 20, e.g., methylthio, ethylthio), an arylthio group (preferably having a C number of 6 to 20, e.g., phenylthio, 4-chlorophenylthio), an alkylsulfonyl group (preferably having a C number of 1 to 20, e.g., methanesulfonyl, butanesulfonyl), an arylsulfonyl group (preferably having a C number of 6 to 20, e.g., benzenesulfonyl, paratoluenesulfonyl), a sulfamoyl group (preferably having a C number of 0 to 20, e.g., sulfamoyl, N-methylsulfamoyl, N-phenylsulfamoyl), a carbamoyl group (preferably having a C number of 1 to 20, e.g., carbamoyl, N-methylcarbamoyl, N,N-dimethylcarbamoyl, N-phenyl-carbamoyl), an acylamino group (preferably having a C number of 1 to 20, e.g., acetylamino, benzoylamino), an imino group (preferably having a C number of 2 to 20, e.g., phthalimino), an acyloxy group (preferably having a C number of 1 to 20, e.g., acetyloxy, benzoyloxy), an alkoxycarbonyl group (preferably having a C number of 2 to 20, e.g., methoxycarbonyl, phenoxycarbonyl) and a carbamoylamino group (preferably having a C number of 1 to 20, e.g., carbamoylamino, N-methyl-carbamoylamino, N-phenyl-carbamoylamino). Among these, more preferred are an alkyl group, an aryl group, a heterocyclic group, a halogen atom, a cyano group, a carboxyl group, a sulfo group, an alkoxy group, a sulfamoyl group, a carbamoyl group and an alkoxycarbonyl group.

$R_{24}$ is preferably $-CR_{21}R_{22}R_{23}$, more preferably $-CCl_3$, and $R_{25}$ is preferably $-CR_{21}R_{22}R_{23}$, an alkyl group, an alkenyl group or an aryl group.

Specific examples of the trihalomethyl-substituted triazine-base acid generator include 2-methyl-4,6-bis(trichloromethyl)-1,3,5-triazine, 2,4,6-tris(tri-chloromethyl)-1,3,5-triazine, 2-phenyl-4,6-bis(trichloromethyl)-1,3,5-triazine, 2-(4'-methoxyphenyl)-4,6-bis(tri-chloromethyl)-1,3,5-triazine, 2-(4'-trifluoromethylphenyl)-4,6-bis(trichloromethyl)-1,3,5-triazine, 2,4-bis(trichloromethyl)-6-(p-methoxyphenylvinyl)-1,3,5-triazine and 2-(4'-methoxy-1'-naphthyl)-4,6-bis(trichloromethyl)-1,3,5-triazine. Preferred examples thereof also include the compounds described in British Patent 1,388,492 and JP-A-53-133428.

5) Diazonium Salt-Base Acid Generator

The diazonium salt-base acid generator is preferably represented by the following formula (12):

Formula (12):

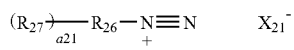

wherein $R_{26}$ represents an aryl group or a heterocyclic group, preferably an aryl group, more preferably a phenyl group;

$R_{27}$ represents a substituent (preferred examples of the substituent are the same as those of the substituent described above for $R_{24}$); a21 represents an integer of 0 to 5, preferably 0 to 2, and when a21 is 2 or more, multiple $R_{27}$s may be the same or different or may combine with each other to form a ring; and $X_{21}^-$ is an anion such that $HX_{21}$ becomes an acid having a pKa of 4 or less (in water, 25° C.), preferably 3 or less, more preferably 2 or less, and preferred examples thereof include chloride, bromide, iodide, tetrafluoroborate, hexafluorophosphate, hexafluoroarcenate, hexafluoro-antimonate, perchlorate, trifluoromethanesulfonate, 9,10-dimethoxyanthracene-2-sulfonate, methanesulfonate, benzene-sulfonate, 4-trifluoromethylbenzenesulfonate, tosylate and tetra(pentafluorophenyl)borate.

Specific examples of the diazonium-base acid generator include the above-described $X_{21}^-$ salts of benzenediazonium, 4-methoxydiazonium and 4-methyldiazonium.

6) Diaryliodonium Salt-Base Acid Generator

The diaryliodonium salt-base acid generator is preferably represented by the following formula (13):

Formula (13):

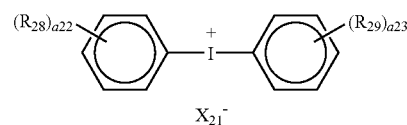

wherein $X_{21}^-$ has the same meaning as in formula (12), $R_{28}$ and $R_{29}$ each independently represents a substituent (preferred examples of the substituent are the same as those of the substituent described above for $R_{24}$), preferably an alkyl group, an alkoxy group, a halogen atom, a cyano group or a nitro group, a22 and a23 each independently represents an integer of 0 to 5, preferably 0 to 1, and when a21 is 2 or more, multiple $R_{28}$s or $R_{29}$s may be the same or different and may combine with each other to form a ring.

Specific examples of the diaryliodonium salt-base acid generator include chloride, bromide, iodide, tetrafluoroborate, hexafluorophosphate, hexafluoroarcenate, hexafluoro-antimonate, perchlorate, trifluoromethanesulfonate, 9,10-dimethoxyanthracene-2-sulfonate, methanesulfonate, benzenesulfonate, 4-trifluoromethylbenzenesulfonate, tosylate, tetra(pentafluorophenyl)borate, perfluorobutane-sulfonate and pentafluorobenzenesulfonate of diphenyliodonium, 4,4'-dichlorodiphenyliodonium, 4,4'-dimethoxydiphenyliodonium, 4,4'-dimethyldiphenyliodonium, 4,4'-tert-butyldiphenyliodonium, 4,4'-di-tert-amyldiphenyliodonium, 3,3'-dinitrodiphenyliodonium, phenyl(p-methoxyphenyl)iodonium, phenyl(p-octyloxyphenyl)iodonium and bis(p-cyanophenyl)iodonium.

Other examples include compounds described in *Macromolecules*, Vol. 10, page 1307 (1977), and diaryliodonium salts described in JP-A-58-29803, JP-A-1-287105 and Japanese Patent Application No. 3-5569.

7) Sulfonium Salt-Base Acid Generator

The sulfonium salt-base acid generator is preferably represented by the following formula (14):

Formula (14):

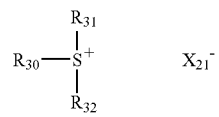

wherein $X_{21}^-$ has the same meaning as in formula (12), and $R_{30}$, $R_{31}$ and $R_{32}$ each independently represents an alkyl group, an aryl group or a heterocyclic group (preferred examples of these groups are the same as those for $R_{24}$), preferably an alkyl group, a phenacyl group or an aryl group.

Specific examples of the sulfonium salt-base acid generator include chloride, bromide, tetrafluoroborate, hexafluorophosphate, hexafluoroarcenate, hexafluoroantimonate, perchlorate, trifluoromethanesulfonate, 9,10-dimethoxyanthracene-2-sulfonate, methanesulfonate, benzenesulfonate, 4-trifluoromethylbenzenesulfonate, tosylate, tetra(pentafluorophenyl)borate, perfluorobutanesulfonate and pentafluorobenzenesulfonate of sulfonium salts such as triphenylsulfonium, diphenylphenacylsulfonium, dimethyl-phenacylsulfonium, benzyl-4-hydroxyphenylmethylsulfonium, 4-tertiary-butyltriphenylsulfonium, tris(4-methylphenyl)-sulfonium, tris(4-methoxyphenyl)sulfonium and 4-phenylthiotriphenylsulfonium, bis-1-(4-(diphenylsulfonium)-phenyl)sulfide.

8) Borate-Base Polymerization Initiator

The borate-base polymerization initiator is preferably represented by the following formula (15):

Formula (15):

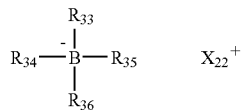

wherein $R_{33}$, $R_{34}$, $R_{35}$ and $R_{36}$ each independently represents an alkyl group, an alkenyl group, an alkynyl group, a cycloalkyl group or an aryl group (preferred examples of these groups are the same as those for $R_{24}$), preferably an alkyl group or an aryl group, provided that $R_{33}$, $R_{34}$, $R_{35}$ and $R_{36}$ are not an aryl group at the same time, and $X_{22}^+$ represents a cation.

The compound where $R_{33}$, $R_{34}$ and $R_{35}$ are each independently an aryl group and $R_{36}$ is an alkyl group is more preferred, and the compound where $R_{33}$, $R_{34}$ and $R_{35}$ all are a phenyl group and $R_{36}$ is an n-butyl group is most preferred.

Specific examples of the borate-base polymerization initiator include tetrabutylammonium n-butyltriphenylborate and tetramethylammonium sec-butyltriphenylborate.

9) Diaryliodonium Organic Boron Complex-Base Polymerization Initiator

The diaryliodonium organic boron complex salt-base polymerization initiator is preferably a compound represented by the following formula (16):

Formula (16):

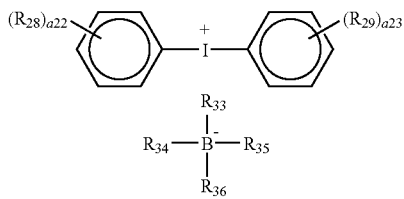

wherein $R_{28}$, $R_{29}$, a22 and a23 have the same meanings as in formula (13) and $R_{33}$, $R_{34}$, $R_{35}$ and $R_{36}$ have the same meanings as in formula (15).

Specific examples of the diaryliodonium organic boron complex salt-base polymerization initiator include I-1 to I-3 shown below.

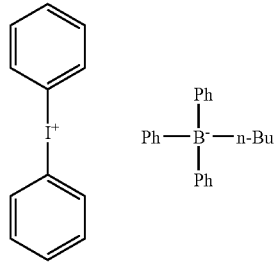

I-1

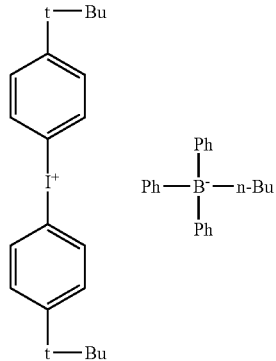

I-2

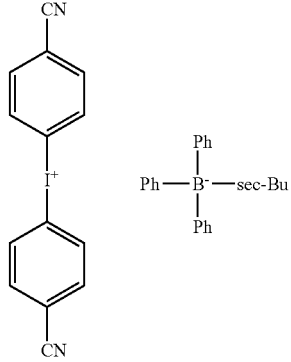

I-3

In addition, iodonium organic boron complexes such as diphenyliodonium (n-butyl)triphenylborate described in JP-A-3-704 are also preferred.

10) Sulfonium Organic Boron Complex-Base Polymerization Initiator

The sulfonium organic boron complex salt-base polymerization initiator is preferably represented by the following formula (17):

Formula (17):

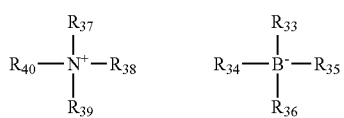

wherein $R_{33}$, $R_{34}$, $R_{35}$ and $R_{36}$ have the same meanings as in formula (15), $R_{37}$, $R_{38}$ and $R_{39}$ each independently represents an alkyl group, an aryl group, an alkenyl group, an alkynyl group, a cycloalkyl group, an alkoxy group, an aryloxy group, an alkylthio group, an arylthio group or an amino group (preferred examples of these groups are the same as those for $R_{24}$), preferably an alkyl group, a phenacyl group, an aryl group or an alkenyl group, $R_{37}$, $R_{38}$ and $R_{39}$ may combine with each other to form a ring, and $R_{40}$ represents an oxygen atom or a lone electron pair.

Specific examples of the sulfonium organic boron complex salt-base polymerization initiator include I-4 to I-10 shown below.

I-4
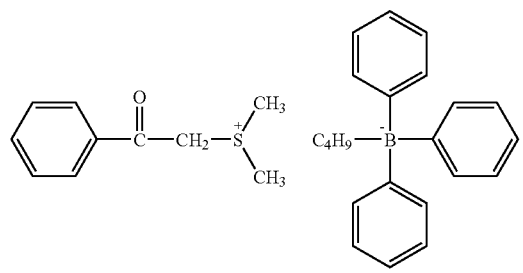

I-5
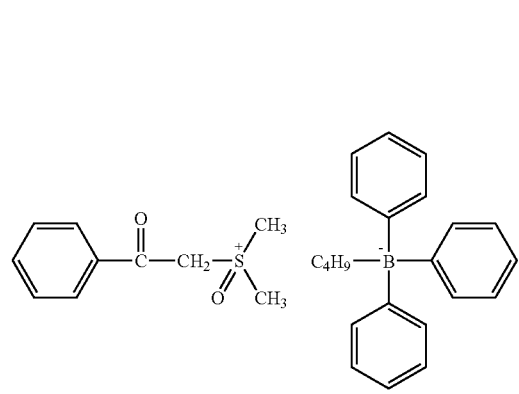

I-6
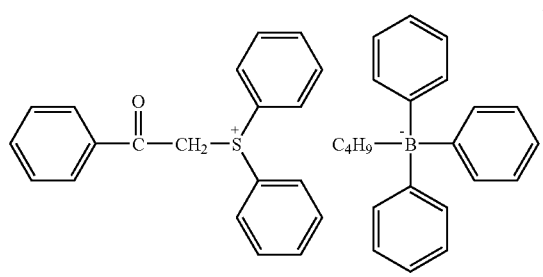

I-7
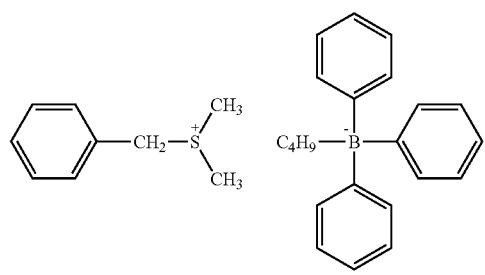

-continued

I-8
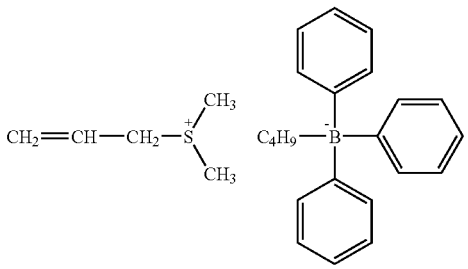

I-9
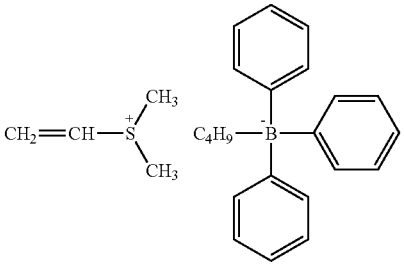

I-10
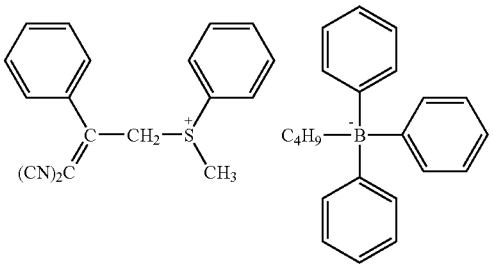

In addition, sulfonium organic boron complexes described in JP-A-5-255347 and JP-A-5-213861 are also preferred.

11) Cationic Two-Photon Absorbing Compound Organic Boron Complex-Base Polymerization Initiator When the polymerization initiator for use in the present invention is a cationic two-photon absorbing compound organic boron complex-base polymerization initiator, the cationic two-photon absorbing compound thereof may play the role of the two-photon absorbing compound for use in the present invention.

The cationic two-photon absorbing compound organic boron complex-base polymerization initiator is preferably represented by formula (18):

Formula (18):

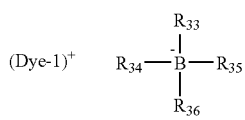

wherein (Dye-1)$^+$ is a cationic two-photon absorbing compound and preferred examples thereof are the cationic two-photon absorbing compound out of the above-described two-photon absorbing compounds, for example, cyanine dyes and merocyanine dyes are preferred with cyanine dyes being more preferred; and $R_{33}$, $R_{34}$, $R_{35}$ and $R_{36}$ have the same meanings as in formula (15).

Specific examples of the cationic two-photon absorbing compound organic boron complex-base polymerization initiator include I-11, I-12, I-13 and I-14 shown below.

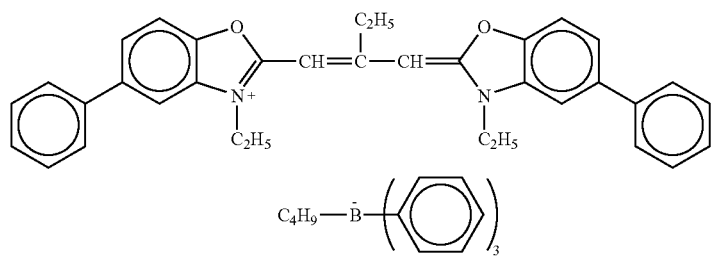

I-11

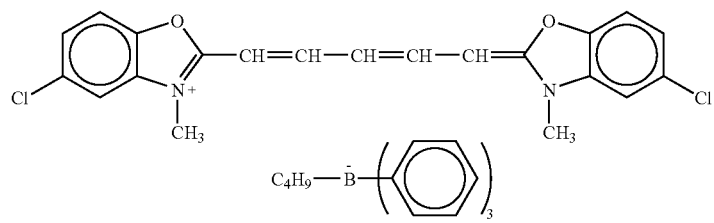

I-12

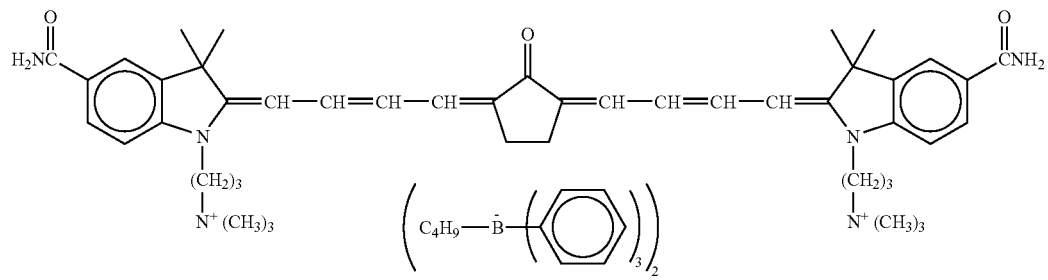

I-13

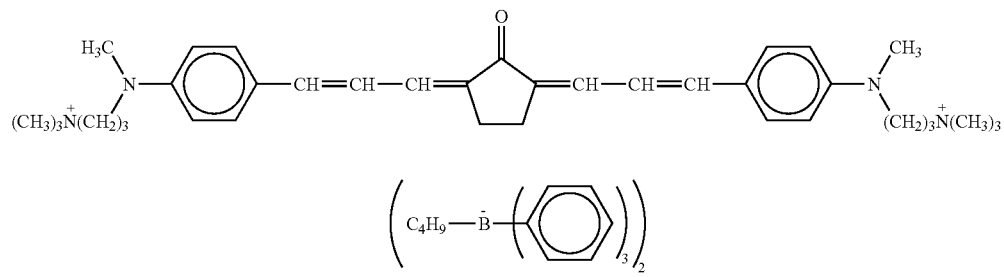

I-14

Other specific examples include cationic dye-borate anion complexes described in JP-A-62-143044 and JP-A-62-150242.

12) Anionic Two-Photon Absorbing Compound Onium Salt Complex-Base Polymerization Initiator When the polymerization initiator for use in the present invention is an anionic two-photon absorbing compound onium salt complex-base polymerization initiator, the anionic two-photon absorbing compound thereof may play the role of the two-photon absorbing compound for use in the present invention.

The anionic two-photon absorbing compound onium salt-base polymerization initiator is preferably represented by formula (19):

$$(Dye-2)^- X_{23}^+ \qquad \text{Formula (19)}$$

wherein (Dye-2)⁻ represents an anionic two-photon absorbing compound and preferred examples thereof are the anionic two-photon absorbing compounds out of the above-described two-photon absorbing compounds, for example, cyanine dyes, merocyanine dyes and oxonol dyes are preferred with cyanine dyes and oxonol dyes being more preferred; and $X_{23}^+$ represents a cation moiety of the diazonium salt of formula (12), a cation moiety of the diaryliodonium salt of formula (13) or a cation moiety of the sulfonium salt of formula (14) (preferred examples thereof are as described above), preferably a cation moiety of the diaryliodonium salt of formula (13) or a cation moiety of the sulfonium salt of formula (14).

Specific examples of the anionic two-photon absorbing compound onium salt-base polymerization initiator include to I-32 shown below.

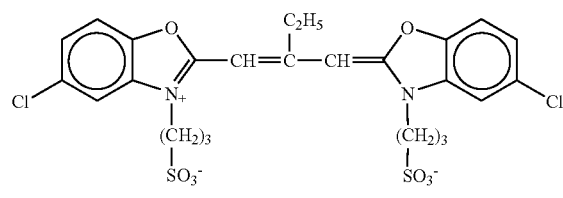
| | •X₂₃⁺ | |
|---|---|---|
| | X₂₃⁺ | |
| I-15 | 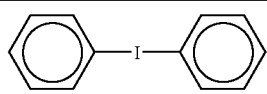 | (=C-1) |
| I-16 | 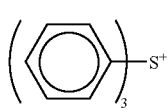 | (=C-2) |
| I-17 | 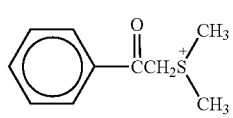 | (=C-3) |
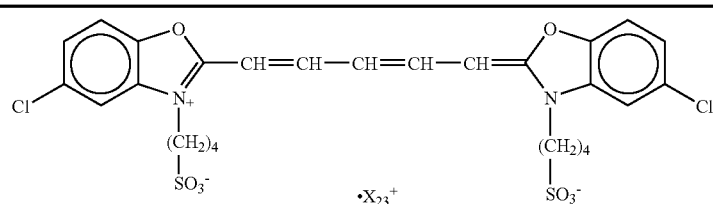
| | X₂₃⁺ | |
|---|---|---|
| I-18 | | C-1 |
| I-19 | | C-2 |
| I-20 | | C-3 |
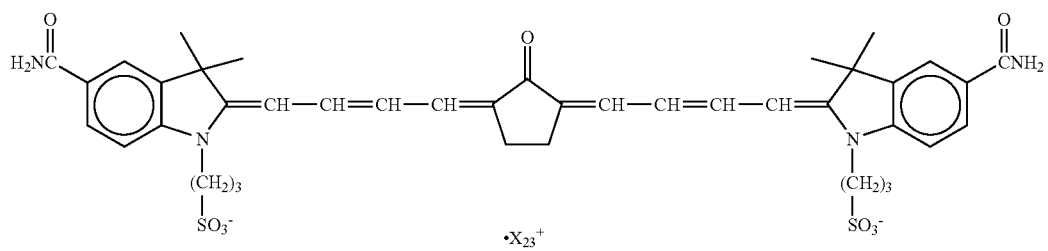
| | X₂₃⁺ | |
|---|---|---|
| I-21 | | C-1 |
| I-22 | | C-2 |
| I-23 | | C-3 |
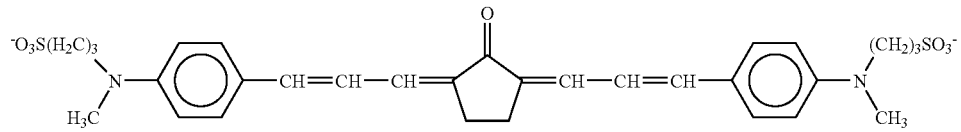
| | X₂₃⁺ | |
|---|---|---|
| I-24 | | C-1 |
| I-25 | | C-2 |
| I-26 | | C-3 |

-continued

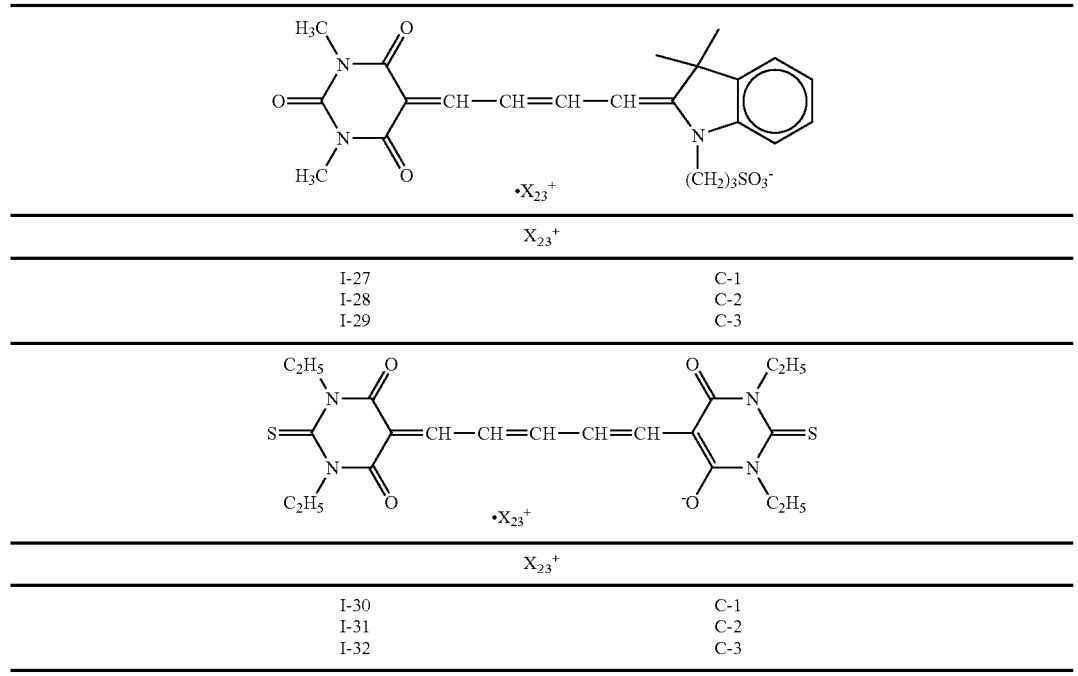

| $X_{23}^+$ | |
|---|---|
| I-27 | C-1 |
| I-28 | C-2 |
| I-29 | C-3 |

| $X_{23}^+$ | |
|---|---|
| I-30 | C-1 |
| I-31 | C-2 |
| I-32 | C-3 |

13) Metal Arene Complex-Base Polymerization Initiator

In the metal arene complex-base polymerization initiator, the metal is preferably iron or titanium.

Specific preferred examples of the metal arene complex-base polymerization initiator include iron arene complexes described in JP-A-1-54440, European Patent Nos. 109851 and 126712, and *J. Imag. Sci.*, Vol. 30, page 174 (1986), iron arene organic boron complexes described in *Organometallics*, Vol. 8, page 2737 (1989), iron arene complex salts described in *Prog. Polym. Sci.*, Vol. 21, pp. 7-8 (1996), and titanocenes described in JP-A-61-151197.

14) Sulfonic Acid Ester-Base Polymerization Initiator

Preferred examples of the sulfonic acid ester-base polymerization initiator include sulfonic acid esters, nitrobenzyl sulfonates and imidosulfonates.

Specific preferred examples of the sulfonic acid esters include benzoin tosylate and pyrogallol trimesylate. Specific preferred examples of the nitrobenzyl sulfonates include o-nitrobenzyl tosylate, 2,6-dinitrobenzyl tosylate, 2',6'-dinitrobenzyl-4-nitrobenzene sulfonate, p-nitrobenzyl-9,10-diethoxyanthracene-2-sulfonate and 2-nitrobenzyl trifluoromethylsulfonate. Specific preferred examples of the imidosulfonates include N-tosylphthalimide, 9-fluorenylidene aminotosylate and α-cyanobenzylidene tosylamine.

15) Other Polymerization Initiators

Examples of the polymerization initiator other than 1) to 14) above include organic azide compounds such as 4,4'-diazide chalcone, aromatic carboxylic acids such as N-phenylglycine, polyhalogen compounds (e.g., $Cl_4$, $CHI_3$, $CBrCl_3$), pyridinium salts such as 1-benzyl-2-cyanopyridinium hexafluoroantimonate, phenylisoxazolones, silanol aluminum complexes, and aluminate complexes described in JP-A-3-209477.

The radical or cationic polymerization initiators for use in the present invention can be classified into:

a) polymerization initiator capable of activating radical polymerization, b) polymerization initiator capable of activating only cationic polymerization, and c) polymerization initiator capable of activating radical polymerization and cationic polymerization at the same time.

The polymerization initiator a) capable of activating radical polymerization is a polymerization initiator capable of generating a radical as a result of energy or electron transfer (giving an electron to the two-photon absorbing compound or accepting an electron from the two-photon absorbing compound) from the excited state of the two-photon absorbing compound, which is produced upon non-resonant two-photon absorption, and thereby initiating the radical polymerization of the polymerizable compound.

Out of the above-described systems, the following systems come under the polymerization initiator capable of activating radical polymerization:

1) ketone-base polymerization initiator, 2) organic peroxide-base polymerization initiator, 3) bisimidazole-base polymerization initiator, 4) trihalomethyl-substituted triazine-base polymerization initiator, 5) diazonium salt-base polymerization initiator, 6) diaryliodonium salt-base polymerization initiator, 7) sulfonium salt-base polymerization initiator, 8) borate-base polymerization initiator, 9) diaryliodonium organic boron complex-base polymerization initiator, 10) sulfonium organic boron complex-base polymerization initiator, 11) cationic two-photon absorbing compound organic boron complex-base polymerization initiator, 12) anionic two-photon absorbing compound onium salt complex-base polymerization initiator, and 13) metal arene complex-base polymerization initiator.

Among these polymerization initiators capable of activating radical polymerization, preferred are 1) ketone-base polymerization initiator, 3) bisimidazole-base polymerization initiator, 4) trihalomethyl-substituted triazine-base polymerization initiator, 6) diaryliodonium salt-base polymerization initiator, 7) sulfonium salt-base polymerization initiator, 11) cationic two-photon absorbing compound organic boron complex-base polymerization initiator, and 12) anionic two-photon absorbing compound onium salt complex-base polymerization initiator, and more preferred are 3) bisimidazole-base polymerization initiator, 6) diaryliodonium salt-base polymerization initiator, 7) sulfonium salt-base polymerization initiator, 11) cationic two-photon absorbing compound organic boron complex-base polymerization initiator, and 12) anionic two-photon absorbing compound onium salt complex-base polymerization initiator.

The polymerization initiator capable of activating only cationic polymerization is a polymerization initiator capable of generating an acid (Broensted acid or Lewis acid) without generating a radical as a result of energy or electron transfer from the excited state of the two-photon absorbing compound, which is produced upon non-resonant two-photon absorption, and initiating the cationic polymerization of the polymerizable compound under the action of the acid.

Out of the above-described systems, the following system comes under the polymerization initiator capable of activating only cationic polymerization:

14) sulfonic acid ester-base polymerization initiator.

Here, as the cationic polymerization initiator, those described, for example, in S. Peter Pappas (compiler), *UV Curing; Science and Technology*, pp. 23-76, A Technology Marketing Publication, and B. Klingert, M. Riediker and A. Roloff, *Comments Inorg. Chem.*, Vol. 7, No. 3, pp. 109-138 (1988) can also be used.

The polymerization initiator capable of activating radical polymerization and cationic polymerization at the same time is a polymerization initiator capable of generating a radical and an acid (Broensted acid or Lewis acid) at the same time as a result of energy or electron transfer from the excited state of the two-photon absorbing compound, which is produced upon non-resonant two-photon absorption, and initiating the radical polymerization of the polymerizable compound under the action of the radical generated and also the cationic polymerization of the polymerizable compound under the action of the acid generated.

Out of the above-described systems, the following systems come under the polymerization initiator capable of activating radical polymerization and cationic polymerization at the same time:

4) trihalomethyl-substituted triazine-base polymerization initiator, 5) diazonium salt-base polymerization initiator, 6) diaryliodonium salt-base polymerization initiator, 7) sulfonium salt-base polymerization initiator, and 13) metal arene complex-base polymerization initiator.

Among these polymerization initiators capable of activating radical polymerization and cationic polymerization at the same time, preferred are 6) diaryliodonium salt-base polymerization initiator, and 7) sulfonium salt-base polymerization initiator.

The anionic polymerization initiator for use in the present invention is described below. The anionic polymerization initiator for use in the present invention is preferably a base generator capable of generating a base (Broensted base or Lewis base) and thereby initiating the anionic polymerization.

The base generator is a compound capable of generating a base as a result of energy or electron transfer from the excited state of the two-photon absorbing compound or color-forming material. The base generator is preferably stable in a dark place. The base generator for use in the present invention is preferably a compound capable of generating a base as a result of electron transfer from the excited state of the two-photon absorbing compound or color-forming material.

The base generator for use in the present invention preferably generates a Broensted base by light, more preferably generates an organic base, still more preferably generates an amine as the organic base.

The anionic polymerization initiator for use in the present invention, namely, the base generator is preferably represented by formula (31-1), (31-2), (31-3) or (31-4). These base generates may be used, if desired, as a mixture of two or more thereof at an arbitrary ratio.

In formulae (31-1) and (31-2), $R_{201}$ and $R_{202}$ each independently represents a hydrogen atom, an alkyl group (preferably having a carbon number (hereinafter referred to as "a C number") of 1 to 20, e.g., methyl, ethyl, n-propyl, isopropyl, n-butyl, n-pentyl, n-octadecyl, benzyl, 3-sulfopropyl, 4-sulfobutyl, carboxymethyl, 5-carboxypentyl), an alkenyl group (preferably having a C number of 2 to 20, e.g., vinyl, allyl, 2-butenyl, 1,3-butadienyl), a cycloalkyl group (preferably having a C number of 3 to 20, e.g., cyclopentyl, cyclohexyl), an aryl group (preferably having a C number of 6 to 20, e.g., phenyl, 2-chlorophenyl, 4-methoxyphenyl, 3-methylphenyl, 1-naphthyl, 2-naphthyl) or a heterocyclic group (preferably having a C number of 1 to 20, e.g., pyridyl, thienyl, furyl, thiazolyl, imidazolyl, pyrazolyl, pyrrolidino, piperidino, morpholino), preferably a hydrogen atom, an alkyl group or a cycloalkyl group, more preferably a hydrogen atom, a methyl group, an ethyl group, a cyclohexyl group or a cyclopentyl group.

$R_{201}$ and $R_{202}$ may combine with each other to form a ring and the heterocyclic ring formed is preferably a piperidine ring, a pyrrolidine ring, a piperazine ring, a moropholine ring, a pyridine ring, a quinoline ring or an imidazole ring, more preferably a piperidine ring, a pyrrolidine ring or an imidazole ring, and most preferably a piperidine ring.

Examples of the preferred combination of $R_{201}$ and $R_{202}$ include a combination where $R_{201}$ is a cyclohexyl group which may be substituted, and $R_{202}$ is a hydrogen atom, a combination where $R_{201}$ is an alkyl group which may be substituted, and $R_{202}$ is a hydrogen atom, and a combination where $R_{201}$ and $R_{202}$ are combined to form a piperidine ring or an imidazole ring.

In formulae (31-1) and (31-2), n201 is 0 or 1, preferably 1.

In formula (31-1), $R_{203}$ represents a substituent and preferred examples of the substituent include an alkyl group (preferably having a C number of 1 to 20, e.g., methyl, ethyl, n-propyl, isopropyl, n-butyl, n-pentyl, benzyl, 3-sulfopropyl, 4-sulfobutyl, carboxymethyl, 5-carboxypentyl), an alkenyl group (preferably having a C number of 2 to 20, e.g., vinyl, allyl, 2-butenyl, 1,3-butadienyl), a cycloalkyl group (preferably having a C number of 3 to 20, e.g., cyclopentyl, cyclohexyl), an aryl group (preferably having a C number of 6 to 20, e.g., phenyl, 2-chlorophenyl, 4-methoxyphenyl, 3-methylphenyl, 1-naphthyl), a heterocyclic group (preferably having a C number of 1 to 20, e.g., pyridyl, thienyl, furyl, thiazolyl, imidazolyl, pyrazolyl, pyrrolidino, piperidino, morpholino), an alkynyl group (preferably having a C number of 2 to 20, e.g., ethynyl, 2-propynyl, 1,3-butadynyl, 2-phenylethynyl), a halogen atom (e.g., F, Cl, Br, I), an amino group (preferably having a C number of 0 to 20, e.g., amino, dimethylamino, diethylamino, dibutylamino, anilino), a cyano group, a nitro group, a hydroxyl group, a mercapto group, a carboxyl group, a sulfo group, a phosphonic acid group, an acyl group (preferably having a C number of 1 to 20, e.g., acetyl, benzoyl, salicyloyl, pivaloyl), an alkoxy group (preferably having a C number of 1 to 20, e.g., methoxy, butoxy, cyclohexyloxy), an aryloxy group (preferably having a C number of 6 to 26, e.g., phenoxy, 1-naphthoxy), an alkylthio group (preferably having a C number of 1 to 20, e.g., methylthio, ethylthio), an arylthio group (preferably having a C number of 6 to 20, e.g., phenylthio, 4-chlorophenylthio), an alkylsulfonyl group (preferably having a C number of 1 to 20, e.g., methanesulfonyl, butanesulfonyl), an arylsulfonyl group (preferably having a C number of 6 to 20, e.g., benzenesulfonyl, paratoluenesulfonyl), a sulfamoyl group (preferably having a C number of 0 to 20, e.g., sulfamoyl, N-methylsulfamoyl, N-phenylsulfamoyl), a carbamoyl group (preferably having a C number of 1 to 20, e.g., carbamoyl, N-methylcarbamoyl, N,N-dimethylcarbamoyl, N-phenyl-carbamoyl), an acylamino group (preferably having a C number of 1 to 20, e.g., acetylamino, benzoylamino), an imino group (preferably having a C number of 2 to 20, e.g., phthalimino), an acyloxy group (preferably having a C number of 1 to 20, e.g., acetyloxy, benzoyloxy), an alkoxycarbonyl group (preferably having a C number of 2 to 20, e.g., methoxycarbonyl, phenoxycarbonyl) and a carbamoylamino group (preferably having a C number of 1 to 20, e.g., carbamoylamino, N-methylcarbamoylamino, N-phenyl-carbamoylamino). Among these, more preferred are an alkyl group, an aryl group, a heterocyclic group, a halogen atom, an amino group, a cyano group, a nitro group, a carboxyl group, a sulfo group, an alkoxy group, an alkylthio group, an arylsulfonyl group, a sulfamoyl group, a carbamoyl group and an alkoxycarbonyl group.

In formula (31-1), $R_{203}$ is preferably a nitro group or an alkoxy group, more preferably a nitro group or a methoxy group, and most preferably a nitro group.

In formula (31-1), n202 is an integer of 0 to 5, preferably 0 to 3, more preferably 1 or 2. When n202 is 2 or more, multiple $R_{203}$s may be the same or different and may combine to form a ring. Preferred examples of the ring formed include a benzene ring and a naphthalene ring.

In formula (31-1), when $R_{203}$ is a nitro group, this is preferably substituted to the 2-position or 2,6-position, and when $R_{203}$ is an alkoxy group, this is preferably substituted to the 3,5-position.

In formula (31-1), $R_{204}$ and $R_{205}$ each independently represents a hydrogen atom or a substituent (preferred examples of the substituent are the same as those of the substituent described for $R_{203}$), preferably a hydrogen atom, an alkyl group or an aryl group, more preferably a hydrogen atom, a methyl group or a 2-nitrophenyl group.

Examples of the preferred combination of $R_{204}$ and $R_{205}$ include a combination where $R_{204}$ and $R_{205}$ both a hydrogen atom, a combination where $R_{204}$ is a methyl group and $R_{205}$ is a hydrogen atom, a combination where $R_{204}$ and $R_{205}$ both a methyl group, and a combination where $R_{204}$ is a 2-nitrophenyl group and $R_{205}$ is a hydrogen atom. Among these, more preferred is a combination where $R_{204}$ and $R_{205}$ both are a hydrogen atom.

In formula (31-2), $R_{206}$ and $R_{207}$ each independently represents a substituent (preferred examples of the substituent are the same as those of the substituent described for $R_{203}$), preferably an alkoxy group, an alkylthio group, a nitro group or an alkyl group, more preferably a methoxy group.

In formula (31-2), n203 and n204 each independently represents an integer of 0 to 5, preferably from 0 to 2. When n203 and n204 each is 2 or more, multiple $R_{206}$s or $R_{207}$s may be the same or different and may combine to form a ring. Preferred examples of the ring formed include a benzene ring and a naphthalene ring.

In formula (31-2), $R_{206}$ is preferably an alkoxy group substituted to the 3,5-position, more preferably a methoxy group substituted to the 3,5-position.

In formula (31-2), $R_{208}$ represents a hydrogen atom or a substituent (preferred examples of the substituent are the same as those of the substituent described for $R_{203}$), preferably a hydrogen atom or an aryl group, more preferably a hydrogen atom.

In formula (31-3), $R_{209}$ represents a substituent (preferred examples of the substituent are the same as those of the substituent described for $R_{203}$), preferably an alkyl group, an aryl group, a benzyl group or an amino group, more preferably an alkyl, tert-butyl, phenyl or benzyl group which may be substituted, more preferably an anilino or cyclohexylamino group which may be substituted.

The compound represented by formula (31-3) may be a compound connected to a polymer chain from $R_{209}$.

In formula (31-3), $R_{210}$ and $R_{211}$ each independently represents a hydrogen atom or a substituent (preferred examples of the substituent are the same as those of the substituent described for $R_{203}$), preferably an alkyl group or an aryl group, more preferably a methyl group, a phenyl group or a 2-naphthyl group.

$R_{210}$ and $R_{211}$ may combine with each other to form a ring and preferred examples of the ring formed include a fluorenone ring.

In formula (31-1), $R_{212}$ represents an aryl group or a heterocyclic group, preferably an aryl group or a heterocyclic group shown below:

$R_{212}$:

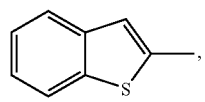 , 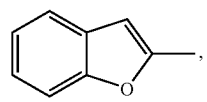 ,

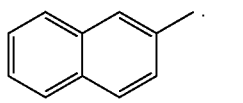

In formula (31-4), $R_{213}$, $R_{214}$ and $R_{215}$ each independently represents a hydrogen atom, an alkyl group, an alkenyl group, a cycloalkyl group, an aryl group or a heterocyclic group (preferred examples of these groups are the same as those described for $R_{201}$ and $R_{202}$), preferably an alkyl group, more preferably a butyl group. $R_{213}$, $R_{214}$ and $R_{215}$ may combine with each other to form a ring and the heterocyclic ring formed is preferably a piperidine ring, a pyrrolidine ring, a piperazine ring, a moropholine ring, a pyridine ring, a quinoline ring or an imidazole ring, more preferably a piperidine ring, a pyrrolidine ring or an imidazole ring.

In formula (31-4), $R_{216}$, $R_{217}$, $R_{218}$ and $R_{219}$ each independently represents an alkyl group or an aryl group and it is preferred that $R_{216}$, $R_{217}$ and $R_{218}$ all are a phenyl group and $R_{219}$ is an n-butyl group or a phenyl group.

The base generator for use in the present invention is preferably represented by formula (31-1) or (31-3), more preferably by formula (31-1).

Specific preferred examples of the base generator for use in the present invention are set forth below, however, the present invention is not limited thereto.

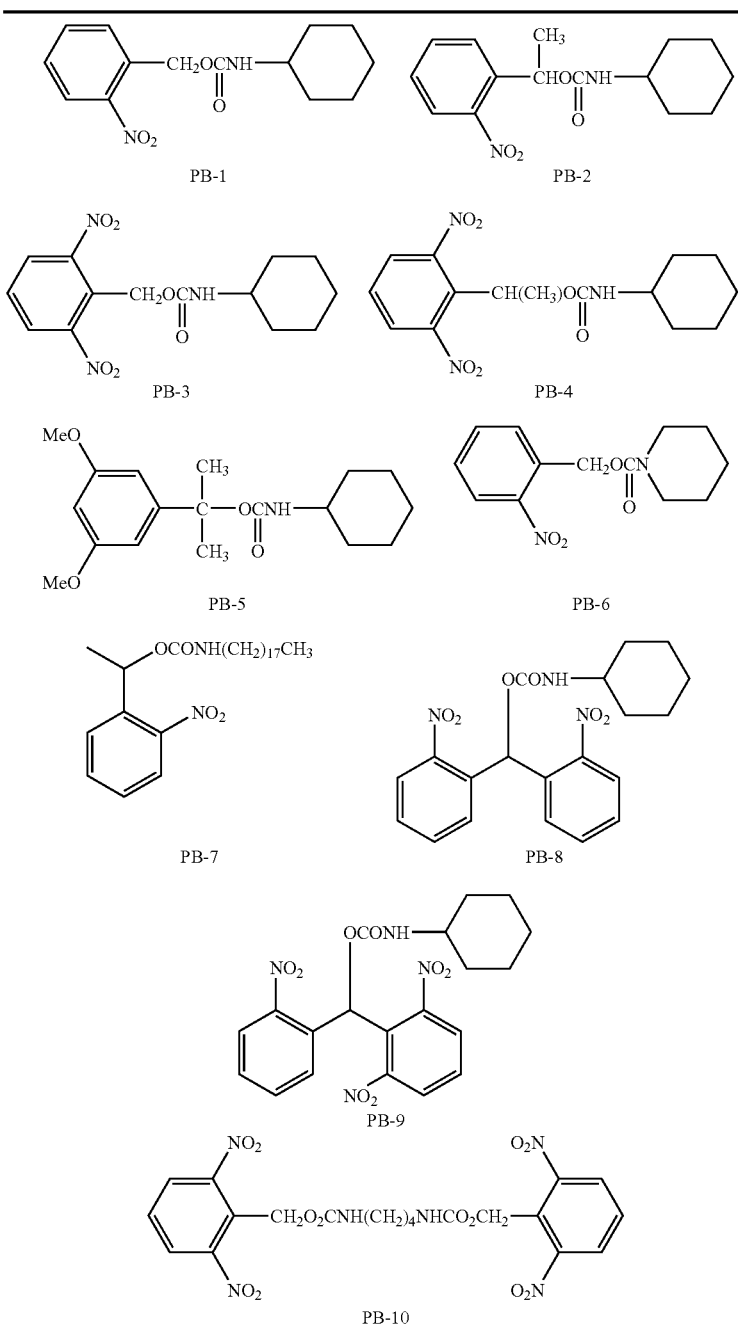

-continued
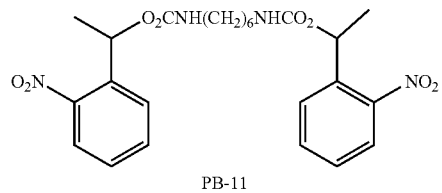
PB-11
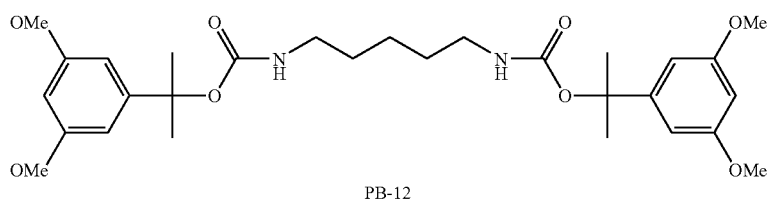
PB-12
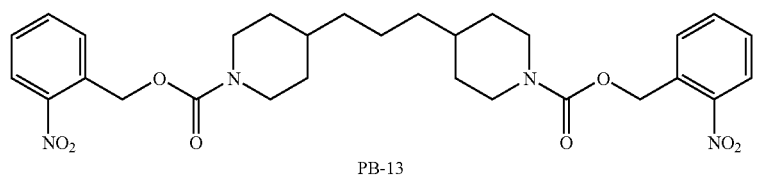
PB-13
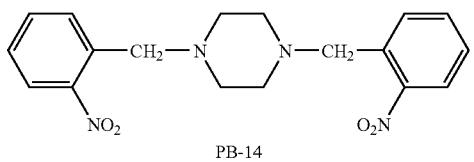
PB-14
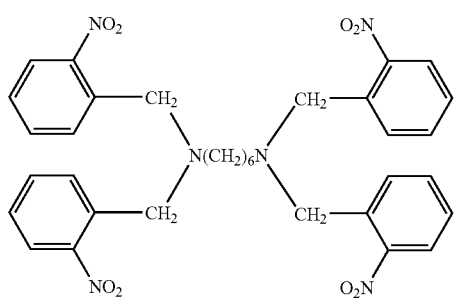
PB-15
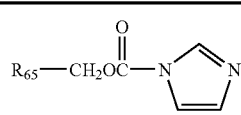
$R_{65}$
| PB-16 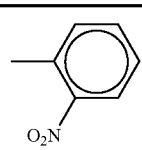 | PB-18  |
| --- | --- |
| PB-17 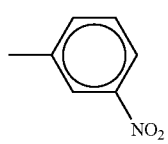 | PB-19 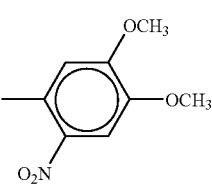 |

-continued
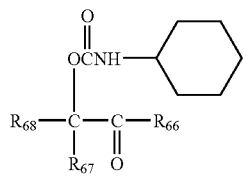
| | $R_{66}$ | $R_{67}$ | $R_{68}$ |
|---|---|---|---|
| PB-20 | phenyl | phenyl | —H |
| PB-21 | 2,5-dimethoxyphenyl | 2,5-dimethoxyphenyl | " |
| PB-22 | phenyl | " | " |
| PB-23 | 4-methoxyphenyl | " | " |
| PB-24 | 4-(methylthio)phenyl | " | " |
| PB-25 | naphthyl | " | " |
| PB-26 | phenyl | " | 2,5-dimethoxyphenyl |
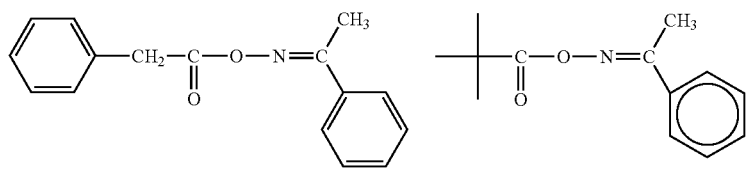
PB-27　　　　　　　　　　PB-28
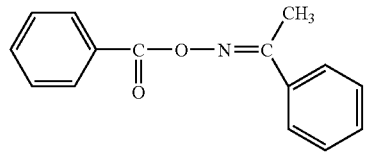
PB-29

-continued
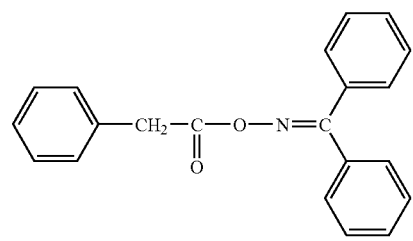
PB-30
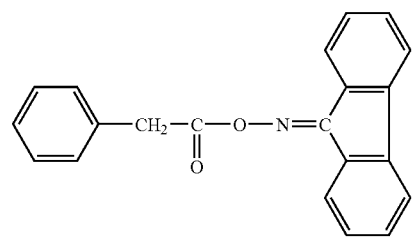
PB-31
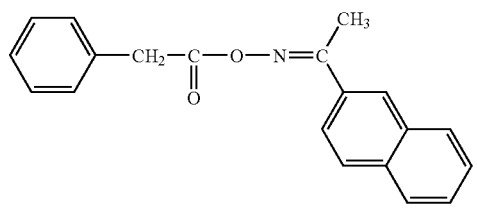
PB-32
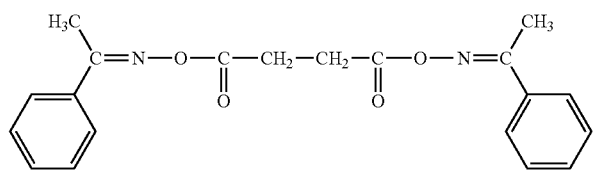
PB-33
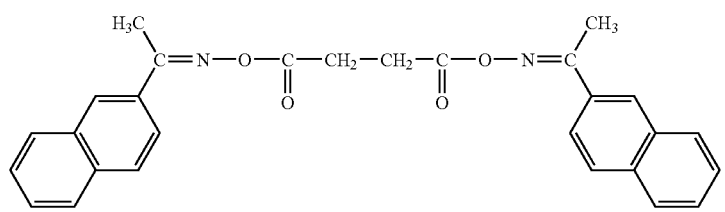
PB-34
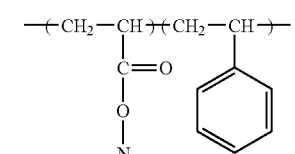 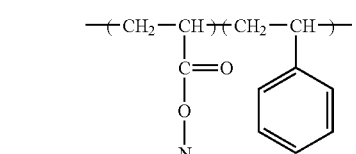
PB-35                    PB-36

-continued
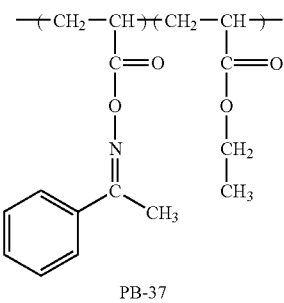
PB-37
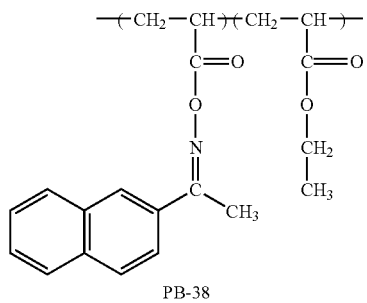
PB-38
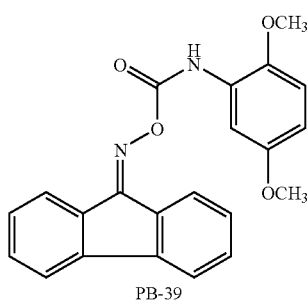
PB-39
| PB-40 | 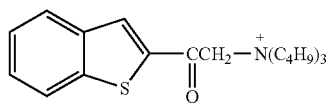 |
| PB-41 | 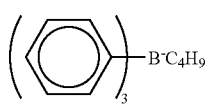 Cl⁻ |
| PB-42 | ⁻BF₄ |
| PB-43 | 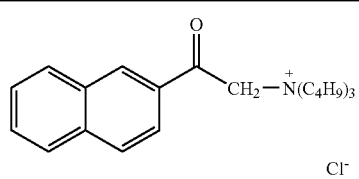 |
| PB-44 | 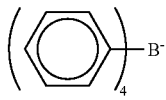 |

-continued
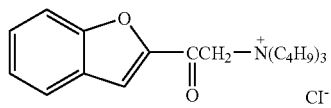
Cl⁻
| | |
|---|---|
| PB-45 | 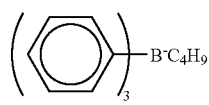 |
| PB-46 | 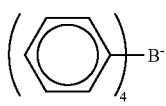 |
| | 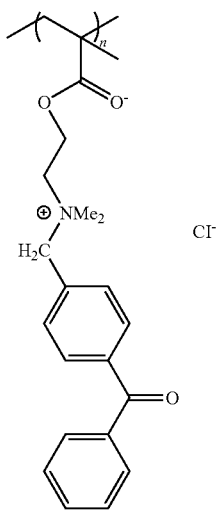 Cl⁻ |
| PB-47 | 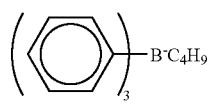 |
| PB-48 | 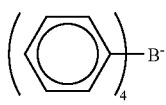 |
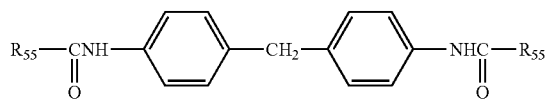
| | R₅₅ |
|---|---|
| PB-49 | —H |
| PB-50 | —CH₃ |
| PB-51 | 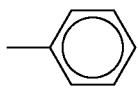 |

-continued

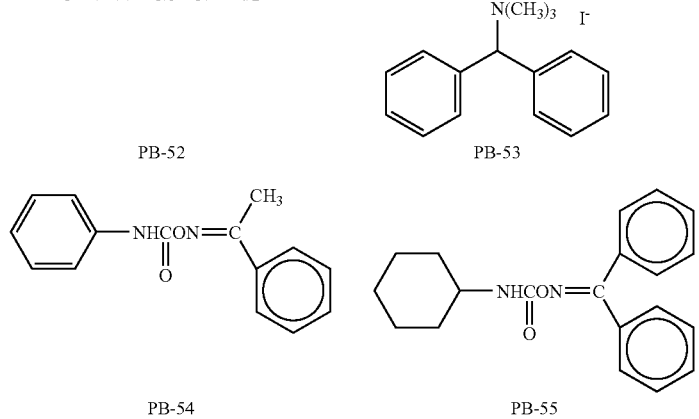

The dye precursor for use in the two-photon absorbing optical recording material of the present invention, which can become a color-forming material as a result of electron or energy transfer from the excited state of the two-photon absorbing compound or color-forming material, the color-forming material having absorption shifted to the longer wavelength side than in the original state and having absorption in the wavelength region where the molar absorption coefficient of linear absorption by the two-photon compound is 5,000 or less, is described in detail below.

The dye precursor for use in the present invention is preferably a dye precursor capable of becoming a color-forming material having absorption shifted to the longer wavelength side than in the original state, as a result of direct electron or energy transfer from the excited state of the two-photon absorbing compound or color-forming material, or under the action of an acid or base generated as a result of electron or energy transfer from the excited state of the two-photon absorbing compound or color-forming material to the acid or base generator.

In the two-photon absorbing optical recording material of the present invention, the recording is preferably performed by the modulation of refractive index. In other words, when reproducing the information, the color-forming material preferably has no or almost no absorption at the wavelength of light used for the reproduction.

Accordingly, the dye precursor for use in the present invention preferably becomes a color-forming material having no absorption at the wavelength of light used for reproduction and having absorption in the shorter wavelength side than that wavelength.

On the other hand, it is also preferred that even when the color-forming material has absorption at the wavelength of light used for reproduction, the color-forming material decomposes in the second step or in the subsequent fixing and loses its absorbing and sensitizing function.

Furthermore, the two-photon absorbing compound also preferably decomposes in the first step of forming a latent image by two-photon absorption, in the second step or in the subsequent fixing and loses its absorbing and sensitizing function.

In the two-photon absorbing optical recording and reproducing method of the present invention, the wavelength of light used for performing the recording by two-photon absorption and the wavelength of light used for reproducing the information are preferably the same.

As the dye precursor for use in the two-photon absorbing optical recording material of the present invention, the following combinations are preferred:

A) a combination comprising at least an acid-color forming dye precursor as the dye precursor and an acid generator and if desired, further containing an acid-increasing agent, B) a combination comprising at least a base-color forming dye precursor as the dye precursor and a base generator and if desired, further containing a base-increasing agent, C) a combination comprising a compound where an organic compound moiety having a function of cutting the covalent bond due to electron or energy transfer with the excited state of the two-photon absorbing compound or color-forming material is covalently bonded with an organic compound moiety of becoming a color-forming material when covalently bonded and when released, or further containing a base, and D) a combination comprising a compound capable of undergoing a reaction due to electron transfer with the excited state of two-photon absorbing compound or color-forming material and changing the absorption form.

In any of these cases, when an energy transfer mechanism from the excited state of the two-photon absorbing compound or color-forming material is used, the mechanism may be either a Forster mechanism where energy transfer occurs from the singlet excited state of the two-photon absorbing compound or color-forming material, or a Dexter mechanism where energy transfer occurs from the triplet excited state.

At this time, in order to cause energy transfer with good efficiency, the excitation energy of the two-photon absorbing compound or color-forming material is preferably larger than the excitation energy of the dye precursor.

In the case of electron transfer mechanism from the excited state of the two-photon absorbing compound or color-forming material, this may be either a mechanism where electron transfer occurs from the singlet excited state of the two-photon absorbing compound or color-forming material, or a mechanism where electron transfer occurs from the triplet excited state.

The excited state of the two-photon absorbing compound or color-forming material may give an electron to the dye precursor, acid generator or base generator or may receive an electron. In the case of giving an electron from the excited state of the two-photon absorbing compound or color-forming material, in order to cause efficient occurrence of electron transfer, the orbital (LUMO) where an excited electron is present in the excited state of the two-photon absorbing compound or color-forming material preferably has a higher energy than the LUMO orbital of the dye precursor or acid or base generator.

In the case where the excited state of the two-photon absorbing compound or color-forming material receives an electron, in order to cause efficient occurrence of electron transfer, the orbital (HOMO) where a hole is present in the excited state of the two-photon absorbing compound of color former preferably has a lower energy than the HOMO orbital of the dye precursor or acid or base generator.

The preferred combinations of the dye precursor for use in the two-photon absorbing optical recording material of the present invention are described in detail below.

The case where the dye precursor used in the two-photon absorbing optical recording material of the present invention is an acid-color forming dye precursor and further contains an acid generator is described below.

The acid generator is a compound capable of generating an acid as result of energy or electron transfer from the excited state of the two-photon absorbing compound or color-forming material. The acid generator is preferably stable in a dark place. The acid generator for use in the present invention is preferably a compound capable of generating an acid as a result of electron transfer from the excited state of the two-photon absorbing compound or color-forming material.

As the acid generator in the dye precursor for use in the present invention, the following 6 systems are preferred. Preferred examples thereof are the same as those described above for the cationic polymerization initiator.

1) Trihalomethyl-substituted triazine-base acid generator

2) Diazonium salt-base acid generator

3) Diaryliodonium salt-base acid generator

4) Sulfonium salt-base acid generator

5) Metal arene complex-base acid generator

6) Sulfonic acid ester-base acid generator

Among these acid generators for use in the present invention, more preferred are 3) diaryliodonium salt-base acid generator, 4) sulfonium salt-base acid generator, and 6) sulfonic acid ester-base acid generator.

In the case of using cationic polymerization and an acid-color forming precursor at the same time, it is preferred that the same compound functions as the cationic polymerization initiator and as the acid generator.

If desired, these acid generators may be used as a mixture of two or more thereof at an arbitrary ratio.

The acid-color forming dye precursor in the case where the dye precursor used in the two-photon absorbing optical recording material of the present invention is an acid-color forming dye precursor and further contains an acid generator, is described below.

The acid-color forming dye precursor for use in the present invention is a dye precursor which can become a color-forming material changed in the absorption from the original state, under the action of an acid generated from the acid generator. The acid-color forming dye precursor for use in the present invention is preferably a compound of which absorption is shifted to the lower wavelength side under the action of an acid, more preferably a compound which is colorless but is color-formed under the action of an acid.

Preferred examples of the acid-color forming dye precursor include triphenylmethane-base compounds, phthalide-base compounds (including indolylphthalide-base, azaphthalide-base and triphenylmethane phthalide-base compounds), phenothiazine-base compounds, phenoxazine-base compounds, fluoran-base compounds, thiofluoran-base compounds, xanthene-base compounds, diphenylmethane-base compounds, chromenopyrazole-base compounds, leucoauramine, methine-base compounds, azomethine-base compounds, Rhodamine lactam-base compounds, quinazoline-base compounds, diazaxanthene-base compounds, fluorene-base compounds and spiropyran-base compounds. Specific examples of these compounds are disclosed, for example, in JP-A-2002-156454 and patents cited therein, JP-A-2000-281920, JP-A-11-279328 and JP-A-8-240908.

The acid-color forming dye precursor is more preferably a leuco dye having a partial structure such as lactone, lactam, oxazine and spiropyran, and examples thereof include fluoran-base compounds, thiofluoran-base compounds, phthalide-base compounds, Rhodamine lactam-base compounds and spiropyran-base compounds.

The dye produced from the acid-color forming dye precursor for use in the present invention is preferably a xanthene dye, a fluoran dye or a triphenylmethane dye.

If desired, these acid-color forming dye precursors may be used as a mixture of two or more thereof at an arbitrary ratio.

Specific examples of the acid-color forming dye precursor preferred in the present invention are described below, however, the present invention is not limited to these specific examples.

The phthalide-base dye precursor is preferably represented by the following formula (21):

Formula (21):

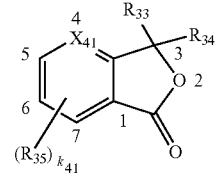

wherein $X_{41}$ represents CH or N, $R_{33}$ and $R_{34}$ each independently represents an alkyl group having a carbon number (hereinafter referred to as "a C number") of 1 to 20, an aryl group having a C number of 6 to 24, a heterocyclic group having a C number of 1 to 24 or a group represented by the following formula (22), $R_{35}$ represents a substituent (preferred examples of the substituent are the same as those of the substituent described for $R_{24}$), $R_{35}$ more preferably represents a halogen atom such as chlorine atom and bromine atom, an alkyl group having a C number of 1 to 20, an alkoxy group having a C number of 1 to 20, an amino group, an alkylamino group containing an alkyl group having a C number of 1 to 20, a dialkylamino group containing alkyl groups each independently having a C number of 1 to 20, an arylamino group containing an aryl group having a C number of 6 to 24, a diarylamino group containing aryl groups each independently having a C number of 6 to 24, a hydroxyl group, an alkoxy group having a C number of 1 to 20, or a heterocyclic group, $k_{41}$ represents an integer of 0 to 4, and when $k_{41}$ is an integer of 2 or more, multiple $R_{35}$s each independently represents a group described above. These groups each may further have a substituent and preferred examples of the substituent include the groups described for $R_{24}$.

Formula (22):

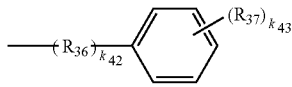

wherein $R_{36}$ represents an alkylene group having a C number of 1 to 3, $k_{42}$ represents an integer of 0 to 1, $R_{37}$ represents a substituent (preferred examples of the substituent are the same as those of the substituent described for $R_{24}$), $R_{37}$ more preferably represents a halogen atom such as chlorine atom and bromine atom, an alkyl group having a C number of 1 to 20, an alkoxy group having a C number of 1 to 20, an amino group, an alkylamino group containing an alkyl group having a C number of 1 to 20, a dialkylamino group containing alkyl groups each independently having a C number of 1 to 20, an arylamino group containing an aryl group having a C number of 6 to 24, a diarylamino group containing aryl groups each independently having a C number of 6 to 24, a hydroxyl group, an alkoxy group having a C number of 1 to 20, or a heterocyclic group, $k_{43}$ represents an integer of 0 to 5, and when $k_{43}$ is an integer of 2 or more, multiple $R_{37}$s each independently represents a group described above. These groups each may further have a substituent and preferred examples of the substituent include the groups described for $R_{24}$.

The heterocyclic group represented by $R_{33}$ and $R_{34}$ in formula (21) is preferably an indolyl group represented by the following formula (23):

Formula (23):

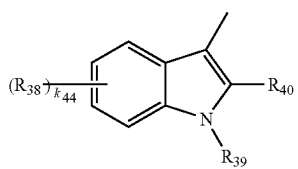

wherein $R_{38}$ represents a substituent (preferred examples of the substituent are the same as those of the substituent described for $R_{24}$), $R_{38}$ more preferably represents a halogen atom such as chlorine atom and bromine atom, an alkyl group having a C number of 1 to 20, an alkoxy group having a C number of 1 to 20, an amino group, an alkylamino group containing an alkyl group having a C number of 1 to 20, a dialkylamino group containing alkyl groups each independently having a C number of 1 to 20, an arylamino group containing an aryl group having a C number of 6 to 24, a diarylamino group containing aryl groups each independently having a C number of 6 to 24, a hydroxyl group, an alkoxy group having a C number of 1 to 20, or a heterocyclic group, $k_{44}$ represents an integer of 0 to 4, and when $k_{44}$ is an integer of 2 or more, multiple $R_{38}$s each independently represents a group described above, $R_{39}$ represents an alkyl group having a C number of 1 to 20, $R_{40}$ represents an alkyl group having a C number of 1 to 20 or an alkoxy group having a C number of 1 to 20. These groups each may further have a substituent and preferred examples of the substituent include the groups described for $R_{24}$.

Specific examples of the phthalide-base dye precursor (including indolylphthalide-base dye precursor and aza-phthalide-base dye precursor) include 3,3-bis(4-diethyl-aminophenyl)-6-diethylaminophthalide, 4-(4-diethylaminophenyl)-3-(1-ethyl-2-methylindol-3-yl)phthalide, 3-(4-dimethylaminophenyl)-3-(1,3-dimethylindol-3-yl) phthalide, 3,3-bis(1-n-butyl-2-methylindol-3-yl)phthalide, 3,3-bis(1-ethyl-2-methylindol-3-yl)phthalide, 3-(4-diethylamino-2-ethoxyphenyl)-3-1-ethyl-2-methylindol-3-yl)-4-azaphthalide, 3,3-bis(4-hydroxyphenyl)-6-hydroxyphthalide, 3,3-bis(4-hexyloxyphenyl)phthalide and 3,3-bis(4-hexyloxyphenyl)-6-methoxyphthalide.

The phthalide-base dye precursor represented by formula (21) is more preferably a triphenylmethane phthalide-base dye precursor represented by the following formula (24):

Formula (24):

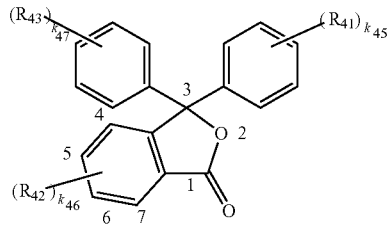

wherein $R_{41}$, $R_{42}$ and $R_{43}$ each independently represents a substituent (preferred examples of the substituent are the same as those of the substituent described for $R_{24}$), the substituent represented by $R_{41}$, $R_{42}$ and $R_{43}$ is more preferably a halogen atom such as chlorine atom and bromine atom, an alkyl group having a C number of 1 to 20, an alkoxy group having a C number of 1 to 20, an amino group, an alkylamino group containing an alkyl group having a C number of 1 to 20, a dialkylamino group containing alkyl groups each independently having a C number of 1 to 20, an arylamino group containing an aryl group having a C number of 6 to 24, a diarylamino group containing aryl groups each independently having a C number of 6 to 24, a hydroxyl group, an alkoxy group having a C number of 1 to 20, or a heterocyclic group, $k_{45}$, $k_{46}$ and $k_{47}$ each independently represents an integer of 0 to 4, and when $k_{45}$, $k_{46}$ and $k_{47}$ each is an integer of 2 or more, multiple $R_{41}$s, $R_{42}$s or $R_{43}$s each independently represents a group described above. These groups each may further have a substituent and preferred examples of the substituent include the groups described for $R_{24}$.

Specific examples of the triphenylmethane phthalide-base dye precursor include 3,3-bis(p-dimethylaminophenyl)-6-dimethylaminophthalide (that is, crystal violet lactone), 3,3-bis(p-dimethylaminophenyl)phthalide, 3,3-bis(p-dihexyl-aminophenyl)-6-dimethylaminophthalide, 3,3-bis(p-dioctyl-aminophenyl)phthalide, 3,3-bis(p-dimethylaminophenyl)-6-diethylaminophthalide, 4-hydroxy-4'-dimethylaminotriphenyl-methane lactone, 4,4'-bisdihydroxy-3,3'-bisdiamino-triphenylmethane lactone, 3,3-bis(4-hydroxyphenyl)-4-hydroxyphthalide, 3,3-bis(4-hexyloxyphenyl)phthalide and 3,3-bis(4-hexyloxyphenyl)-6-methoxyphthalide.

The fluoran-base dye precursor is preferably represented by the following formula (25):

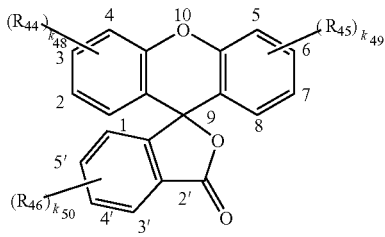

Formula (25):

wherein $R_{44}$, $R_{45}$ and $R_{46}$ each independently represents a substituent (preferred examples of the substituent are the same as those of the substituent described for $R_{24}$), the substituent represented by $R_{44}$, $R_{45}$ and $R_{46}$ is more preferably a halogen atom such as chlorine atom and bromine atom, an alkyl group having a C number of 1 to 20, an alkoxy group having a C number of 1 to 20, an amino group, an alkylamino group containing an alkyl group having a C number of 1 to 20, a dialkylamino group containing alkyl groups each independently having a C number of 1 to 20, an arylamino group containing an aryl group having a C number of 6 to 24, a diarylamino group containing aryl groups each independently having a C number of 6 to 14, a hydroxyl group or a heterocyclic group, $k_{48}$, $k_{49}$ and $k_{50}$ each independently represents an integer of 0 to 4, and when $k_{48}$, $k_{49}$ and $k_{50}$ each is an integer of 2 or more, multiple $R_{44}$s, $R_{45}$s or $R_{46}$s each independently represents a group described above. These groups each may further have a substituent and preferred examples of the substituent include the groups described for $R_{24}$.

Specific examples of the fluoran-base dye precursor include 3-diethylamino-6-(2-chloroanilino)fluoran, 3-dibutylamino-6-(2-chloroanilino)fluoran, 3-diethylamino-7-methyl-6-anilinofluoran, 3-dibutylamino-7-methyl-6-anilinofluoran, 3-dipentylamino-7-methyl-6-anilinofluoran, 3-(N-ethyl-N-isopentylamino)-7-methyl-6-anilinofluoran, 3-diethylamino-7-methyl-6-xylidinofluoran, 3-diethylamino-6,7-benzofluoran, 3-diethylamino-7-methoxy-6,7-benzofluoran, 1,3-dimethyl-6-diethylaminofluoran, 2-bromo-3-methyl-6-dibutylaminofluoran, 2-N,N-dibenzylamino-6-diethylaminofluoran, 3-dimethylamino-6-methoxyfluoran, 3-diethylamino-7-methyl-6-chlorofluoran, 3-diethylamino-6-methoxyfluoran, 3,6-bisdiethylaminofluoran, 3,6-dihexyloxyfluoran, 3,6-dichlorofluoran and 3,6-diacetyloxyfluoran.

Specific examples of the Rhodamine lactam-base dye precursor include Rhodamine-B-anilinolactam, Rhodamine-B-(p-chloroanilino)lactam and Rhodamine-B-(o-chloroanilino)-lactam.

Specific examples of the spiropyran-base dye precursor include 3-methyl-spirodinaphthopyran, 3-ethyl-spirodinaphthopyran, 3,3'-dichloro-spirodinaphthopyran, 3-benzyl-spirodinaphthopyran, 3-propyl-spirodibenzopyran, 3-phenyl-8'-methoxybenzoindolinospiropyran, 8'-methoxybenzoindolinospiropyran and 4,7,8'-trimethoxybenzoindolinospiropyran.

Other specific examples include spiropyran-base dye precursors disclosed in JP-A-2000-281920.

In addition, BLD compounds represented by formula (6) of JP-A-2000-284475, leuco dyes disclosed in JP-A-2000-144004, and leuco dyes having structures shown below can also be suitably used as the acid-color forming dye precursor for use in the present invention.

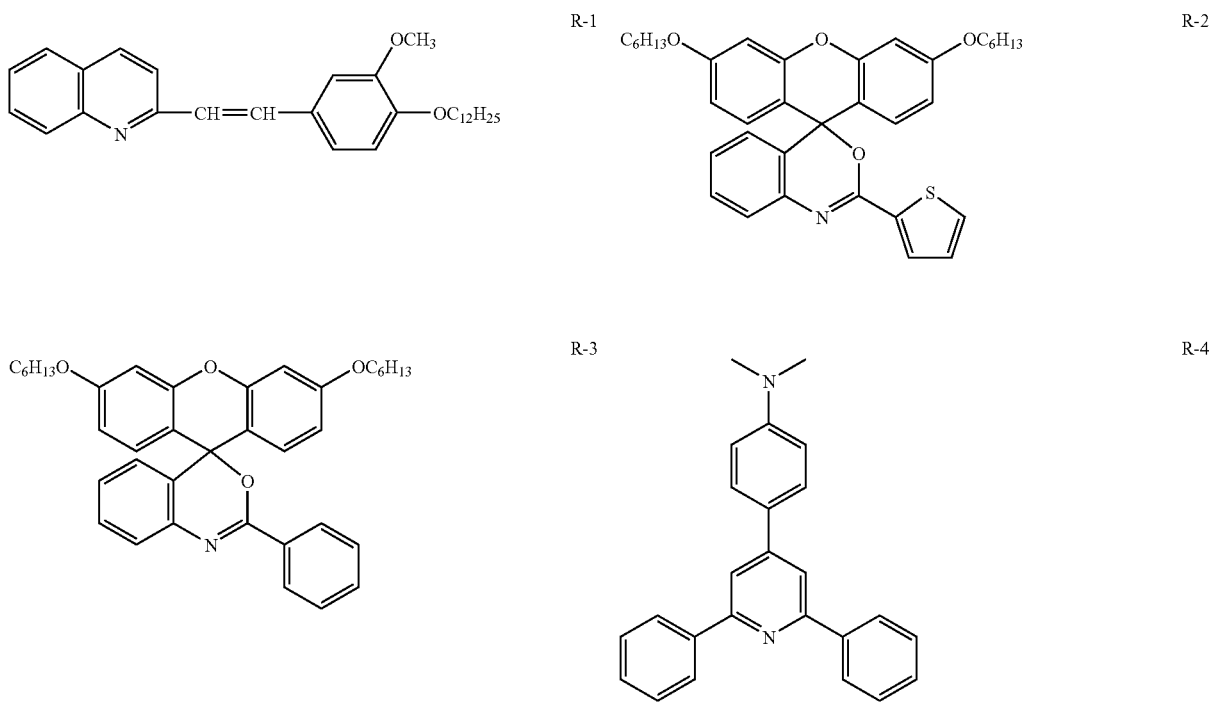

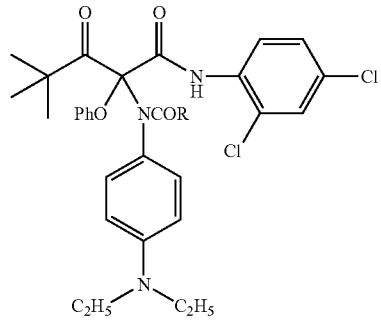

R-5

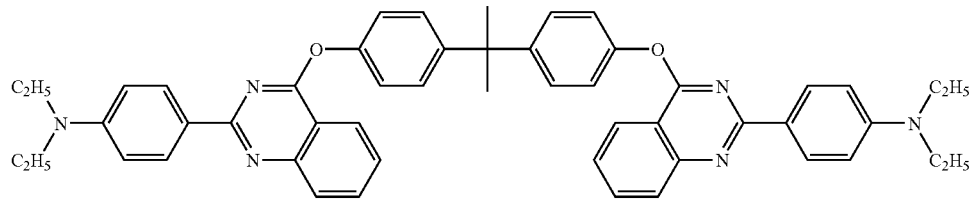

R-6

R = -CH₃
-CO₂C₂H₅
-CO₂CH₂Ph
-CO₂C₄H₉ᵗ

When the dye precursor group for use in the present invention contains at least an acid-color forming dye precursor as the dye precursor and an acid generator, the dye precursor group may further contain an acid-increasing agent.

The acid-increasing agent for use in the present invention is a compound of increasing an acid by using, as a trigger, a small amount of acid generated from the acid generator and this compound is stable in the absence of an acid but when an acid is present, decomposes to release an acid which triggers decomposition of another acid-increasing agent to also release an acid.

The acid-increasing agent is preferably represented by formula (34-1), (34-2), (34-3), (34-4), (34-5) or (34-6).

In formulae (34-1) to (34-6), $R_{101}$ represents a group of becoming, in the form of $R_{101}OH$, an acid having a pKa of 5 or less, preferably an acid having a pKa of 3 or less.

$R_{101}$ is preferably a group of becoming, in the form of $R_{101}OH$, a sulfonic acid, a carboxylic acid, a phosphoric acid, a phosphonic acid or a phosphinic acid, more preferably a sulfonic acid or an electron-withdrawing group-substituted carboxylic acid. The electron-withdrawing group is preferably a halogen atom, a cyano group, a nitro group, an alkoxycarbonyl group, a carbamoyl group, an alkylsulfonyl group, an arylsulfonyl group or a heterocyclic group. $R_{101}$ is most preferably a group of becoming a sulfonic acid in the form of $R_{101}OH$.

Specific preferred examples of $R_{101}$ are set forth below, however, the present invention is not limited thereto.

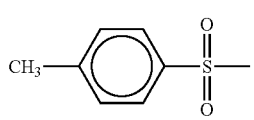

A-1

-continued

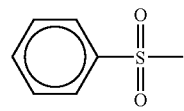

A-2

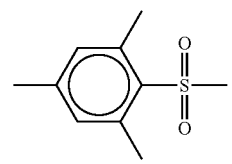

A-3

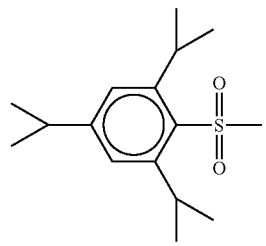

A-4

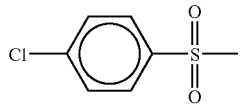

A-5

A-6

-continued

A-7 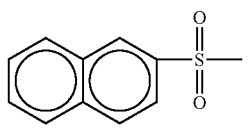

A-8 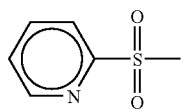

A-9 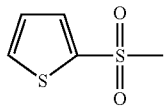

A-10 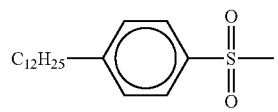

A-11 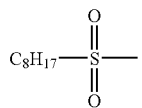

A-12 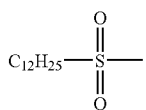

A-13 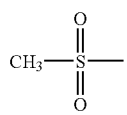

A-14 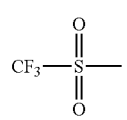

A-15 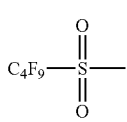

A-16 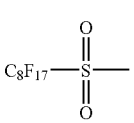

A-17 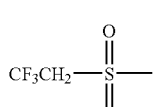

A-18 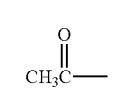

A-19 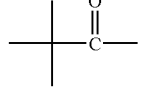

A-20 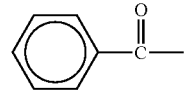

A-21 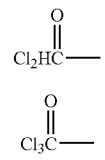

A-22 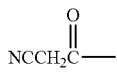

A-23 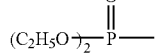

A-24 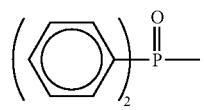

A-25 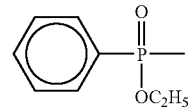

A-26

In formula (34-1), $R_{102}$ represents a 2-alkyl-2-propyl group, a 2-aryl-2-propyl group, a cyclohexyl group, a tetrahydropyranyl group or a bis(p-alkoxyphenyl)methyl group, preferably a 2-alkyl-2-propyl group or a 2-aryl-2-propyl group, more preferably a 2-alkyl-2-propyl group, and most preferably a tert-butyl group.

In formula (34-1), $R_{103}$ and $R_{104}$ each independently represents a substituent (preferred examples of the substituent are the same as those of the substituent described for $R_{24}$), more preferably an alkyl group, an alkenyl group, a cycloalkyl group, an aryl group or a heterocyclic group, still more preferably an alkyl group or an aryl group, and most preferably an alkyl group.

In formulae (34-1) to (34-6), $R_{105}$, $R_{106}$, $R_{107}$, $R_{110}$, $R_{113}$ and $R_{116}$ each independently represents a hydrogen atom or a substituent (preferred examples of the substituent are the same as those of the substituent described for $R_{24}$), more preferably a hydrogen atom, an alkyl group, an alkenyl group, a cycloalkyl group, an aryl group or a heterocyclic group, still more preferably a hydrogen atom, an alkyl group or an aryl group.

$R_{105}$, $R_{106}$ and $R_{116}$ all are preferably a hydrogen atom. $R_{107}$, $R_{110}$ and $R_{113}$ are more preferably an alkyl group.

In formula (34-2), $R_{108}$ and $R_{109}$ each independently represents an alkyl group, preferably a methyl group or an ethyl group. Also, $R_{108}$ and $R_{109}$ may combine with each other to form a ring and the ring formed is preferably a dioxal ring or a dioxane ring.

In formula (34-3), $R_{111}$ and $R_{112}$ represent alkyl groups which combine with each other to form a ring. The ring formed is preferably a saturated cycloalkane ring.

In formula (34-4), $R_{114}$ represents a hydrogen atom or a nitro group, preferably a nitro group, $R_{115}$ represents a substituent, and n101 represents an integer of 0 to 3, preferably 0 or 1, more preferably 0.

In formula (34-6), $R_{117}$ represents a substituent (preferred examples of the substituent are the same as those of the substituent described for $R_{24}$), more preferably an alkyl group, an alkenyl group, a cycloalkyl group, an aryl group or a heterocyclic group, still more preferably an alkyl group or an aryl group, and most preferably an alkyl group.

The acid-increasing agent for use in the present invention is preferably represented by formula (34-1), (34-3) or (34-4), and most preferably represented by formula (34-1).

Specific examples of the acid-increasing agent for use in the present invention are set forth below, however, the present invention is not limited thereto.

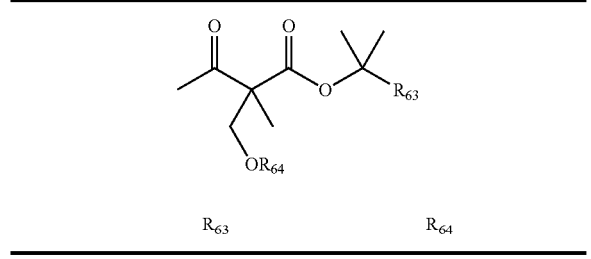

| | $R_{63}$ | $R_{64}$ |
|---|---|---|
| AA-1 | —CH₃ | 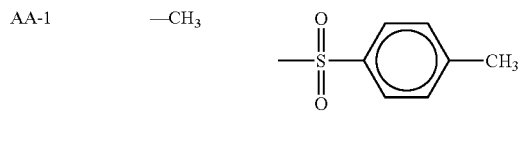 |
| AA-2 | 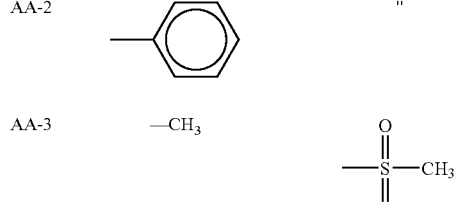 | " |
| AA-3 | —CH₃ | 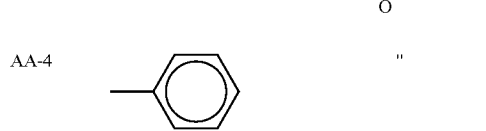 |
| AA-4 | 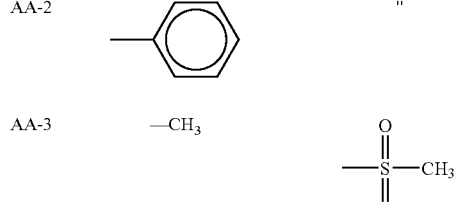 | " |
| AA-5 | —CH₃ | —C(O)CHCl₂ |
| AA-6 | 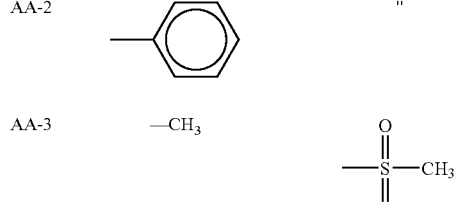 | —C(O)CHCl₂ |
| AA-7 | —CH₃ | —C(O)Ph |
| AA-8 | —CH₃ | —C(O)CF₃ |
| AA-9 | —CH₃ | SO₂CF₃ |
| AA-10 | —CH₃ | SO₂C₄F₉ |

-continued

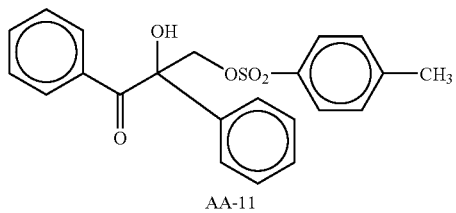

AA-11

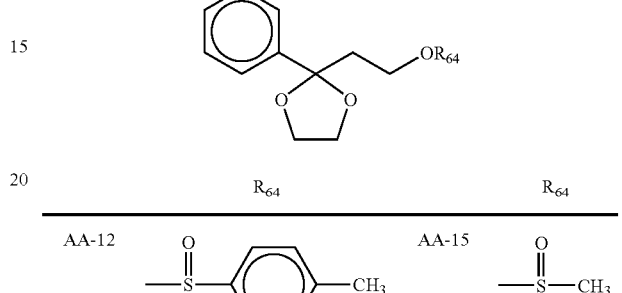

| | $R_{64}$ | | $R_{64}$ |
|---|---|---|---|
| AA-12 | 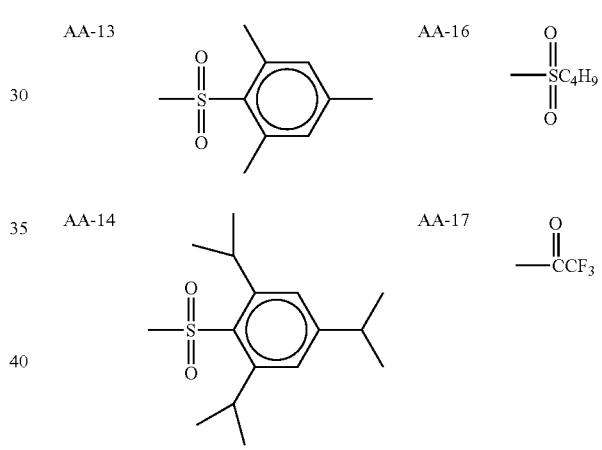 | AA-15 | |
| AA-13 | | AA-16 | |
| AA-14 | | AA-17 | |

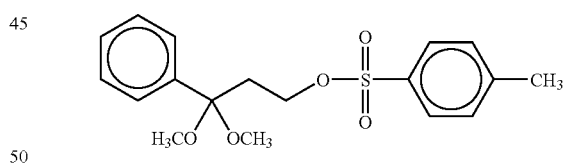

AA-18

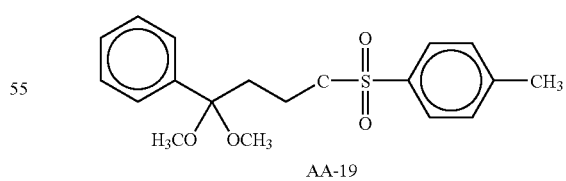

AA-19

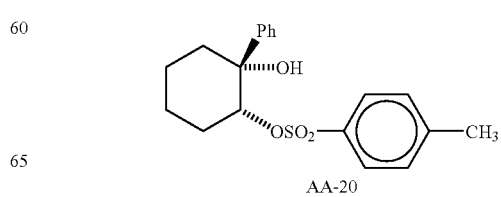

AA-20

-continued
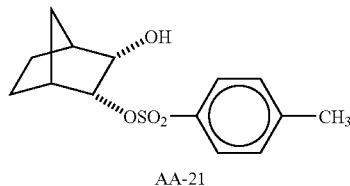
AA-21
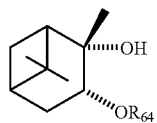
R₆₄
AA-22
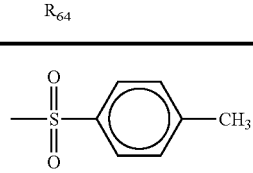
AA-23
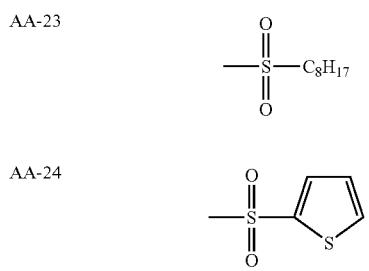
AA-24
AA-25
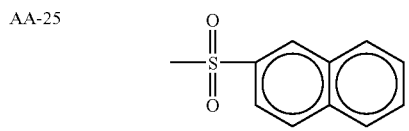
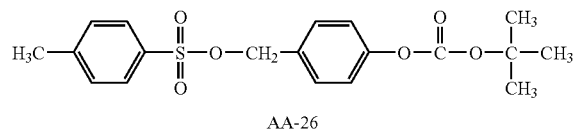
AA-26
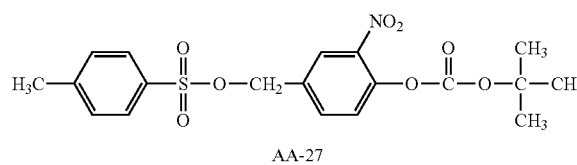
AA-27
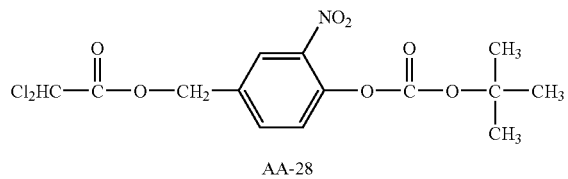
AA-28
-continued
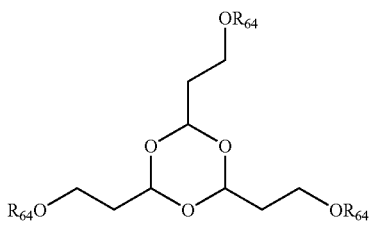
R₆₄
AA-29
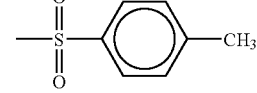
AA-30
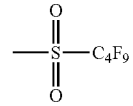
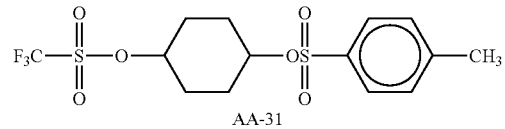
AA-31
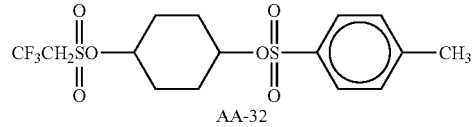
AA-32
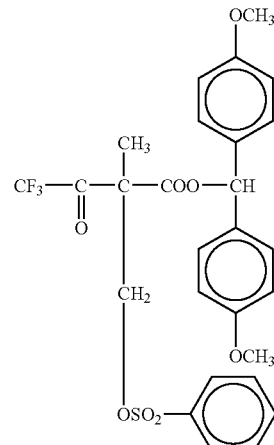
AA-33
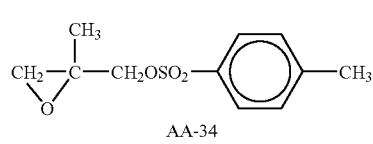
AA-34
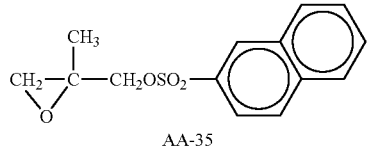
AA-35

The acid-increasing agent is preferably heated and therefore, this is preferably heat-treated in the second step or in the separately provided fixing step.

The case where the dye precursor used in the two-photon absorbing optical recording material of the present invention is a base-color forming dye precursor and further contains a base generator is described below.

The base generator is a compound capable of generating a base as a result of energy or electron transfer from the excited state of the two-photon absorbing compound or color-forming material. The base generator is preferably stable in a dark place. The base generator for use in the present invention is preferably a compound capable of generating a base as a result of electron transfer from the excited state of the two-photon absorbing compound or color-forming material.

The base generator for use in the present invention preferably generates a Broensted base by light, more preferably generates an organic base, still more preferably generates an amine as the organic base.

Preferred examples of the base generator in the dye precursor for use in the present invention are the same as those of the above-described base generator for the anionic polymerization initiator.

In the case of using anionic polymerization and a base-color forming precursor at the same time, it is preferred that the same compound functions as the anionic polymerization initiator and as the base generator.

If desired, these base generators may be used as a mixture of two or more thereof at an arbitrary ratio.

The base-color forming dye precursor in the case where the dye precursor used in the two-photon absorbing optical recording material of the present invention is a base-color forming dye precursor and further contains a base generator, is described below.

The base-color forming dye precursor for use in the present invention is a dye precursor which can become a color-forming material changed in the absorption from the original state, under the action of a base generated from the base generator.

The base-color forming dye precursor for use in the present invention is preferably a compound of which absorption is shifted to the lower wavelength side under the action of a base, more preferably a compound which is colorless but is color-formed under the action of a base.

The base-color forming dye precursor for use in the present invention is preferably a non-dissociated form of a dissociation-type dye. The dissociation-type dye is a compound in which a dissociative group having a pKa of 12 or less, preferably 10 or less, and capable of readily dissociating to release a proton is present on the dye chromophore and when changed from the non-dissociated form to the dissociated form, absorption is shifted to the longer wavelength side or the colorless state turns to the color-formed state. Preferred examples of the dissociative group include a OH group, a SH group, a COOH group, a $PO_3H_2$ group, a $SO_3H$ group, a $NR_{91}R_{92}H^+$ group, a $NHSO_2R_{93}$ group, a $CHR_{94}R_{95}$ group and a $NHR_{96}$ group.

$R_{91}$, $R_{92}$ and $R_{96}$ each independently represents a hydrogen atom, an alkyl group, an alkenyl group, a cycloalkyl group, an aryl group or a heterocyclic group (preferred examples of these groups are the same as those for $R_{203}$), preferably a hydrogen atom or an alkyl group. $R_{93}$ represents an alkyl group, an alkenyl group, a cycloalkyl group, an aryl group or a heterocyclic group (preferred examples of these groups are the same as those for $R_{203}$), preferably an alkyl group which may be substituted, or an aryl group which may be substituted, more preferably an alkyl group which may be substituted, and the substituent here preferably has electron-withdrawing property and is preferably fluorine.

$R_{94}$ and $R_{95}$ each independently represents a substituent (preferred examples of the substituent are the same as those of the substituent described for $R_{203}$), but an electron-withdrawing group is preferred and this is preferably a cyano group, an alkoxycarbonyl group, a carbamoyl group, an acyl group, an alkylsulfonyl group or an arylsulfonyl group.

The dissociative group in the dissociation-type dye for use in the present invention is preferably a OH group, a COOH group, a $NHSO_2R_{93}$ group, a $NHR_{96}$ group or a $CHR_{94}R_{95}$ group, more preferably a OH group or a $CHR_{94}R_{95}$ group, and most preferably a OH group.

The non-dissociated form of a dissociation-type dye, which is preferred as the base-color forming dye precursor for use in the present invention, is a non-dissociated form of a dissociation-type azo dye, a dissociation-type azomethine dye, a dissociation-type oxonol dye, a dissociation-type arylidene dye, a dissociation-type xanthene dye, a dissociation-type fluoran dye or a dissociation-type triphenylamine dye, more preferably a non-dissociated form of a dissociation-type azo dye, a dissociation-type azomethine dye, a dissociation-type oxonol dye or a dissociation-type arylidene dye.

As examples of the base-color forming dye precursor for use in the present invention, examples of the non-dissociated form of a dissociation-type dye are set forth below, however, the present invention is not limited thereto.

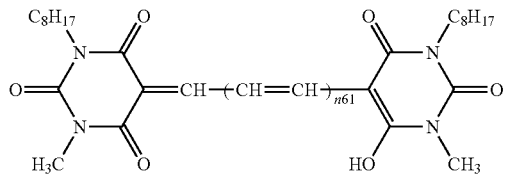

| | $n_{61}$ |
|---|---|
| DD-1 | 1 |
| DD-2 | 2 |
| DD-3 | 3 |

-continued
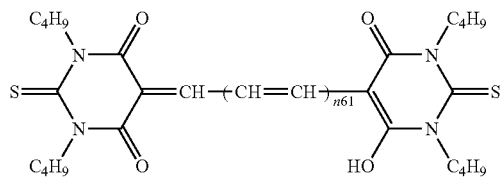
| | $n_{61}$ |
|---|---|
| DD-4 | 0 |
| DD-5 | 1 |
| DD-6 | 2 |
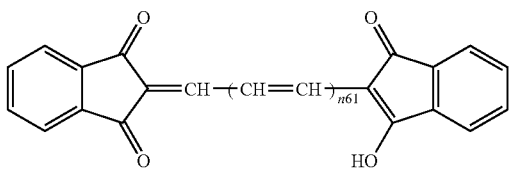
| | $n_{61}$ |
|---|---|
| DD-7 | 0 |
| DD-8 | 1 |
| DD-9 | 2 |
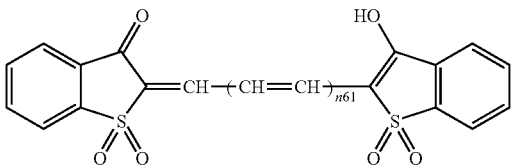
| | $n_{61}$ |
|---|---|
| DD-10 | 0 |
| DD-11 | 1 |
| DD-12 | 2 |
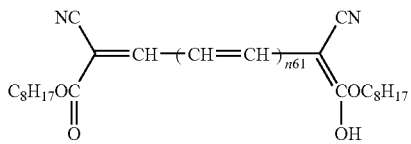
| | $n_{61}$ |
|---|---|
| DD-13 | 0 |
| DD-14 | 1 |
| DD-15 | 2 |
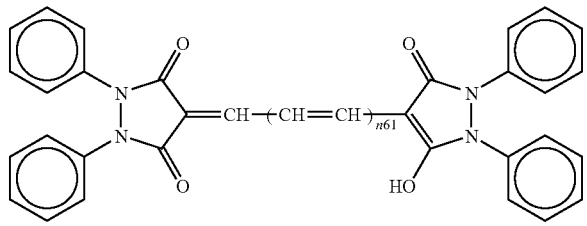
| | $n_{61}$ |
|---|---|
| DD-16 | 0 |
| DD-17 | 2 |
| DD-18 | 3 |

-continued
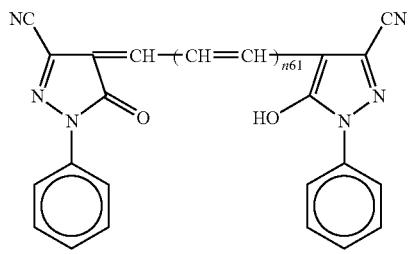
| | $n_{61}$ |
|---|---|
| DD-19 | 1 |
| DD-20 | 2 |
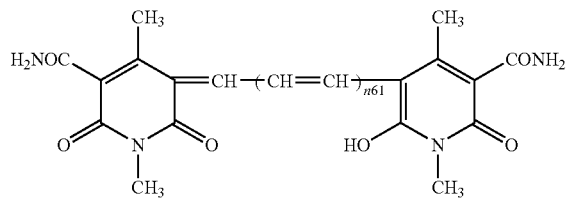
| | $n_{61}$ |
|---|---|
| DD-21 | 1 |
| DD-22 | 2 |
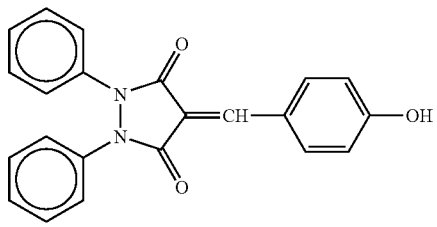
DD-23
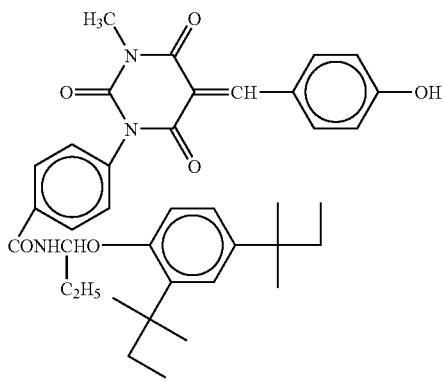
DD-24
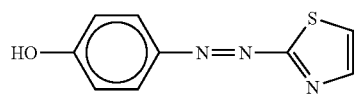
DD-25

-continued
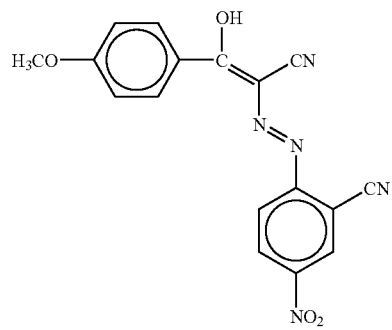
DD-26
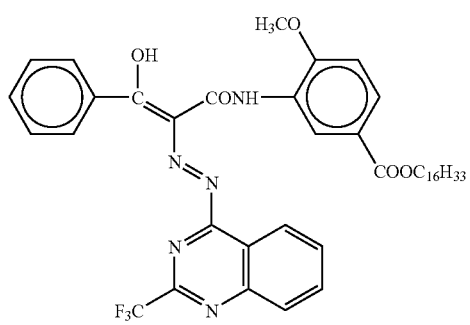
DD-27
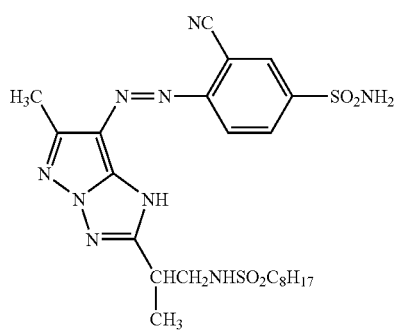
DD-28
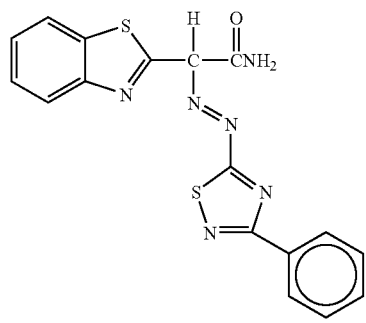
DD-29

-continued
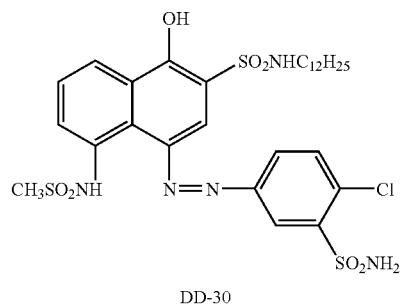
DD-30
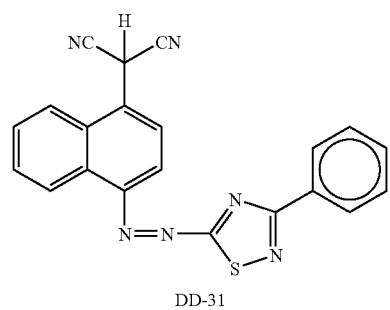
DD-31
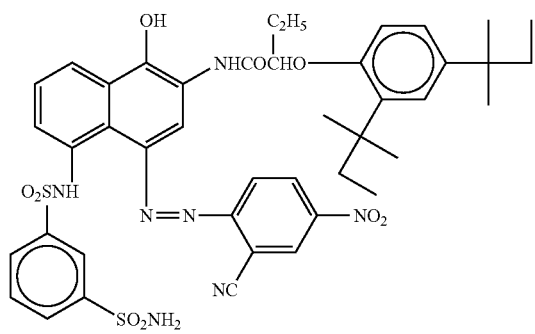
DD-32
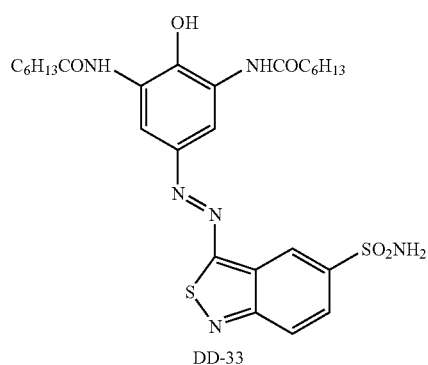
DD-33

-continued
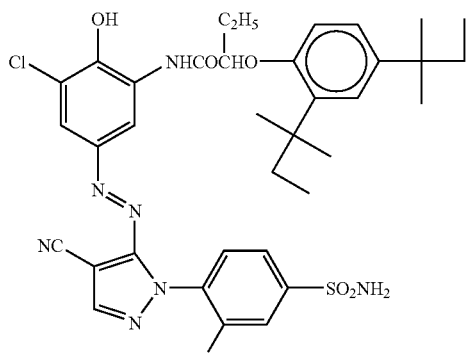
DD-34
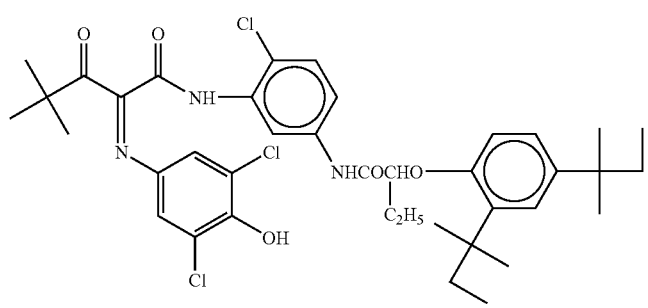
DD-35
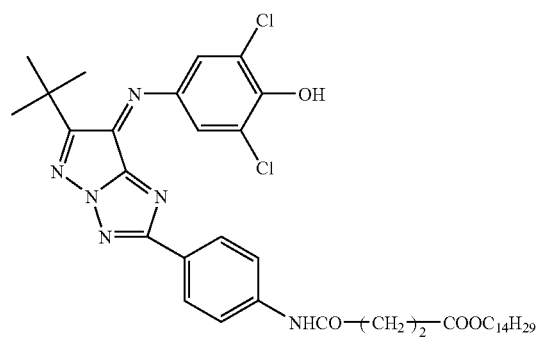
DD-36
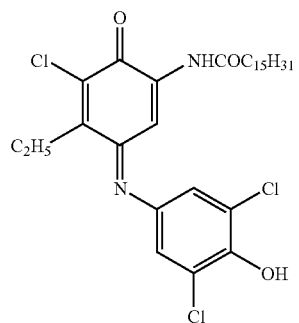
DD-37
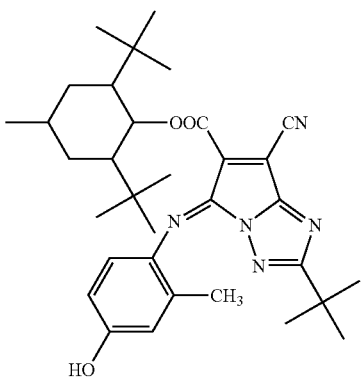
D-38

-continued
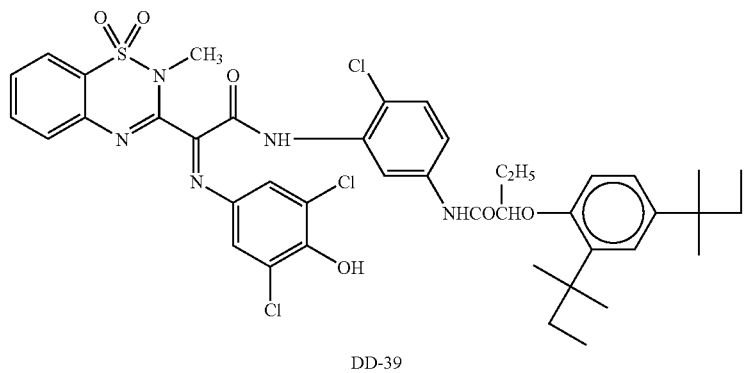
DD-39
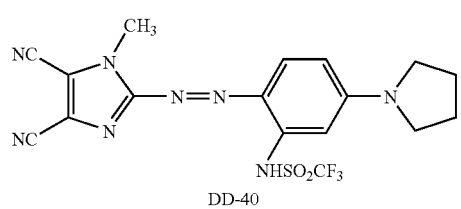
DD-40
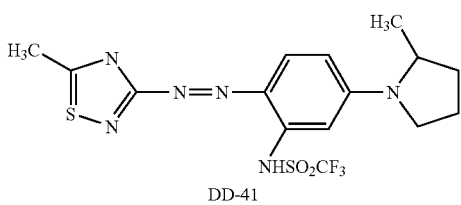
DD-41
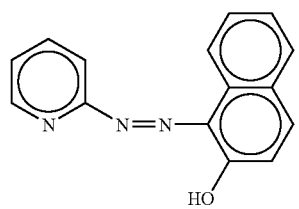
DD-42
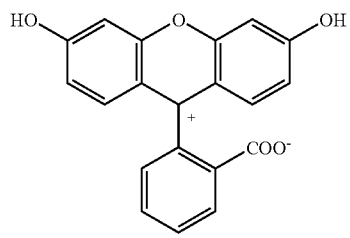
DD-43
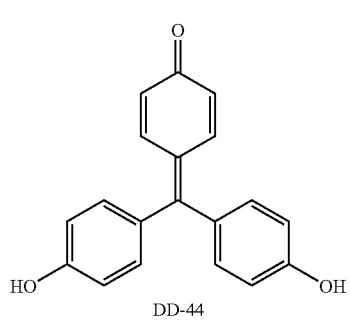
DD-44
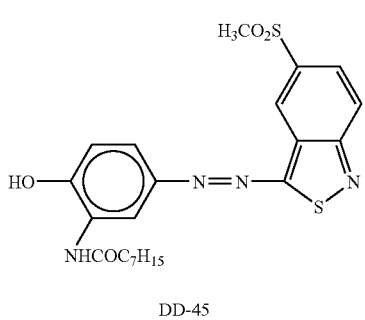
DD-45
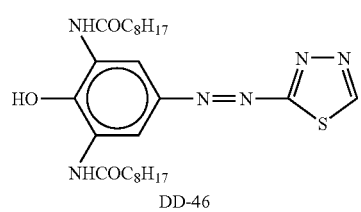
DD-46

When the dye precursor for use in the present invention is a base-color forming dye precursor, the dye precursor may further contain a base-increasing agent in addition to the base generator.

The base-increasing agent for use in the present invention is a compound of increasing a base by using, as a trigger, a small amount of base generated from the base generator and this compound is stable in the absence of a base but when a base is present, decomposes to release a base which triggers decomposition of another base-increasing agent to also release a base.

The base-increasing agent is preferably represented by formula (35).

In formula (35), $R_{12}$, and $R_{122}$ each independently represents a hydrogen atom, an alkyl group, an alkenyl group, a cycloalkyl group, an aryl group or a heterocyclic group (preferred examples of these substituents are the same as those of the substituent described for $R_1$), more preferably a hydrogen atom, an alkyl group or a cycloalkyl group, more preferably a hydrogen atom, a methyl group, an ethyl group, a cyclohexyl group or a cyclopentyl group.

$R_{121}$ and $R_{122}$ may combine with each other to form a ring and the heterocyclic ring formed is preferably a piperidine ring, a pyrrolidine ring, a piperazine ring, a moropholine ring, a pyridine ring, a quinoline ring or an imidazole ring, more preferably a piperidine ring, a pyrrolidine ring or an imidazole ring, and most preferably a piperidine ring.

Examples of the preferred combination of $R_{121}$ and $R_{122}$ include a combination where $R_{121}$ is a cyclohexyl group which may be substituted, and $R_{122}$ is a hydrogen atom, a combination where $R_{121}$ is an alkyl group which may be substituted, and $R_{122}$ is a hydrogen atom, and a combination where $R_{121}$ and $R_{122}$ are combined to form a piperidine ring or an imidazole ring.

$R_{123}$ and $R_{124}$ each independently represents a hydrogen atom or a substituent (preferred examples of the substituent are the same as those of the substituent described for $R_{203}$), preferably a hydrogen atom, an aryl group or an arylsulfonyl group, more preferably an aryl group.

$R_{123}$ and $R_{124}$ may combine with each other to form a ring and the ring formed is preferably a fluorene ring.

$R_{125}$ and $R_{126}$ each independently represents a hydrogen atom or a substituent (preferred examples of the substituent are the same as those of the substituent described for $R_{203}$), preferably a hydrogen atom or an alkyl group, more preferably a hydrogen atom or a methyl group.

n102 represents an integer of 0 or 1, preferably 1.

The base-increasing agent for use in the present invention is more preferably a compound represented by formula (36-1) or (36-2).

In formulae (36-1) and (36-2), $R_{12}$, and $R_{122}$ have the same meanings as in formula (35).

The base-increasing agent for use in the present invention is still more preferably a compound represented by formula (36-1).

Specific examples of the base-increasing agent for use in the present invention are set forth below, however, the present invention is not limited thereto.

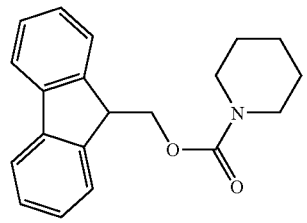

BA-1

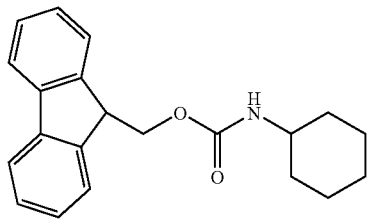

BA-2

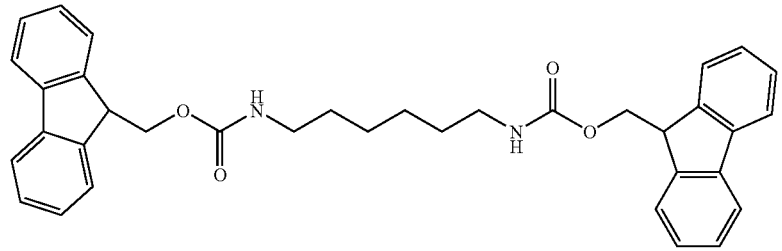

BA-3

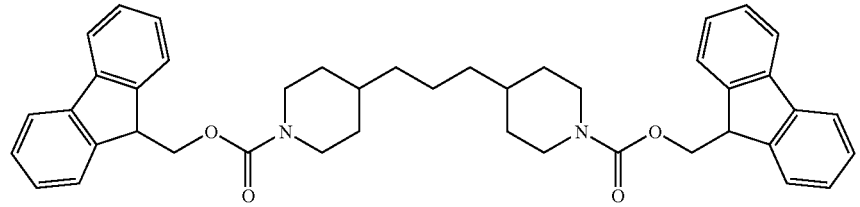

BA-4

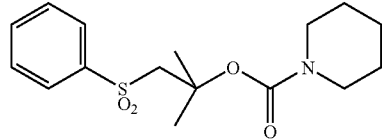

BA-5

-continued

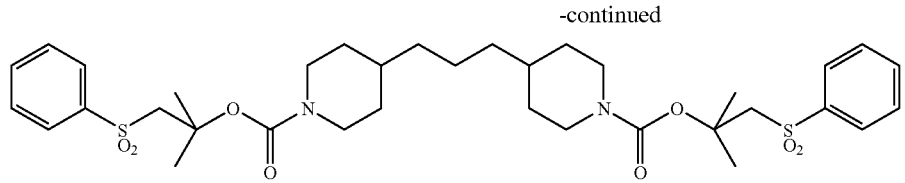
BA-6

The base-increasing agent is preferably heated and therefore, when a base-increasing agent is used in the two-photon absorbing optical recording material of the present invention, this is preferably heat-treated in the second step or in the separately provided fixing step.

The case where the dye precursor for use in the present invention is a compound in which an organic compound moiety having a function of cutting the covalent bond due to electron or energy transfer with the excited state of the two-photon absorbing compound or color-forming material is covalently bonded with an organic compound moiety of becoming a color-forming material when covalently bonded and when released is described below.

In this case, the dye precursor group for use in the present invention preferably contains at least a dye precursor represented by formula (32).

In formula (32), A1 and PD are covalently bonded, A1 represents an organic compound moiety having a function of cutting the covalent bond with PD due to electron or energy transfer with the excited state of two-photon absorbing compound or color-forming material, and PD represents an organic compound moiety of becoming a color-forming material when covalently bonded with A1 and when released as a result of cutting of the covalent bond with A1

A1 is preferably an organic compound moiety having a function of cutting the covalent bond with PD due to electron transfer with the excited state of the two-photon absorbing compound or color-forming material.

PD is preferably a group comprising a dissociation-type dye such as dissociation-type azo dye, dissociation-type azomethine dye, dissociation-type oxonol dye and dissociation-type arylidene dye, or a dye capable of becoming a so-called "leuco dye", such as triphenylmethane dye and xanthene dye, and this is connected to A1 through a covalent bond on the chromophore.

PD is more preferably a dissociation-type azo dye, a dissociation-type azomethine dye, a dissociation-type oxonol dye or a dissociation-type arylidene dye.

PD is preferably in the colorless or pale-colored state or showing absorption in the short wavelength region when covalently bonded with A1, but when released as a result of cutting of the covalent bond, strongly colored or showing absorption shifted to the longer wavelength side.

Specific preferred examples of PD are set forth below, however, the present invention is not limited thereto.

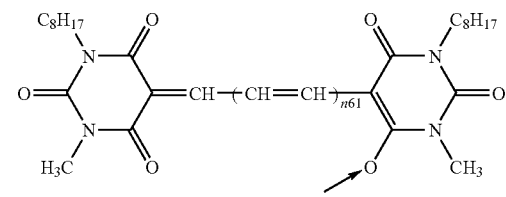

| | $n_{61}$ |
|---|---|
| PD-1 | 1 |
| PD-2 | 2 |
| PD-3 | 3 |

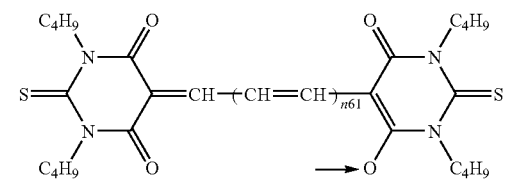

| | $n_{61}$ |
|---|---|
| PD-4 | 0 |
| PD-5 | 1 |
| PD-6 | 2 |

-continued
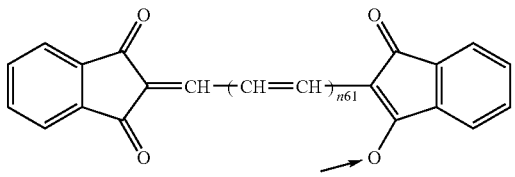
n$_{61}$
| PD-7 | 0 |
| PD-8 | 1 |
| PD-9 | 2 |
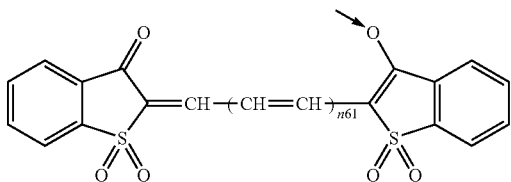
n$_{61}$
| PD-10 | 0 |
| PD-11 | 1 |
| PD-12 | 2 |
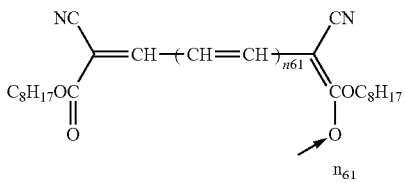
n$_{61}$
| PD-13 | 0 |
| PD-14 | 1 |
| PD-15 | 2 |
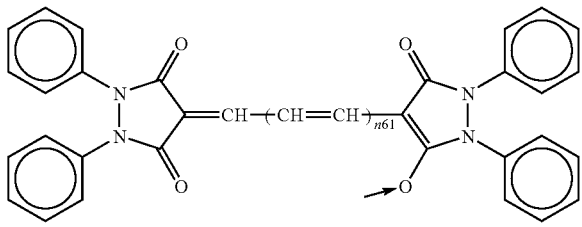
n$_{61}$
| PD-16 | 0 |
| PD-17 | 2 |
| PD-18 | 3 |
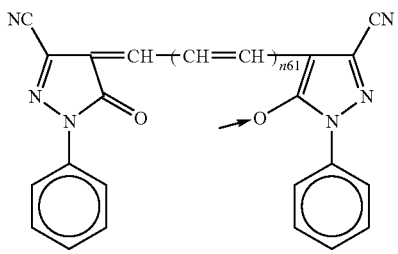
n$_{61}$
| PD-19 | 1 |
| PD-20 | 2 |

-continued
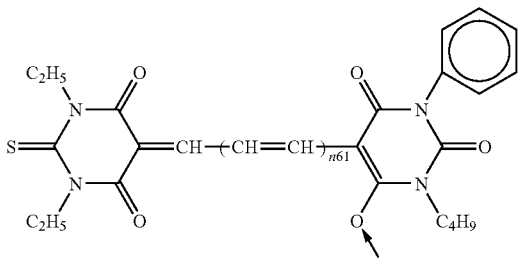
| | $n_{61}$ |
|---|---|
| PD-21 | 0 |
| PD-22 | 1 |
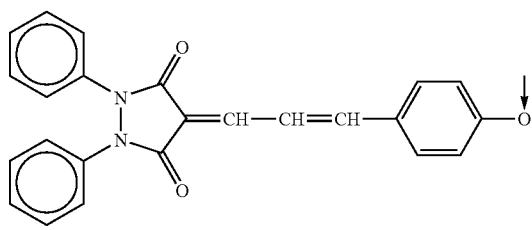
PD-23
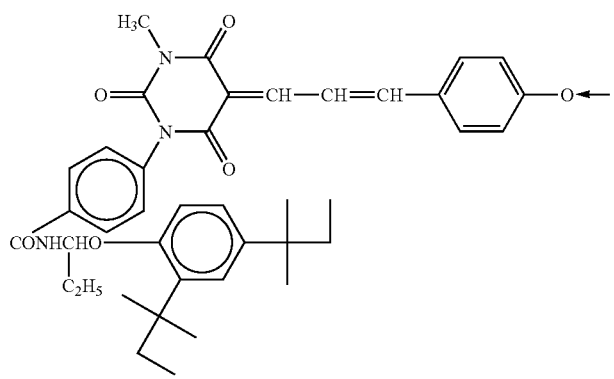
PD-24
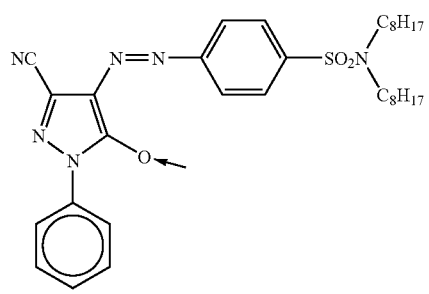
PD-25

-continued
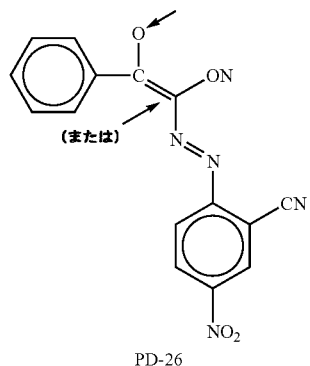
PD-26
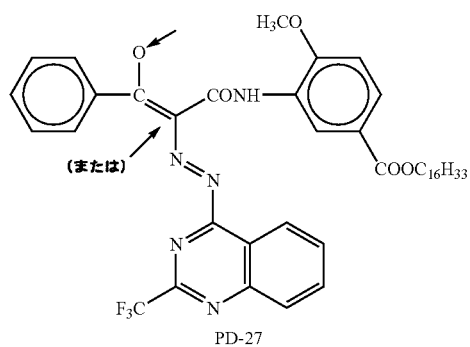
PD-27
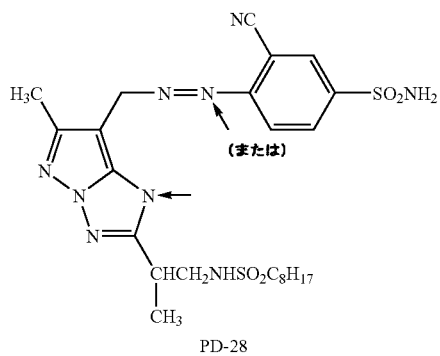
PD-28
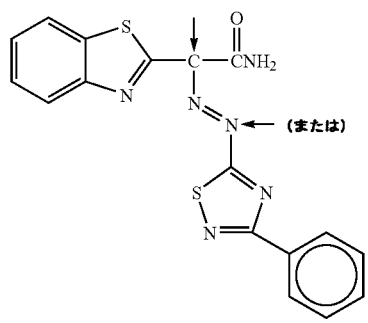
PD-29

-continued
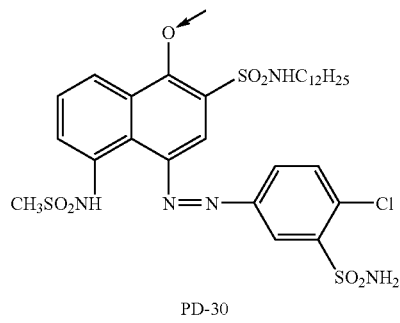
PD-30
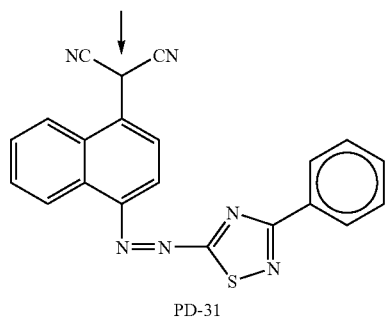
PD-31
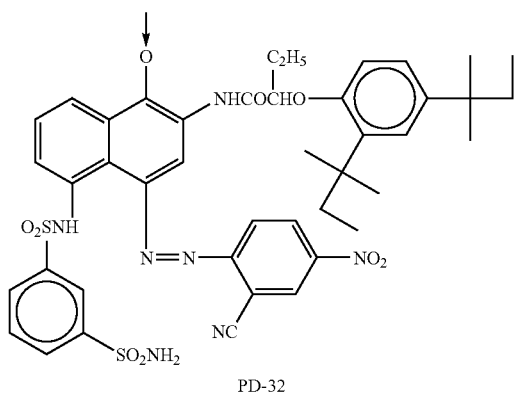
PD-32
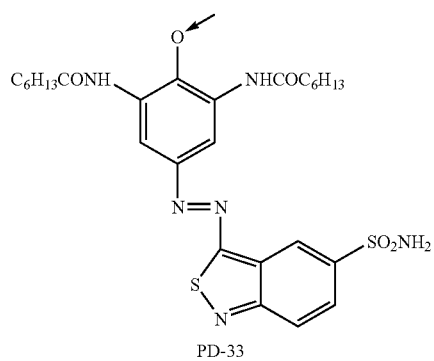
PD-33

-continued
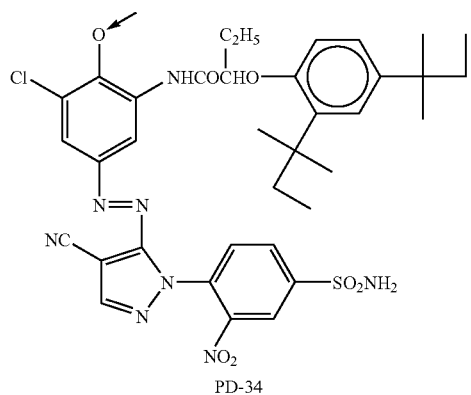
PD-34
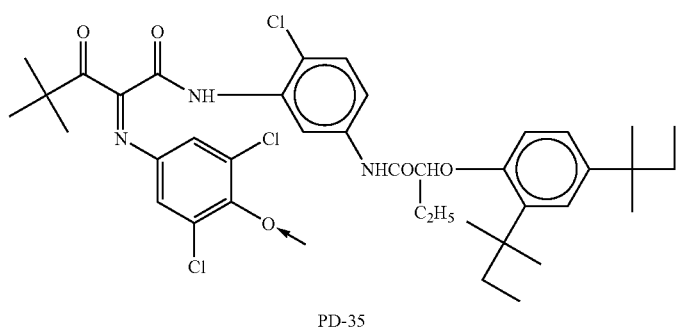
PD-35
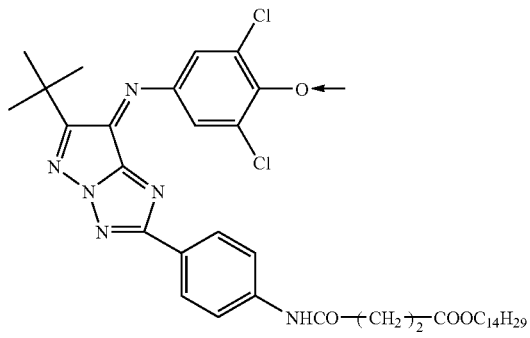
PD-36
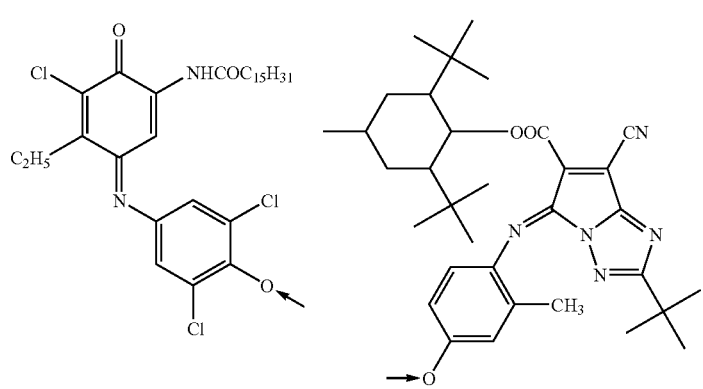
PD-37        PD-38

-continued
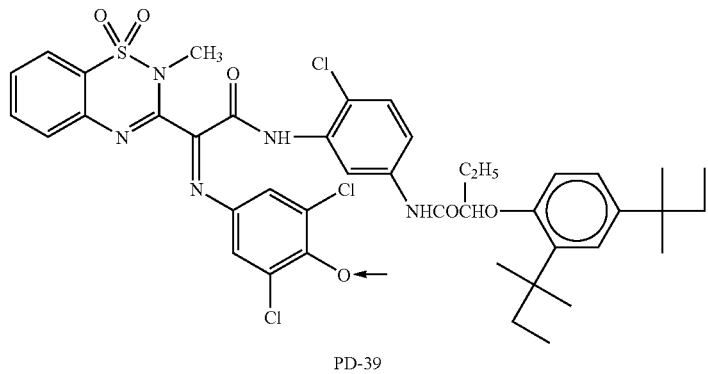
PD-39
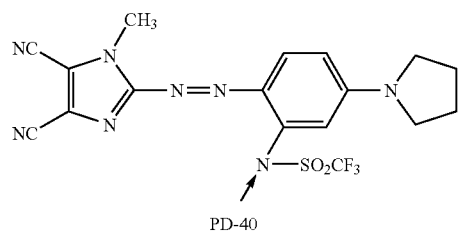
PD-40
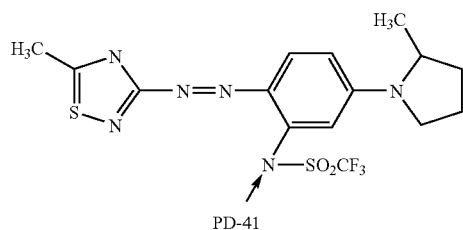
PD-41
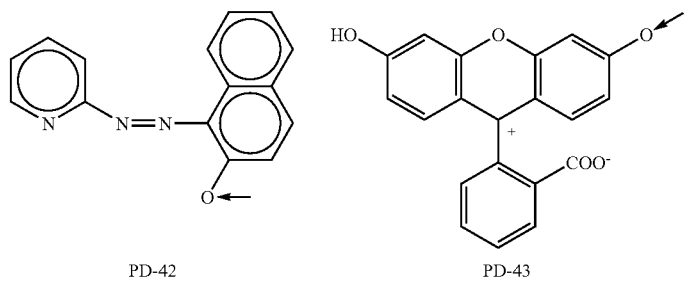
PD-42    PD-43
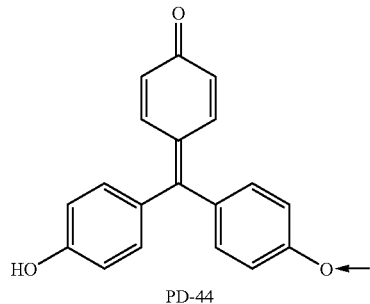
PD-44

-continued
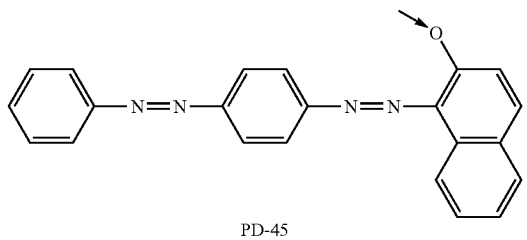
PD-45
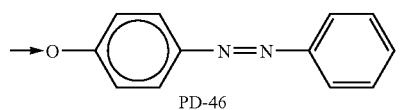
PD-46
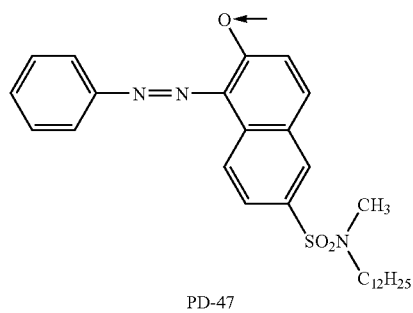
PD-47
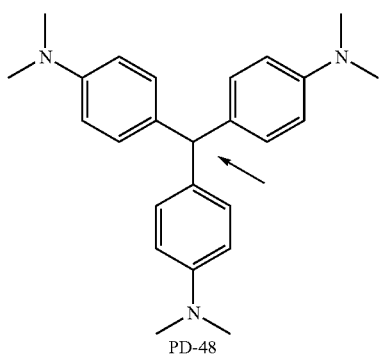
PD-48
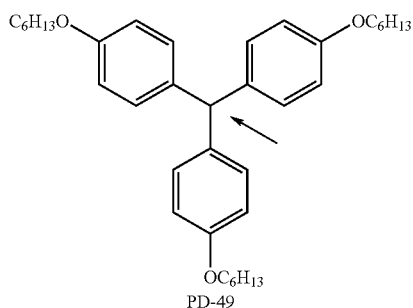
PD-49
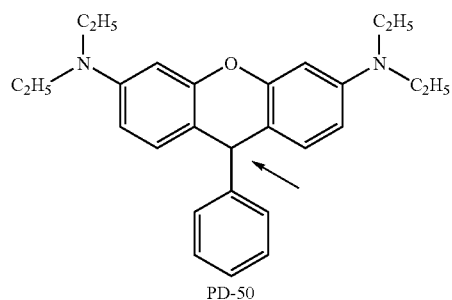
PD-50

-continued
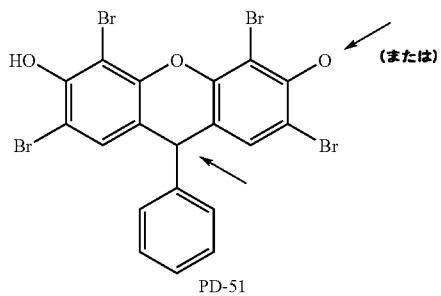
PD-51
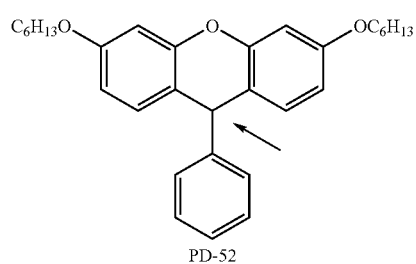
PD-52
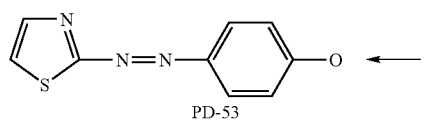
PD-53
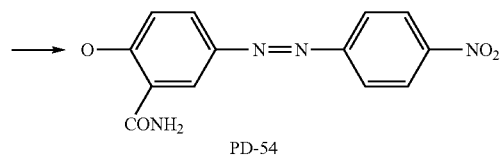
PD-54
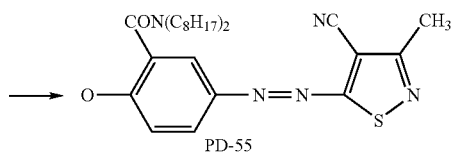
PD-55
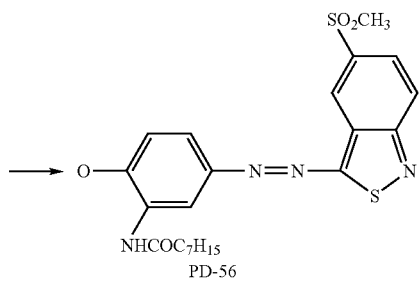
PD-56
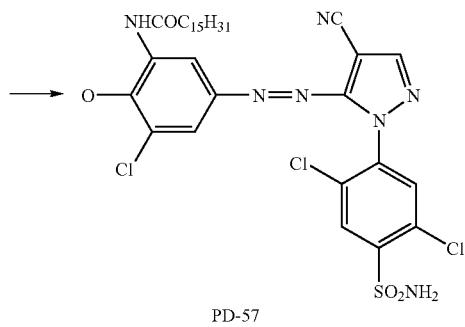
PD-57

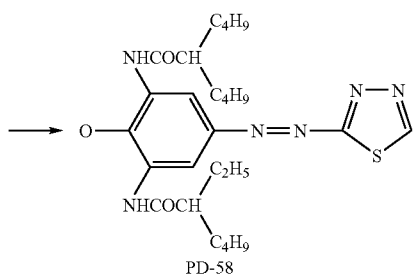

PD-58

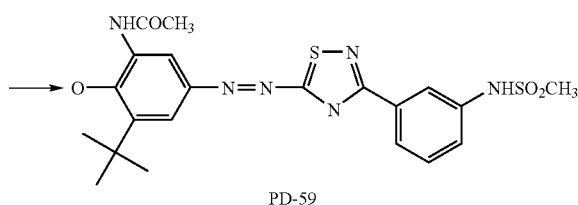

PD-59

As for the covalent bond with A1, PD may be covalently bonded with any portion of A1 as long as it is on the dye chromophore, but is preferably covalently bonded with A1 at the atom shown by an arrow in the formulae above.

The dye precursor of formula (32) is preferably a compound represented by any one of formulae (33-1) to (33-6).

In formulae (33-1) to (33-6), PD has the same meaning as in formula (32).

In formula (33-1), $R_7$, represents a hydrogen tom or a substituent (preferred examples of the substituent are the same as those of the substituent described for $R_{203}$), preferably an alkyl group or an aryl group, more preferably a tert-butyl group.

$R_{72}$ represents a substituent (preferred examples of the substituent are the same as those of the substituent described for $R_{203}$), preferably an electron-withdrawing group, more preferably a nitro group, a sulfamoyl group, a carbamoyl group, an alkoxycarbonyl group, a cyano group or a halogen atom. a71 represents an integer of 0 to 5 and when a71 is 2 or more, multiple $R_{72}$s may be the same or different and may combine with each other to form a ring. a71 is preferably 1 or 2 and $R_{72}$ is preferably substituted to the 2- or 4-position.

In formula (33-2), $R_{73}$ represents a substituent (preferred examples of the substituent are the same as those of the substituent described for $R_{203}$), preferably an electron-withdrawing group, more preferably a nitro group, a sulfamoyl group, a carbamoyl group, an alkoxycarbonyl group, a cyano group or a halogen atom, still more preferably a nitro group. a72 represents an integer of 0 to 5 and when a72 is 2 or more, multiple $R_{73}$s may be the same or different and may combine with each other to form a ring. a72 is preferably 1 or 2. When a72 is 1, $R_{73}$ is preferably substituted to the 2-position, and when a72 is 2, $R_{73}$ preferably substituted to the 2-position and 4-position or the 2-position and 6-position, more preferably to the 2-position and 6-position.

a73 represents 0 or 1.

In formula (33-3), $R_{74}$ to $R_{77}$ each independently represents an alkyl group, preferably both represent a methyl group.

In formula (33-4), $R_{78}$ and $R_{79}$ each independently represents a substituent (preferred examples of the substituent are the same as those of the substituent described for $R_{203}$), and $R_{79}$ preferably represents an alkoxy group, more preferably a methoxy group. a74 and a75 each independently represents an integer of 0 to 5 and when a74 and a75 each is 2 or more, multiple $R_{78}$s or $R_{79}$s may be the same or different and may combine with each other to form a ring. a74 and a75 each is preferably an integer of 0 to 2, a74 is more preferably 0 or 1 and a73 is more preferably 2. When a75 is 2, $R_{79}$ preferably substituted to the 3-position and 5-position.

a76 represents 0 or 1.

In formula (33-5), $R_{80}$ and $R_{81}$ each independently represents a hydrogen atom or a substituent (preferred examples of the substituent are the same as those of the substituent described for $R_{203}$), and $R_{80}$ and $R_{81}$ may combine to form a ring. The ring formed is preferably a benzene ring or a norbornene ring. When a ring is not formed, $R_{80}$ and $R_{81}$ are preferably both a hydrogen atom.

In formula (33-6), $R_{82}$ and $R_{83}$ each independently represents a substituent (preferred examples of the substituent are the same as those of the substituent described for $R_{203}$), preferably an alkyl group, an alkenyl group or an aryl group. $R_{82}$ and $R_{83}$ preferably combine with each other to form a ring and the ring formed is preferably a fluorene ring, a dibenzopyran ring or a tetrahydro-naphthalene ring.

The dye precursor represented by formula (32) is more preferably a compound represented by formula (33-1), (33-2) or (33-4).

Preferred examples of the dye precursor represented by formulae (33-1) to (33-6) for use in the present invention are set forth below, however, the present invention is not limited thereto.

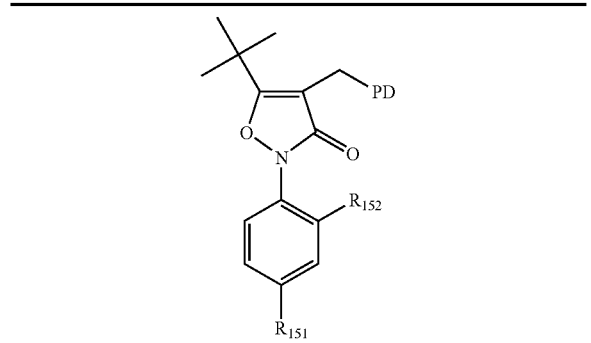

| | R₁₅₁ | R₁₅₂ | PD |
|---|---|---|---|
| E-1 | —CONHC₁₆H₃₃ | —NO₂ | PD-2 |
| E-2 | —SO₂NHC₁₆H₃₃ | " | PD-9 |
| E-3 | —CONHC₁₆H₃₃ | " | PD-12 |
| E-4 | " | " | PD-23 |
| E-5 | " | " | PD-24 |
| E-6 | —SO₂NHC₁₆H₃₃ | " | PD-25 |
| E-7 | —CONHC₁₆H₃₃ | —H | PD-26 |
| E-8 | —OC₈H₁₇ | —Cl | PD-28 |
| E-9 | —CONHC₁₆H₃₃ | —CN | PD-36 |
| E-10 | —C₈H₁₇ | —NO₂ | PD-37 |
| E-11 | —CONHC₁₆H₃₃ | " | PD-33 |
| E-12 | " | " | PD-34 |
| E-13 | " | " | PD-30 |
| E-14 | " | " | PD-32 |
| E-15 | " | " | PD-35 |
| E-16 | " | " | PD-55 |
| E-17 | " | " | PD-59 |
| E-18 | " | " | PD-56 |
| E-19 | " | " | PD-58 |

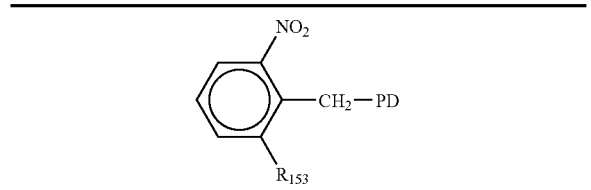

| | R₁₅₃ | PD |
|---|---|---|
| E-20 | H | PD-21 |
| E-21 | " | PD-11 |
| E-22 | —NO₂ | PD-6 |
| E-23 | H | PD-17 |
| E-24 | " | PD-23 |
| E-25 | —NO₂ | PD-24 |
| E-28 | H | PD-30 |
| E-27 | —NO₂ | PD-33 |
| E-28 | H | PD-29 |
| E-29 | —NO₂ | PD-38 |
| E-30 | H | PD-39 |
| E-31 | " | PD-55 |
| E-32 | —NO₂ | PD-56 |
| E-33 | H | PD-49 |
| E-34 | " | PD-57 |

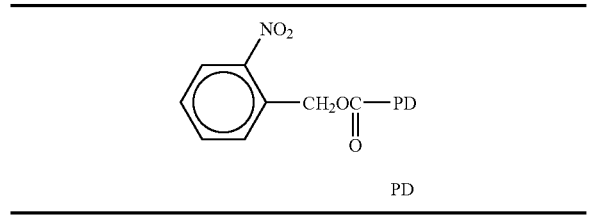

| | PD |
|---|---|
| E-35 | PD-6 |
| E-36 | PD-30 |
| E-37 | PD-36 |

-continued

| | |
|---|---|
| E-38 | PD-23 |
| E-39 | PD-59 |
| E-40 | PD-44 |

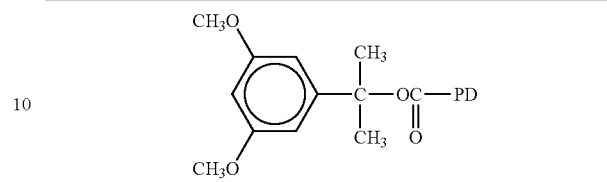

| | PD |
|---|---|
| E-41 | PD-17 |
| E-42 | PD-24 |
| E-43 | PD-31 |
| E-44 | PD-40 |
| E-45 | PD-45 |

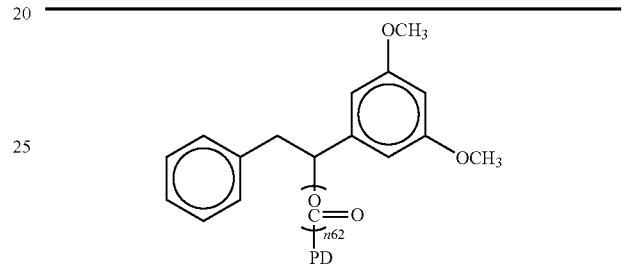

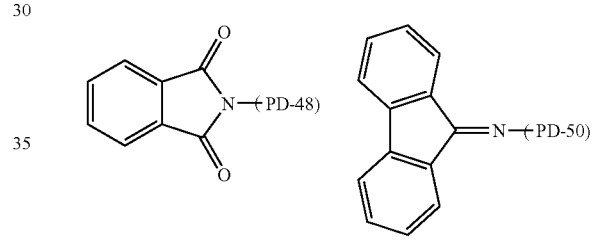

| | PD | n₆₂ |
|---|---|---|
| E-46 | PD-15 | 0 |
| E-47 | PD-32 | 0 |
| E-48 | PD-37 | 0 |
| E-49 | PD-51 | 1 |

When the dye precursor for use in the present invention is at least a dye precursor represented by formula (32), (33-1), (33-2), (33-3), (33-4), (33-5) or (33-6), if desired, the two-photon absorbing optical recording material of the present invention preferably further contains a base for the purpose of dissociating the produced dissociation-type dye. The base may be either an organic base or an inorganic base and preferred examples thereof include alkylamines, anilines, imidazoles, pyridines, carbonates, hydroxide salts, carboxylates and metal alkoxide. Also, polymers containing such a base are preferably used.

The case where the dye precursor for use in the present invention is a compound capable of undergoing a reaction due to electron transfer with the excited state of two-photon absorbing compound or color-forming material and changing the absorption form is described below. The compounds capable of undergoing such a reaction are generically named a so-called "electrochromic compound".

Preferred examples of the electrochromic compound for use as the dye precursor in the present invention include polypyrroles (preferably, for example, polypyrrole, poly(N- methylpyrrole), poly(N-methylindole) and polypyrrolo-pyrrole), polythiophenes (preferably, for example, polythiophene, poly(3-hexylthiophene), polyisothianaphthene, polydithienothiophene, poly(3,4-ethylenedioxy)thiophene), polyanilines (preferably, for example, polyaniline, poly(N-naphthylaniline), poly(o-phenylenediamine), poly(aniline-m-sulfonic acid), poly(2-methoxyaniline) and poly(o-aminophenol)), poly(diarylamine), poly(N-vinylcarbazole), Co pyridinoporphyrazine complex, Ni phenanthroline complex and Fe basophenanthroline complex.

In addition, electrochromic materials such as viologens, polyviologens, lanthanoid diphthalocyanines, styryl dyes, TNFs, TCNQ/TTF complexes, Ru trisbipyridyl complexes are also preferred.

When the dye precursor is a compound capable of undergoing a reaction due to electron transfer with the excited state of two-photon absorbing compound or color-forming material and changing the absorption form, the dye precursor for use in the present invention is preferably at least a dye precursor represented by formula (37).

In formula (37), $R_{13}$ represents a hydrogen atom, an alkyl group, an alkenyl group, a cycloalkyl group, an aryl group or a heterocyclic group (preferred examples of these substituents are the same as those for $R_{24}$), preferably an alkyl group.

$X_{131}$ represents —O—, —S—, —NR$_{135}$— or —CR$_{136}$R$_{137}$—, $R_{135}$ represents a hydrogen atom, an alkyl group, an alkenyl group, a cycloalkyl group, an aryl group or a heterocyclic group (preferred examples of these substituents are the same as those for $R_{24}$), preferably an alkyl group. $R_{136}$ and $R_{137}$ each independently represents an alkyl group, an alkenyl group or an aryl group (preferred examples of these substituents are the same as those for $R_{24}$), preferably an alkyl group, more preferably both represent a methyl group. $X_{131}$ preferably represents —CR$_{136}$R$_{137}$—.

$R_{132}$, $R_{133}$, $R_{138}$ and $R_{139}$ each independently represents a hydrogen atom or a substituent (preferred examples of the substituent are the same as those for $R_{24}$), preferably a hydrogen atom.

$R_{134}$ represents a substituent (preferred examples of the substituent are the same as those for $R_{24}$), preferably an alkyl group, an aryl group, a halogen atom, an alkoxy group, a sulfo group, a carboxyl group, an alkoxycarbonyl group, a carbamoyl group or a cyano group.

n131 represents an integer of 0 to 4, preferably 0 or 1.

n132 represents an integer of 0 to 3, preferably from 0 to 2.

Preferred examples of the dye precursor represented by formula (37) for use in the present invention are set forth below, however, the present invention is not limited thereto.

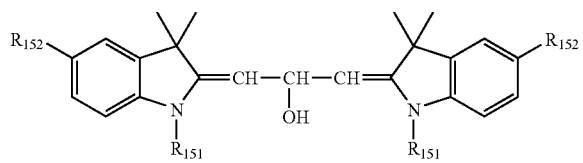

| | $R_{151}$ | $R_{152}$ |
|---|---|---|
| ES-1 | —CH$_3$ | —H |
| ES-2 | —C$_8$H$_{17}$ | —H |
| ES-3 | —C$_4$H$_9$ | —Cl |
| ES-4 | —C$_2$H$_5$ | —CONH$_2$ |
| ES-5 | —(CH$_2$)$_3$—SO$_3$Na | —COOH |
| ES-6 | —CH$_2$COOH | —CH$_3$ |

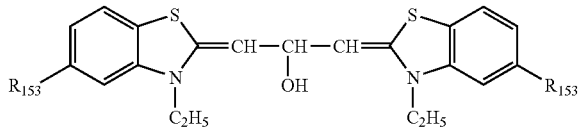

| | $R_{153}$ |
|---|---|
| ES-7 | —Ph |
| ES-8 | —Cl |
| ES-9 | —CH$_3$ |

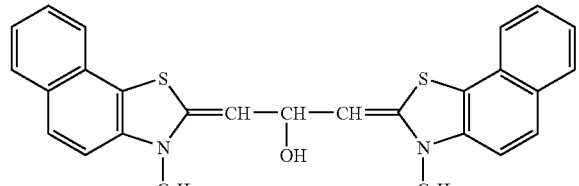

ES-10

-continued

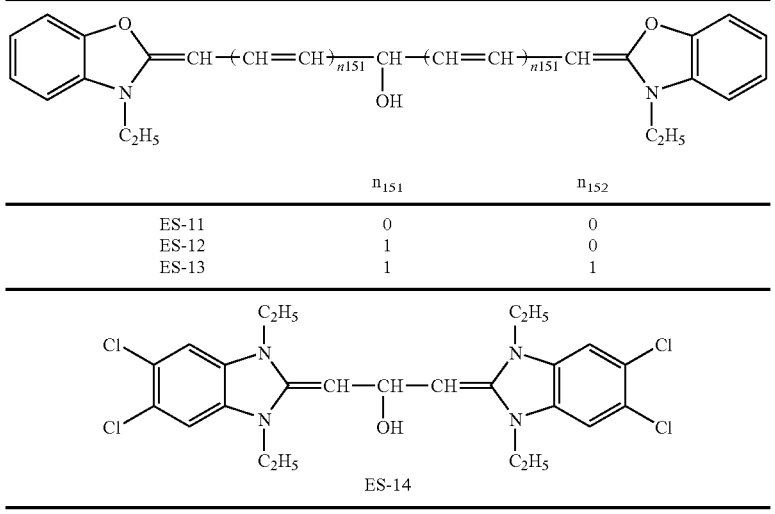

| | $n_{151}$ | $n_{152}$ |
|---|---|---|
| ES-11 | 0 | 0 |
| ES-12 | 1 | 0 |
| ES-13 | 1 | 1 |

The dye precursor for use in the present invention may be a commercially available product or may be synthesized by a known method.

In the two-photon absorbing optical recording material of the present invention, an electron-donating compound having an ability of reducing the radical cation of two-photon absorbing compound or color-forming material, or an electron-accepting compound having an ability of oxidizing the radical anion of two-photon absorbing compound or color-forming material can be preferably used.

Preferred examples of the electron-donating compound include alkylamines (preferably, for example, triethylamine, tributylamine, trioctylamine, N,N-dimethyldodecylamine, triethanolamine and triethoxyethylamine), anilines (preferably for example, N,N-dioctylaniline, N,N-dimethylaniline, 4-methoxy-N,N-dibutylaniline and 2-methoxy-N,N-dibutylaniline), phenylenediamines (preferably for example, N,N,N',N'-tetramethyl-1,4-phenylenediamine, N,N,N',N'-tetramethyl-1,3-phenylenediamine, N,N,N',N'-tetraethyl-1,3-phenylenediamine, N,N'-dibutylphenylene-diamine), triphenylamines (preferably, for example, triphenylamine, tri(4-methoxyphenyl)amine, tri(4-dimethylaminophenyl)amine and TPD), carbazoles (preferably, for example, N-vinylcarbazole and N-ethylcarbazole), phenothiazines (preferably, for example, N-methylphenothiazine, N-phenylphenothiazine), phenoxazines (preferably, for example, N-methylphenoxazine, N-phenylphenoxazine), phenazines (preferably, for example, N,N'-dimethylphenazine, N,N'-diphenylphenazine), hydroquinones (preferably, for example, hydroquinone, 2,5-dimethylhydroquinone, 2,5-dichlorohydroquinone, 2,3,4,5-tetrachlorohydroquinone, 2,6-dichloro-3,5-dicyanohydroquinone, 2,3-dichloro-5,6-dicyanohydroquinone, 1,4-dihydroxynaphthalene and 9,10-dihydroxyanthracene), catechols (preferably, for example, catechol and 1,2,4-trihydroxybenzene), alkoxybenzenes (preferably, for example, 1,2-dimethoxybenzene, 1,3-dibutoxybenzene, 1,3,4-tributoxybenzene and 1,4-dihexyloxybenzene), aminophenols (preferably, for example, 4-(N,N-diethylamino)phenol and N-octylaminophenol), imidazoles (preferably, for example, imidazole, N-methylimidazole, N-octylimidazole and N-butyl-2-methylimidazole), pyridines (preferably, for example, pyridine, picoline, lutidine, 4-tert-butylpyridine, 4-octyloxypyridine, 4-N,N-dimethylamino)pyridine, 4-(N,N-dibutylamino)pyridine and 2-(N-octylamino)pyridine), metallocenes (preferably, for example, ferrocene, titanocene and ruthenocene), metal complexes (preferably, for example, Ru bisbipyridine complexes, Cu phenanthroline complexes, Cu trisbipyridine complexes, Fe EDTA complexes and other complexes of Ru, Fe, Re, Pt, Cu, Co, Ni, Pd, W, Mo, Cr, Mn, Ir and Ag), fine particulate semiconductors (preferably, for example, Si, CdSe, GaP, PbS and ZnS).

Preferred examples of the electron-accepting compound include aromatic compounds having introduced thereinto an electron-withdrawing (preferably, for example, 1,4-dinitrobenzene, 1,3-dicyanobenzene, 4,5-dichloro-1,3-dicyanobenzene, 4-nitro-1,3-dicyanobenzene, 4-octanesulfonyl-1,3-dicyanobenzene and 1,10-dicyanoanthracene), heterocyclic compounds or heterocyclic compounds having introduced thereinto an electron-withdrawing group (preferably, for example, pyrimidine, pyrazine, triazine, dichloropyrazine, 3-cyanopyrazole, 4,5-dicyano-1-methyl-2-octanoylaminoimidazole, 4,5-dicyanoimidazole, 2,4-dimethyl-1,3,4-thiadiazole, 5-chloro-3-phenyl-1,3,4-thiadiazole, 1,3,4-oxadiazole, 2-chlorobenzothiazole, N-butyl-1,2,4-triazole), N-alkylpyridinium salts (preferably, for example, N-butylpyridinium iodide, N-butylpyridinium bis(trifluoromethanesulfonyl)imide, N-butyl-3-ethoxycarbonyl-pyridinium butanesulfonate, N-octyl-3-carbamoylpyridinium bis(trifluoromethanesulfonyl)imide, N,N-dimethylviologen di(hexafluorophosphate) and N,N-diphenylviologen di(bis (trifluoromethanesulfonyl)imide), benzoquinones (preferably, for example, benzoquinone, 2,5-dimethylbenzoquinone, 2,5-dichlorobenzoquinone, 2,3,4,5-tetrachlorobenzoquinone, 2,6-dichloro-3,5-dicyanobenzoquinone, 2,3-dichloro-5,6-dicyanobenzoquinone, naphthoquinone and anthraquinone), imides (preferably, for example, N,N'-dioctylpyromellitimide and 4-nitro-N-octylphthalimide), metal complexes (preferably, for example, Ru trisbipyridine complexes, Ru bisbipyridine complexes, Co trisbipyridine complexes, Cr trisbipyridine complexes, $PtCl_6$ complexes and other complexes of Ru, Fe, Re, Pt, Cu, Co, Ni, Pd, W, Mo, Cr, Mn, Ir and Ag) and fine particulate semiconductors (preferably, for example, $TiO_2$, $Nb_2O_5$, ZnO, $SnO_2$, $Fe_2O_3$ and $WO_3$).

The oxidation potential of the electron-donating compound is preferably baser (in the minus side) than the oxidation potential of two-photon absorbing compound or color-forming material, or than the reduction potential of the excited state of two-photon absorbing compound or color-forming material, and the reduction potential of the electron-accepting compound is preferably nobler (in the plus side) than the reduction potential of two-photon absorbing compound or color-forming material, or than the oxidation potential of the excited state of two-photon absorbing compound or color-forming material.

The polymerizable compound for use in the two-photon absorbing optical recording material of the present invention is described below.

In the two-photon absorbing optical recording material of the present invention, the polymerizable compound and the binder are preferably differing in the refractive index. By virtue of this difference, the compositional ratio of the polymerizable compound and a polymerization reaction product thereof to the binder becomes non-uniform between the recorded area and the unrecorded area upon photopolymerization in the second step (depending on the case, also in the first step) to enable the recording by utilizing the modulation of refractive index.

As for the difference in the refractive index between the polymerizable compound and the binder, the polymerizable compound may have a larger refractive index or the binder may have a larger refractive index, but the polymerizable compound preferably has a larger refractive index than that of the binder.

In order to form a large modulation of refractive index, the difference in the refractive index between the polymerizable compound and the binder is preferably large in bulk and the difference in the refractive index is preferably 0.01 or more, more preferably 0.05 or more, still more preferably 0.1 or more.

For this purpose, it is preferred that either one of the polymerizable compound and the binder contains at least one aryl group, aromatic heterocyclic group, chlorine atom, bromine atom, iodine atom or sulfur atom and the remaining does not contain such a group or atom. More preferably, the polymerizable compound contains at least one aryl group, aromatic heterocyclic group, chlorine atom, bromine atom, iodine atom or sulfur atom and the binder does not contain such a group or atom.

In order to form a large modulation of refractive index, it is preferred that the polymerizable compound can be easily transferred in the two-photon absorbing optical recording material.

The polymerizable compound for use in the present invention is a compound capable of causing addition polymerization under the action of radical or acid (Broensted acid or Lewis acid) generated upon irradiation of light on the two-photon absorbing compound (or color-forming material) and polymerization initiator and thereby undertaking oligomerization or polymerization.

The polymerizable compound for use in the present invention may be monofunctional or polyfunctional, may comprise one component or multiple components, or may be a monomer, a prepolymer (e.g., dimer, oligomer) or a mixture thereof.

The shape thereof may be a liquid form or a solid form at room temperature, but a liquid monomer having a boiling point of 100° C. or more or a mixture of a liquid monomer having a boiling point of 100° C. or more and a solid monomer is preferred.

The polymerizable compounds for use in the present invention are roughly classified into a polymerizable compound capable of radical polymerization and a polymerizable compound capable of cationic or anionic polymerization.

Preferred examples of the polymerizable compound are described below for respective cases of the polymerizable compound capable of radical polymerization and the polymerizable compound capable of cationic or anionic polymerization by grouping each polymerizable compound into A) refractive index: polymerizable compound>binder, and B) refractive index: binder>polymerizable compound.

Preferred Examples of Radical Polymerizable Compound in A) Refractive Index: Polymerizable Compound>Binder:

In this case, the radical polymerizable compound preferably has a high refractive index and the high-refractive index radical polymerizable compound is preferably a compound having at least one ethylenically unsaturated double bond within the molecule and further containing at least one aryl group, aromatic heterocyclic group, chlorine atom, bromine atom, iodine atom or sulfur atom. Also, this compound is preferably a liquid having a boiling point of 100° C. or more.

Specific examples thereof include the polymerizable monomers described below and prepolymers (e.g., dimer, oligomer) comprising such a polymerizable monomer.

Preferred examples of the high-refractive index radical polymerizable compound include styrene, 2-chloro-styrene, 2-bromostyrene, methoxystyrene, phenyl acrylate, p-chlorophenyl acrylate, 2-phenylethyl acrylate, 2-phenoxyethyl acrylate, 2-phenoxyethyl methacrylate, phenol ethoxylate acrylate, 2-(p-chlorophenoxy)ethyl acrylate, benzyl acrylate, 2-(1-naphtyloxy)ethyl acrylate, 2,2-di(p-hydroxyphenyl)propane diacrylate or dimethacrylate, 2,2-di(p-hydroxyphenyl)propane dimethacrylate, polyoxyethyl-2,2-di(p-hydroxyphenyl)propane dimethacrylate, di(2-methacryloxyethyl)ether of bisphenol-A, ethoxylated bisphenol-A diacrylate, di(3-acryloxy-2-hydroxypropyl)ether of bisphenol-A, di(2-acryloxyethyl)ether of bisphenol-A, di(3-acryloxy-2-hydroxypropyl)ether of tetrachloro-bisphenol-A, di(2-methacryloxyethyl)ether of tetrachloro-bisphenol-A, di(3-methacryloxy-2-hydroxypropyl)ether of tetrabromo-bisphenol-A, di(2-methacryloxyethyl)ether of tetrabromo-bisphenol-A, di(3-methacryloxy-2-hydroxypropyl)-ether of diphenolic acid, 1,4-benzenediol dimethacrylate, 1,4-diisopropenylbenzene, 1,3,5-triisopropenylbenzene, benzoquinone monomethacrylate, 2-[β-(N-carbazyl)propionyloxy]ethyl acrylate, phenylthioacrylate and 4-iodophenyl acrylate. Among these, more preferred are 2-phenoxyethyl acrylate, 2-phenoxyethyl methacrylate, phenolethoxylate acrylate, 2-(p-chlorophenoxy)ethyl acrylate, p-chlorophenyl acrylate, phenyl acrylate, 2-phenylethyl acrylate, di(2-acryloxyethyl)ether of bisphenol-A, ethoxylated bisphenol-A diacrylate and 2-(1-naphthyloxy)ethyl acrylate.

The polymerizable compound useful in the present invention is a liquid, but this can be used by mixing it with a second solid polymerizable compound such as N-vinylcarbazole, ethylenically unsaturated carbazole monomer disclosed in H. Kamogawa et al., *Journal of Polymer Science: Polymer Chemistry Edition*, Vol. 18, pp. 9-18 (1979), 2-naphthyl acrylate, pentachlorophenyl acrylate, 2,4,6-tribromophenyl acrylate, bisphenol-A diacrylate, 2-(2-naphthyloxy)ethyl acrylate and N-phenylmaleimide.

Preferred Examples of Radical Polymerizable Compound in B) Refractive Index: Binder>Polymerizable Compound:

In this case, the radical polymerizable compound preferably has a low refractive index and the low-refractive index radical polymerizable compound for use in the present invention is preferably a compound having at least one ethylenically unsaturated double bond within the molecule and not containing at all an aryl group, an aromatic heterocyclic group, a chlorine atom, a bromine atom, an iodine atom and a sulfur atom.

Also, this compound is preferably a liquid having a boiling point of 100° C. or more.

Specific examples thereof include the polymerizable monomers described below and prepolymers (e.g., dimer, oligomer) comprising such a polymerizable monomer.

Preferred examples of the low-refractive index radical polymerizable monomer include tert-butyl acrylate, cyclohexyl acrylate, iso-bornyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, 1,4-cyclohexyldiol diacrylate, 2,2-dimethylolpropane diacrylate, glycerol diacrylate, trimethylolpropane diacrylate, pentaerythritol triacrylate, polyoxyethylated trimethylolpropane triacrylate, trimethacrylate and analogous compounds disclosed in U.S. Pat. No. 3,380,831, pentaerythritol tetraacrylate, triethylene glycol diacrylate, triethylene glycol dimethacrylate, polyoxy-propyltrimethylolpropane diacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-propanediol dimethacrylate, pentaerythritol trimethacrylate, pentaerythritol tetramethacrylate, trimethylolpropane trimethacrylate, 1,5-pentanediol dimethacrylate, diallyl fumarate, 1H,1H-perphlorooctyl acrylate, 1H,1H,2H,2H-perphlorooctyl methacrylate and 1-vinyl-2-pyrrolidinone. Among these, more preferred are decanediol diacrylate, iso-bornyl acrylate, triethylene glycol diacrylate, diethylene glycol diacrylate, triethylene glycol dimethacrylate, ethoxyethoxyethyl acrylate, triacrylate ester of ethoxylated trimethylolpropane, and 1-vinyl-2-pyrrolidine.

The useful polymerizable compound is a liquid, but this compound may be used by mixing it with a second solid polymerizable compound monomer such as N-vinylcaprolactam.

The cationic polymerizable compound for use in the present invention is a compound of which polymerization is initiated by the two-photon absorbing compound or color-forming material and an acid generated from the cationic polymerization initiator, and the anionic polymerizable compound for use in the present invention is a compound of which polymerization is initiated by the two-photon absorbing compound or color-forming material and a base generated from the anionic polymerization initiator. Examples thereof include the compounds described in J. V. Crivello, *Chemtech. Oct.*, page 624 (1980), JP-A-62-149784, *Nippon Secchaku Gakkai Shi (Journal of The Adhesion Society of Japan)*, Vol. 26, No. 5, pp. 179-187 (1990).

The cationic polymerizable compound for use in the present invention is preferably a compound having at least one or more oxylane ring, oxetane ring, vinyl ether group or N-vinylcarbazole moiety within the molecule, more preferably a compound having an oxylane ring moiety.

The anionic polymerizable compound for use in the present invention is preferably a compound having at least one oxylane ring, oxetane ring, vinyl ether group, N-vinylcarbazole moiety, ethylenic double bond moiety with an electron-withdrawing substituent, lactone moiety, lactam moiety, cyclic urethane moiety, cyclic urea moiety or cyclic siloxane moiety within the molecule, more preferably a compound having an oxylane ring moiety.

Preferred Examples of Cationic or Anionic Polymerizable Compound in A) Refractive Index: Polymerizable Compound>Binder:

In this case, the cationic or anionic polymerizable compound preferably has a high refractive index and the high-refractive index radical polymerizable compound is preferably a compound having at least one ethylenically unsaturated double bond within the molecule and further containing at least one aryl group, aromatic heterocyclic group, chlorine atom, bromine atom, iodine atom or sulfur atom, more preferably at least one aryl group. Also, this compound is preferably a liquid having a boiling point of 100° C. or more.

Specific examples thereof include the polymerizable monomers described below and prepolymers (e.g., dimer, oligomer) comprising such a polymerizable monomer.

Preferred examples of the high-refractive index cationic or anionic polymerizable compound having an oxylane ring include phenylglycidyl ether, p-tert-butylphenylglycidyl ether, diglycidyl phthalate, resorcin diglycidyl ether, dibromophenylglycidyl ether, dibromoneopentyl glycol diglycidyl ether, 4,4'-bis(2,3-epoxypropoxyperfluoroisopropyl)diphenyl ether, p-bromostyrene oxide, bisphenol-A-diglycidyl ether, tetrabromo-bisphenol-A-diglycidyl ether, bisphenol-F-diglycidyl ether, 1,3-bis(3',4'-epoxycyclohexyl)ethyl)-1,3-diphenyl-1,3-dimethyl-disiloxane.

In addition, the compounds shown below are also preferred as the high-refractive index cationic or anionic polymerizable monomer.

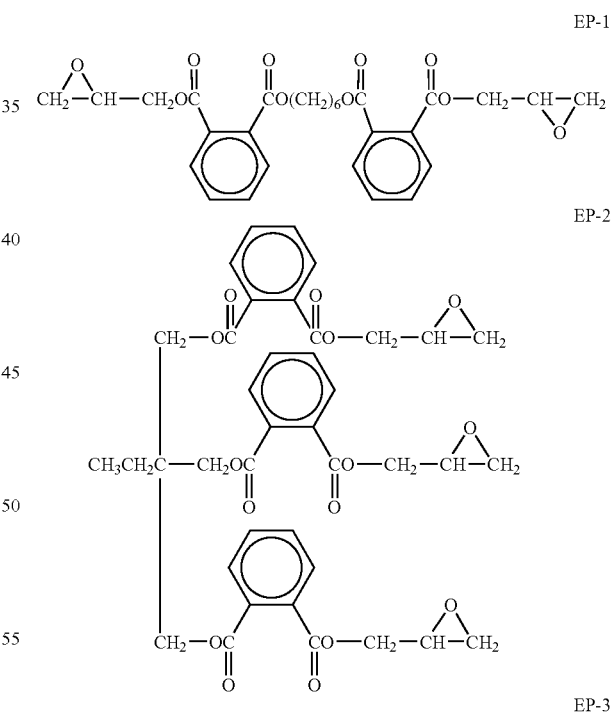

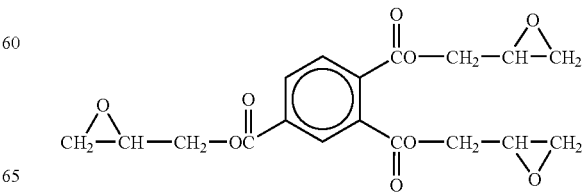

Specific examples of the high-refractive index cationic or anionic polymerizable monomer having an oxetane ring include the compound described above as specific examples of the high-refractive cationic or anionic polymerizable monomer having an oxylane ring, where the oxylane ring is replaced by an oxetane ring.

Specific examples of the high-refractive index cationic or anionic polymerizable monomer having a vinyl ether group moiety include vinyl-2-chloroethyl ether, 4-vinyl ether styrene, hydroquinone vinyl ether, phenylvinyl ether, bisphenol A divinyl ether, tetrabromo-bisphenol A divinyl ether, bisphenol A divinyl ether, phenoxyethylene vinyl ether and p-bromophenoxyethylene vinyl ether.

In addition, N-vinylcarbazole is also preferred as the high-refractive index cationic polymerizable monomer.

Preferred Examples of Cationic or Anionic Polymerizable Compound in B) Refractive Index: Binder>Polymerizable Compound:

In this case, the cationic or anionic polymerizable compound preferably has a low refractive index and the low-refractive index cationic or anionic polymerizable compound for use in the present invention preferably a compound having at least one ethylenically unsaturated double bond within the molecule and not containing at all an aryl group, an aromatic heterocyclic group, a chlorine atom, a bromine atom, an iodine atom and a sulfur atom. Also, this compound is preferably a liquid having a boiling point of 100° C. or more.

Specific examples thereof include the polymerizable monomers described below and prepolymers (e.g., dimer, oligomer) comprising such a polymerizable monomer.

Specific examples of the low-refractive index cationic or anionic polymerizable monomer having an oxylane ring include glycerol diglycidyl ether, glycerol triglycidyl ether, diglycerol triglycidyl ether, diglycerol polyglcidyl ether, pentaerythritol polyglycidyl ether, 1,4-bis(2,3-epoxypropoxyperfluoroisopropyl)cyclohexane, sorbitol tetrraglycidyl ether, trimethylolpropane diglycidyl ether, trimethylolpropane monoglycidyl ether, trimethylolpropane triglycidyl ether, 1,6-hexanediol diglycidyl ether, ethylene glycol diglycidyl ether, ethylene glycol monoglycidyl ether, polyethylene glycol diglycidyl ether, propylene glycol diglycidyl ether, propylene glycol monoglycidyl ether, neopentyl glycol diglycidyl ether, neopentyl glycol monoglycidyl ether, diglycidyl adipate, 1,2,7,8-diepoxyoctane, 1,6-dimethylol perfluorohexane diglycidyl ether, vinylcyclohexene dioxide, 3,4-epoxycyclohexylmethyl-3',4'-epoxycyclohexane carboxylate, 3,4-epoxycyclohexyloxylane, bis(3,4-epoxycyclohexyl)adipate, bis(3,4-epoxy-6-methyl-cyclohexylmethyl)adipate, 2,2-bis[4-(2,3-epoxypropoxy)cyclohexyl]-propane, 2,2-bis[4-(2,3-epoxypropoxy)cyclohexyl]hexafluoropropane, 1,2,5,6-diepoxy-4,7-methanoperhydroindene, 2-(3,4-epoxycyclohexyl)-3',4'-epoxy-1,3-dioxane-5-spirocyclohexane, 1,2-ethylenedioxy-bis(3,4-epoxycyclohexylmethane), 4',5'-epoxy-2'-methylcyclohexylmethyl-4,5-epoxy-2-methylcyclohexane carboxylate, ethylene glycol-bis(3,4-epoxycyclohexane carboxylate), bis-(3,4-epoxycyclohexylmethyl)adipate, di-2,3-epoxycyclopentyl ether, vinyl glycidyl ether, allyl glycidyl ether and 2-ethylhexyl glycidyl ether.

In addition, the compounds shown below are also preferred as the low-refractive index cationic or anionic polymerizable monomer.

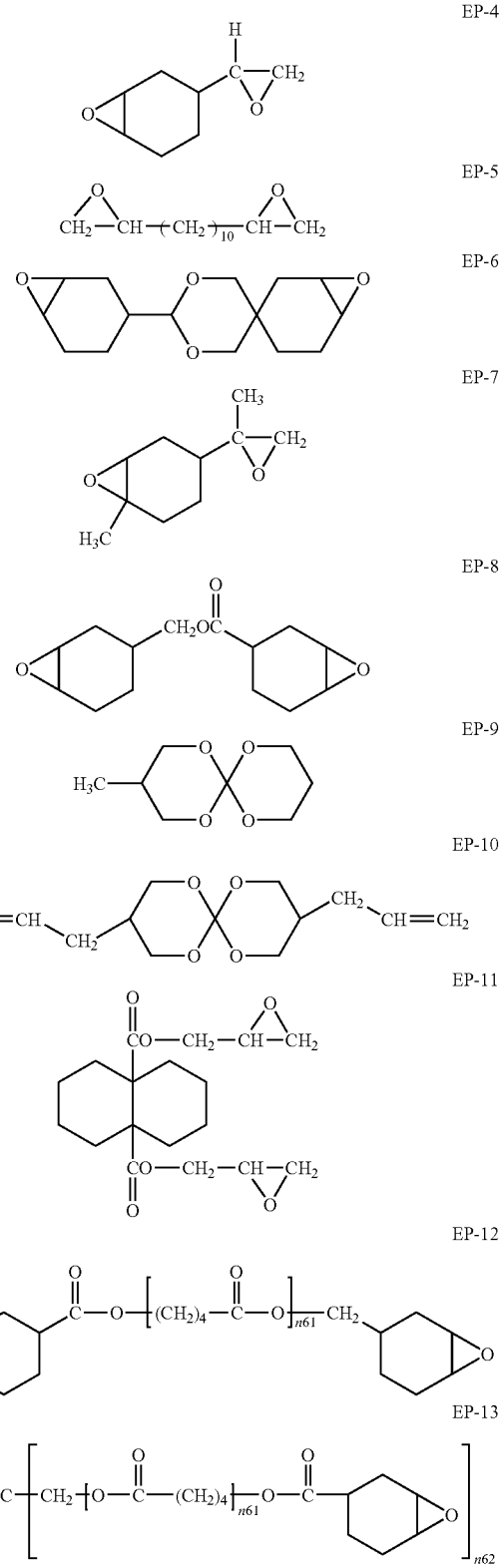

[wherein n61 is an integer of 1 to 5]

[wherein n62 is 3 or 4, R is an ethyl group or a hydroxymethyl group, and n61 has the same meaning as above]

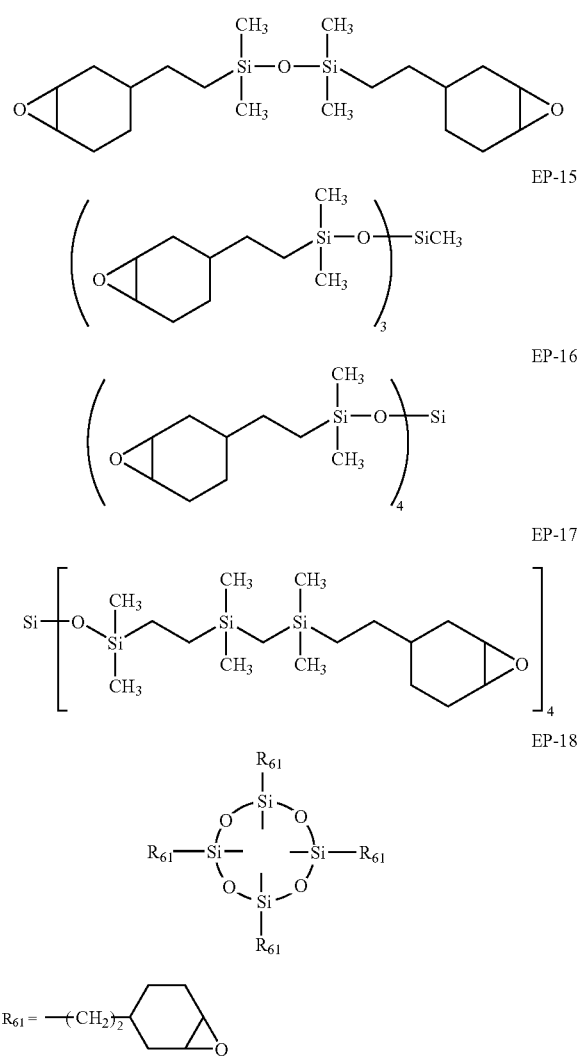

Specific examples of the low-refractive index cationic or anionic polymerizable monomer having an oxetane ring include the compounds described above as specific examples of the low-refractive index cationic or anionic polymerizable monomer having an oxylane ring, where the oxylane ring is replaced by an oxetane ring.

Specific examples of the low-refractive index cationic or anionic polymerizable monomer having a vinyl ether group moiety include vinyl-n-butyl ether, vinyl-tert-butyl ether, ethylene glycol divinyl ether, ethylene glycol monovinyl ether, propylene glycol divinyl ether, propylene glycol monovinyl ether, neopentyl glycol divinyl glycol, neopentyl glycol monovinyl glycol, glycerol divinyl ether, glycerol trivinyl ether, triethylene glycol divinyl ether, trimethylolethane trivinyl ether, trimethylolpropane monovinyl ether, trimethylolpropane divinyl ether, trimethylolpropane trivinyl ether, diglycerol trivinyl ether, sorbitol tetravinyl ether, allyl vinyl ether, 2,2-bis(4-cyclohexanol)propane divinyl ether, 2,2-bis(4-cyclohexanol)trifluoropropane divinyl ether and 1,4-cyclohexanedimethane.

In the two-photon absorbing optical recording material of the present invention, the binder is usually used for the purpose of improving the film-forming property of composition before polymerization, the uniform film thickness and the storage stability. The binder preferably has good compatibility with the polymerizable compound, the polymerization initiator and the two-photon absorbing compound or color-forming material.

The binder is preferably a solvent-soluble thermoplastic polymer and these polymers can be used individually or in combination.

The binder may also be a reactive binder capable of undergoing a reaction upon radical or cationic polymerization. In this case, the binder is preferably a reactive oligomer having, specifically, an ethylenically unsaturated group, an oxylane ring or the like.

As described above, the binder and the polymerizable compound for use in the present invention are preferably differing in the refractive index and the polymerizable compound may have a larger refractive index or the binder may have a larger refractive index, but the polymerizable compound preferably has a larger refractive index than that of the binder.

For this purpose, it is preferred that either one of the polymerizable compound and the binder contains at least one aryl group, aromatic heterocyclic group, chlorine atom, bromine atom, iodine atom or sulfur atom and the remaining does not contain such a group or atom. More preferably, the polymerizable compound contains at least one aryl group, aromatic heterocyclic group, chlorine atom, bromine atom, iodine atom or sulfur atom and the binder does not contain such a group or atom.

Examples of the binder are described below by grouping it into A) refractive index: polymerizable compound>binder and B) refractive index: binder>polymerizable compound.

Preferred Examples of Binder in A) Refractive Index Polymerizable Compound>Binder:

Specific preferred examples of the low-refractive index binder include acrylates, α-alkyl acrylate esters, acidic polymers and interpolymers (for example, polymethyl methacrylate, polyethyl methacrylate and copolymer of methyl methacrylate with other alkyl (meth)acrylate), polyvinyl esters (for example, polyvinyl acetate, polyvinyl acetate/acrylate, polyvinyl acetate/methacrylate, and hydrolysis-type polyvinyl acetate), ethylene/vinyl acetate copolymers, saturated or unsaturated polyurethanes, butadiene and isoprene polymers and copolymers, high molecular weight polyethylene oxides of polyglycol having a weight average molecular weight of 4,000 to 1,000,000, epoxidates (for example, epoxidate having an acrylate or methacrylate group), polyamides (for example, N-methoxymethyl polyhexamethylene adipamide), cellulose esters (for example, cellulose acetate, cellulose acetate succinate and cellulose acetate butyrate), cellulose ethers (for example, methyl cellulose, ethyl cellulose, ethyl benzyl cellulose), polycarbonates, polyvinyl acetals (for example, polyvinyl butyral and polyvinyl formal), polyvinyl alcohols, polyvinylpyrrolidones, acid-containing polymers and copolymers disclosed in U.S. Pat. Nos. 3,458,311 and 4,273,857, and amphoteric polymer binders disclosed in U.S. Pat. No. 4,293,635. Among these, more preferred are a cellulose acetate butyrate polymer, a cellulose acetate lactate polymer, a polymethyl methacrylate, an acryl-base polymer or interpolymer containing methyl methacrylate/methacrylic acid and methyl methacrylate/acrylic acid copolymers, a terpolymer of methyl methacrylate/C2-C4 alkyl acrylate or methacrylate/acrylic acid or methacrylic acid, a polyvinyl acetate, a polyvinyl acetal, a polyvinyl butyral, a polyvinyl formal and a mixture thereof.

In addition, a fluorine atom-containing polymer is also preferred as the low-refractive index binder. The polymer is preferably a solvent-soluble polymer containing a fluoroolefin as an essential component and containing, as a copolymerization component, one or more unsaturated monomer selected from an alkyl vinyl ether, an alicyclic vinyl ether, a hydroxyvinyl ether, an olefin, a haloolefin, an unsaturated carboxylic acid or an ester thereof, and a vinyl carboxylate. The weight average molecular weight thereof is preferably from 5,000 to 200,000 and the fluorine atom content is preferably from 5 to 70 wt %.

As the fluoroolefin in the fluorine atom-containing polymer, for example, tetrafluoroethylene, chlorotrifluoroethylene, vinyl fluoride or vinylidene fluoride is used. As for another copolymerization component, examples of the alkyl vinyl ether include ethyl vinyl ether, isobutyl vinyl ether and n-butyl vinyl ether, examples of the alicyclic vinyl ether include cyclohexyl vinyl ether and derivatives thereof, examples of the hydroxyvinyl ether include hydroxybutyl vinyl ether, examples of the olefin and haloolefin include ethylene, propylene, isobutylene, vinyl chloride and vinylidene chloride, examples of the vinyl carboxylate include vinyl acetate and n-vinyl butyrate, examples of the unsaturated carboxylic acid and an ester thereof include unsaturated carboxylic acids such as (meth)acrylic acid and crotonic acid, C1-C18 alkyl esters of (meth)acrylic acid, such as methyl (meth)acrylate, ethyl (meth)acrylate, propyl (meth) acrylate, isopropyl (meth)acrylate, butyl (meth)acrylate, hexyl (meth)acrylate, octyl (meth)acrylate and lauryl (meth) acrylate, C2-C8 hydroxyalkyl esters of (meth)acrylic acid, such as hydroxyethyl (meth)acrylate and hydroxypropyl (meth)acrylate, N,N-dimethylaminoethyl (meth)acrylate and N,N-diethylaminoethyl (meth)acrylate). These radical polymerizable monomers may be used individually or in combination of two or more thereof and if desired, a part of the monomer may be replaced by another radical polymerizable monomer such as styrene, α-methylstyrene, vinyltoluene and (meth)acrylonitrile. Other than these, monomer derivatives such as carboxylic acid group-containing fluoroolefin and glycidyl group-containing vinyl ether can also be used.

Specific examples of the fluorine atom-containing polymer include "Lumiflon" series (for example, Lumiflon LF200, weight average molecular weight: about 50,000, produced by Asahi Glass Company) having a hydroxyl group and being soluble in an organic solvent. In addition, organic solvent-soluble fluorine atom-containing polymers are commercially available also from Daikin Kogyo Co., Ltd. and Central Glass Co., Ltd. and these can also be used.

Other preferred examples include silicon compounds such as poly(dimethylsiloxane), and aromatic-free silicon oils.

Furthermore, the epoxy oligomer compounds shown below can also be used as the low-refractive index reactive binder.

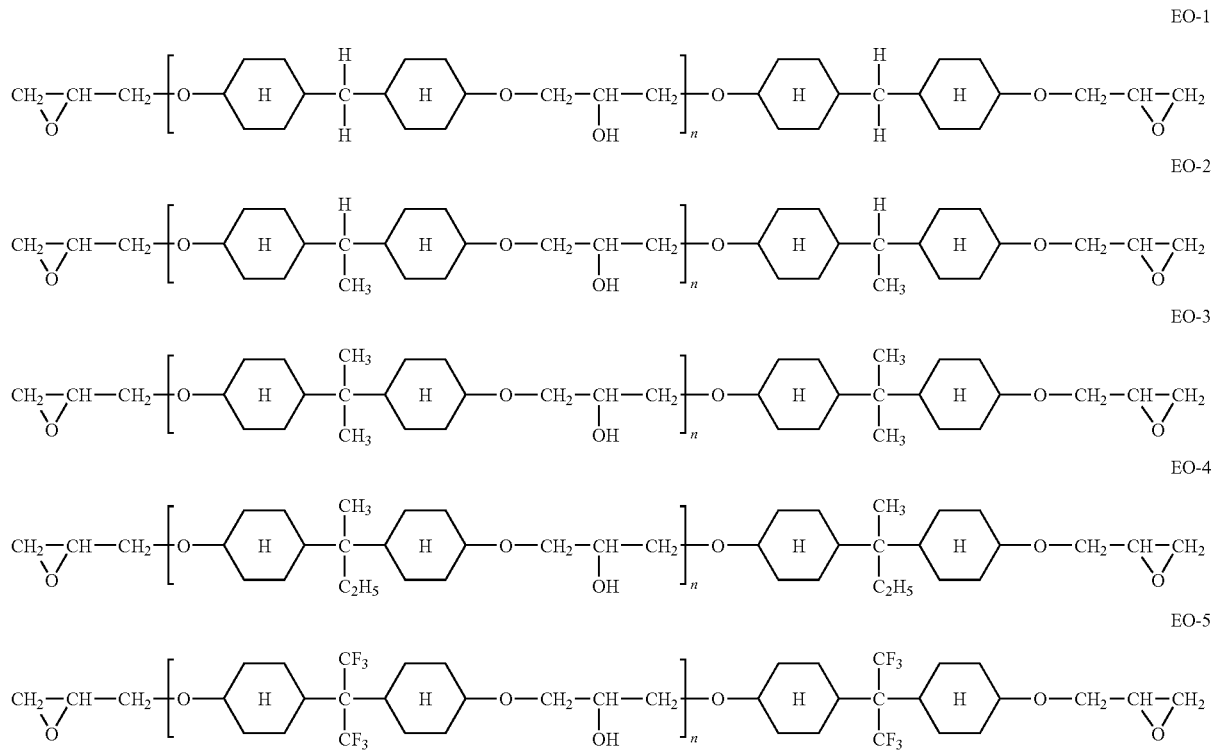

Preferred Examples of Binder in B) Refractive Index Binder>Polymerizable Compound:

Specific preferred examples of the high-refractive index binder include polystyrene polymers and copolymers with, for example, acrylonitrile, maleic anhydride, acrylic acid, methacrylic acid or an ester thereof, vinylidene chloride copolymers (e.g., vinylidene chloride/acrylonitrile copolymer, vinylidene chloride/methacrylate copolymer, vinylidene chloride/vinyl acetate copolymer), polyvinyl chloride and copolymers thereof (e.g., polyvinyl chloride/acetate, vinyl chloride/acrylonitrile copolymer), polyvinyl benzal synthetic rubbers (e.g., butadiene/acrylonitrile copolymer, acrylonitrile/butadiene/styrene copolymer, methacrylate/acrylonitrile/butadiene/styrene copolymer, 2-chlorobutadiene-1,3 polymer, chlorinated rubber, styrene/butadiene/styrene, styrene/isoprene/styrene block copolymer), copolyesters (for example, polymethylene glycol represented by the formula: $(HO(CH_2)_nOH$ (wherein n is an integer of 2 to 10, those produced from a reaction product of (1) hexahydroterephthalic acid, sebacic acid and terephthalic acid, (2) terephthalic acid, isophthalic acid and sebacic acid, (3) terephthalic acid and sebacic acid, or (4) terephthalic acid and isophthalic acid, and a mixture of copolyesters produced from (5) the glycol and (i) terephthalic acid, isophthalic acid and sebacic acid or (ii) terephthalic acid, isophthalic acid, sebacic acid and adipic acid), poly-N-vinylcarbazole and copolymers thereof, and carbazole-containing polymers disclosed in H. Kamogawa et al., *Journal of Polymer Science: Polymer Chemistry Edition*, Vol. 18, pp. 9-18 (1979). Among these, more preferred are polystyrene, poly(styrene/acrylonitrile), poly(styrene/methyl methacrylate), polyvinyl benzal and a mixture thereof.

In the two-photon absorbing optical recording material of the present invention, additives such as chain transfer agent, heat stabilizer, plasticizer and solvent may be appropriately used, if desired Other preferred examples include silicon compounds such as poly(methylphenylsiloxane) and 1,3,5-trimethyl-1,1,3,5,5-pentaphenyltrisiloxane, and aromatic-rich silicon oils.

In addition, the epoxy oligomer compounds shown below can also be used as the high-refractive index reactive binder.

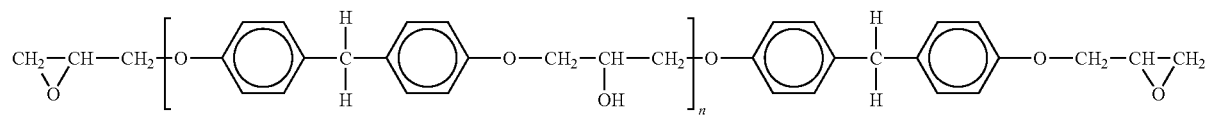

EO-6

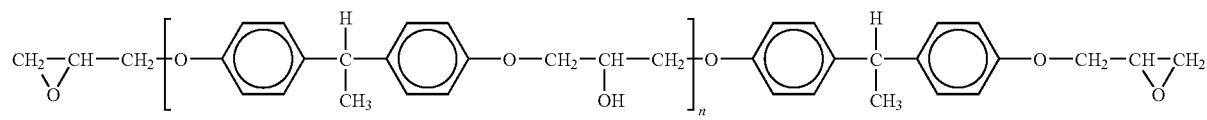

EO-7

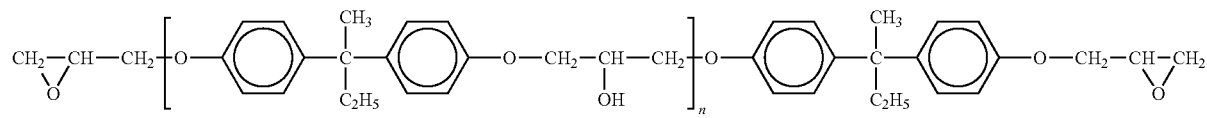

EO-8

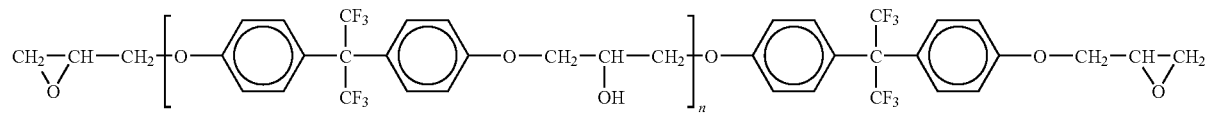

EO-9

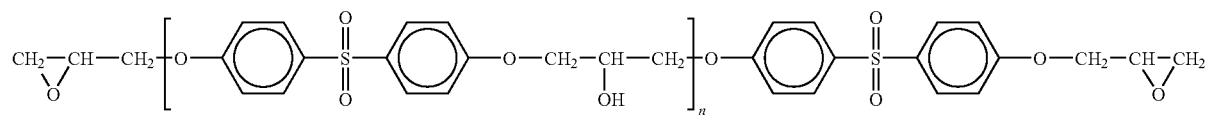

EO-10

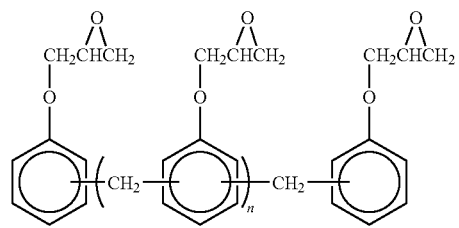

EO-11

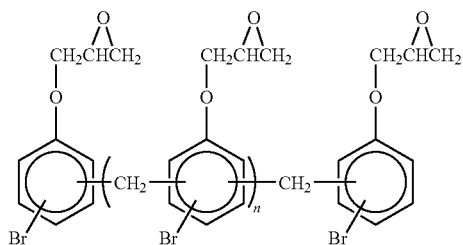

EO-12

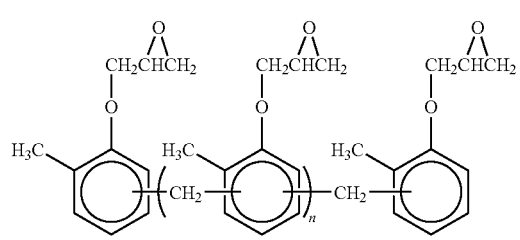

EO-13

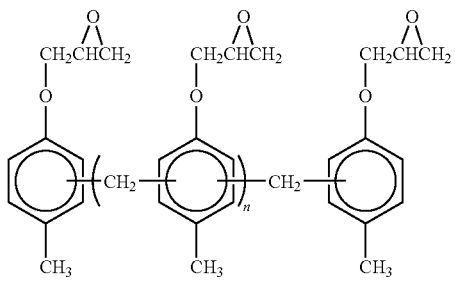

EO-14

In the two-photon absorbing optical recording material of the present invention, a chain transfer agent is preferably used in some cases. Preferred examples of the chain transfer agent include thiols such as 2-mercaptobenzoxazole, 2-mercaptobenzothiazole, 2-mercaptobenzimidazole, 4-methyl-4H-1,2,4-triazole-3-thiol, 4,4-thiobisbenzenethiol, p-bromobenzenethiol, thiocyanuric acid, 1,4-bis(mercaptomethyl)benzene and p-toluenethiol, thiols described in U.S. Pat. No. 4,414,312 and JP-A-64-13144, disulfides described in JP-A-2-291561, thiones described in U.S. Pat. No. 3,558,322 and JP-A-64-17048, and O-acylthiohydroxamate and N-alkoxypyridine thiones described in JP-A-2-291560.

Particularly, in the case where the polymerization initiator is a 2,4,5-triphenylimidazolyl dimer, a chain transfer agent is preferably used.

The amount of the chain transfer agent used is preferably from 1.0 to 30 wt % based on the entire composition.

In the two-photon absorbing optical recording material of the present invention, a heat stabilizer may be added for the purpose of enhancing the storage stability.

Useful examples of the heat stabilizer include hydroquinone, phenidone, p-methoxyphenol, alkyl- or aryl-substituted hydroquinone or quinone, catechol, tert-butyl catechol, pyrogallol, 2-naphthol, 2,6-di-tert-butyl-p-cresol, phenothiazine and chloranil. In addition, dinitroso dimers described in U.S. Pat. No. 4,168,982 by Pazos are also useful.

The plasticizer is used for varying the adhesive property, flexibility, hardness and other various mechanical properties of the two-photon absorbing optical recording material. Examples of the plasticizer include triethylene glycol dicaprylate, triethylene glycol bis(2-ethylhexanoate), tetraethylene glycol diheptanoate, diethyl sebacate, dibutyl suberate, tris(2-ethylhexyl)phosphate, tricresyl phosphate and dibutyl phthalate.

Generally, the percentage of each component in the two-photon absorbing optical recording material and the two-photon absorbing polymerizable composition of the present invention is preferably in the following range based on the entire mass of the composition:

Binder:
preferably from 0 to 90 wt %, more preferably from 35 to 75 wt %,

Polymerizable Compound:
preferably from 5 to 60 wt %, more preferably from 15 to 50 wt %, Polymerization Initiator:
preferably from 0.01 to 10 wt %, more preferably from 0.1 to 7 wt %, Dye Precursor:
preferably from 0.5 to 30 wt %, more preferably from 1 to 20 wt %, Two-Photon Absorbing Compound:
preferably from 0.01 to 10 wt %, more preferably from 0.1 to 3 wt %, and Electron-Donating Compound or Electron-Accepting Compound:
preferably from 0 to 30 wt %, more preferably from 0 to 20 wt %.

The two-photon absorbing optical recording material of the present invention may be prepared by an ordinary method, for example, by adding the above-described essential components and arbitrary components with or without a solvent.

Examples of the solvent include a ketone-base solvent such as methyl ethyl ketone, methyl isobutyl ketone, acetone and cyclohexanone, an ester-base solvent such as ethyl acetate, butyl acetate, ethylene glycol diacetate, ethyl lactate and cellosolve acetate, a hydrocarbon-base solvent such as cyclohexane, toluene and xylene, an ether-base solvent such as tetrahydrofuran, dioxane and diethyl ether, a cellosolve-base solvent such as methyl cellosolve, ethyl cellosolve, butyl cellosolve and dimethyl cellosolve, an alcohol-base solvent such as methanol, ethanol, n-propanol, 2-propanol, n-butanol and diacetone alcohol, a fluorine-base solvent such as 2,2,3,3-tetrafluoropropanol, a halogenated hydrocarbon-base solvent such as dichloromethane, chloroform and 1,2-dichloroethane, and an amide-base solvent such as N,N-dimethylformamide.

The two-photon absorbing optical recording material of the present invention may be directly coated on a substrate by using a spin coater, a roll coater or a bar coater or may be cast as a film and then laminated on a substrate by an ordinary method, whereby the two-photon absorbing optical recording material can be completed.

The term "substrate" as used herein means an arbitrary natural or synthetic support, suitably a soft or rigid film, a sheet or a material which can be present in the form of a plate.

Preferred examples of the substrate include polyethylene terephthalate, resin-undercoated polyethylene terephthalate, polyethylene terephthalate subjected to flame or electrostatic discharge treatment, cellulose acetate, polycarbonate, polymethyl methacrylate, polyester, polyvinyl alcohol and glass.

The solvent used can be removed by evaporation at the drying. For the removal by evaporation, heating or reduced pressure may be used.

Furthermore, a protective layer for blocking oxygen may be formed on the two-photon absorbing optical recording material. The protective layer may be formed by laminating a plastic-made film or sheet such as polyolefin (e.g., polypropylene, polyethylene), polyvinyl chloride, polyvinylidene chloride, polyvinyl alcohol, polyethylene terephthalate and cellophane film, with use of electrostatic adhesion or an extruder or by coating a solution of such a polymer. Also, a glass sheet may be laminated. Between the protective layer and the photo-sensitive film and/or between the substrate and the photosensitive film, a pressure-sensitive adhesive or a liquid substance may be allowed to be present so as to increase the air tightness.

In the two-photon absorbing optical recording material of the present invention, the following combinations are preferred:

1) a combination where the polymerization initiator is an acid generator, the polymerizable compound is a cationic polymerizable compound, and the dye precursor comprises an acid-color forming dye precursor and an acid generator serving also as the polymerization initiator;

2) a combination where the polymerization initiator is a generator of generating an acid and a radical, the polymerizable compound is a radical polymerizable compound, and the dye precursor comprises an acid-color forming dye precursor and an acid generator serving also as the polymerization initiator;

3) a combination where the polymerization initiator is a base generator, the polymerizable compound is an anionic polymerizable compound, and the dye precursor comprises a base-color forming dye precursor and a base generator serving also as the polymerization initiator;

4) a combination where the polymerization initiator is a radical generator, the polymerizable compound is a radical polymerizable compound, and the dye precursor is a compound represented by formula (7);

5) a combination where the polymerization initiator is a cation generator, the polymerizable compound is a cationic polymerizable compound, and the dye precursor is a compound represented by formula (7);

6) a combination where the polymerization initiator is a radical generator, the polymerizable compound is a radical polymerizable compound, and the dye precursor contains a compound represented by formula (2); and 7) a combination where the polymerization initiator is an anion generator, the polymerizable compound is an anionic polymerizable compound, and the dye precursor contains a compound represented by formula (2).

As described in the foregoing pages, the two-photon absorbing polymerization material and two-photon absorbing optical recording method of the present invention each uses a highly efficient two-photon absorbing compound of the present invention and can form a color-forming latent image by two-photon absorption in the laser-focused (recorded) area (first step) and bring about polymerization by causing linear absorption of only the color-forming material upon irradiation of light in a wavelength region having no linear absorption of the two-photon absorbing compound and having linear absorption of the color-forming material on the color-forming latent image (second step), so that polymerization can be brought about with very high efficiency as compared with conventional cases of bringing about polymerization by using only two-photon absorption. Moreover, modulation of the refractive index can be brought about by using the polymerization and therefore, recording by polymerization and modulation of refractive index can be achieved with very high sensitivity as compared with known systems.

Furthermore, two-photon absorption is used for the recording and therefore, the refractive index can be three-dimensionally modulated by polymerization between the laser-focused (recorded) area and the unfocused (unrecorded) area, as a result, the reflectance of light can be changed and this enables application to a three-dimensional optical recording medium and a recording/reproducing method therefor.

EXAMPLES

Working examples of the present invention are specifically described below based on experimental results. Needless to say, the present invention is not limited to these working examples.

Example 1

Synthesis of Two-Photon Absorbing Compound of the Present Invention (1) Synthesis of D-73

Two-Photon Absorbing Compound D-73 of the present invention can be synthesized by the following method.

Synthesis Example of D-73

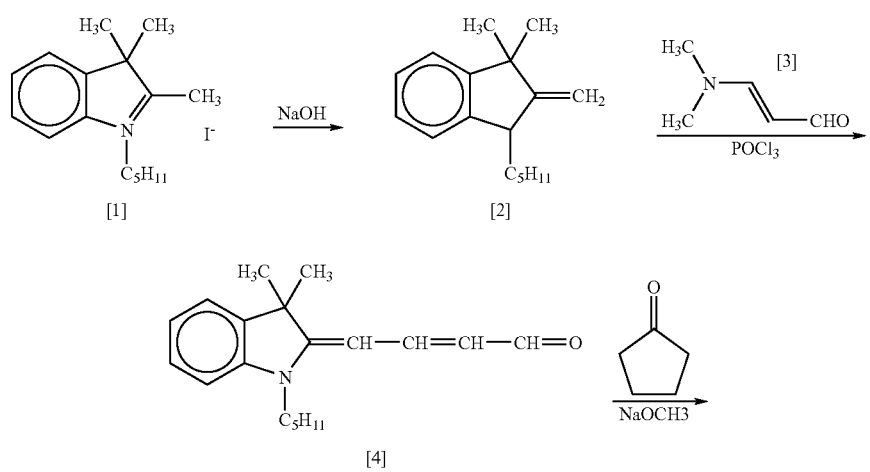

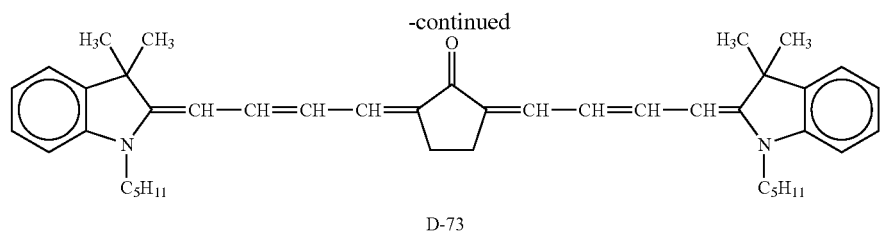

D-73

A quaternary salt [1] (14.3 g (40 mmol)) was dissolved in 50 ml of water and thereto, 1.6 g (40 mmol) of sodium hydroxide was added. The resulting solution was stirred at room temperature for 30 minutes and the obtained reaction solution was extracted three times with ethyl acetate, dried over magnesium sulfate and then concentrated to obtain 9.2 g (yield: 100%) of the oil of methylene base [2].

Thereafter, 3.97 g (40 mmol) of dimethylaminoacrolein was dissolved in 50 ml of acetonitrile and while cooling to 0° C., 6.75 g (44 mmol) of phosphorus oxychloride was added dropwise, followed by stirring at 0° C. for 10 minutes. Thereto, an acetonitrile solution containing 9.2 g of methylene base [2] was added dropwise and the resulting solution was stirred at 35° C. for 4 hours and then poured in 100 ml of ice water. After adding 16 g of sodium hydroxide, the solution was refluxed for 10 minutes, then cooled, extracted three times with ethyl acetate, dried over magnesium sulfate and concentrated. The concentrated solution was purified by silica gel column chromatography (developing solvent: ethyl acetate:hexane=1:10→1:3) to obtain 4.4 g (yield: 39%) of the oil of aldehyde [4].

Subsequently, 0.126 g (1.5 mmol) of cyclopentanone and 0.85 g (3 mmol) of aldehyde [4] were dissolved in 30 ml of dehydrated methanol and the resulting solution was refluxed in a nitrogen atmosphere in a dark place. When the solution became uniform, 0.69 g (3.6 mmol) of a methanol solution of 28% sodium methoxide was added and the resulting solution was further refluxed for 6 hours. After cooling, the precipitated crystal was separated by filtration and washed with methanol to obtain 0.50 g (yield: 54%) of D-73 as a dark green crystal. The structure was confirmed by NMR spectrum, MS spectrum and elemental analysis.

(2) Synthesis of D-84

Two-Photon Absorbing Compound D-84 of the present invention can be synthesized by the following method.

Synthesis Example of D-84

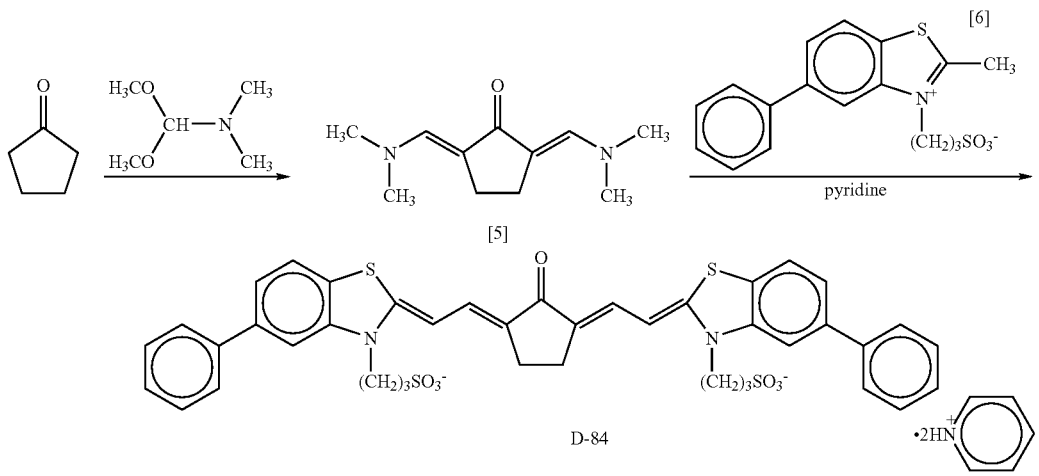

Cyclopentanone (33.6 g (0.4 mol)), 2 ml of DBN and 400 g of N,N-dimethylformamidedimethylacetal were refluxed for 5 days. The resulting solution was concentrated and after adding acetone thereto, cooled and the crystal was separated by filtration and washed with cold acetone to obtain 32.4 g (yield: 42%) of the crystal of [5].

Thereafter, 0.78 g (4 mmol) of [5], 2.78 g (8 mmol) of a quaternary salt [6] and 20 ml of pyridine were refluxed in a nitrogen atmosphere for 4 hours in a dark place. The resulting solution was cooled and after adding ethyl acetate thereto, the crystal was separated by filtration and washed with ethyl acetate. The crystal was dispersed in methanol and then separated by filtration to obtain 2.14 g (yield: 56%) of the objective D-84 as a dark blue crystal.

The structure was confirmed by NMR spectrum, MS spectrum and elemental analysis.

Other two-photon absorbing compounds represented by formula (1) of the present invention can also be synthesized according to the synthesis method of D-74 or D-84 or the method described, for example, in *Tetrahedron. Lett.*, Vol. 42, page 6129 (2001).

Furthermore, other cyanine dyes, merocyanine dyes, oxonol dyes and the like can also be synthesized according to the method, described, for example, in F. M. Harmer, *Heterocyclic Compounds-Cyanine Dyes and Related Compounds*, John Wiley & Sons, New York, London (1964), and D. M. Sturmer, *Heterocyclic Compounds—Special Topics in Heterocyclic Chemistry*, Chap. 18, Section 14, pp. 482-515, John Wiley & Sons, New York, London.

Many of the dye precursors for use in the present invention are commercially available or can be synthesized by a known method.

[Evaluation of Recording by Modulation of Refractive Index Resulting from Polymerization]

The two-photon absorbing optical recording material and two-photon optical recording method of the present invention are described in detail below.

According to the composition shown below, the two-photon absorbing compound of 1 wt %, electron donor ED-1 of wt %, dye precursor+polymerization initiator of 15 wt %, polymerizable compound of 34 wt % and binder of 40 wt % shown in Table 1 were dissolved in 300 wt % of chloroform in a dark room to prepare two-photon absorbing three-dimensional optical recording material Samples 101 to 105 of the present invention and Comparative Samples 1 to 5.

R-7
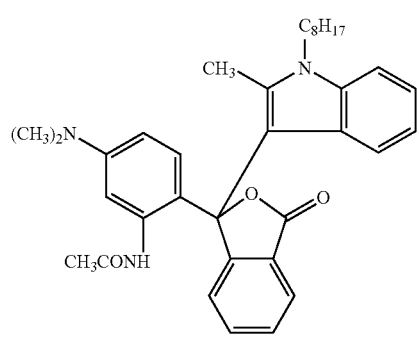

R-8
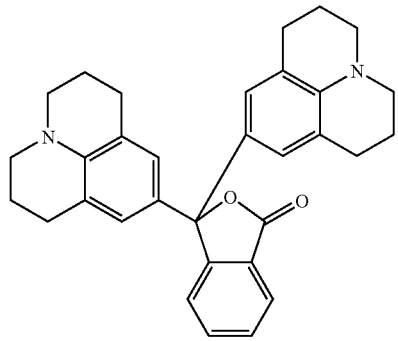

R-9
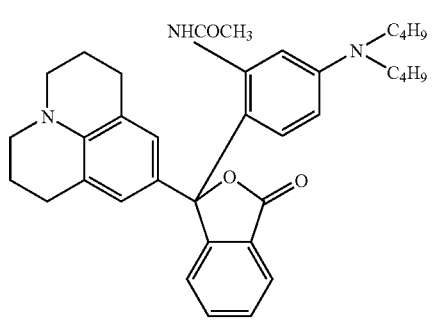

-continued

I-101
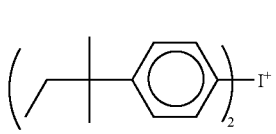

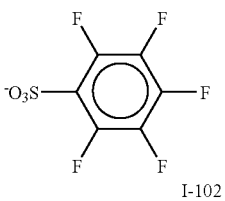

I-102

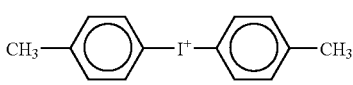

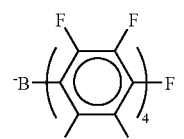

I-103
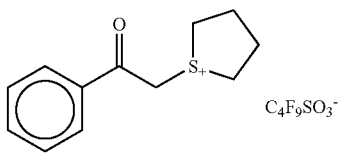

I-104
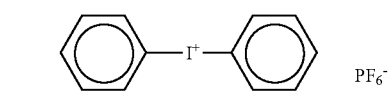

O—Cl—HABI
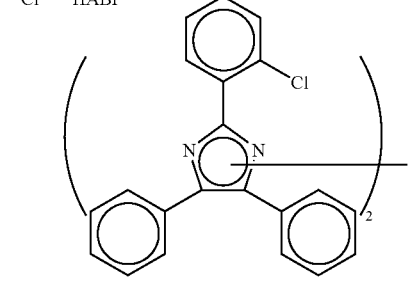

NVC
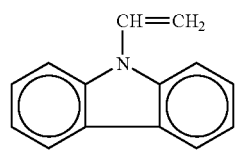

POEA
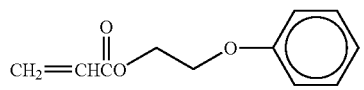

NA
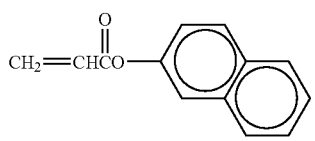

MBO

ED-1
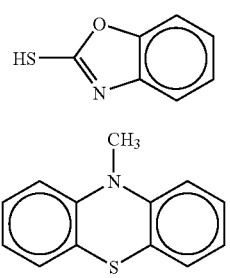

-continued

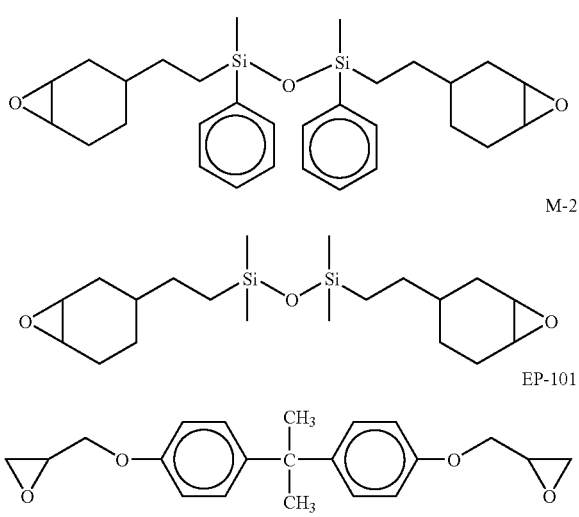

M-1

M-2

EP-101 light at 740 nm (first step), in the case of Samples 101 to 105, color formation as a latent image was slightly confirmed in the laser-focused (recorded) area where the light was irradiated. Furthermore, light in the wavelength region of 680 to 740 nm was irradiated to effect entire surface exposure (second step), as a result, it was confirmed that polymerization occurred in the recorded area of the first step.

The difference in the refractive index between the recorded area and the unrecorded area was measured and found to be 0.03. When a laser of 740 nm was irradiated, the difference in reflectance between the recorded area and the unrecorded area due to difference in the refractive index could be confirmed.

Incidentally, when only the first step of irradiating a laser of 740 nm was performed to obtain the same modulation of refractive index as in the case of performing first and second steps in Samples 101 to 105, an irradiation time as long as about 10 times was necessary. This reveals that in the recording system of the present invention, amplification of about 10 times can be attained in the second step. It was also confirmed that larger amplification can be obtained by more prolonging the irradiation time of the second step.

On the other hand, in the case of Comparative Samples 1 to 5 not containing the two-photon absorbing compound D-128

TABLE 1

| Sample | Two-Photon Absorbing Compound | Dye Precursor | + | Polymerization Initiator | Polymerizable Compound | Binder |
|---|---|---|---|---|---|---|
| 101 | D-128 | R-9 (10 wt %) | + | I-104 (5 wt %) | M-1 | polydimethylsiloxane |
| Comparative Example 1 | — | " | + | " | " | " |
| 102 | D-128 | " | + | " | POEA:NVC = 2:1 | polyvinyl acetal |
| Comparative Example 2 | — | " | + | " | " | " |
| 103 | D-128 | PB-3 (10 wt %) |   | DD-17 (5 wt %) | M-2 | poly(methylphenyl)-siloxane |
| Comparative Example 3 | — | " | + | " | " | poly(methylphenyl)-siloxane |
| 104 | D-128 | E-22 (10 wt %) | + + | O-Cl-HABI (3 wt %) MBO (2 wt %) | POEA:NVC = 2:1 | polymethyl methacrylate |
| Comparative Example 4 | — | " | + | O-Cl-HABI (3 wt %) MBO (2 wt %) | " | polymethyl methacrylate |
| 105 | D-128 | E-14 (10 wt %) | + | PB-3 (5 wt %) | EP-101 | EO-1 |
| Comparative Example 5 | — | " | + | " | " | " |

Samples 101 to 105 and Comparative Samples 1 to 5 each was bar-coated on a preparation glass plate and after drying the solvent, a preparation glass plate was placed thereon to obtain samples for evaluation. The film thickness was about 10 μm.

In the performance evaluation of the two-photon absorbing polymerizable composition of the present invention, a Ti:sapphire pulse laser (pulse width: 100 fs, repetition: 80 MHz, average output: 1 W, peak power: 100 kW) capable of performing the measurement in the wavelength range from 700 to 1,000 nm was used and the two-photon absorbing polymerizable composition of the present invention was irradiated with the laser light while converging light through an NA0.6 lens.

The wavelength of light used for irradiation was in the vicinity of a wavelength where the two-photon absorbing cross-sectional area δ becomes maximum in a $10^{-4}$ M solution of the two-photon absorbing compound.

When two-photon absorption was caused in Samples 101 to 105 and Comparative Samples 1 to 5 by irradiating laser of the present invention, no change occurred even when a laser of 740 nm was irradiated. As apparent from this, the polymerization (modulation of refractive index) is caused when the two-photon absorbing compound produces an excited state by two-photon absorption.

Also, the modulation of refractive index by polymerization can be brought about at an arbitrary place in the three-dimensional direction by scanning the laser focus position in the horizontal and depth directions, and modulation of light reflectance by the three-dimensional modulation of refractive index can be formed.

Even when the two-photon absorbing compound was changed to D-5, D-22, D-41, D-56, D-58, D-73, D-75, D-77, D-84, D-117, D-118, D-123, D-132 or D-176, the same effects could be obtained.

Even when the acid generator (serving also as the cationic or radical polymerization initiator) of the dye precursor group in Samples 101 and 102 was changed to 2-(4'-methoxyphenyl)-4,6-bis(trichloromethyl)-1,3,5-triazine, 4-diethylaminophenyldiazonium tetrafluoroborate, di(tert-butylphenyl)

iodonium tetra(pentafluorophenyl)borate, tris-(4-methylphenyl)sulfonium tetra(pentafluorophenyl)borate, triphenylsulfonium methanesulfonate, triphenylsulfonium perfluoropentanoate, bis(1-(4-diphenylsulfonium)phenyl-sulfide ditriflate, benzoin tosylate, 2,6-dinitrobenzyl tosylate, N-tosylphthalic acid imide I-101, I-103 or I-102, and even when the acid-color forming dye precursor of the recording component in Samples 101 and 102 was changed to crystal violet lactone, R-7 or R-8, the same effects could be obtained.

Even when the base generator (serving also as the anionic polymerization initiator) of the dye precursor in Samples 103 and 105 was changed to PB-4, PB-8, PB-10, PB-12, PB-13: PB-19, PB-22, PB-32, PB-33 or PB-52 and even when the base-color forming dye precursor (non-dissociated form of dissociation-type dye) in Sample 103 was changed to DD-3, DD-9, DD-12, DD-23, DD-24, DD-30, DD-32, DD-37, DD-38 or DD-43, the same effects could be obtained.

Even when the dye precursor in Samples 104 and 105 was changed to E-1, E-4, E-5, E-10, E-11, E-12, E-13, E-16, E-17, E-18, E-19, E-20, E-25, E-26, E-27, E-29, E-32, E-35, E-37, E-38, E-39 or E-42, the same effects could be obtained.

Even when the radical polymerization initiator in Sample 104 was changed to Irgacure 651, I-2, I-4, I-12, I-18, I-19, I-22, I-32, CDM-HABI, TCTM-HABI, tetrabutylammonium n-butyltriphenylborate or the like, the same effects could be obtained.

In the evaluations above, as for the wavelength of laser for causing two-photon absorption, the wavelength of light for effecting entire surface exposure, and the wavelength of light for examining the change in reflectance due to modulation of refractive index, optimal wavelengths in respective systems were used.

Example 2

Evaluation of Three-Dimensional Modulation of Refractive Index by Two-Photon Absorbing Polymerizable Composition The method for three-dimensionally modulating the refractive index as a result of photopolymerization caused by non-resonant two-photon absorption of the two-photon absorbing polymerizable composition of the present invention is described below. As for the laser light source used, laser light at a wavelength being longer than the linear absorption band of the two-photon absorbing compound for use in the present invention and not having linear absorption is used. More specifically, a solid or fiber laser having an oscillation wavelength in the vicinity of the center wavelength of 1,000 nm, a semiconductor, solid or fiber laser having an oscillation wavelength in the vicinity of 780 nm, a semiconductor or solid laser having an oscillation wavelength in the range from 620 to 680 nm, or the like can be used.

Sample 101 of the two-photon absorbing polymerizable composition of the present invention was prepared according to the composition shown below.

Also, Samples 102 to 111 were prepared by replacing the two-photon absorbing compound, polymerization initiator, polymerizable monomer and binder with those shown in Table 1 each in an equivalent mass. The chain transfer agent was added only to Sample 106 other than Sample 101.

Each sample was bar-coated on a preparation glass plate and after drying the solvent, a PET film was placed thereon to obtain samples for evaluation. The film thickness was from 5 to 10 μm.

<Sample 101: Two-Photon Absorbing Polymerizable Composition of the Present Invention>

Two-photon absorbing compound: D-77, 0.02 g

Polymerization initiator: I-54, 0.03 g

Polymerizable compound (polymerizable monomer): M-1, 1.15 g

Binder: CAB, 1.25 g

Chain transfer agent: I-57, 0.045 g

Solvent: dichloromethane, 7.8 g

Polymerization Initiator:

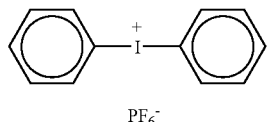

I-51

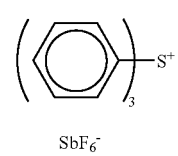

I-52

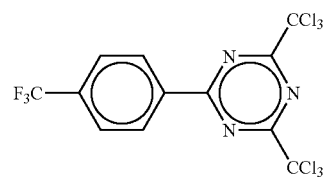

I-53

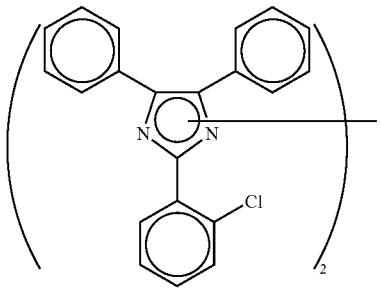

I-54

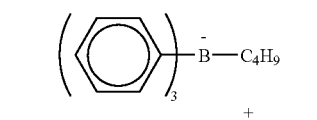

I-55

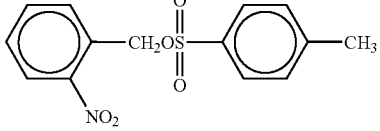

I-56

Chain Transfer Agent:

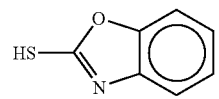

I-57

Polymerizable Monomer:

M-1:

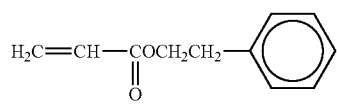

M-2:

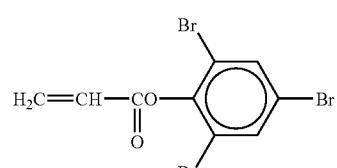

M-3:

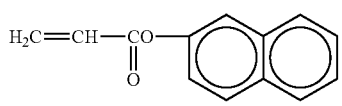

M-4:

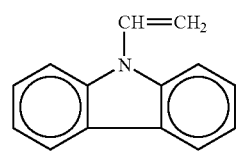

M-5:

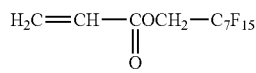

M-6:

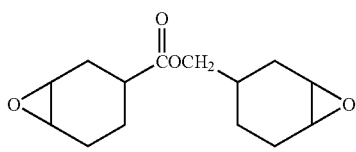

M-7:

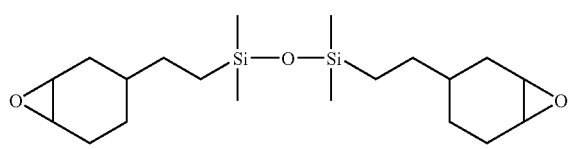

M-8:

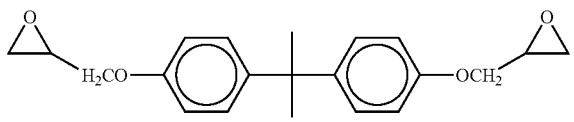

TABLE 1

| Two-Photon Absorbing Polymerizable Composition | Two-Photon Absorbing Compound | Polymerization Initiator | Polymerizable Monomer (ratio by mass) | Binder | Chain Transfer Agent |
|---|---|---|---|---|---|
| Sample 101 | D-77 | I-54 | M-1 | CAB | I-57 |
| 102 | " | I-51 | M-7 | PMPS | — |
| 103 | D-73 | I-56 | M-6 | PS | — |
| 104 | D-86 | I-1 | M-1:M-4 = 63:37 | PVA | — |
| 105 | D-94 | I-53 | M-1:M-3 = 80:20 | CAB | — |
| 106 | D-4 | I-54 | M-1:M-4 = 63:37 | PVA | I-57 |
| 107 | " | I-52 | M-8 | PVB | — |

TABLE 1-continued

| Two-Photon Absorbing Polymerizable Composition | Two-Photon Absorbing Compound | Polymerization Initiator | Polymerizable Monomer (ratio by mass) | Binder | Chain Transfer Agent |
|---|---|---|---|---|---|
| 108 | D-42 | I-55 | M-5 | PS | — |
| 109 | D-56 | I-4 | M-1:M-3 = 80:20 | CAB | — |
| 110 |  | I-12 | M-1:M-4 = 80:20 | PVA | — |
| 111 |  | I-32 | M-1:M-2 = 63:37 | PVA | — |

Binder:
CAB: cellulose acetate butyrate
PS: polystyrene
PVA: polyvinyl acetate
PVB: polyvinyl butyral
PMPS: polymethylphenylsiloxane In the performance evaluation of the two-photon absorbing polymerizable composition of the present invention, a Ti:sapphire pulse laser (pulse width: 100 fs, repetition: 80 MHz, average output: 1 W, peak power: 100 kW) capable of performing the measurement in the wavelength range from 700 to 1,000 nm was used and the two-photon absorbing polymerizable composition of the present invention was irradiated with the laser light while converging light through an NA0.6 lens.

The light used for irradiation was at a wavelength where the two-photon absorbing cross-sectional area δ becomes maximum in a $10^{-4}$ M solution of the two-photon absorbing compound.

In all of the samples of the present invention, the modulation of refractive index (0.005 or more) could be confirmed between the laser-focused area and the unfocused area after photopolymerization.

The modulation of refractive index could be similarly confirmed even after standing in a bright place or in a dark place for 1 week.

Furthermore, in all of the samples, it was confirmed that the modulation of refractive index can be formed at an arbitrary position in the depth direction, namely, in the three-dimensional direction, by scanning the laser-focused position in the depth direction.

By using the two-photon absorbing polymerizable composition, the refractive index can be three-dimensionally modulated between the laser-focused area and the unfocused area.

This application is based on Japanese patent applications JP 2003-146527, filed on May 23, 2004 and JP 2003-312744, filed on Sep. 4, 2004, the entire content of which is hereby incorporated by reference, the same as if set forth at length.

What is claimed is:

1. A two-photon absorbing polymerization method comprising:
    a first step of irradiating light on a composition comprising a free radical polymerizable compound capable of a two-photon absorption to form only a latent image; and a second step of exciting the latent image by an application of heat to cause a polymerization,
    wherein as a two-photon absorbing compound, a cyanine dye, a merocyanine dye, an oxonol dye, a phthalocyanine dye or a compound represented by the following formula (1) is used:

Formula (1)

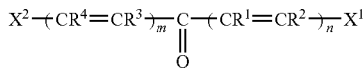

wherein $R^1$, $R^2$, $R^3$ and $R^4$ each independently represents a hydrogen atom or a substituent and some of $R^1$, $R^2$, $R^3$ and $R^4$ may combine with each other to form a ring; n and m each independently represents an integer of 0 to 4 and when n and m each is 2 or more, multiple $R^1$s, $R^2$s, $R^3$s or $R^4$s may be the same or different, provided that n and m are not 0 at the same time; and $X^1$ and $X^2$ each independently represents an aryl group, a heterocyclic group or a group represented by formula (2):

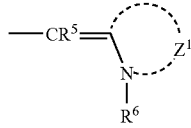

wherein $R^5$ represents a hydrogen atom or a substituent, $R^6$ represents a hydrogen atom, an alkyl group, an alkenyl group, an aryl group or a heterocyclic group, and $Z^1$ represents an atomic group for forming a 5- or 6-membered ring.

2. The two-photon absorbing polymerization method as claimed in claim 1, wherein the cyanine dye is represented by the following formula (3), the merocyanine dye is represented by formula (4) and the oxonol dye is represented by formula (5):

Formula (3):

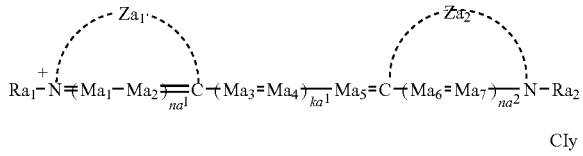

Formula (4):

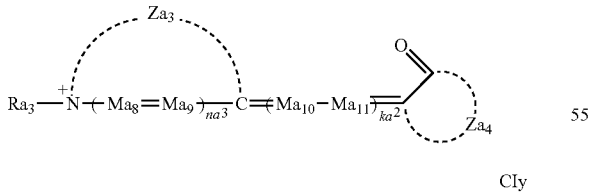

Formula (5):

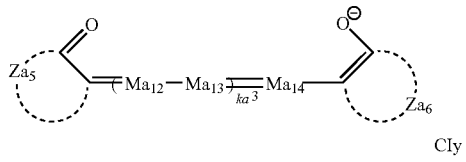

wherein $Za_1$, $Za_2$ and $Za_3$ each represents an atomic group for forming a 5- or 6-membered nitrogen-containing heterocyclic ring, $Za_4$, $Za_5$ and $Za_6$ each represents an atomic group for forming a 5- or 6-membered ring, $Ra_1$, $Ra_2$ and $Ra_3$ each independently represents a hydrogen atom, an alkyl group, an alkenyl group, an aryl group or a heterocyclic group, $Ma_1$ to $Ma_{14}$ each independently represents a methine group which may have a substituent or may form a ring together with another methine group, $na^1$, $na^2$ and $na^3$ each represents 0 or 1, $ka^1$ and $ka^3$ each represents an integer of 0 to 3, provided that when $ka^1$ is 2 or more, multiple $Ma_3$s or $Ma_4$s may be the same or different and when $ka^3$ is 2 or more, multiple $Ma_{12}$s or $Ma_{13}$s may be the same or different, $ka^2$ represents an integer of 0 to 8, provided that when $ka^2$ is 2 or more, multiple $Ma_{10}$s or $Ma_{11}$s may be the same or different, CI represents an ion for neutralizing the electric charge, and y represents a number necessary for the neutralization of electric charge.

3. A two-photon absorbing polymerization method comprising: a first step of irradiating light on a composition comprising a cationic or anionic polymerizable compound capable of a two-photon absorption to form only a latent image; and a second step of exciting the latent image by an irradiation of light to cause a polymerization, wherein as a two-photon absorbing compound, a cyanine dye, a merocyanine dye, an oxonol dye, a phthalocyanine dye or a compound represented by the following formula (1) is used:

Formula (1)

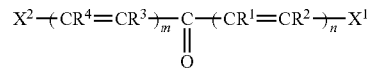

wherein $R^1$, $R^2$, $R^3$ and $R^4$ each independently represents a hydrogen atom or a substituent and some of $R^1$, $R^2$, $R^3$ and $R^4$ may combine with each other to form a ring; n and m each independently represents an integer of 0 to 4 and when n and m each is 2 or more, multiple $R^1$s, $R^2$s, $R^3$s or $R^4$s may be the same or different, provided that n and m are not 0 at the same time; and $X^1$ and $X^2$ each independently represents an aryl group, a heterocyclic group or a group represented by formula (2):

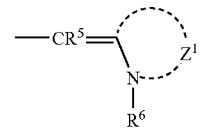

wherein $R^5$ represents a hydrogen atom or a substituent, $R^6$ represents a hydrogen atom, an alkyl group, an alkenyl group, an aryl group or a heterocyclic group, and $Z^1$ represents an atomic group for forming a 5- or 6-membered ring.

4. The two-photon absorbing polymerization method as claimed in claim 3, wherein the cyanine dye is represented by the following formula (3), the merocyanine dye is represented by formula (4) and the oxonol dye is represented by formula (5):

Formula (3):

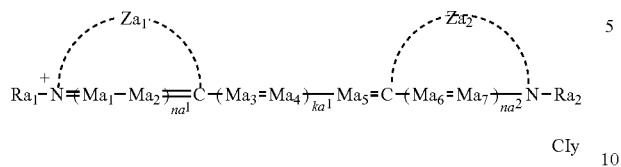

Cly

Formula (4):

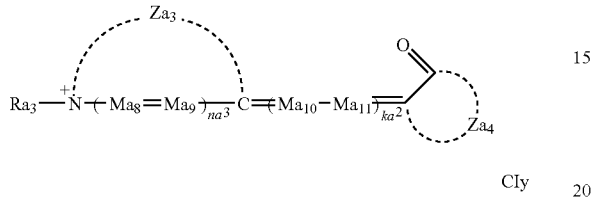

Cly

Formula (5):

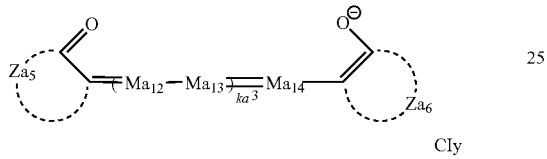

Cly wherein $Za_1$, $Za_2$ and $Za_3$ each represents an atomic group for forming a 5- or 6-membered nitrogen-containing heterocyclic ring, $Za_4$, $Za_5$ and $Za_6$ each represents an atomic group for forming a 5- or 6-membered ring, $Ra_1$, $Ra_2$ and $Ra_3$ each independently represents a hydrogen atom, an alkyl group, an alkenyl group, an aryl group or a heterocyclic group, $Ma_1$ to $Ma_{14}$ each independently represents a methine group which may have a substituent or may form a ring together with another methine group, $na^1$, $na^2$ and $na^3$ each represents 0 or 1, $ka^2$ and $ka^3$ each represents an integer of 0 to 3, provided that when $ka^1$ is 2 or more, multiple $Ma_3$s or $Ma_4$s may be the same or different and when $ka^3$ is 2 or more, multiple $Ma_{12}$s or $Ma_{13}$s may be the same or different, $ka^2$ represents an integer of 0 to 8, provided that when $ka^2$ is 2 or more, multiple $Ma_{10}$s or $Ma_{11}$s may be the same or different, CI represents an ion for neutralizing the electric charge, and y represents a number necessary for the neutralization of electric charge.

5. A two-photon absorbing optical recording method comprising:
  a first step of forming a latent image of a color-forming material comprising a cationic or anionic polymerizable compound by a two-photon absorption; a second step of irradiating light on said latent image of a color-forming material to cause a polymerization based on a linear absorption of the color-forming material; and thereby forming difference in the refractive index to perform a recording,
    wherein as a two-photon absorbing compound, a cyanine dye, a merocyanine dye, an oxonol dye, a phthalocyanine dye or a compound represented by the following formula (1) is used:

Formula (1)

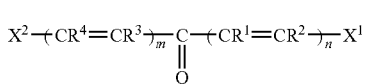

wherein $R^1$, $R^2$, $R^3$ and $R^4$ each independently represents a hydrogen atom or a substituent and some of $R^1$, $R^2$, $R^3$ and $R^4$ may combine with each other to form a ring; n and m each independently represents an integer of 0 to 4 and when n and m each is 2 or more, multiple $R^1$s, $R^1$s, $R^3$s or $R^4$s may be the same or different, provided that n and m are not 0 at the same time; and $X^1$ and $X^2$ each independently represents an aryl group, a heterocyclic group or a group represented by formula (2):

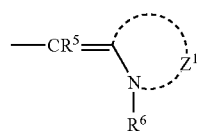

wherein $R^5$ represents a hydrogen atom or a substituent, $R^6$ represents a hydrogen atom, an alkyl group, an alkenyl group, an aryl group or a heterocyclic group, and $Z^1$ represents an atomic group for forming a 5- or 6-membered ring.

6. The two-photon absorbing optical recording method as claimed in claim 5, wherein in said second step, light is irradiated on said latent image of a color-forming material to cause a polymerization while self-sensitizing and self-amplifying based on a linear absorption of the color-forming material and thereby difference in the refractive index is formed to perform a recording.

7. The two-photon absorbing optical recording method as claimed in claim 5, wherein the cyanine dye is represented by the following formula (3), the merocyanine dye is represented by formula (4) and the oxonol dye is represented by formula (5):

Formula (3):

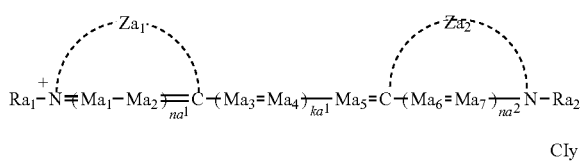

Cly

Formula (4):

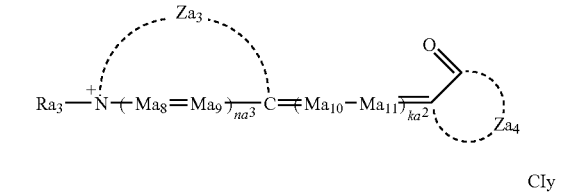

Cly

-continued

Formula (5):

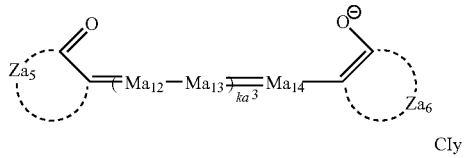
Cly wherein $Za_1$, $Za_2$ and $Za_3$ each represents an atomic group for forming a 5- or 6-membered nitrogen-containing heterocyclic ring, $Za_4$, $Za_5$ and $Za_6$ each represents an atomic group for forming a 5- or 6-membered ring, $Ra_1$, $Ra_2$ and $Ra_3$ each independently represents a hydrogen atom, an alkyl group, an alkenyl group, an aryl group or a heterocyclic group, $Ma_1$ to $Ma_{14}$ each independently represents a methine group which may have a substituent or may form a ring together with another methine group, $na^1$, $na^2$ and $na^3$ each represents 0 or 1, $ka^1$ and $ka^3$ each represents an integer of 0 to 3, provided that when $ka^1$ is 2 or more, multiple $Ma_3$s or $Ma_4$s may be the same or different and when $ka^3$ is 2 or more, multiple $Ma_{12}$s or $Ma_{13}$s may be the same or different, $ka^2$ represents an integer of 0 to 8, provided that when $ka^2$ is 2 or more, multiple $Ma_{10}$s or $Ma_{11}$s may be the same or different, CI represents an ion for neutralizing the electric charge, and y represents a number necessary for the neutralization of electric charge.

8. A two photon absorbing optical recording and reproduction method comprising: performing a recording by the first and second steps described in claim 5; then performing a reproduction by irradiating light on said recorded area and detecting the difference in reflectance attributable to the difference in refractive index.

9. A two-photon absorbing optical recording method comprising: a first step of forming a latent image of a color-forming material containing a cationic or anionic polymerizable compound by a two-photon absorption; a second step of irradiating light on said latent image of a color-forming material to cause a polymerization based on a linear absorption of the color-forming material; and thereby forming difference in the refractive index to perform a recording, wherein the recording is performed by using a two-photon absorbing optical recording material comprising:

1) a two-photon absorbing compound capable of undergoing a two-photon absorption to produce an excited state upon irradiation with light having a wavelength that is longer than the linear absorption band of the compound 1) itself and has a molar absorption coefficient of linear absorption of 10 or less;

2) a dye precursor having an absorption shifted to the longer wavelength side than in the original state by electron or energy transfer from said two-photon absorbing compound 1) in the excited state to become a color-forming material having an absorption in the wavelength region where the molar absorption coefficient of linear absorption in the two-photon absorbing compound 1) is 5,000 or less;

3) a polymerization initiator capable of initiating a polymerization of a polymerizable compound by electron or energy transfer from said two-photon absorbing compound 1) in the excited state;

4) a cationic or anionic polymerizable compound; and 5) a binder, wherein said two-photon absorbing compound is a cyanine dye, a merocyanine dye, an oxonol dye, a phthalocyanine dye or a compound represented by the following formula (1):

Formula (1)

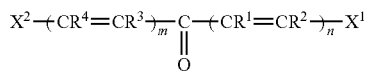

wherein $R^1$, $R^2$, $R^3$ and $R^4$ each independently represents a hydrogen atom or a substituent and some of $R^1$, $R^2$, $R^3$ and $R^4$ may combine with each other to form a ring; n and m each independently represents an integer of 0 to 4 and when n and m each is 2 or more, multiple $R^1$s, $R^2$s, $R^3$s or $R^4$s may be the same or different, provided that n and m are not 0 at the same time; and $X^1$ and $X^2$ each independently represents an aryl group, a heterocyclic group or a group represented by formula (2):

Formula (2):

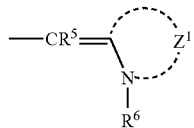

wherein $R^5$ represents a hydrogen atom or a substituent, $R^6$ represents a hydrogen atom, an alkyl group, an alkenyl group, an aryl group or a heterocyclic group, and $Z^1$ represents an atomic group for forming a 5- or 6-membered ring.

10. The two-photon absorbing optical recording method as claimed in claim 9, wherein the wavelength of light for performing the formation of a latent image by two-photon absorption in the first step and the wavelength of light for causing a polymerization by the latent image in the second step are the same.

11. The two-photon absorbing optical recording method as claimed in claim 9, wherein the wavelength of light for causing a polymerization by a latent image in the second step is shorter than the wavelength of light for performing the formation of the latent image by two-photon absorption in the first step, and is present in the wavelength region where the molar absorption coefficient of linear absorption in the two-photon absorbing compound is 5,000 or less.

12. The two-photon absorbing optical recording method as claimed in claim 9, wherein the polymerizable compound and the binder have a difference in the refractive index, and the compositional ratio of the polymerizable compound and a polymerization reaction product thereof to the binder becomes non-uniform between the recorded area and the unrecorded area to enable a two-photon absorbing optical recording by utilizing a modulation of refractive index.

13. A two photon recording process and reproduction method comprising: performing a recording by using a two-photon absorbing polymerizable composition; then performing a reproduction by irradiating light on said recorded area and detecting the difference in reflectance attributable to the difference in refractive index, wherein the two-photon absorbing polymerizable composition comprises a two-photon absorbing compound, a polymerization initiator, a cationic or anionic polymerizable compound and a binder, in which the two-photon absorbing polymerizable composition is capable of generating a three-dimensional modulation of refractive index as a result of photo-polymerization caused by non-resonant two-photon absorption, and said two-photon absorbing compound is a methine dye, a cyanine dye, a merocyanine dye, an oxonol dye, or a phthalocyanine dye.

14. The two photon recording process and reproduction method as claimed in claim 13, wherein the cyanine dye is represented by the following formula (3), the merocyanine dye is represented by formula (4) and the oxonol dye is represented by formula (5):

Formula (3):

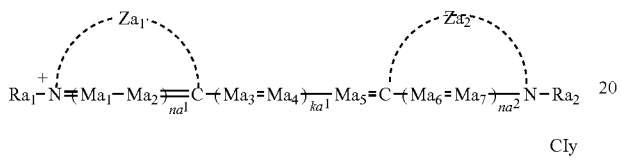

CIy

Formula (4):

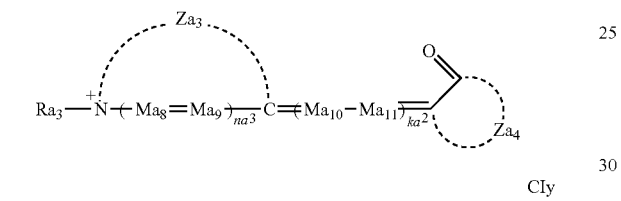

CIy

Formula (5):

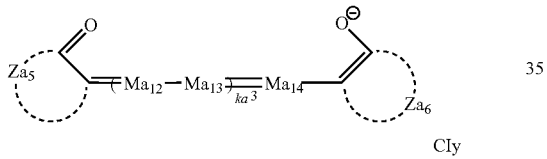

CIy wherein $Za_1$, $Za_2$ and $Za_3$ each represents an atomic group for forming a 5- or 6-membered nitrogen-containing heterocyclic ring, $Za_4$, $Za_5$ and $Za_6$ each represents an atomic group for forming a 5- or 6-membered ring, $Ra_1$, $Ra_2$ and $Ra_3$ each independently represents a hydrogen atom, an alkyl group, an alkenyl group, an aryl group or a heterocyclic group, $Ma_1$ to $Ma_{14}$ each independently represents a methine group which may have a substituent or may form a ring together with another methine group, $na^1$, $na^2$ and $na^3$ each represents 0 or 1, $ka^1$ and $ka^3$ each represents an integer of 0 to 3, provided that when $ka^1$ is 2 or more, multiple $Ma_3$s or $Ma_4$s may be the same or different and when $ka^3$ is 2 or more, multiple $Ma_{12}$s or $Ma_{13}$s may be the same or different, $ka^2$ represents an integer of 0 to 8, provided that when $ka^2$ is 2 or more, multiple $Ma_{10}$s or $Ma_{11}$s may be the same or different, CI represents an ion for neutralizing the electric charge, and y represents a number necessary for the neutralization of electric charge.

15. A method for three-dimensionally modulating a refractive index, comprising: irradiating a two-photon absorbing polymerizable composition with laser light at a wavelength being longer than the linear absorption band of the two-photon absorbing compound and having no linear absorption to induce a two-photon absorption; and causing photopolymerization by utilizing the two-photon absorption induced, wherein the two-photon absorbing polymerizable composition comprises a two-photon absorbing compound, a polymerization initiator, a cationic or anionic polymerizable compound and a binder, in which the two-photon absorbing polymerizable composition is capable of generating a three-dimensional modulation of refractive index as a result of photo-polymerization caused by non-resonant two-photon absorption, and said two-photon absorbing compound is a methine dye, a cyanine dye, a merocyanine dye, an oxonol dye, or a phthalocyanine dye.

16. A three-dimensional optical recording method comprising:
    irradiating a two-photon absorbing polymerizable composition with laser light at a wavelength being longer than the linear absorption band of the two-photon absorbing compound and having no linear absorption to induce a two-photon absorption;
    causing photopolymerization by utilizing the two-photon absorption induced to cause a non-uniformity of the compositional ratio of the polymerizable compound and a polymerization reaction product thereof to the binder between the laser-focused area and unfocused area; and
    performing a recording by using a three-dimensional modulation of refractive index caused by the non-uniformity of the compositional ratio,
    wherein the two-photon absorbing polymerizable composition comprises a two-photon absorbing compound, a polymerization initiator, a cationic or anionic polymerizable compound and a binder, in which the two-photon absorbing polymerizable composition is capable of generating a three-dimensional modulation of refractive index as a result of photo-polymerization caused by non-resonant two-photon absorption, and said two-photon absorbing compound is a methine dye, a cyanine dye, a merocyanine dye, an oxonol dye, or a phthalocyanine dye.

* * * * *